US012628329B2

(12) United States Patent
Ito et al.

(10) Patent No.:  US 12,628,329 B2
(45) Date of Patent:       May 12, 2026

(54) SEMICONDUCTOR MEMORY DEVICE

(71) Applicant: Kioxia Corporation, Tokyo (JP)

(72) Inventors: Naomi Ito, Shinagawa (JP); Koichi Kishi, Fujisawa (JP)

(73) Assignee: Kioxia Corporation, Tokyo (JP)

( * ) Notice: Subject to any disclaimer, the term of this patent is extended or adjusted under 35 U.S.C. 154(b) by 500 days.

(21) Appl. No.: 18/067,133

(22) Filed: Dec. 16, 2022

(65) Prior Publication Data

US 2023/0209803 A1      Jun. 29, 2023

(30) Foreign Application Priority Data

Dec. 28, 2021     (JP) ................................. 2021-214720

(51) Int. Cl.
H10B 12/00          (2023.01)
G11C 11/4091       (2006.01)

(52) U.S. Cl.
CPC .......... H10B 12/30 (2023.02); G11C 11/4091 (2013.01); H10B 12/03 (2023.02); H10B 12/05 (2023.02); H10B 12/50 (2023.02)

(58) Field of Classification Search
CPC ........ H10B 12/03; H10B 12/05; H10B 12/09; H10B 12/30; H10B 12/482; H10B 12/488; H10B 12/50; G11C 11/4091; G11C 11/4094
See application file for complete search history.

(56) References Cited

U.S. PATENT DOCUMENTS

| | | | |
|---|---|---|---|
| 8,659,070 B2 | 2/2014 | Tanaka et al. | |
| 10,121,553 B2 | 11/2018 | Harari | |
| 2019/0252386 A1 | 8/2019 | Lee et al. | |
| 2020/0111512 A1 | 4/2020 | Kim et al. | |
| 2022/0108987 A1 | 4/2022 | Lee et al. | |
| 2022/0108988 A1 | 4/2022 | Kim et al. | |
| 2022/0130830 A1 | 4/2022 | Yokoyama | |
| 2022/0285365 A1 | 9/2022 | Kim et al. | |
| 2022/0399309 A1* | 12/2022 | Simsek-Ege | ............ H01L 24/08 |

FOREIGN PATENT DOCUMENTS

JP               5091526 B2      12/2012

* cited by examiner

*Primary Examiner* — Edward Chin
(74) *Attorney, Agent, or Firm* — Oblon, McClelland, Maier & Neustadt, L.L.P.

(57) ABSTRACT

A semiconductor memory device includes a substrate including a first region and a second region arranged in a first direction, and first electrodes arranged in a second direction. The first electrodes each include a pair of first parts disposed in the first region and arranged in a third direction, and a second part disposed in the second region and electrically connected to the first parts. The device includes first wirings arranged along one of the first parts, first semiconductor layers opposed to the one of the first parts and connected to the first wirings, first memory portions electrically connected to the first wirings via the first semiconductor layers, second wirings arranged along the other of the first parts, second semiconductor layers opposed to the other of the first parts and connected to the second wirings, and second memory portions electrically connected to the second wirings via the second semiconductor layers.

9 Claims, 162 Drawing Sheets

Figure 111:
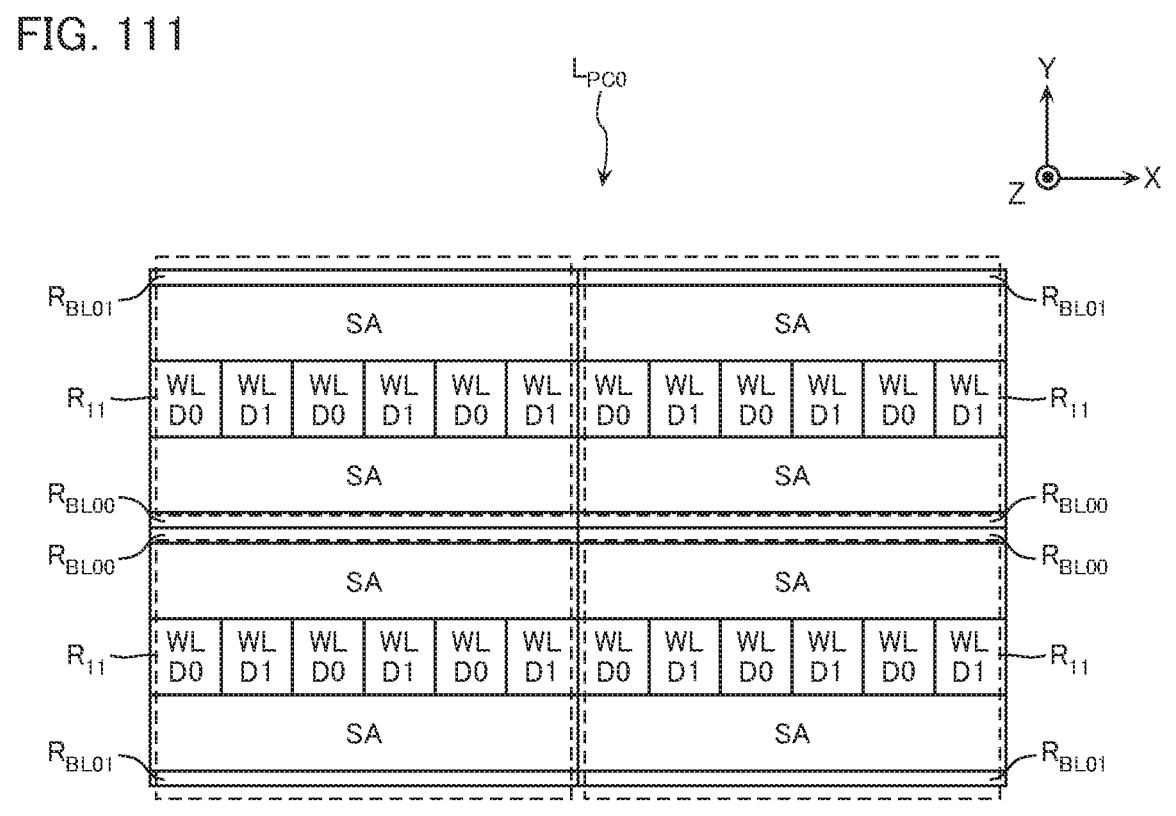

| | | | | | | | | | | | |
|---|---|---|---|---|---|---|---|---|---|---|---|
| $R_{BL01}$ | | SA | | | | | | SA | | | $R_{BL01}$ |
| $R_{11}$ | WL D0 | WL D1 | WL D0 | WL D1 | WL D0 | WL D1 | WL D0 | WL D1 | WL D0 | WL D1 | $R_{11}$ |
| | | SA | | | | | | SA | | | |
| $R_{BL00}$ | | | | | | | | | | | $R_{BL00}$ |
| $R_{BL00}$ | | SA | | | | | | SA | | | $R_{BL00}$ |
| $R_{11}$ | WL D0 | WL D1 | WL D0 | WL D1 | WL D0 | WL D1 | WL D0 | WL D1 | WL D0 | WL D1 | $R_{11}$ |
| $R_{BL01}$ | | SA | | | | | | SA | | | $R_{BL01}$ |

SEMICONDUCTOR MEMORY DEVICE

CROSS-REFERENCE TO RELATED APPLICATIONS

This application is based upon and claims the benefit of Japanese Patent Application No. 2021-214720, filed on Dec. 28, 2021, the entire contents of which are incorporated herein by reference.

BACKGROUND

Field

Embodiments described herein relate generally to a semiconductor memory device.

Description of the Related Art

In accordance with an increasing high integration of a semiconductor memory device, a study for converting the semiconductor memory device into a three-dimensional form has been in progress.

BRIEF DESCRIPTION OF THE DRAWINGS

FIG. 7 is a schematic plan view illustrating a part of the configuration of the semiconductor memory device;

3

Figure 51:
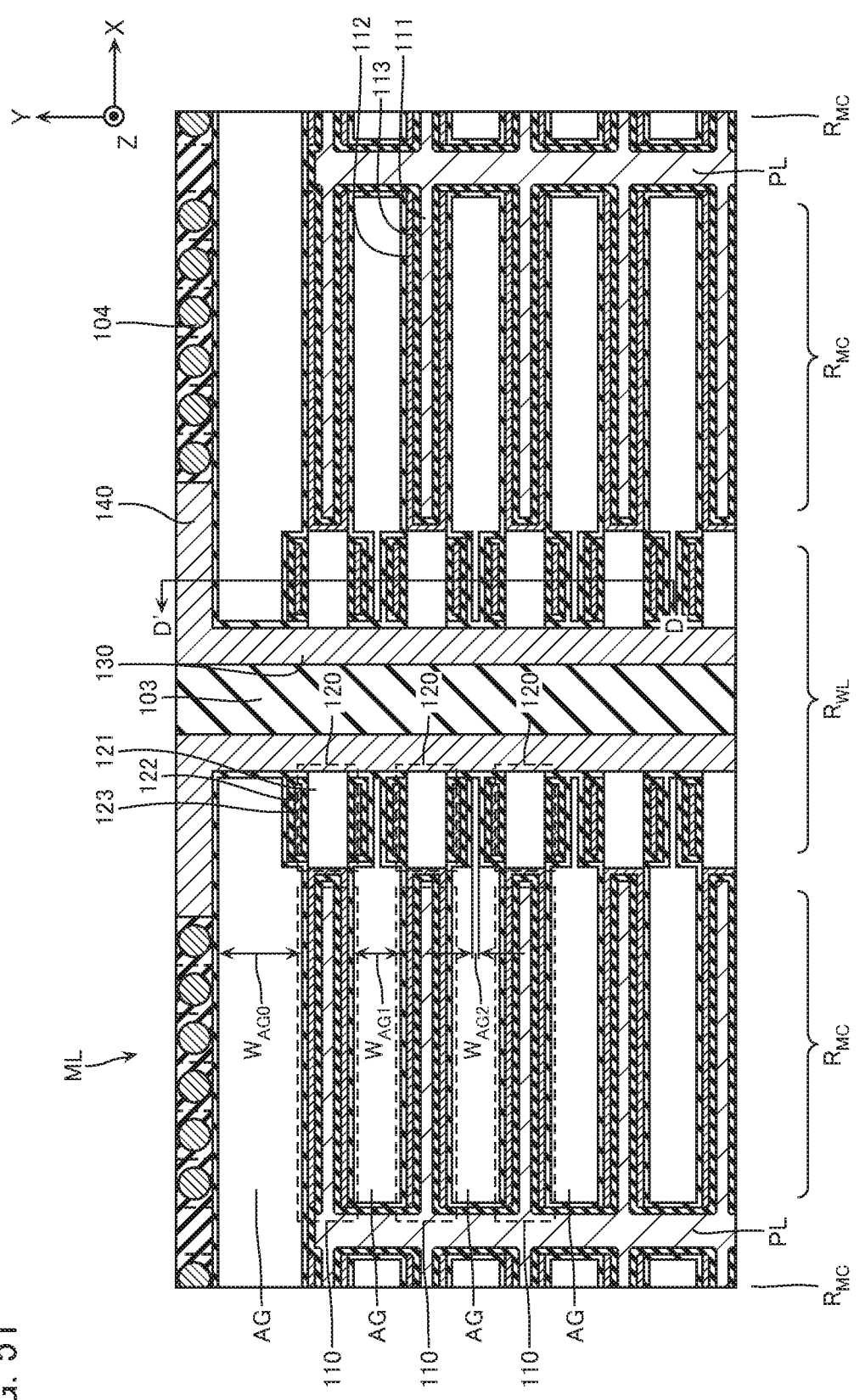
Figure 52:
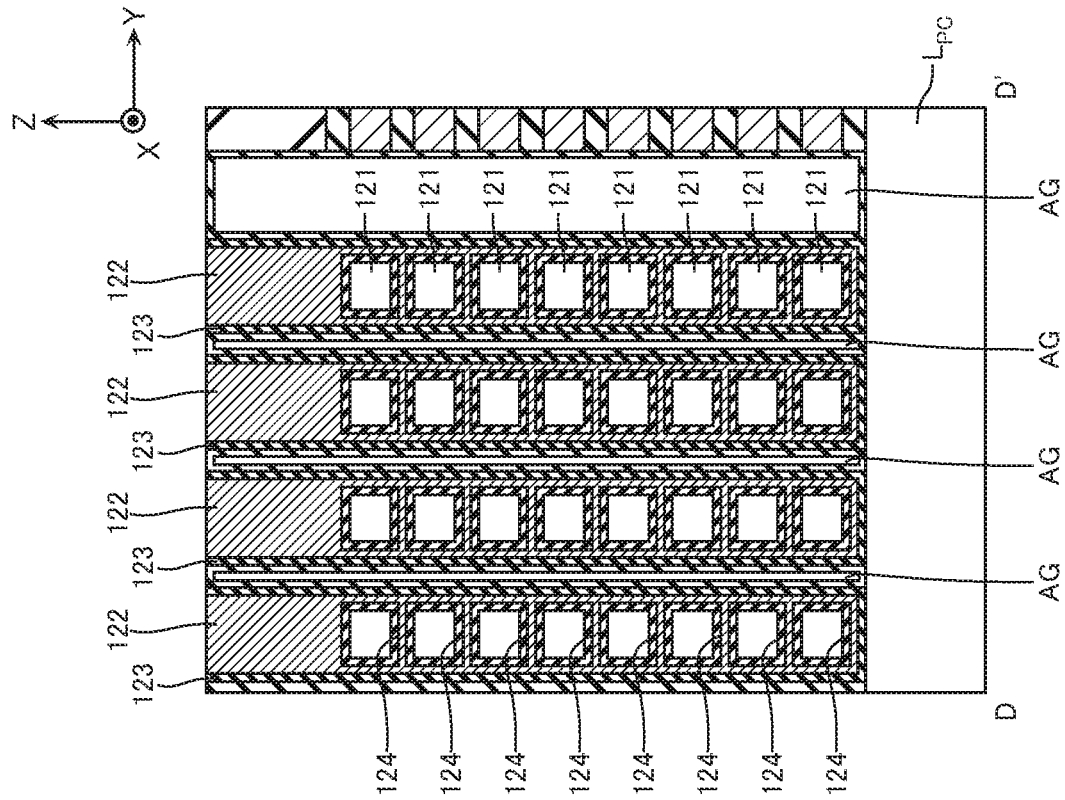
Figure 53:
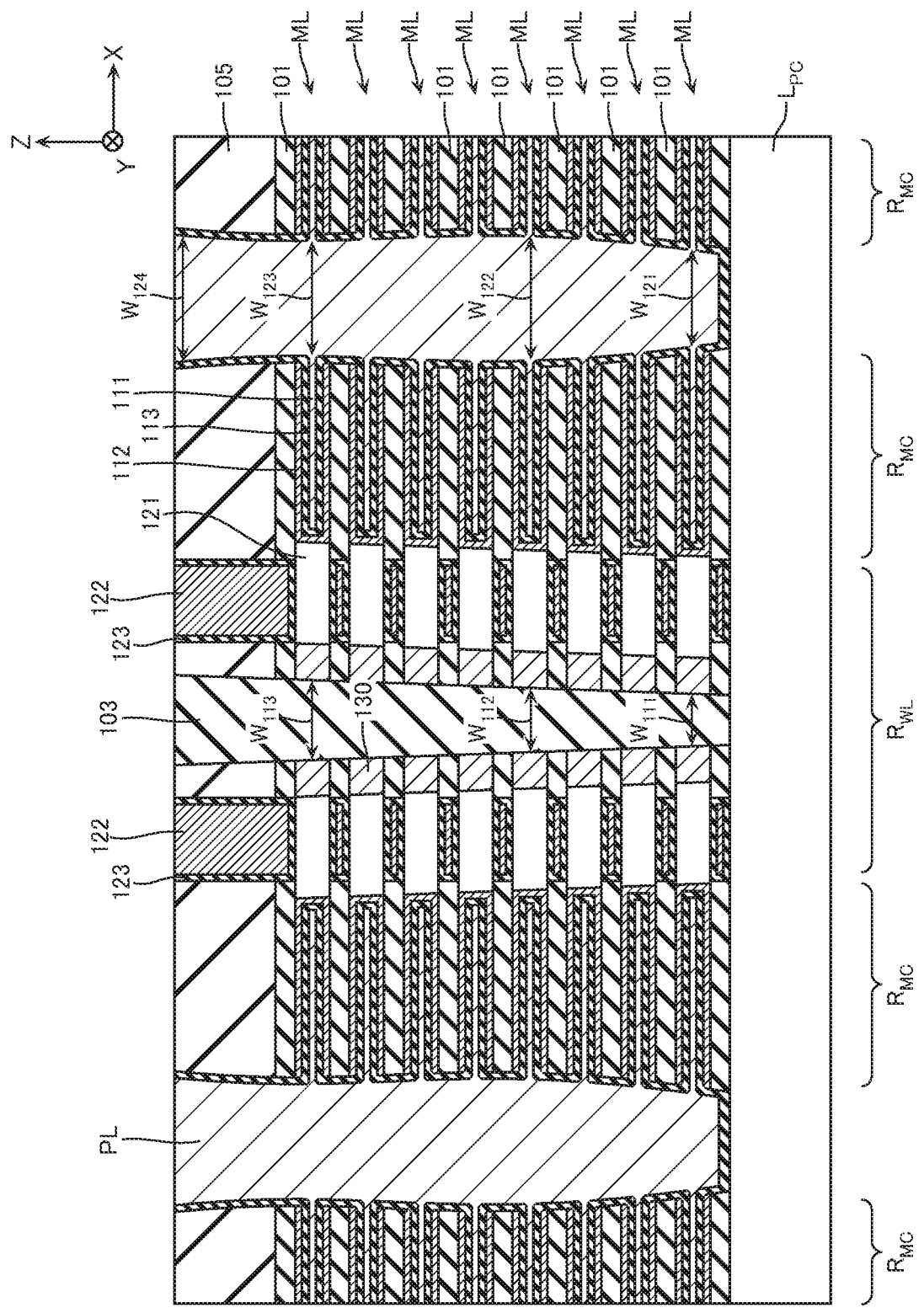
Figure 54:
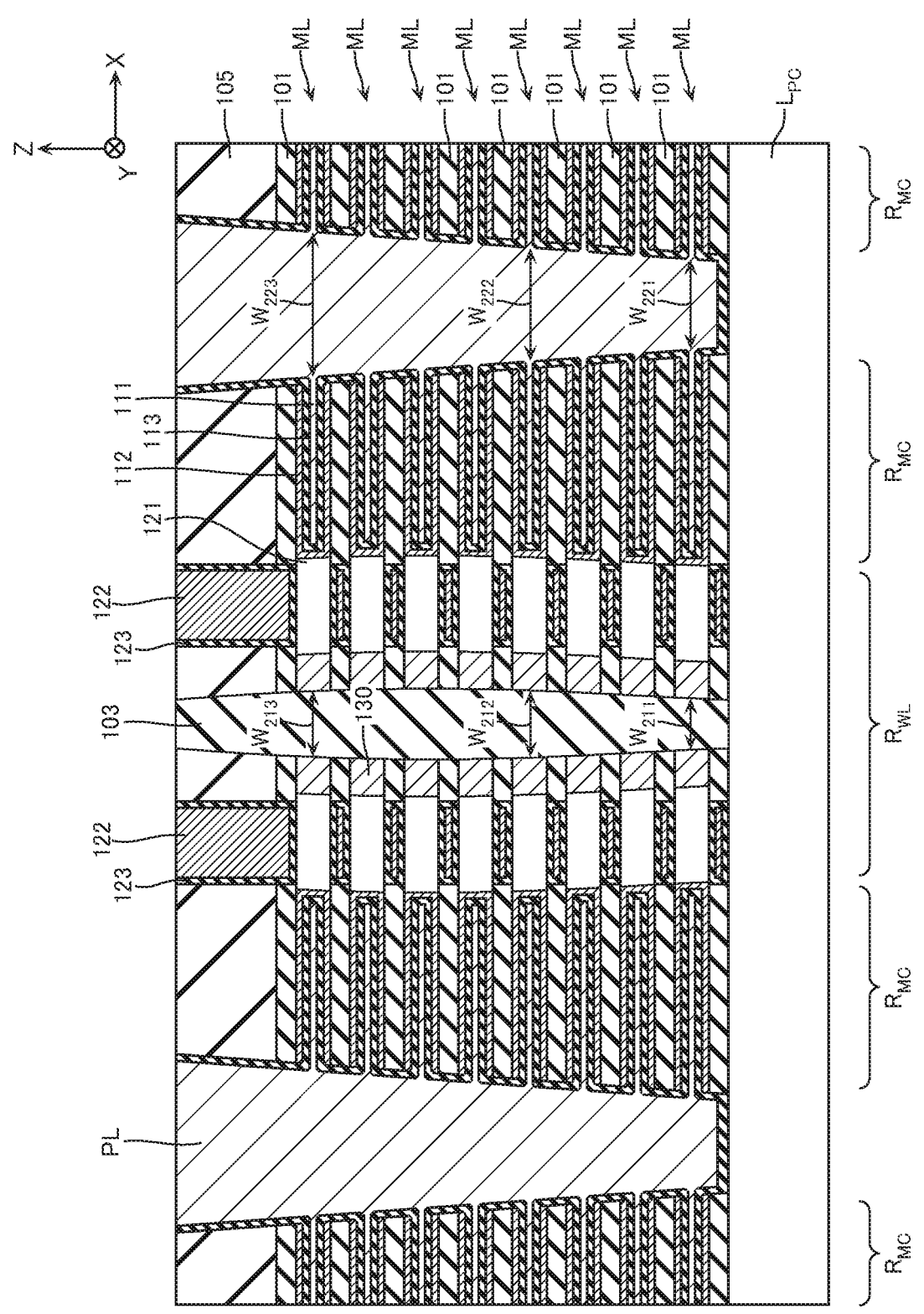
Figure 55:
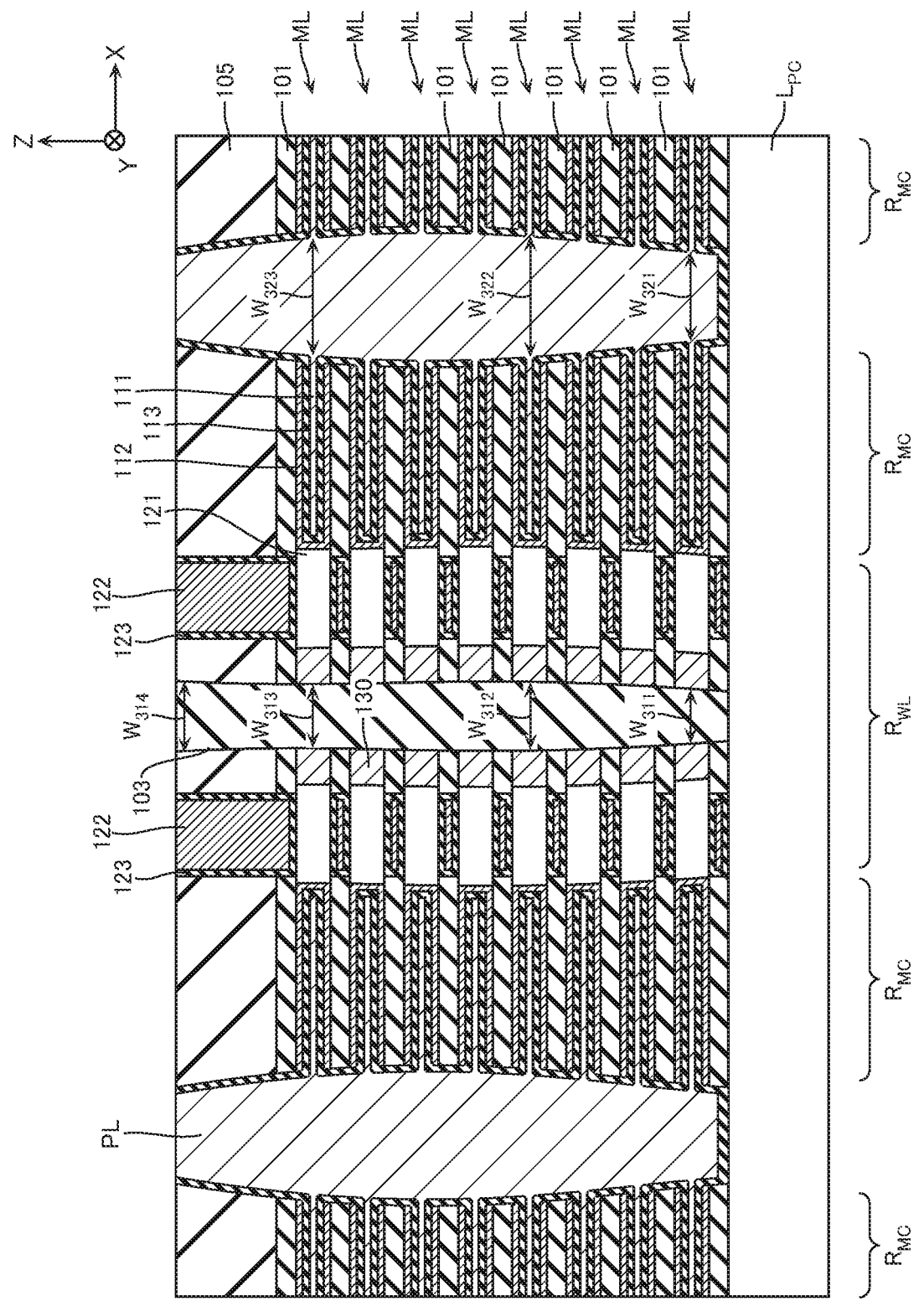
Figure 56:
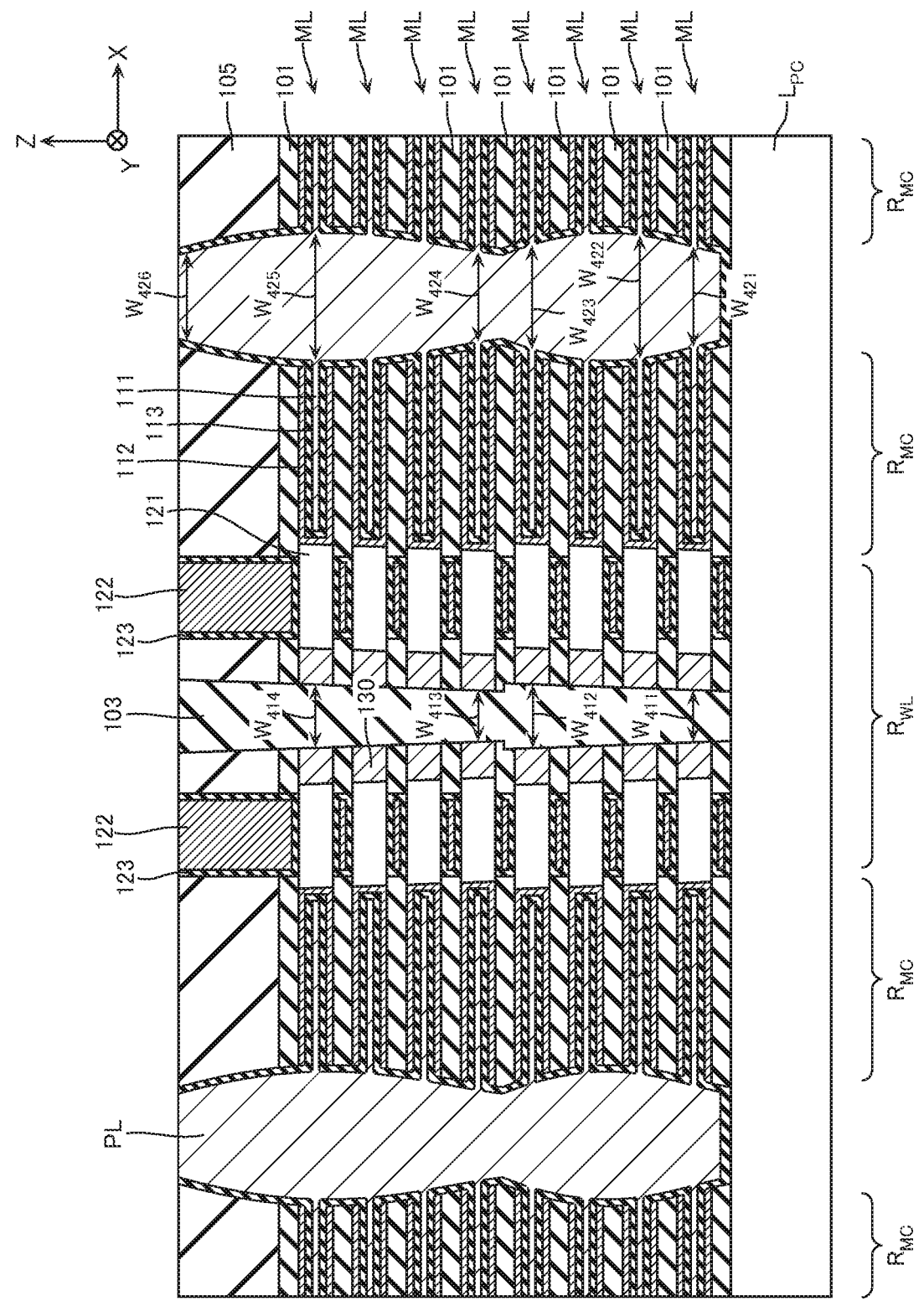
Figure 57:
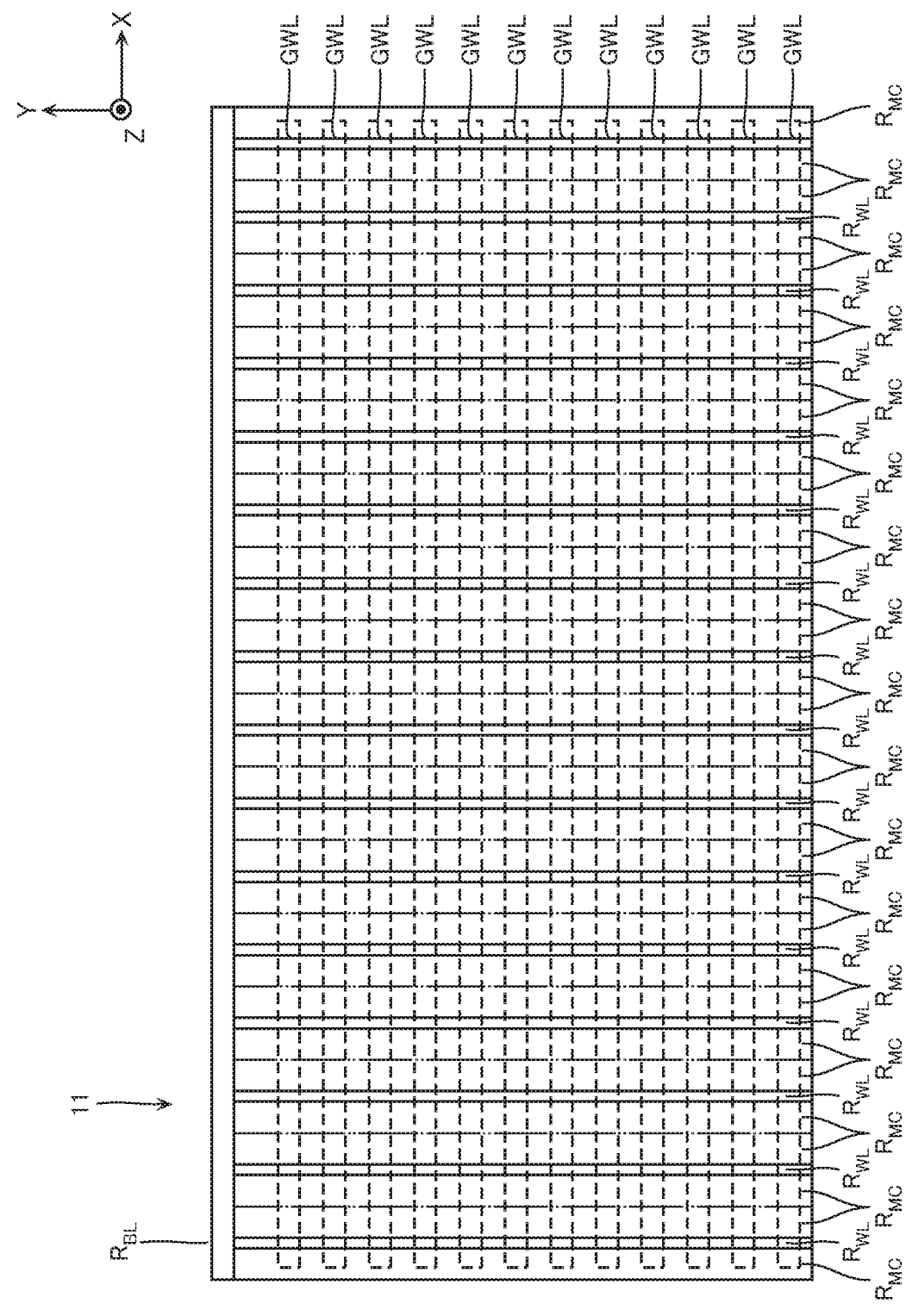
Figure 58:
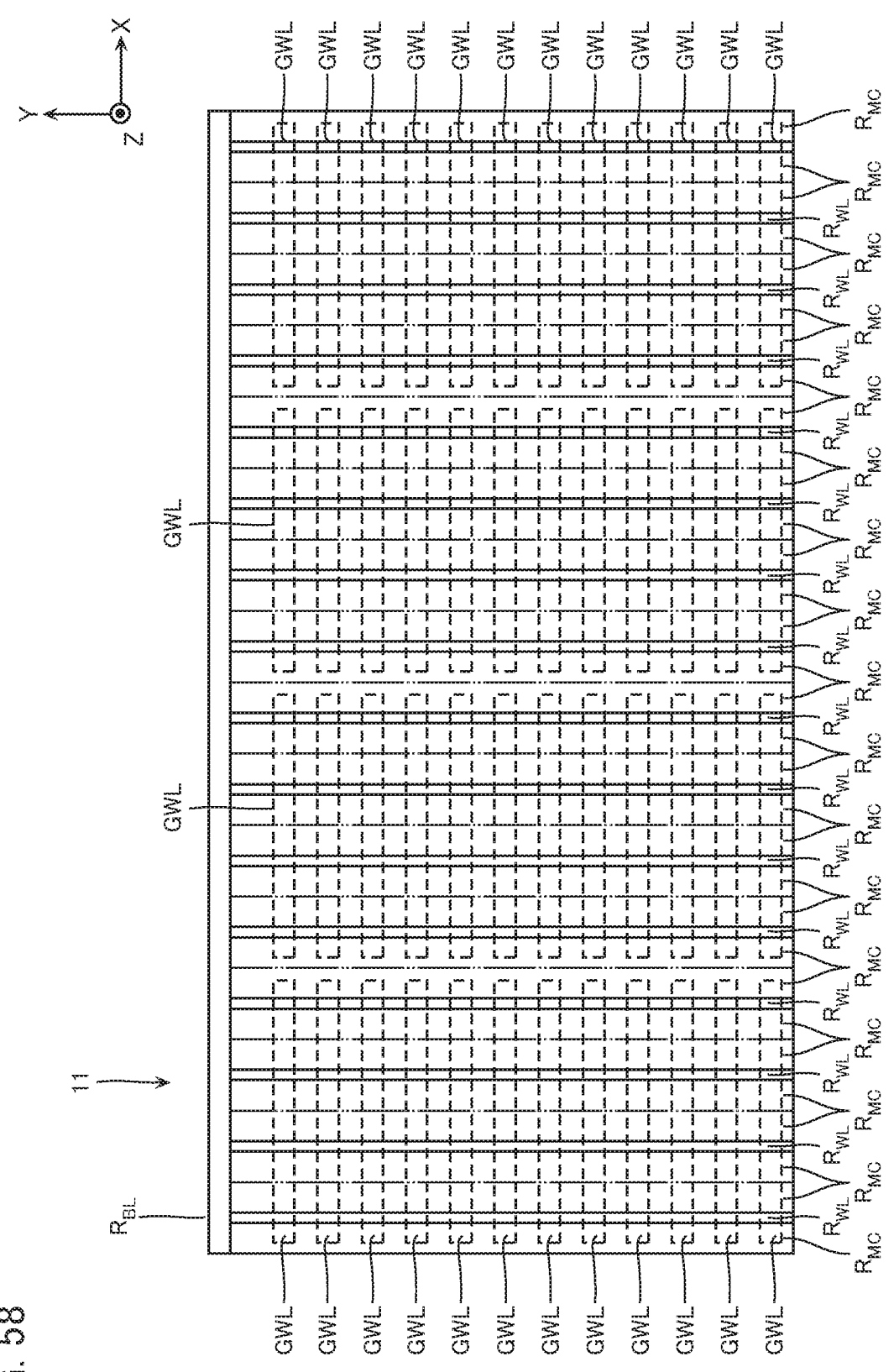
Figure 59:
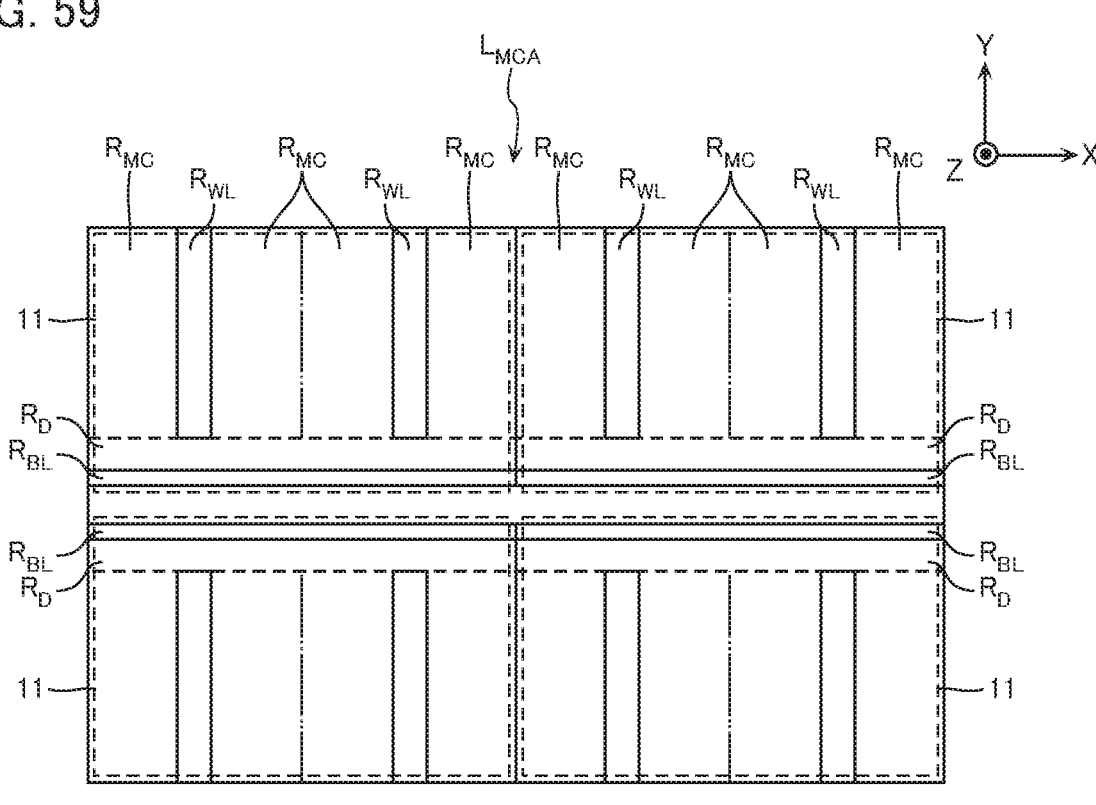
Figure 60:
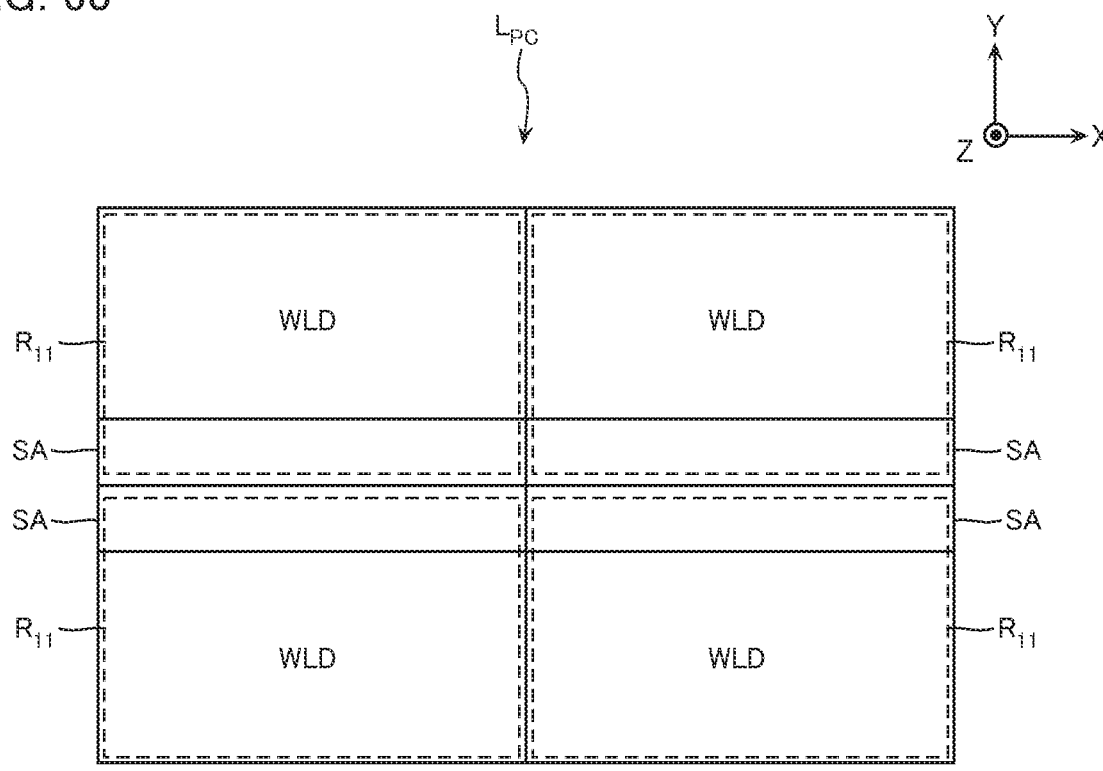
Figure 61:
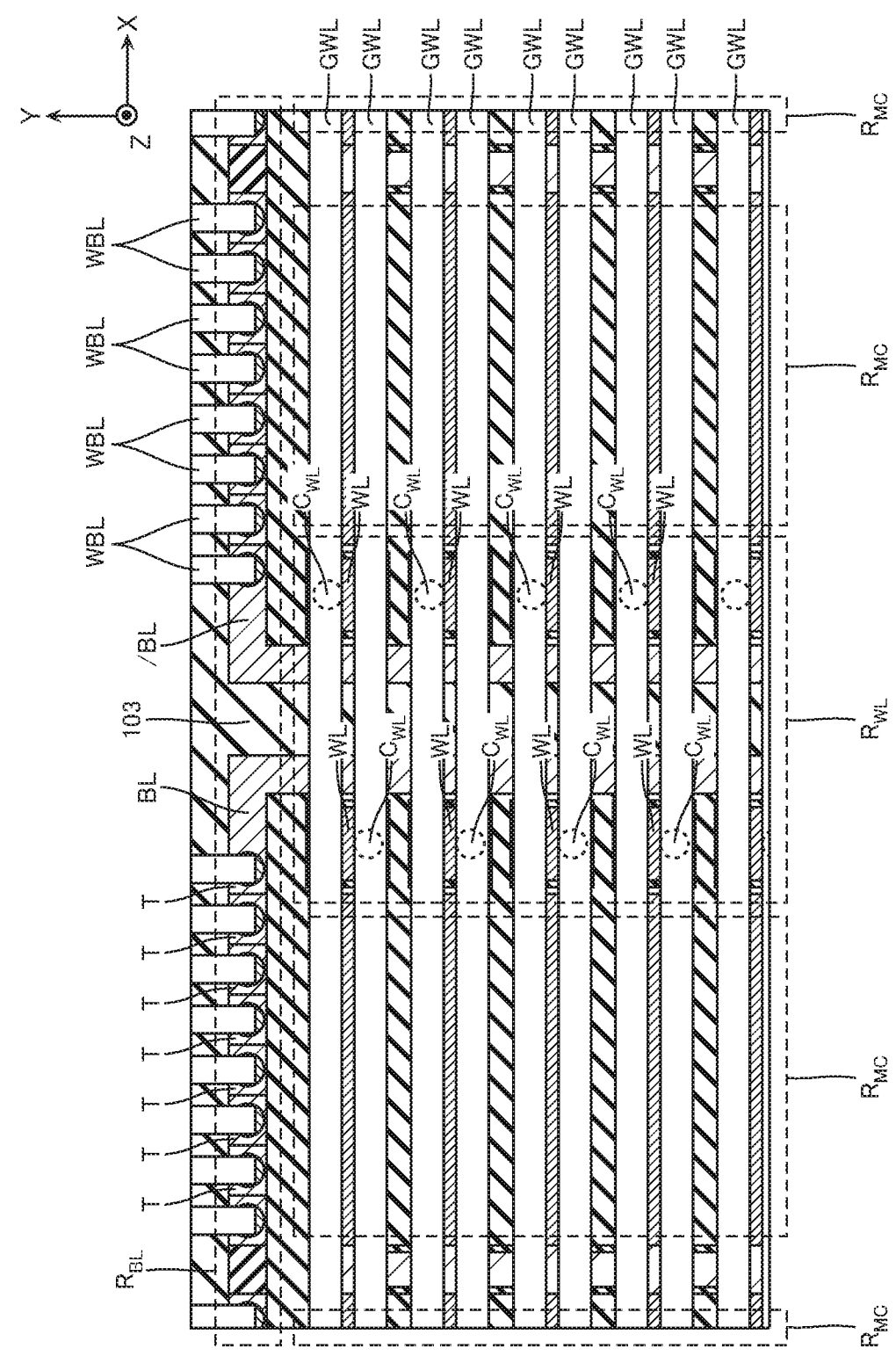
Figure 62:
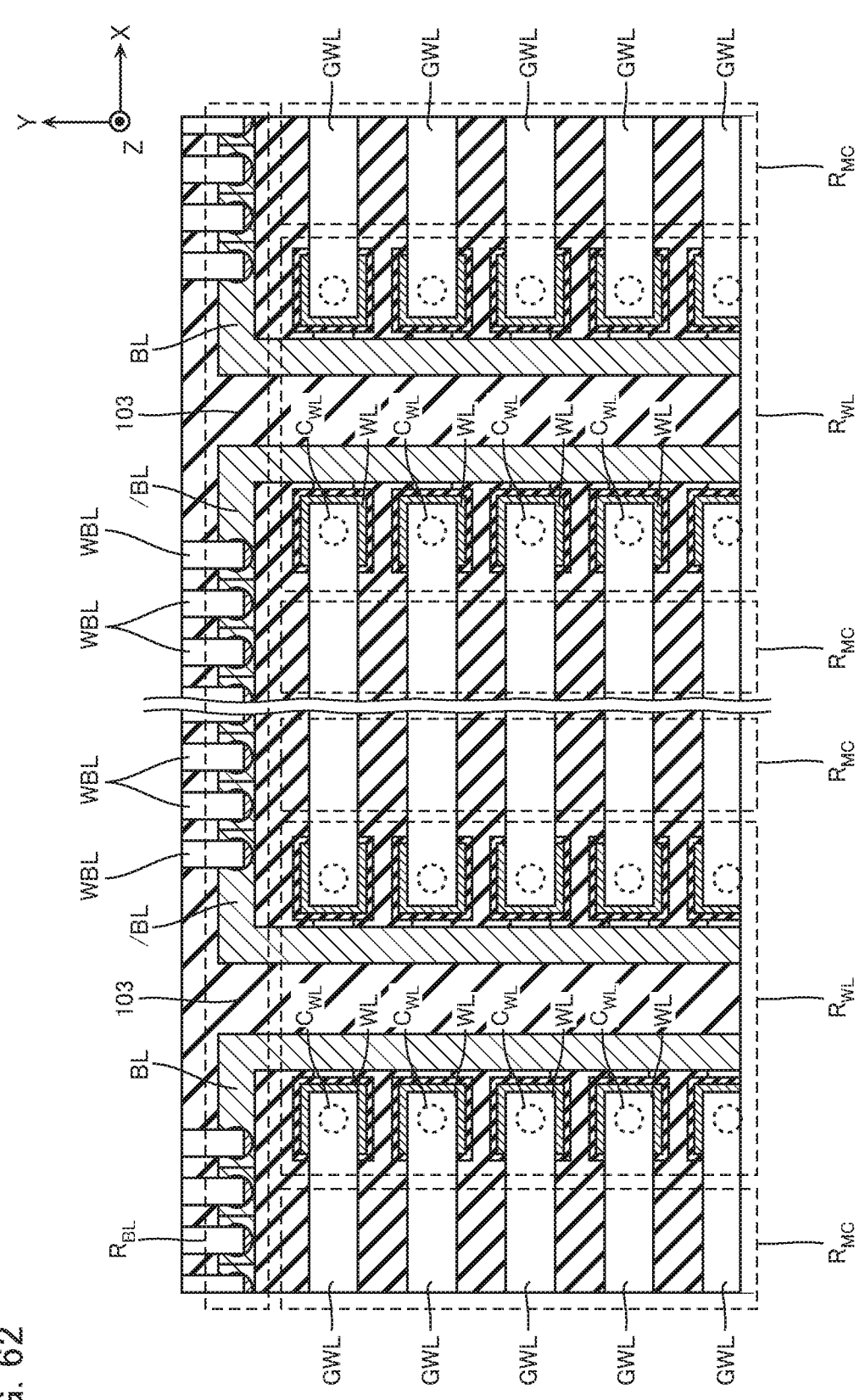
Figure 63:
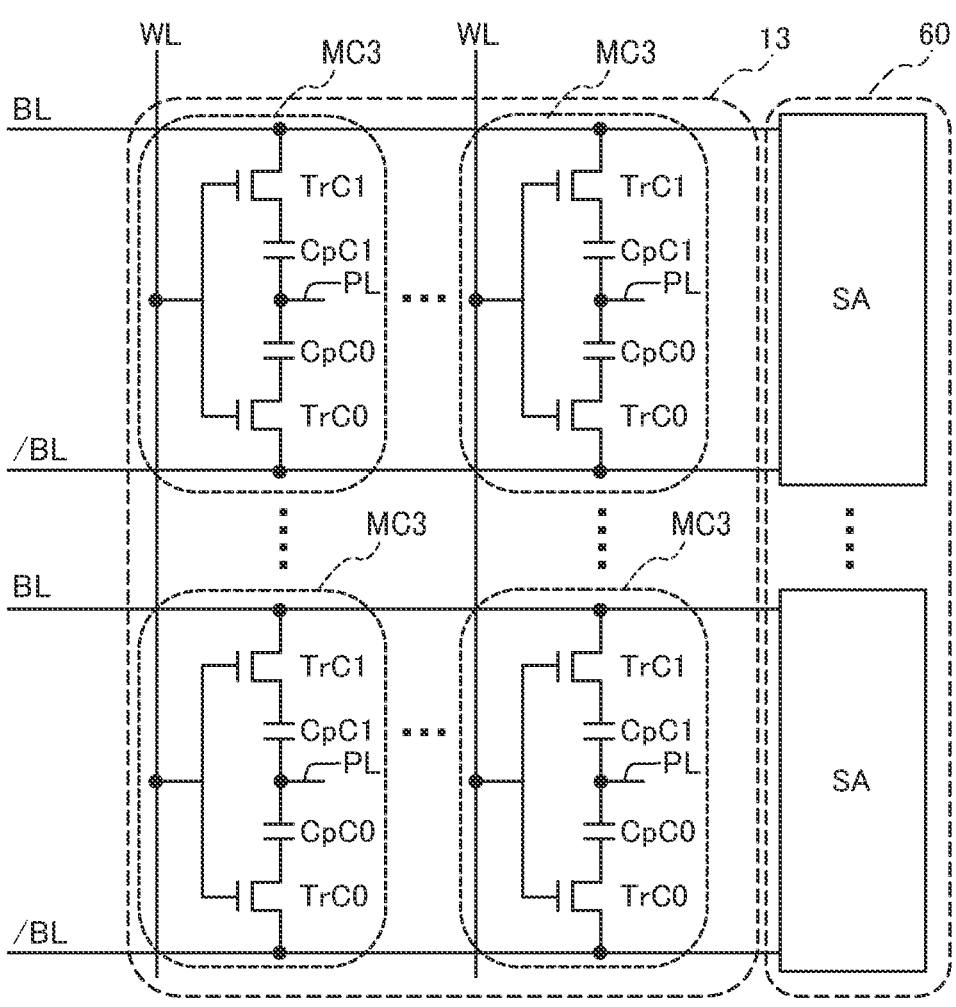
Figure 64:
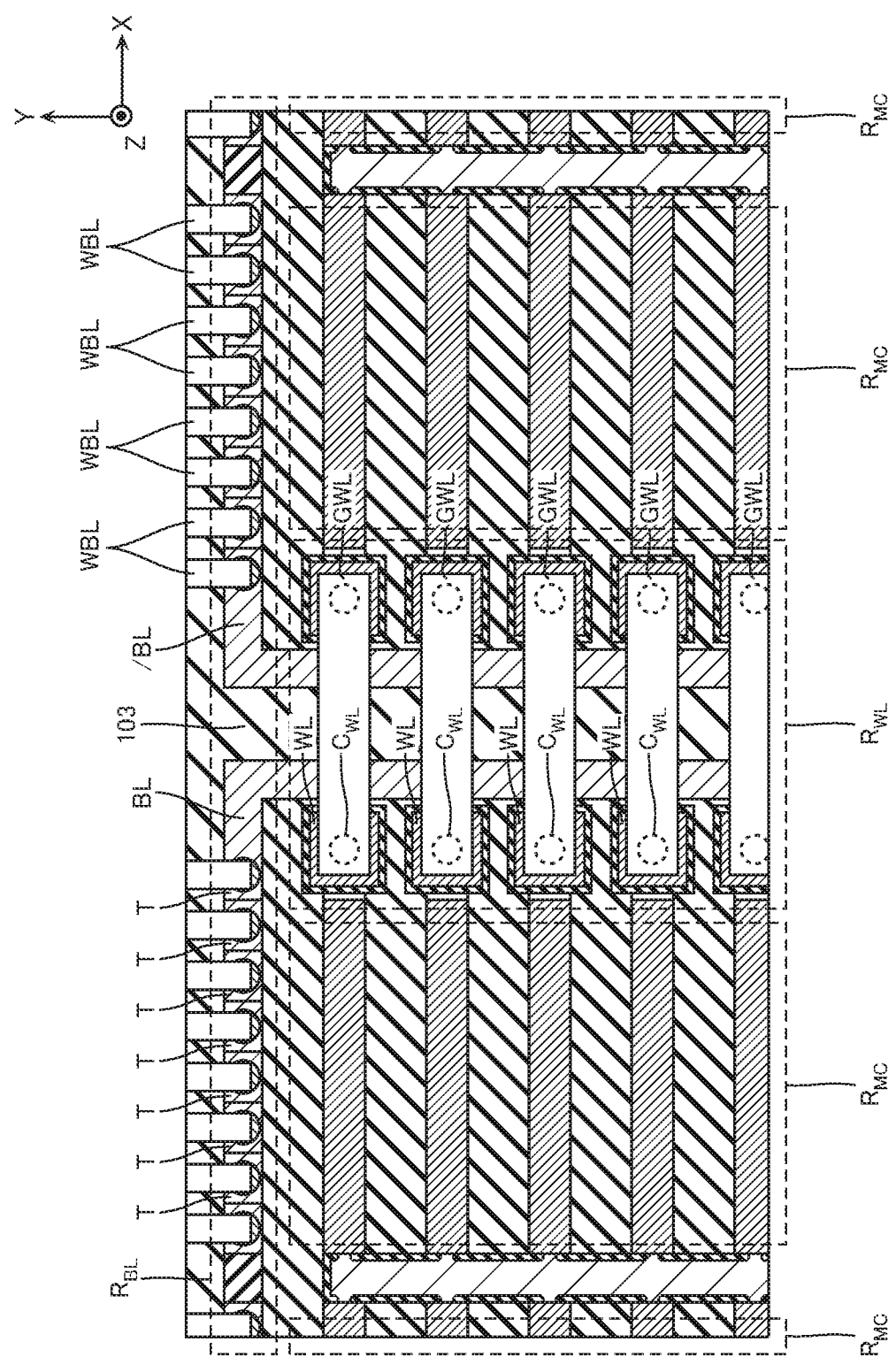
Figure 65:
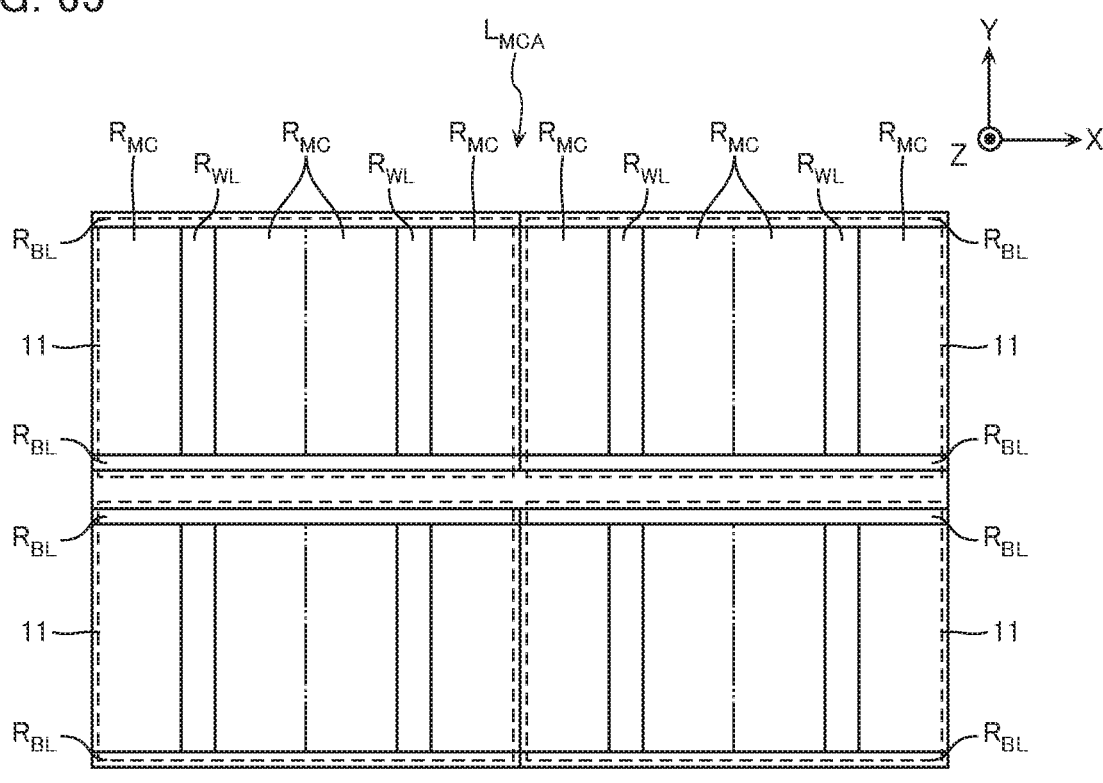
Figure 66:
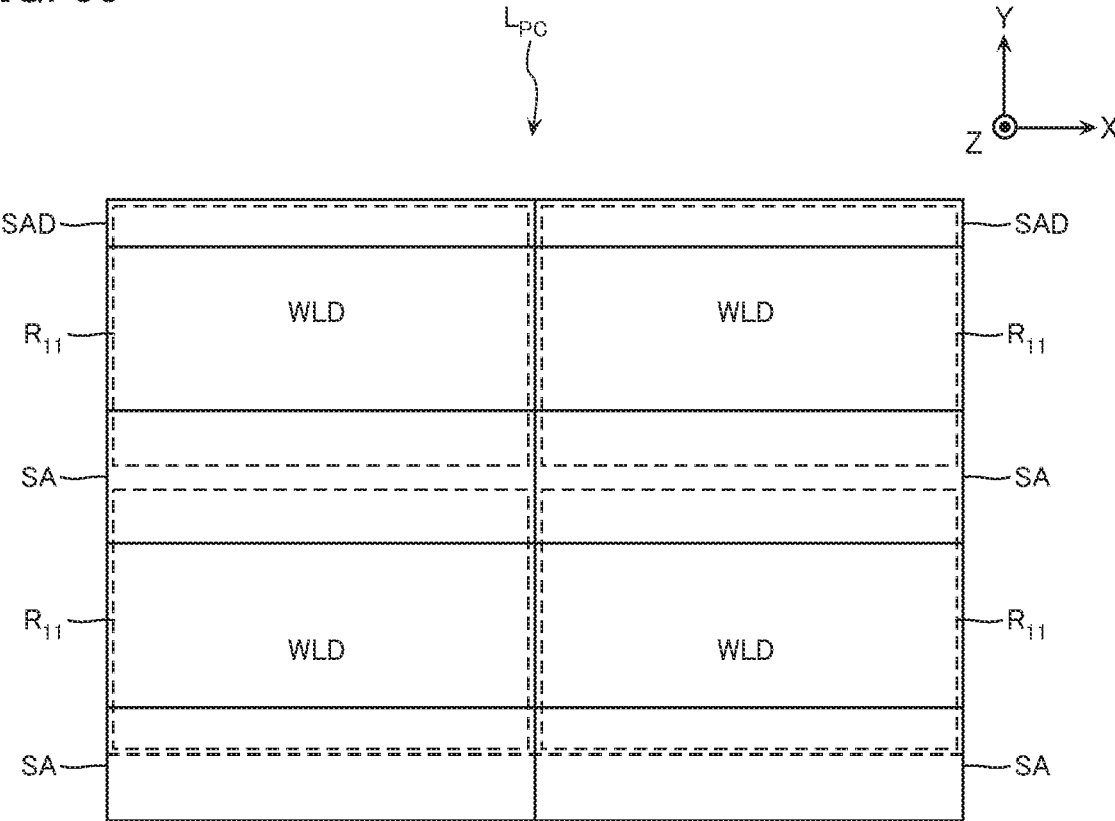
Figure 67:
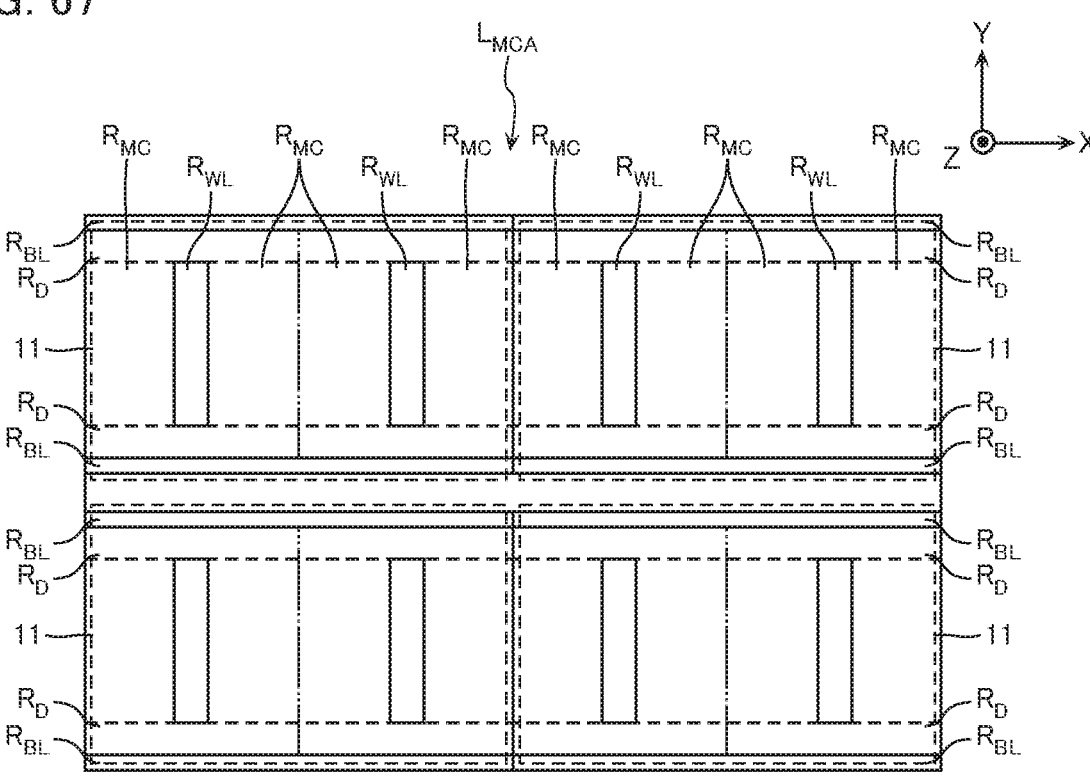
Figure 68:
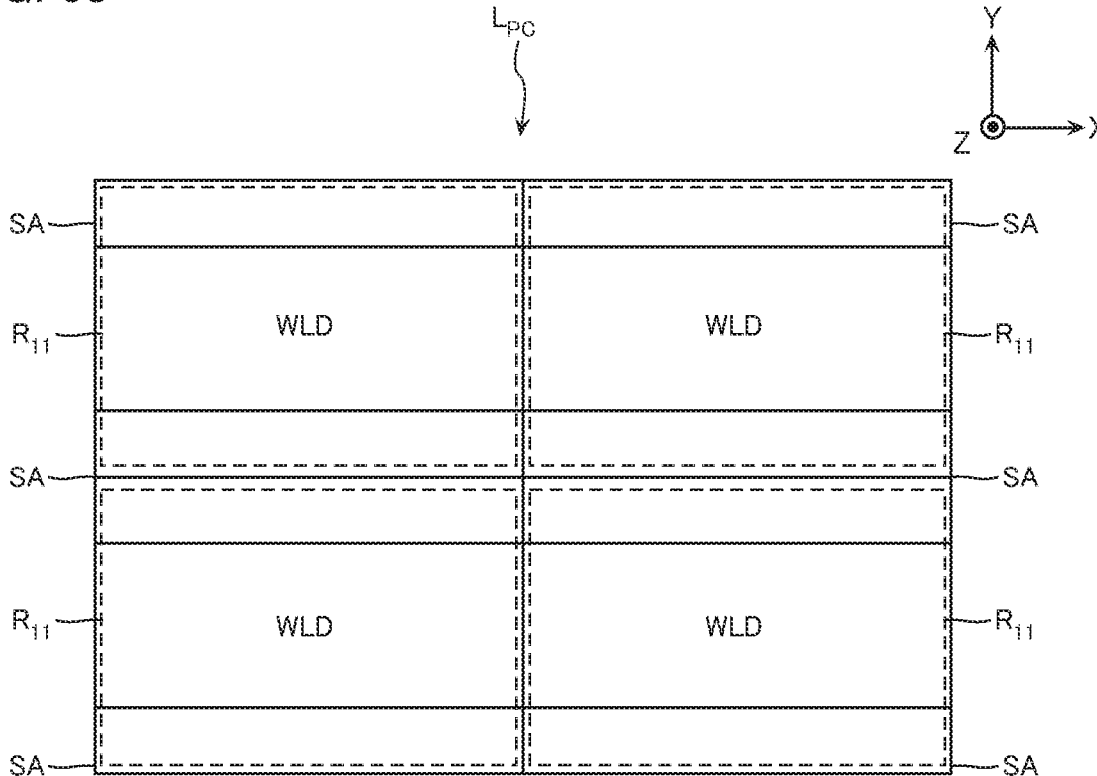
Figure 69:
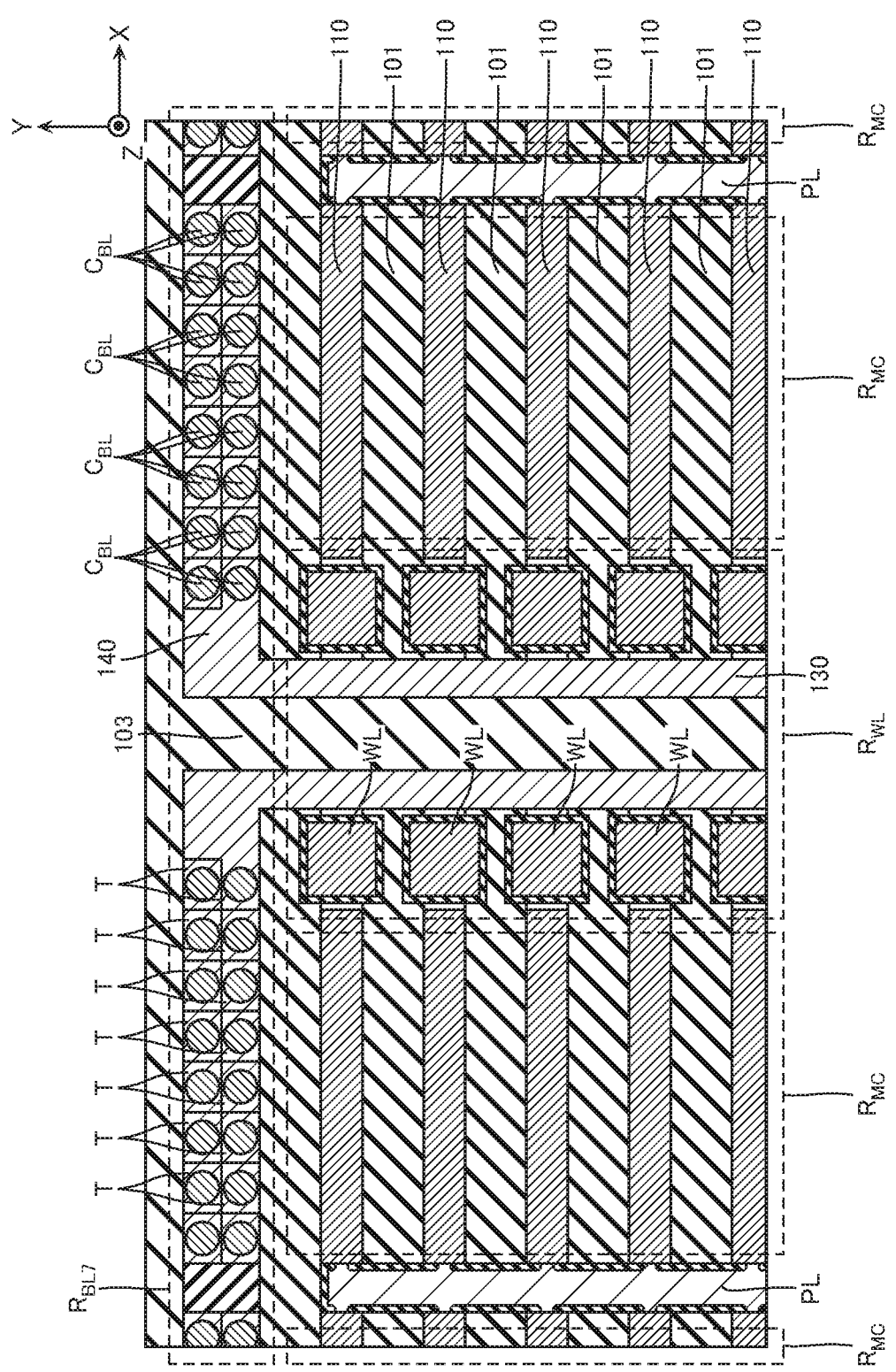
Figure 70:
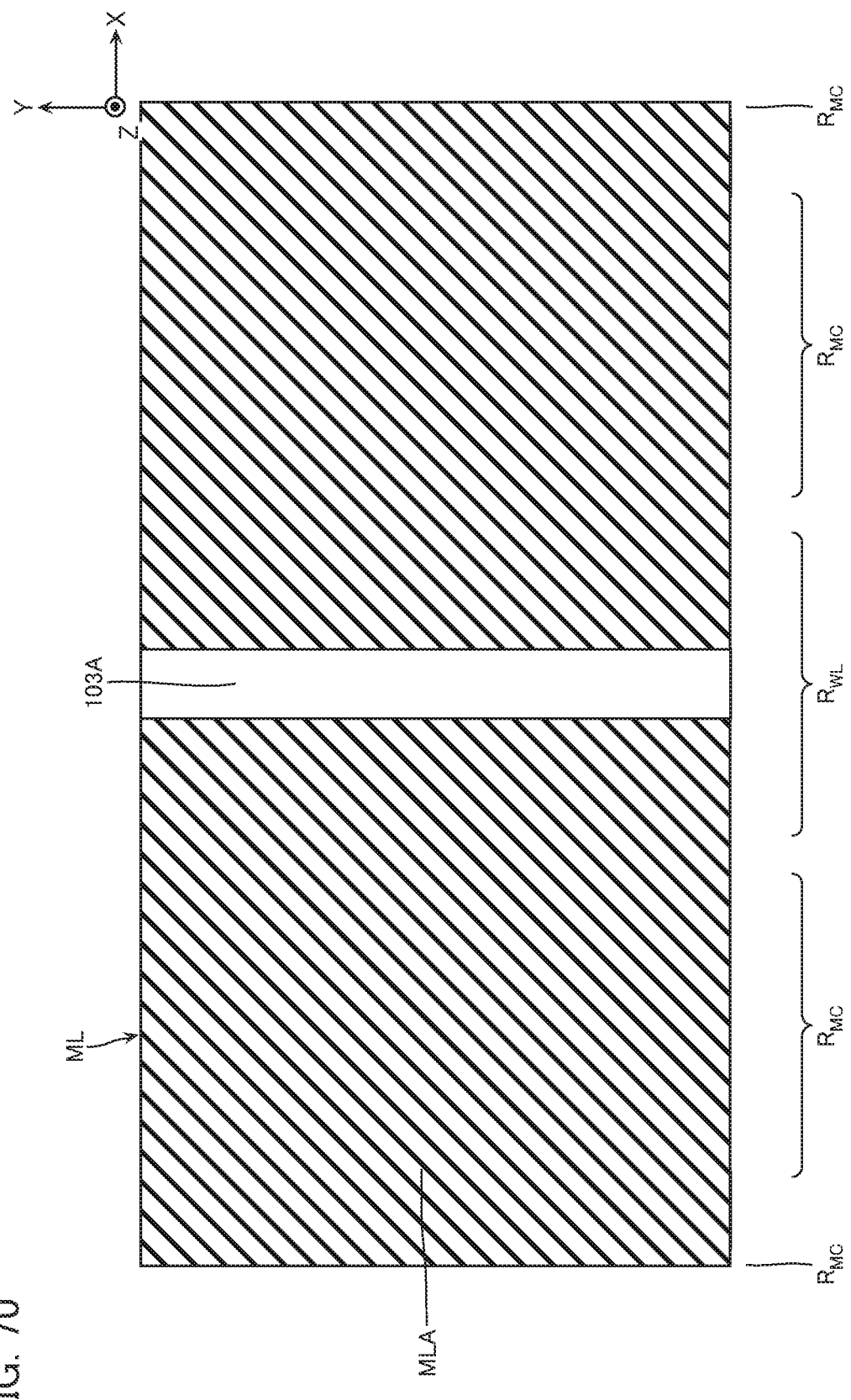
Figure 71:
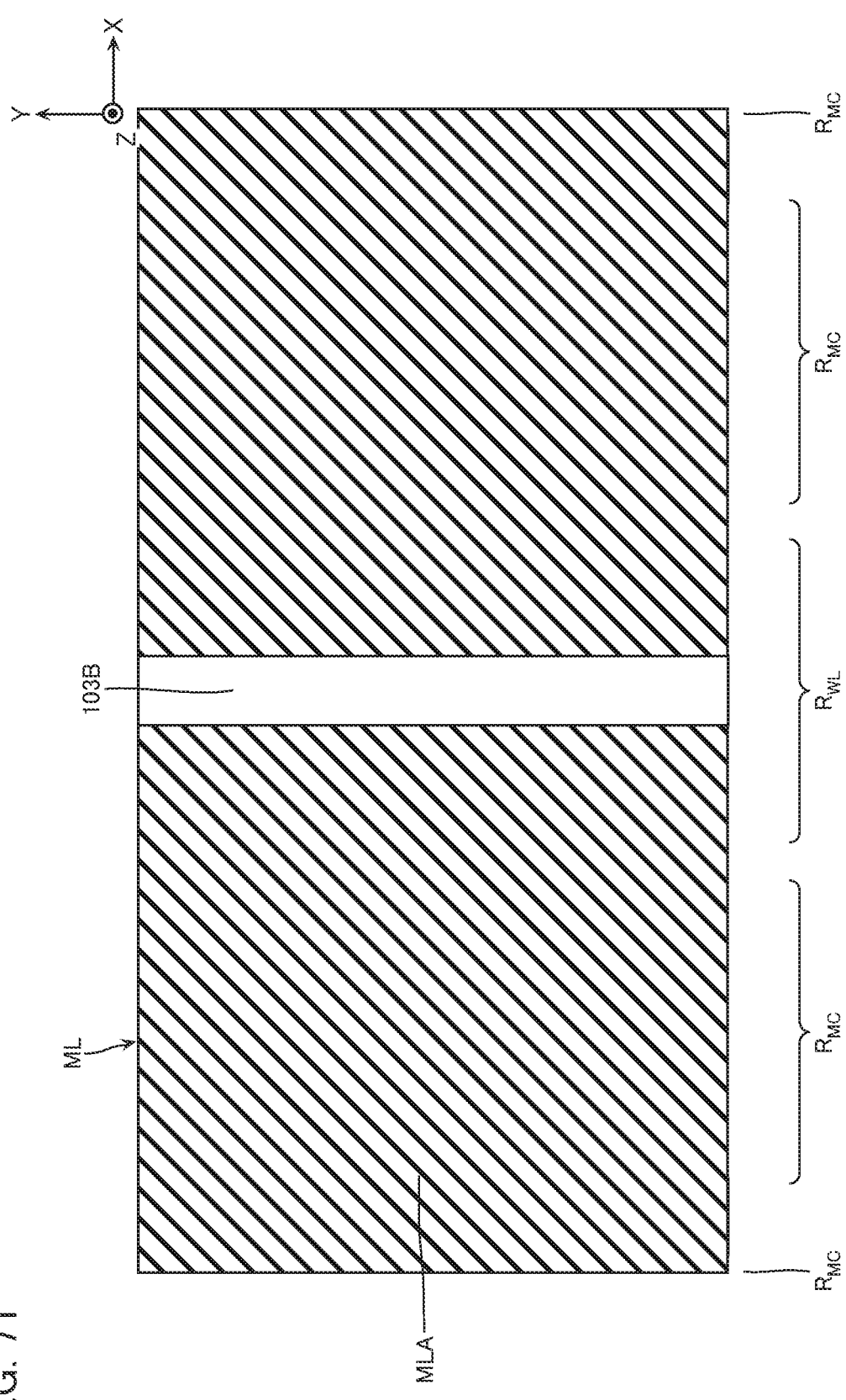
Figure 72:
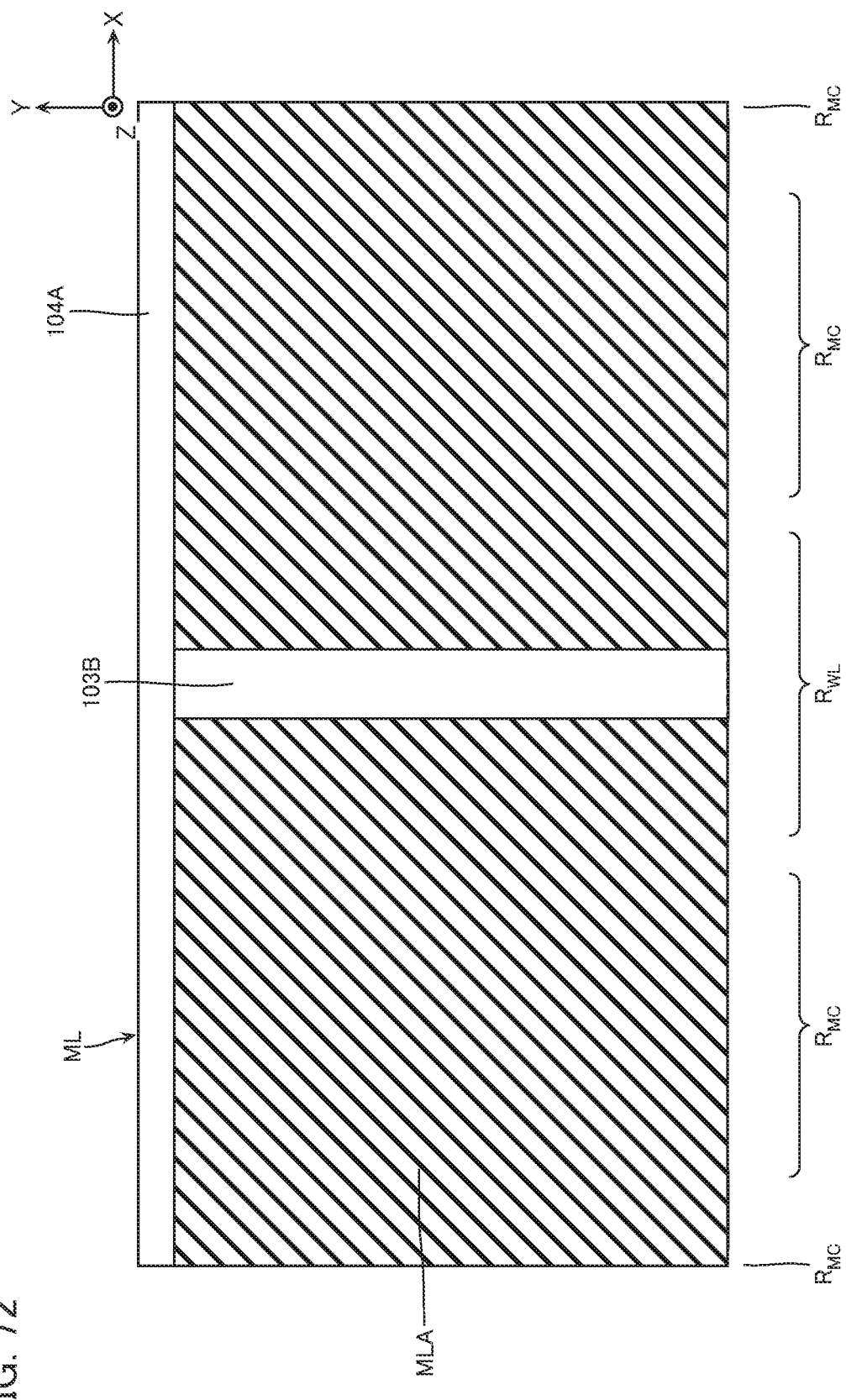
Figure 73:
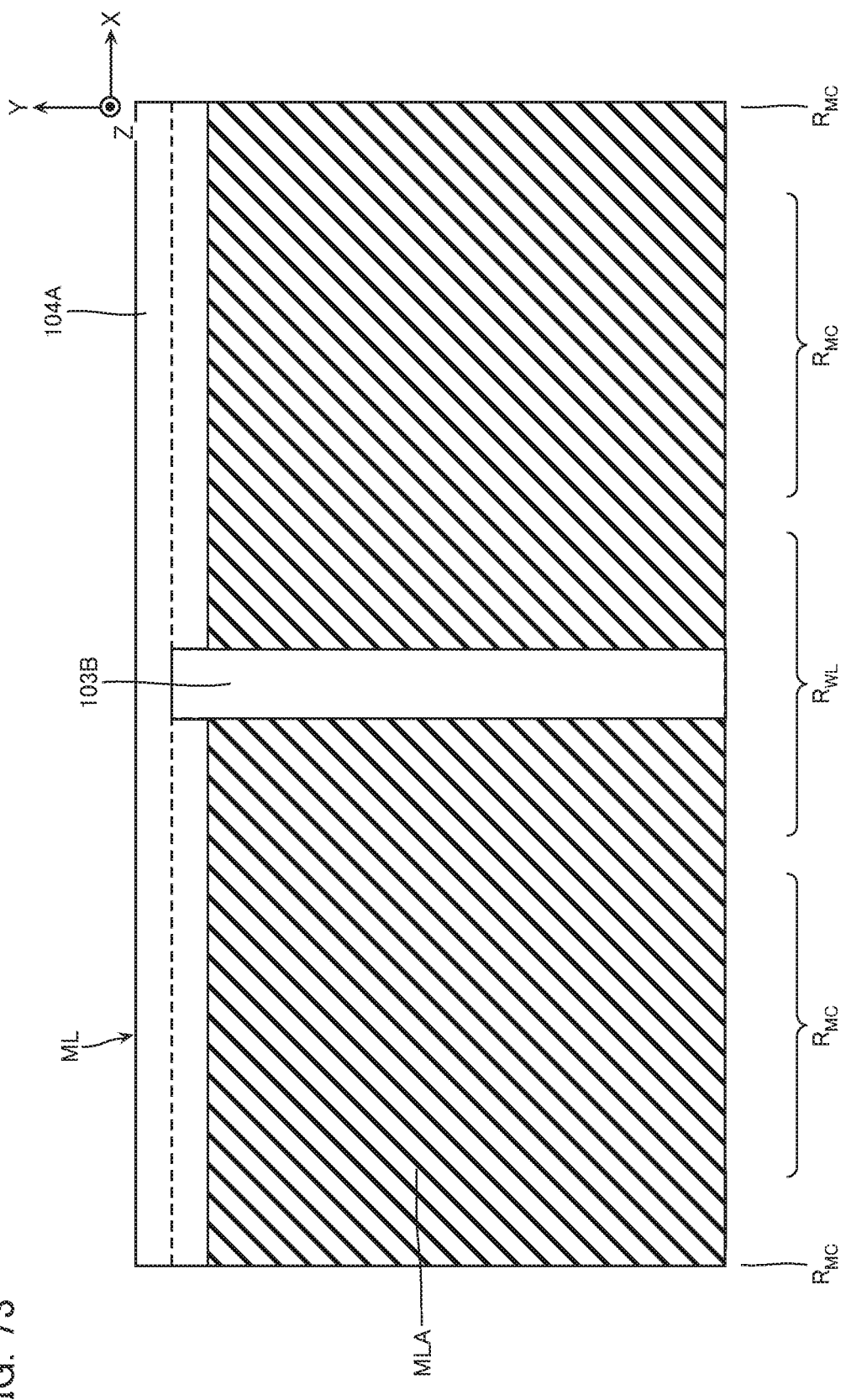

FIG. 51 is a schematic cross-sectional view illustrating another exemplary configuration of the semiconductor memory device according to the first embodiment;

FIG. 52 is a schematic cross-sectional view illustrating another exemplary configuration of the semiconductor memory device according to the first embodiment;

FIG. 53 is a schematic cross-sectional view illustrating another exemplary configuration of the semiconductor memory device according to the first embodiment;

FIG. 54 is a schematic cross-sectional view illustrating another exemplary configuration of the semiconductor memory device according to the first embodiment;

FIG. 55 is a schematic cross-sectional view illustrating another exemplary configuration of the semiconductor memory device according to the first embodiment;

FIG. 56 is a schematic cross-sectional view illustrating another exemplary configuration of the semiconductor memory device according to the first embodiment;

FIG. 57 is a schematic cross-sectional view illustrating an exemplary configuration of the semiconductor memory device according to the first embodiment;

FIG. 58 is a schematic cross-sectional view illustrating an exemplary configuration of the semiconductor memory device according to the first embodiment;

FIG. 59 is a schematic plan view illustrating another exemplary configuration of the semiconductor memory device according to the first embodiment;

FIG. 60 is a schematic plan view illustrating a part of a configuration of a semiconductor memory device according to a second embodiment;

FIG. 61 is a schematic plan view illustrating a part of the configuration of the semiconductor memory device according to the second embodiment;

FIG. 62 is a schematic plan view illustrating another exemplary configuration of the semiconductor memory device according to the second embodiment;

FIG. 63 is a schematic circuit diagram illustrating a part of a configuration of a semiconductor memory device according to a third embodiment;

FIG. 64 is a schematic plan view illustrating a part of the configuration of the semiconductor memory device according to the third embodiment;

FIG. 65 is a schematic plan view illustrating a part of a configuration of a semiconductor memory device according to a fourth embodiment;

FIG. 66 is a schematic plan view illustrating a part of the configuration of the semiconductor memory device according to the fourth embodiment;

FIG. 67 is a schematic plan view illustrating another exemplary configuration of the semiconductor memory device according to the fourth embodiment;

FIG. 68 is a schematic plan view illustrating a part of a configuration of a semiconductor memory device according to a fifth embodiment;

FIG. 69 is a schematic plan view illustrating a part of a configuration of a semiconductor memory device according to a seventh embodiment;

FIG. 70 is a schematic cross-sectional view for describing a manufacturing method of the semiconductor memory device according to the seventh embodiment;

FIG. 71 is a schematic cross-sectional view for describing the manufacturing method;

FIG. 72 is a schematic cross-sectional view for describing the manufacturing method;

FIG. 73 is a schematic cross-sectional view for describing the manufacturing method;

4

Figure 74:
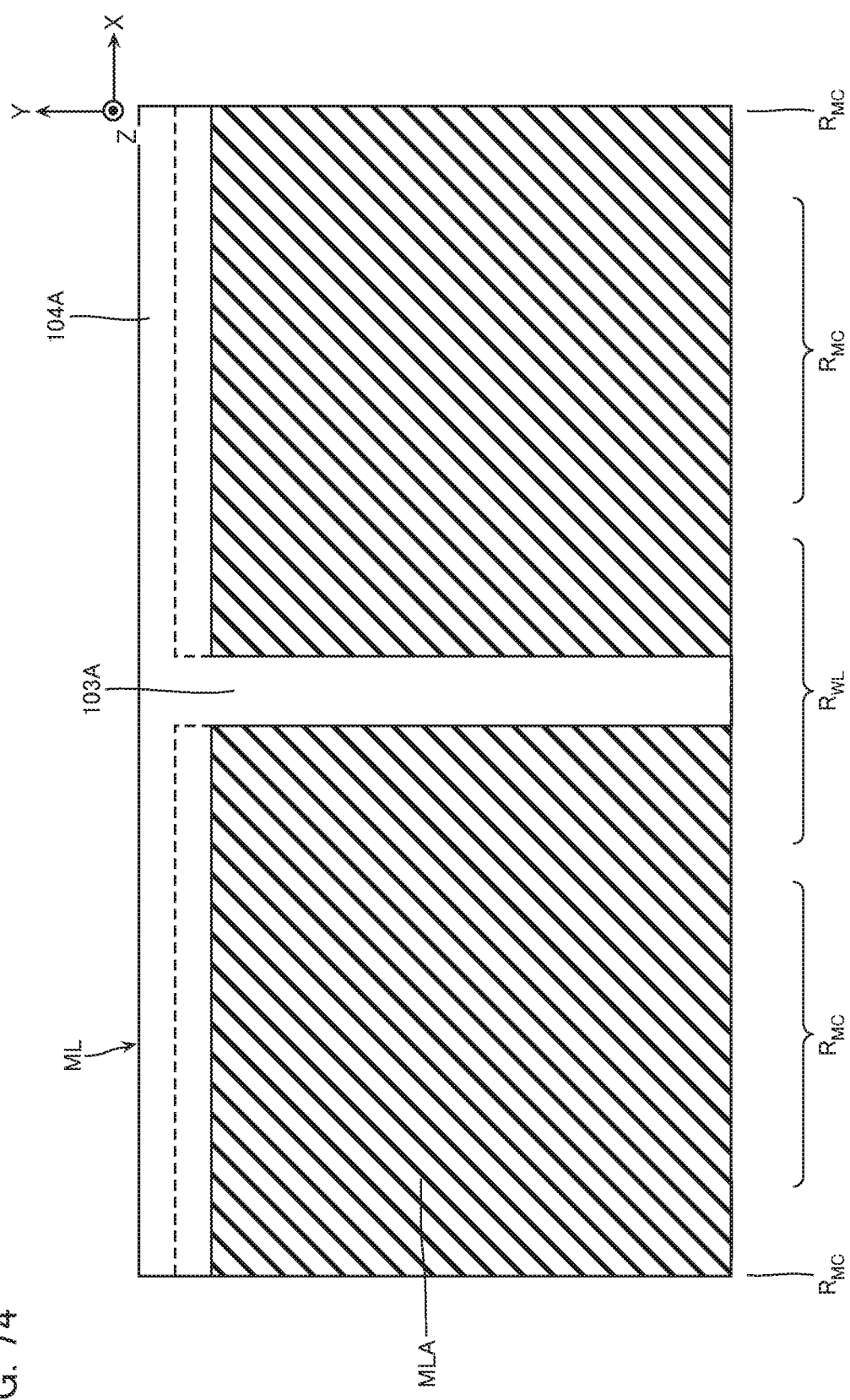
Figure 75:
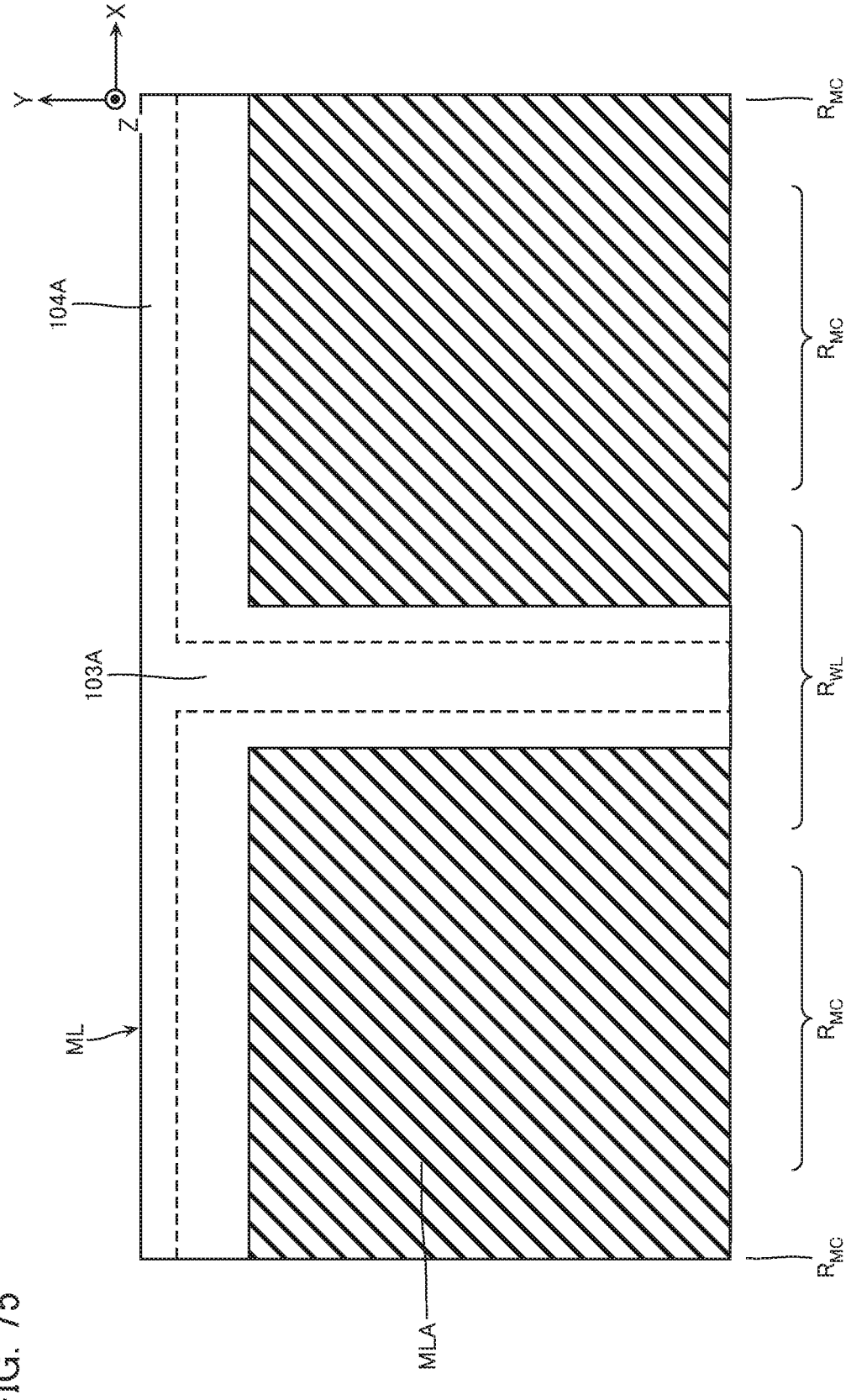
Figure 77:
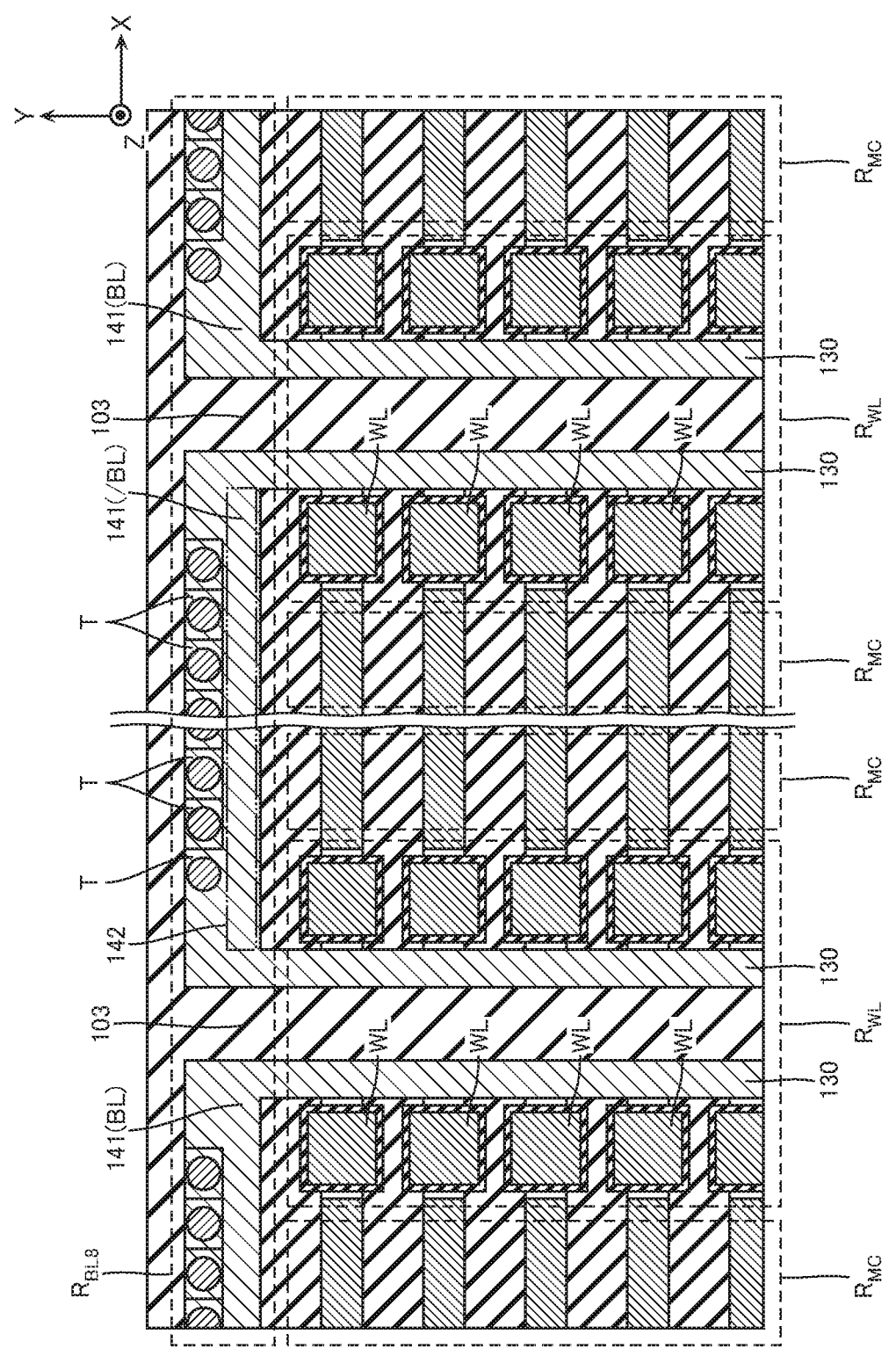
Figure 78:
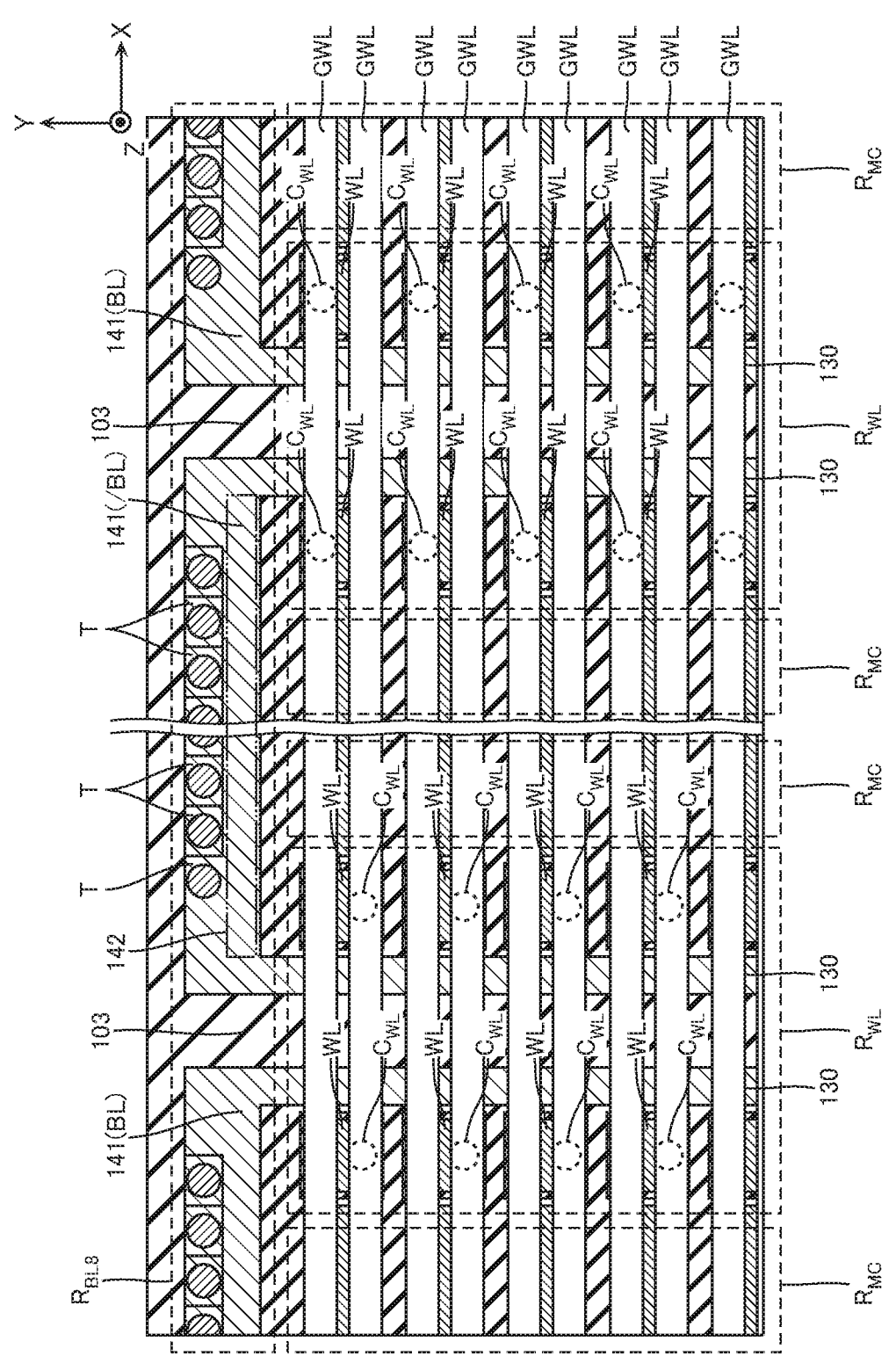
Figure 80:
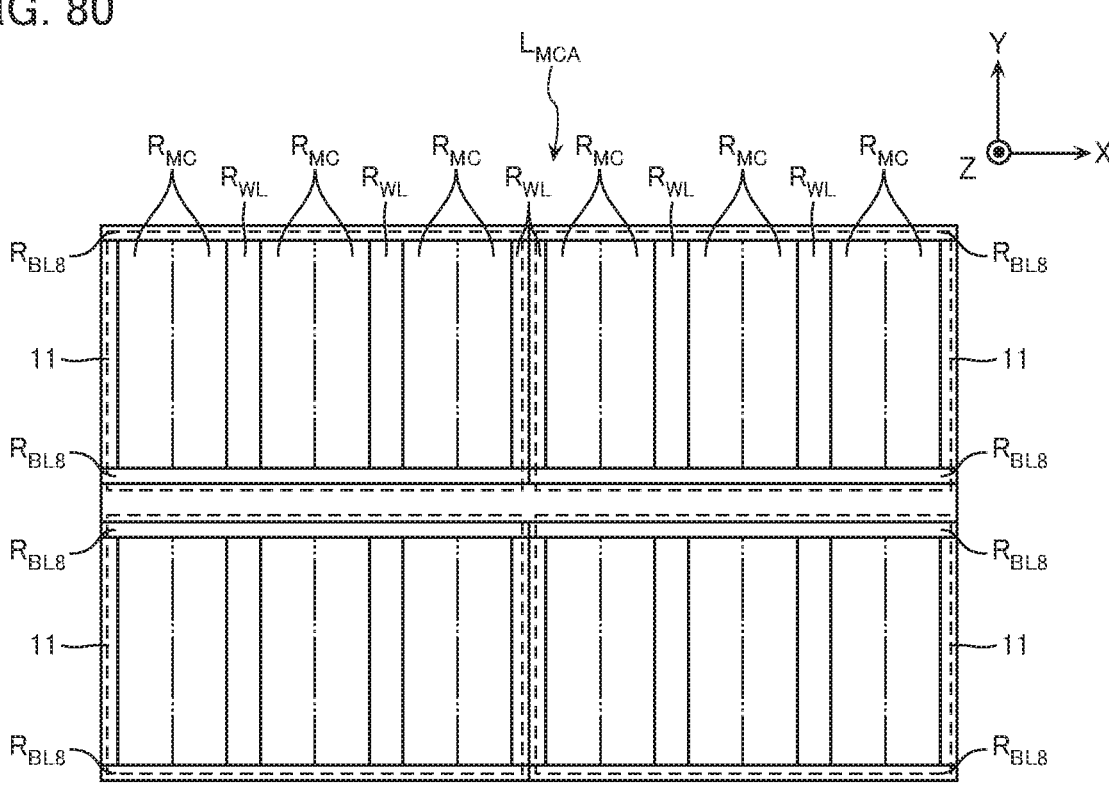
Figure 81:
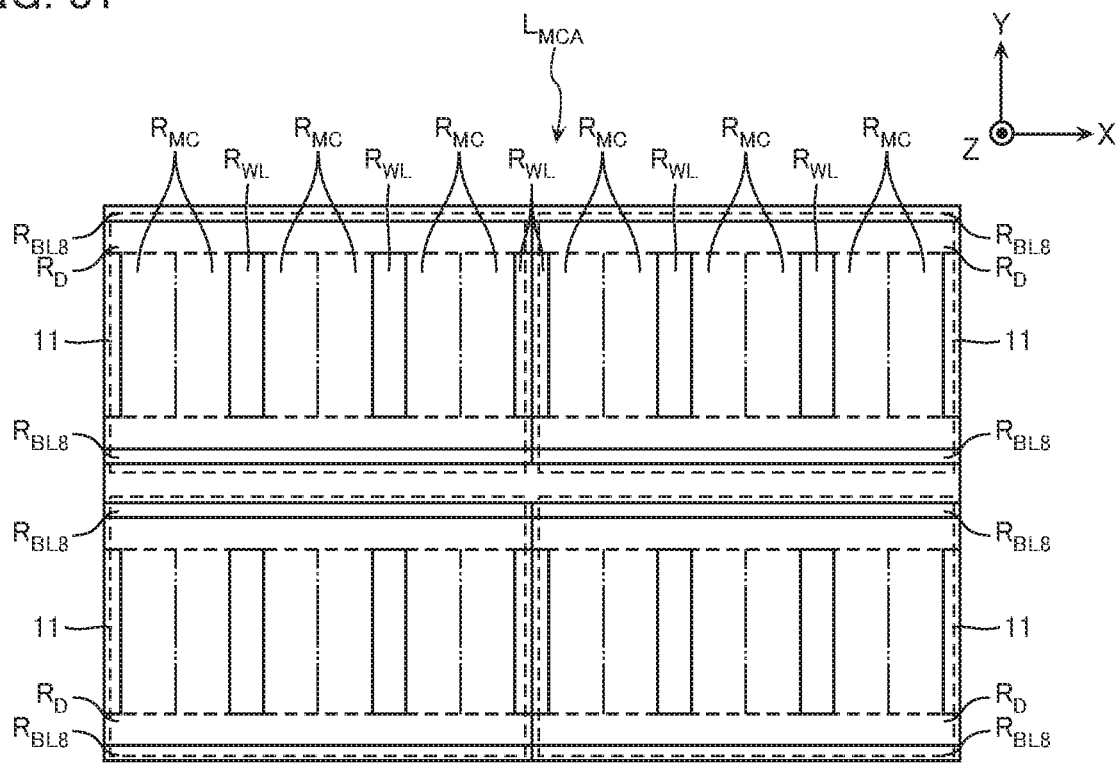
Figure 82:
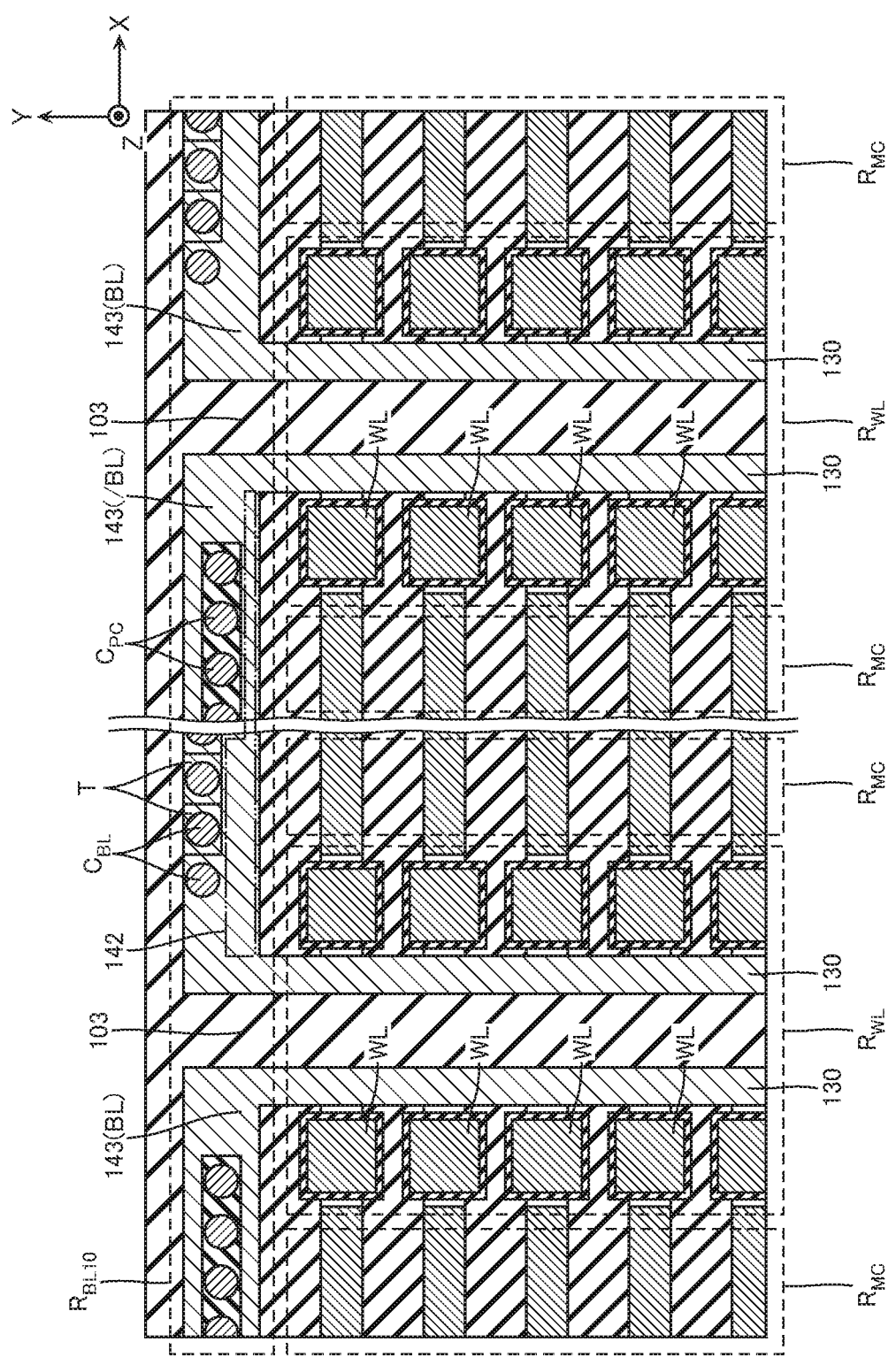
Figure 83:
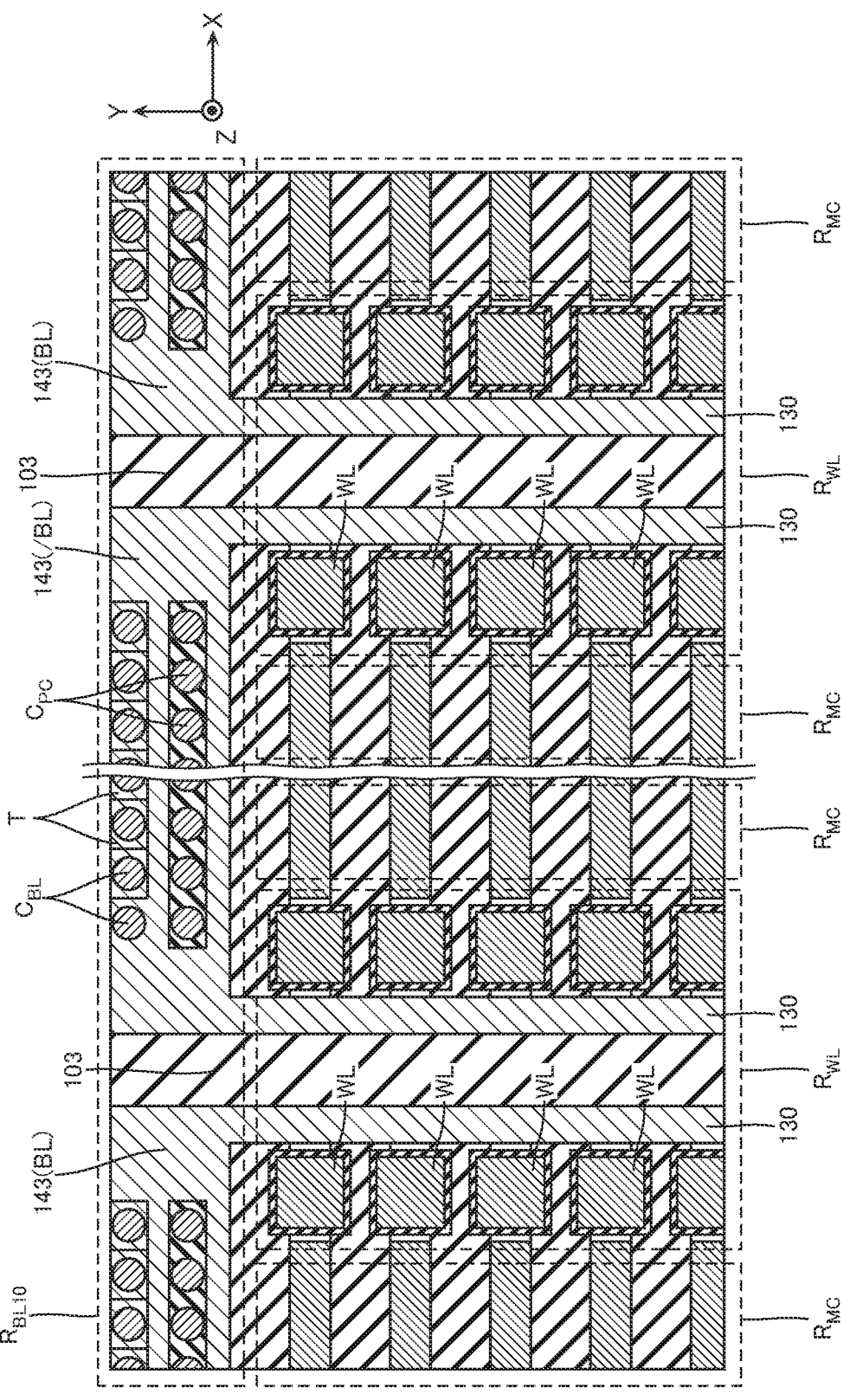
Figure 84:
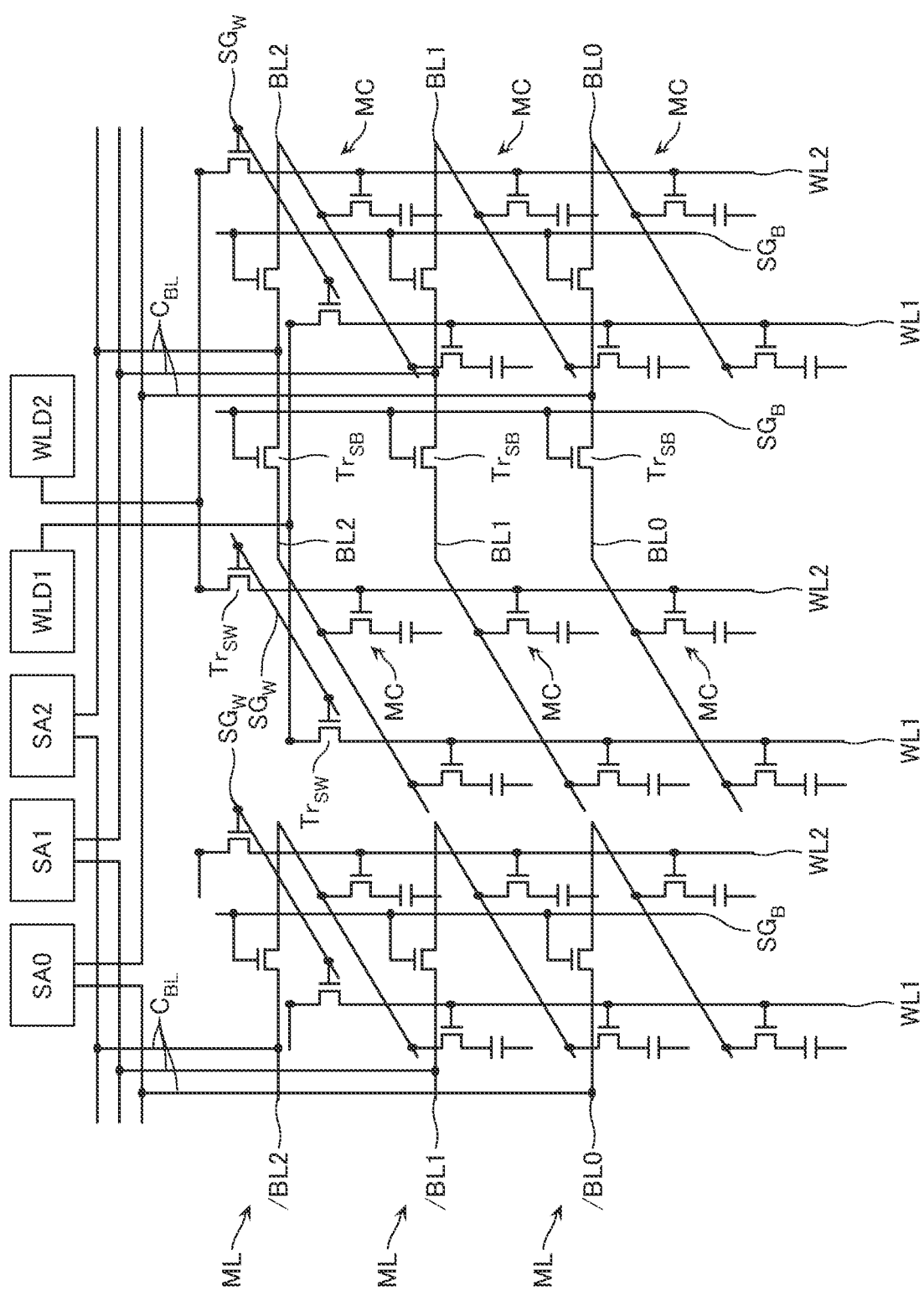
Figure 85:
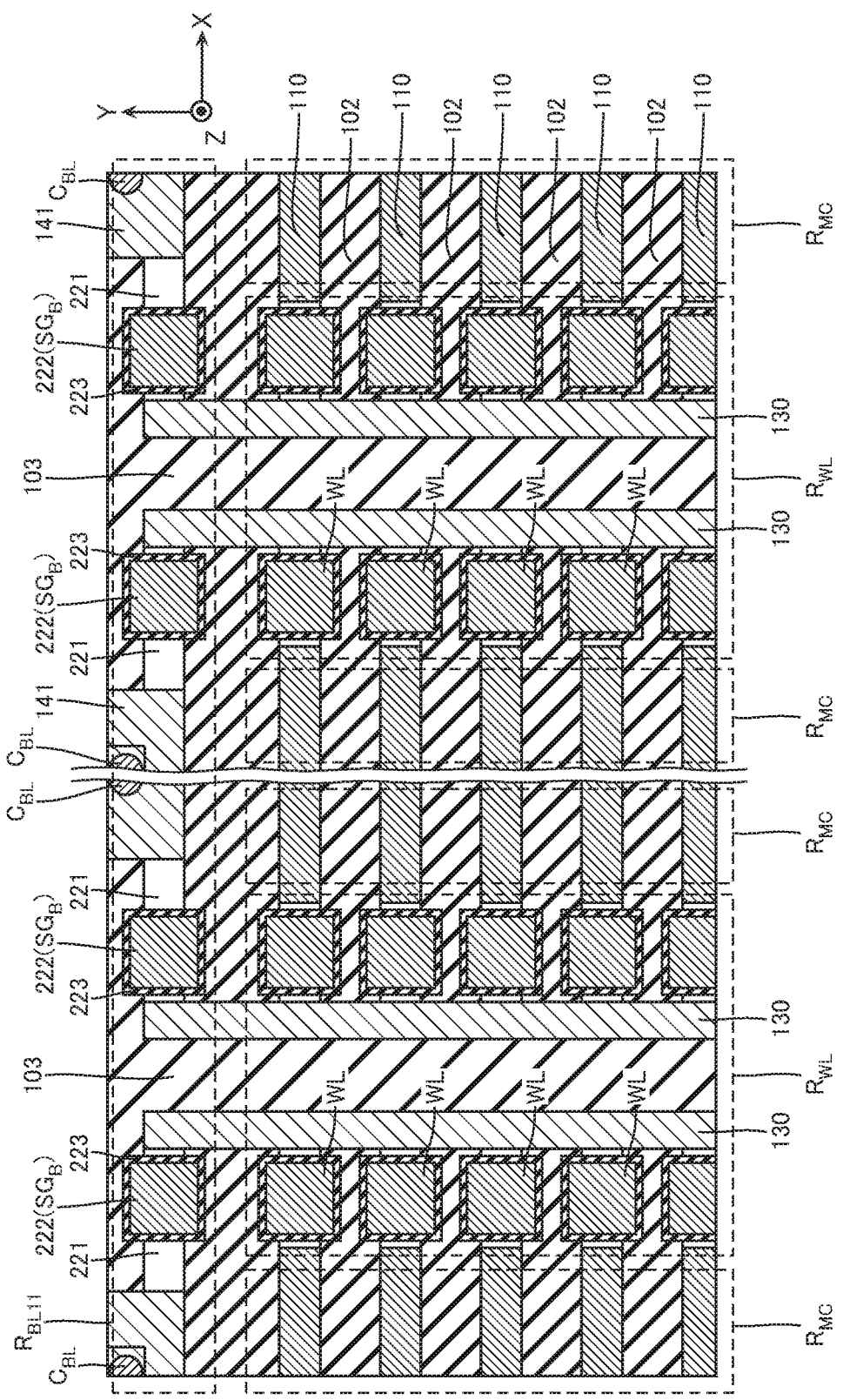
Figure 86:
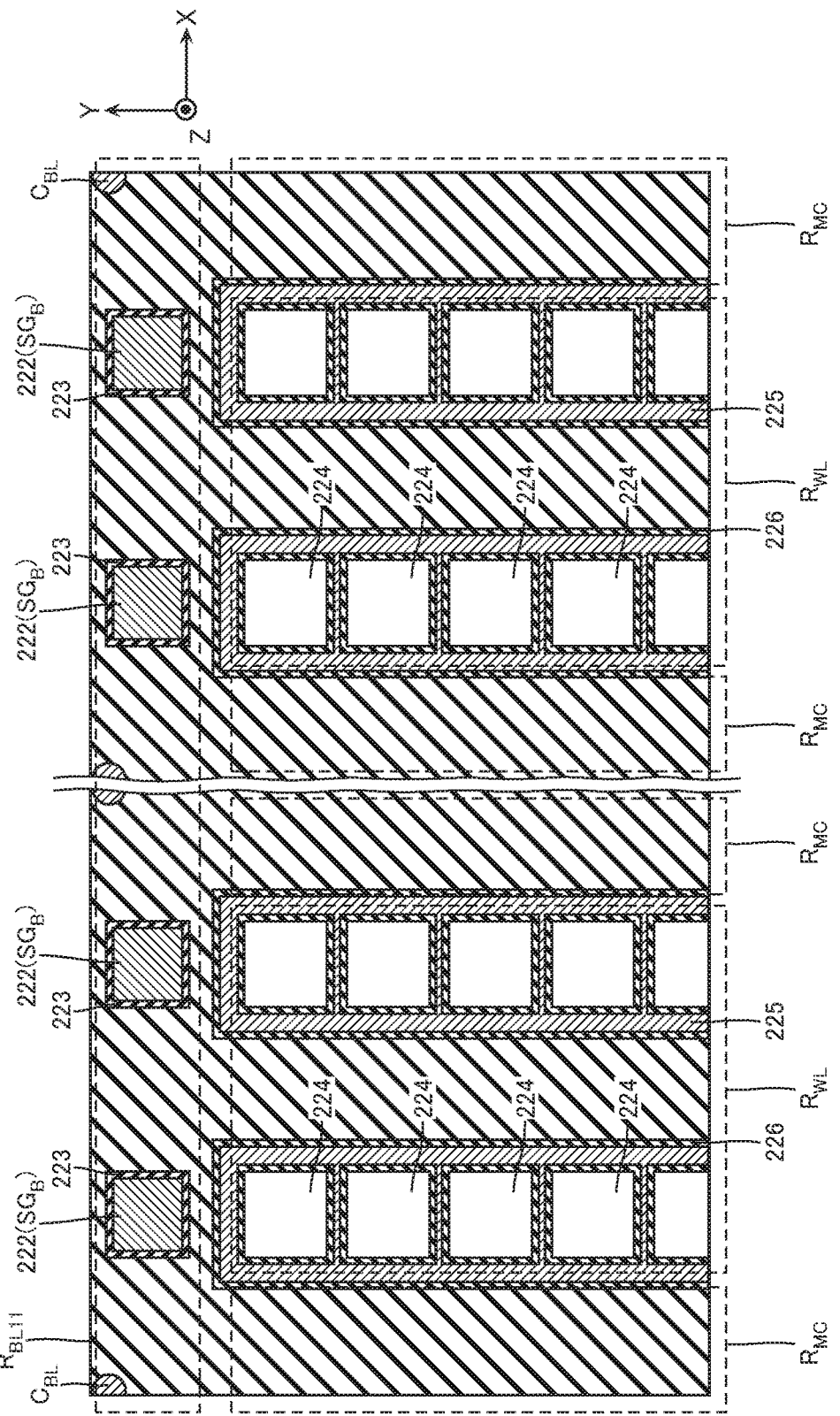
Figure 87:
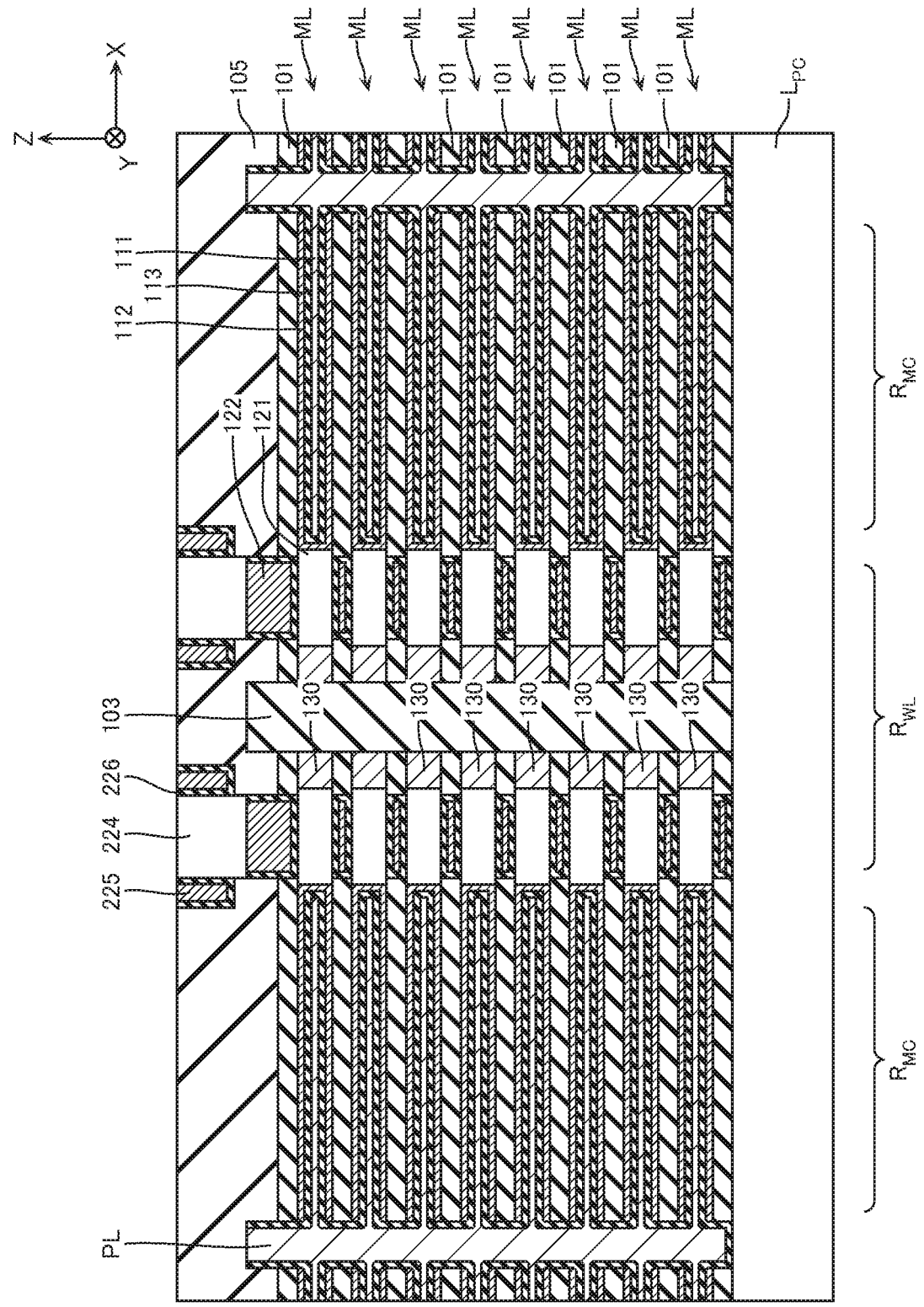
Figure 88:
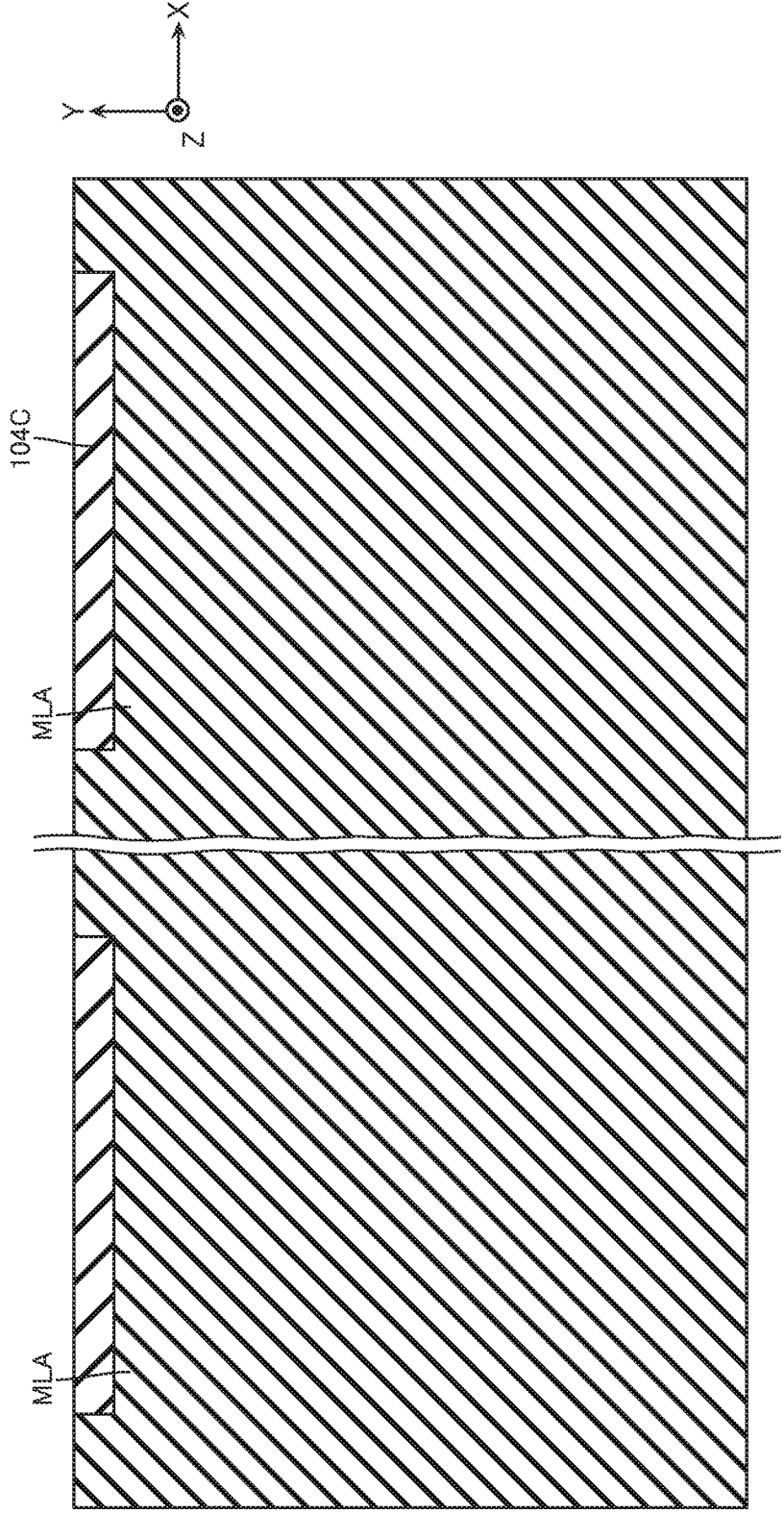
Figure 89:
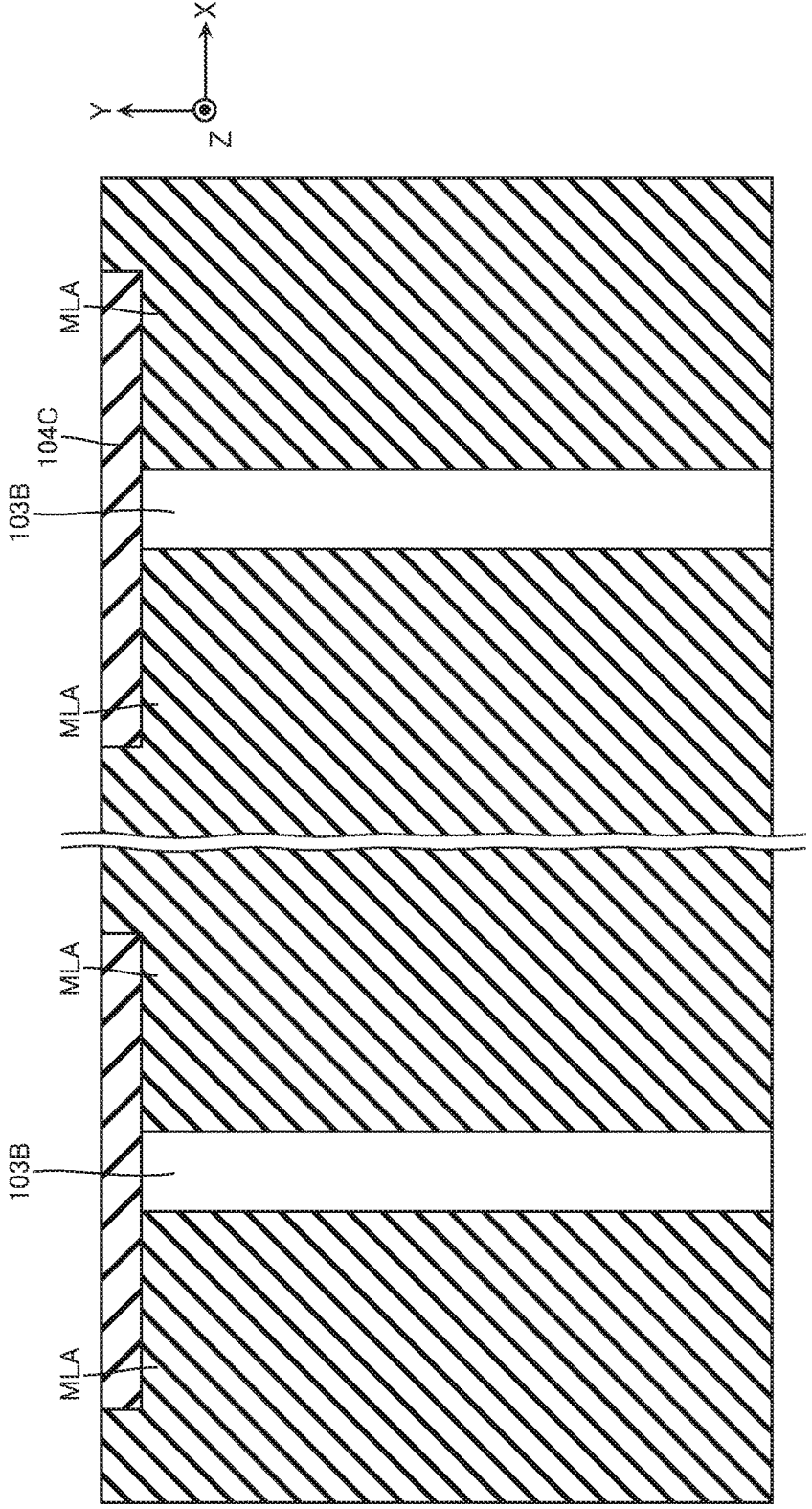
Figure 90:
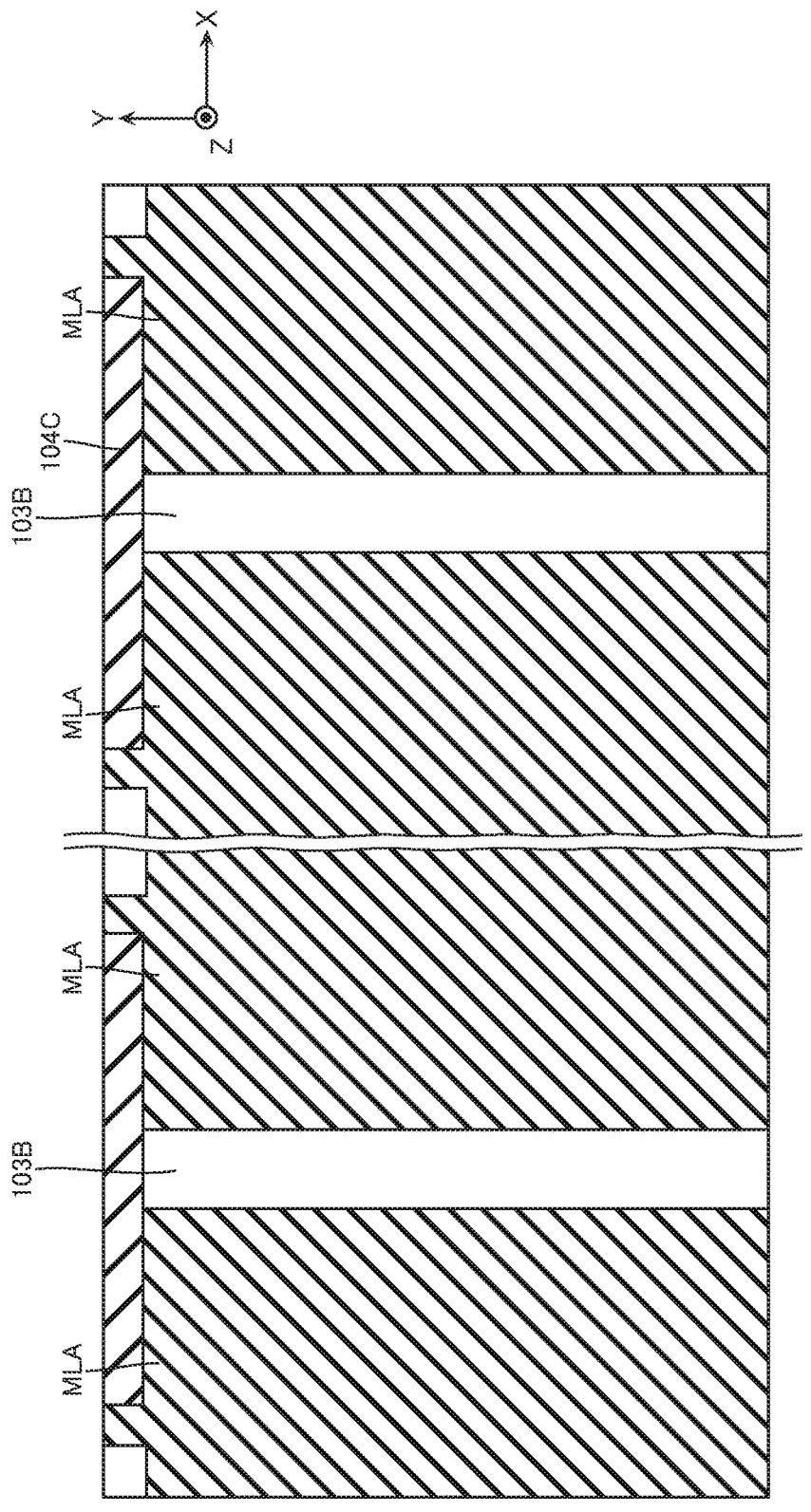
Figure 91:
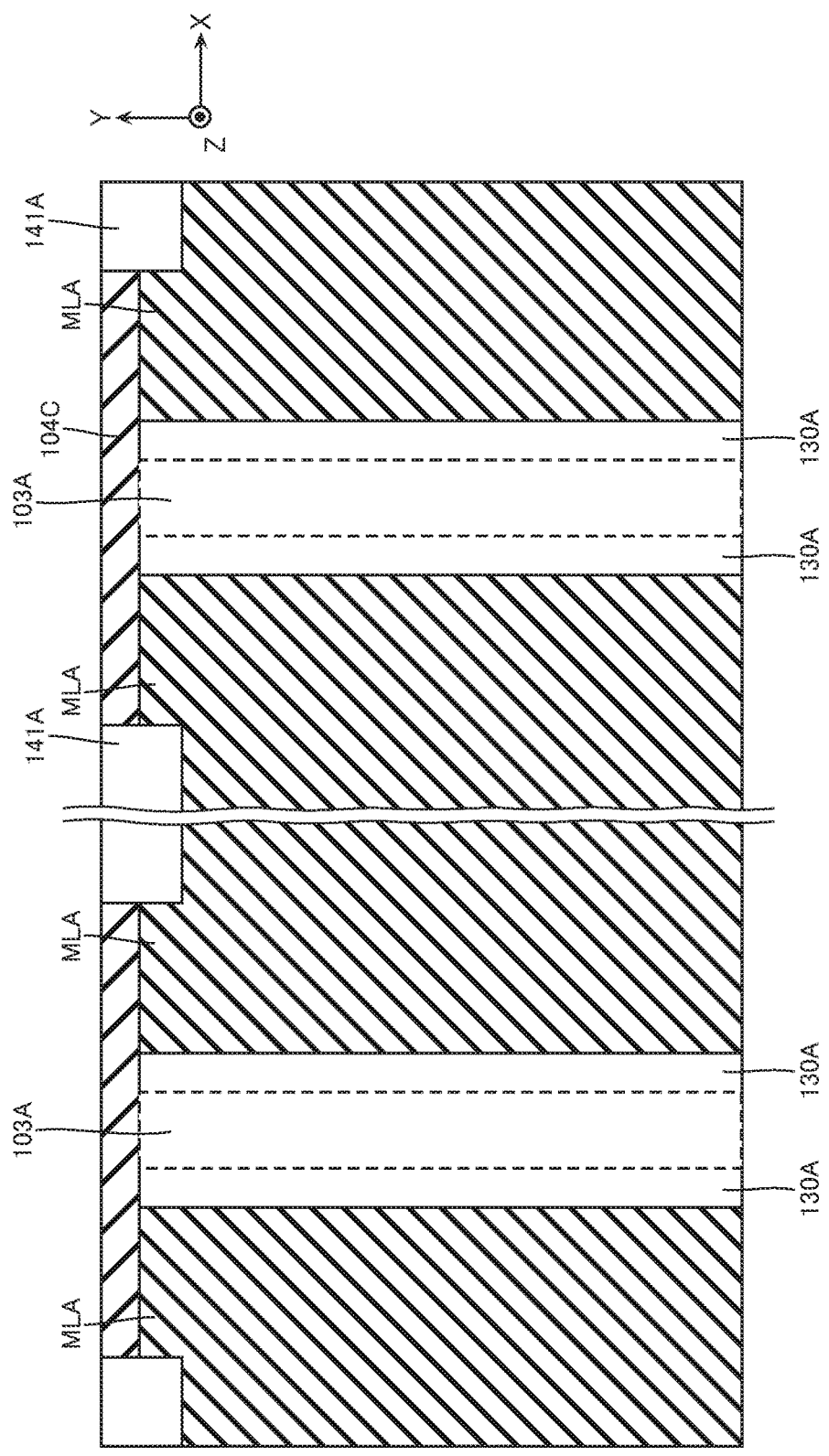
Figure 92:
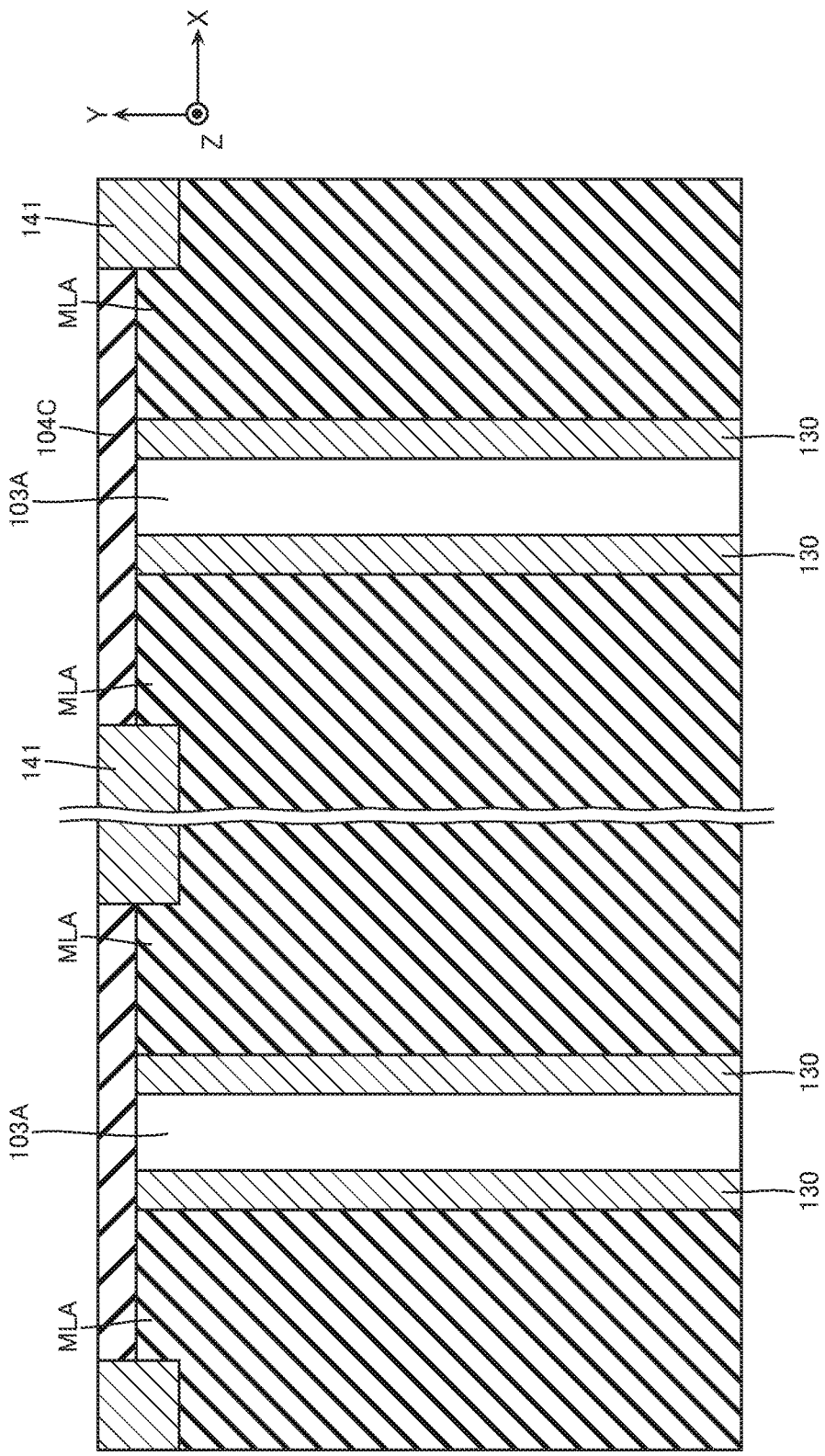
Figure 93:
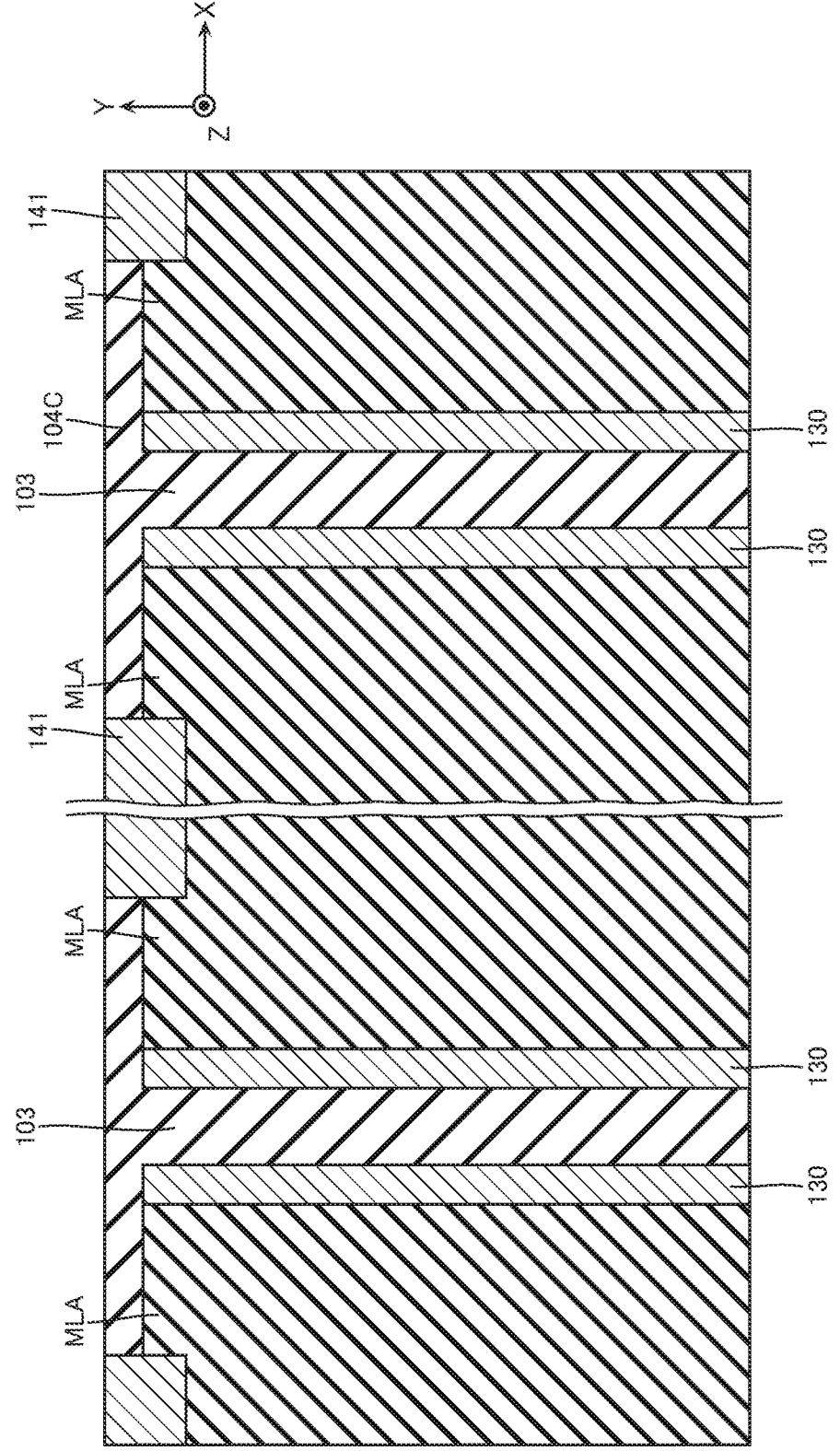
Figure 94:
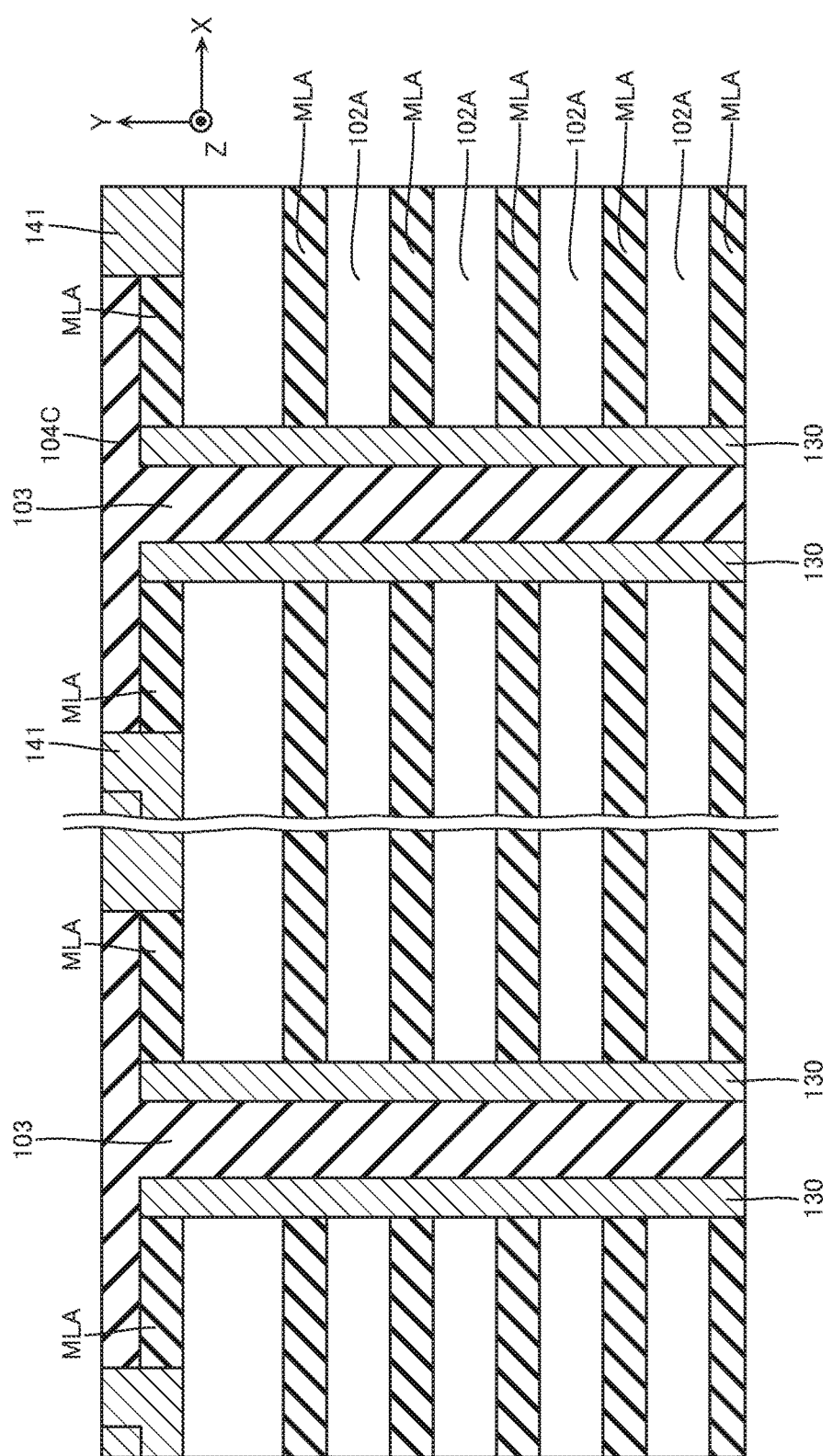
Figure 95:
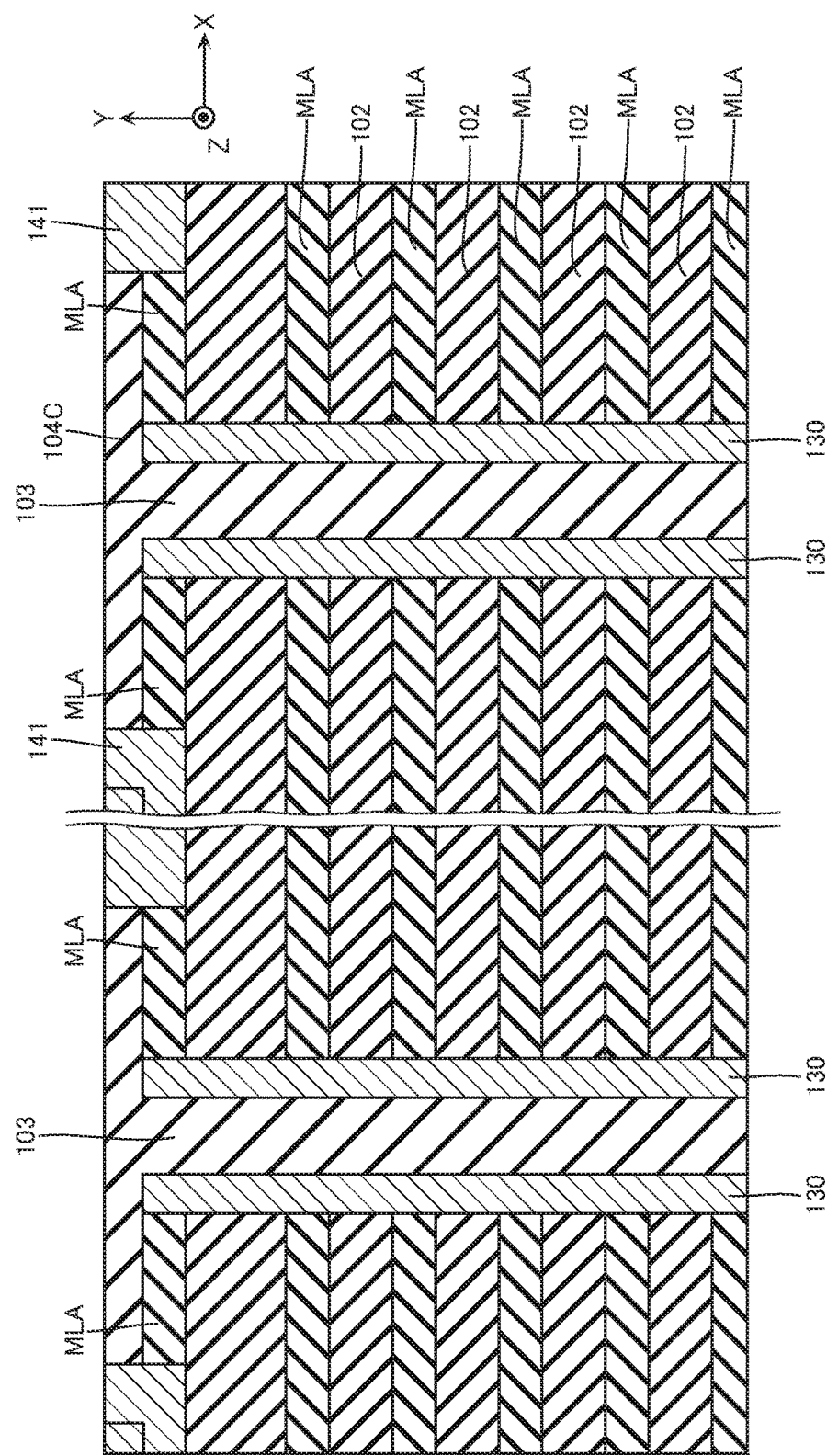
Figure 96:
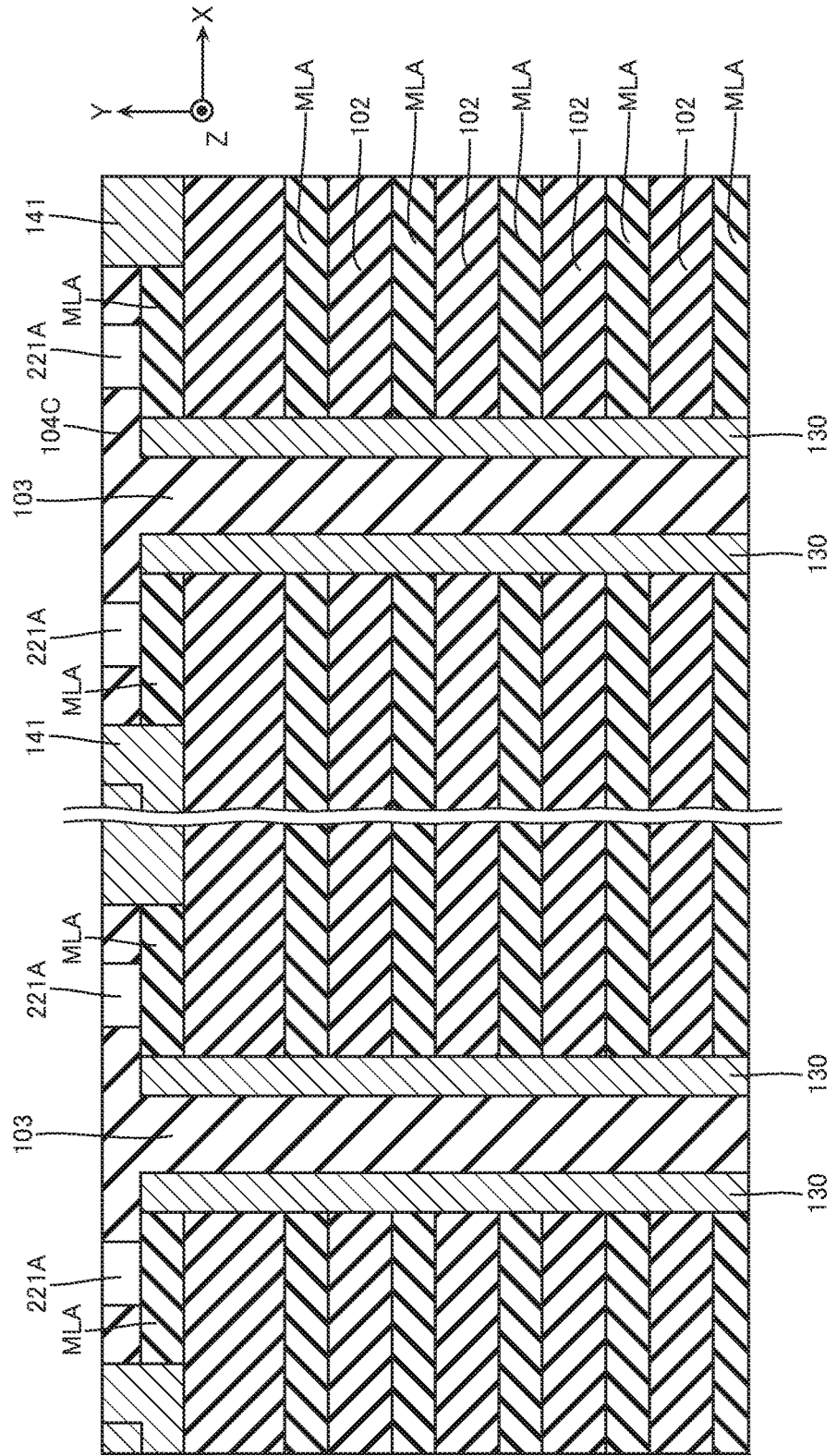
Figure 97:
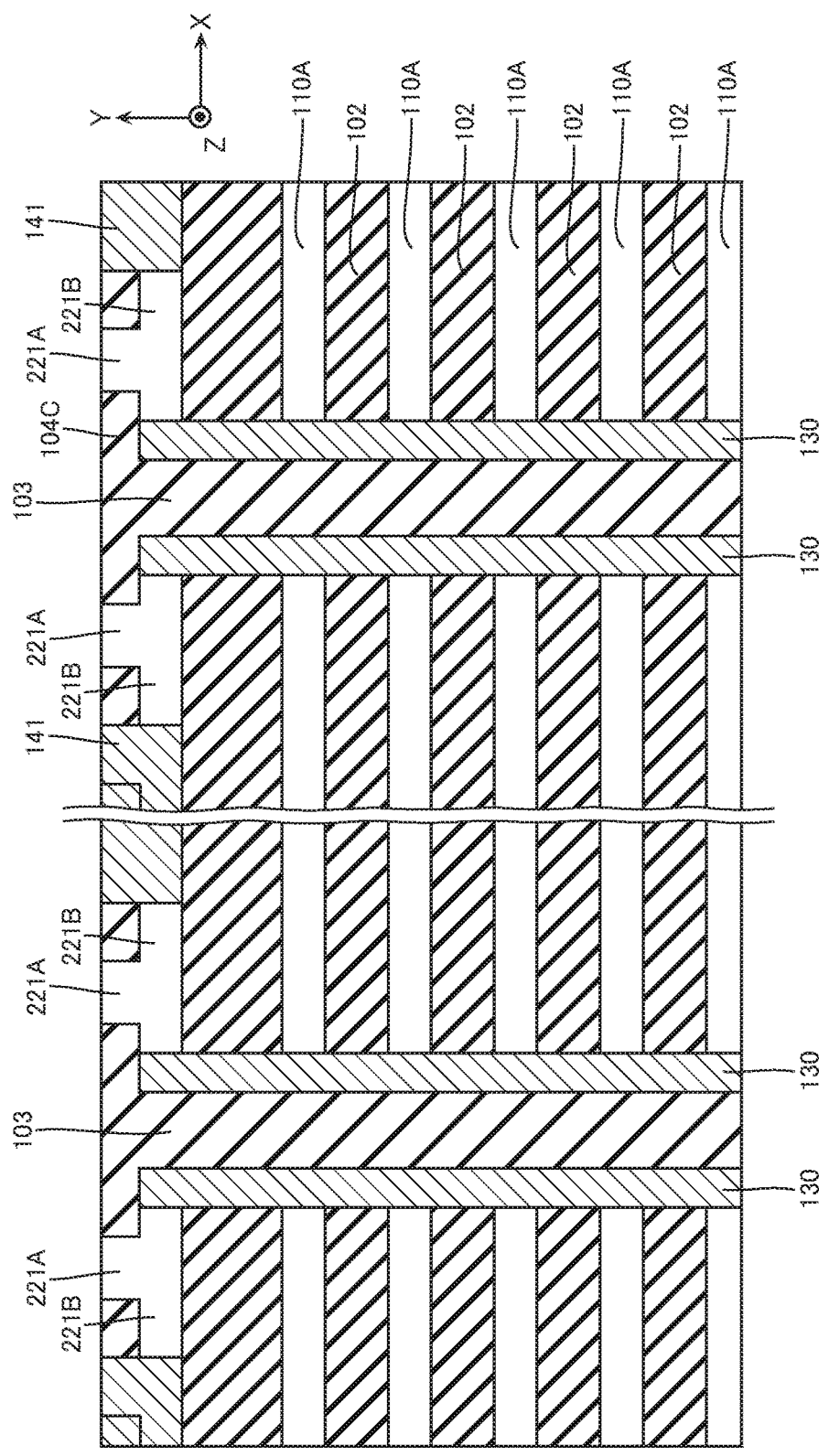
Figure 98:
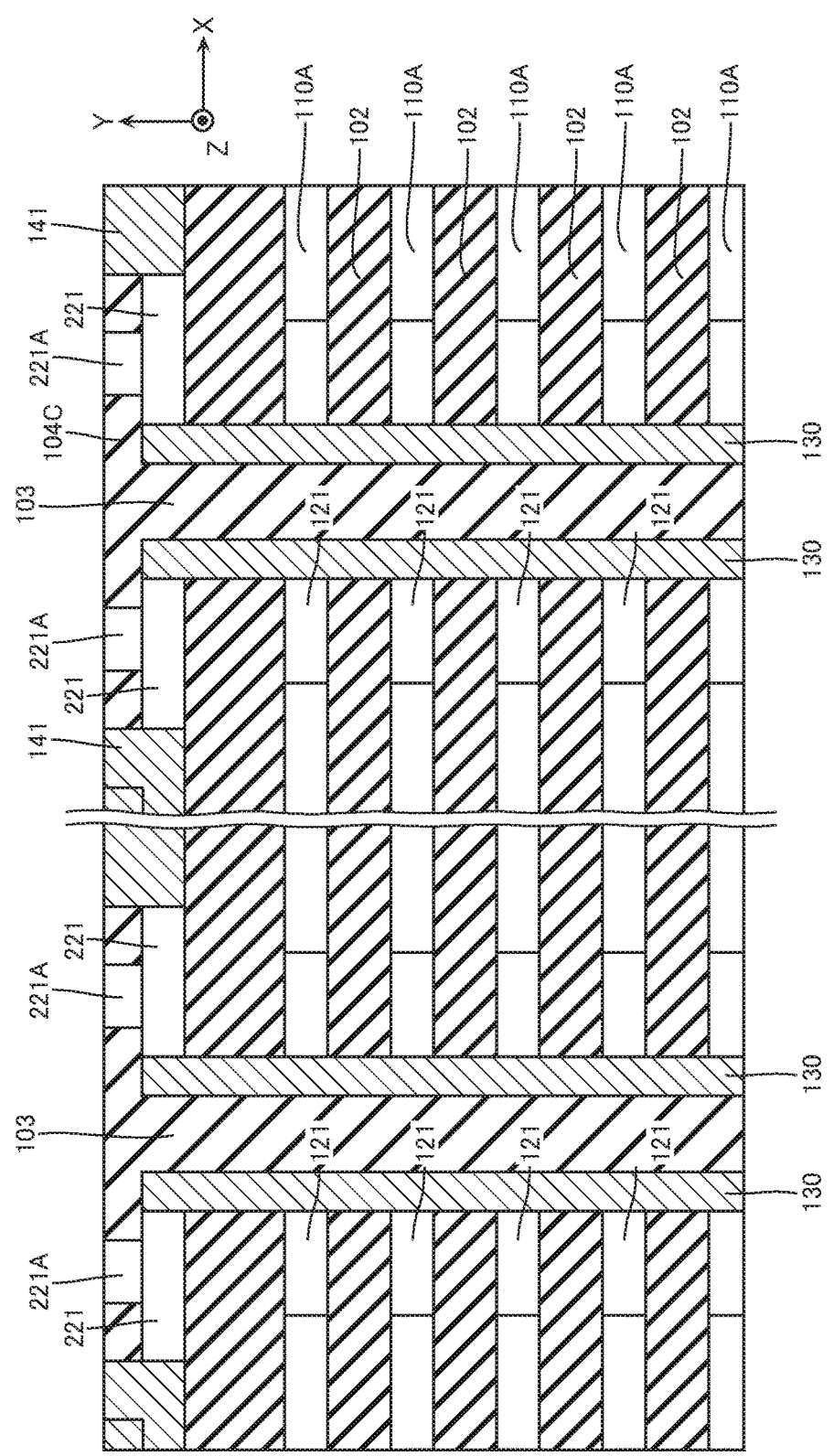
Figure 99:
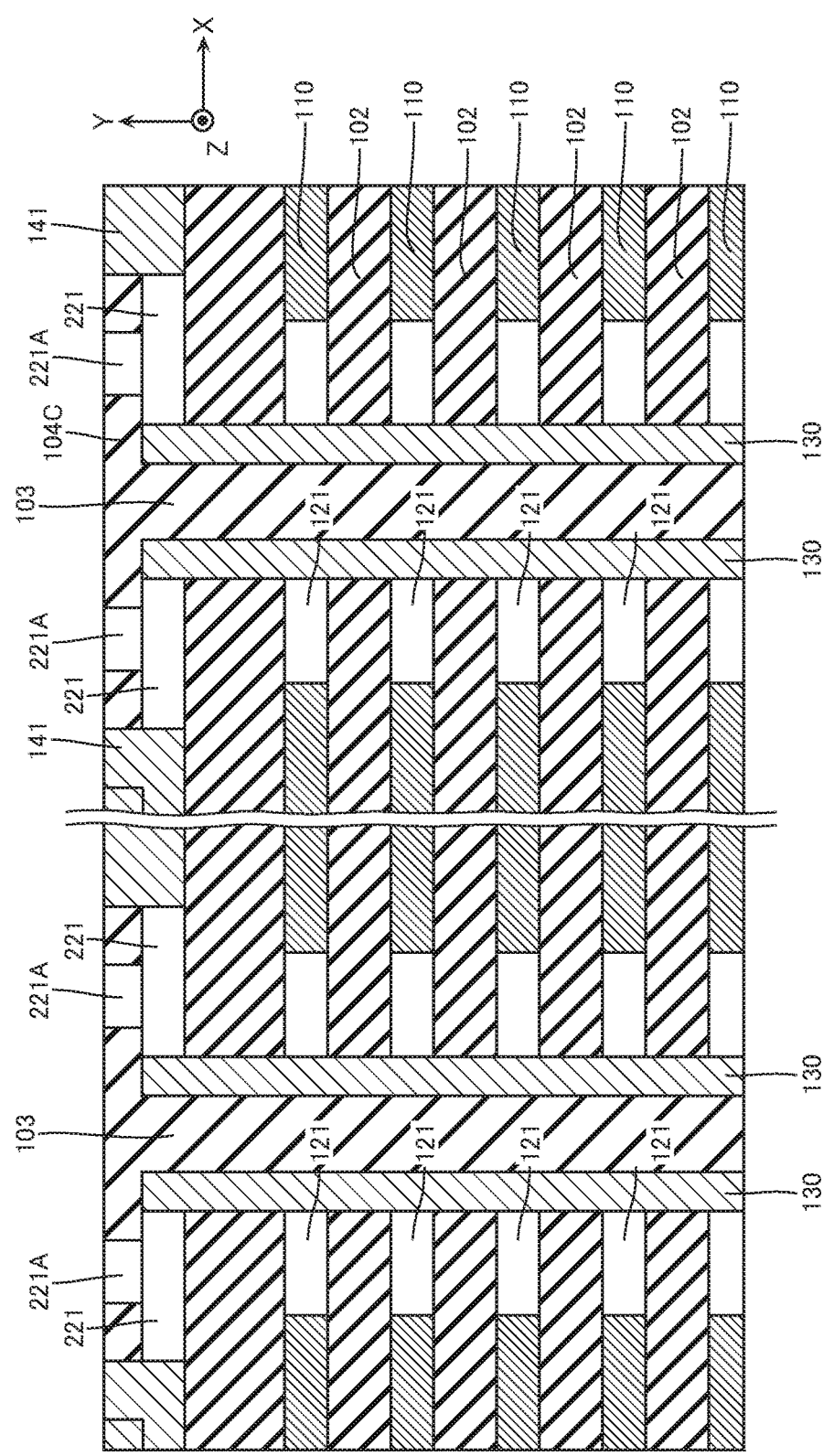
Figure 100:
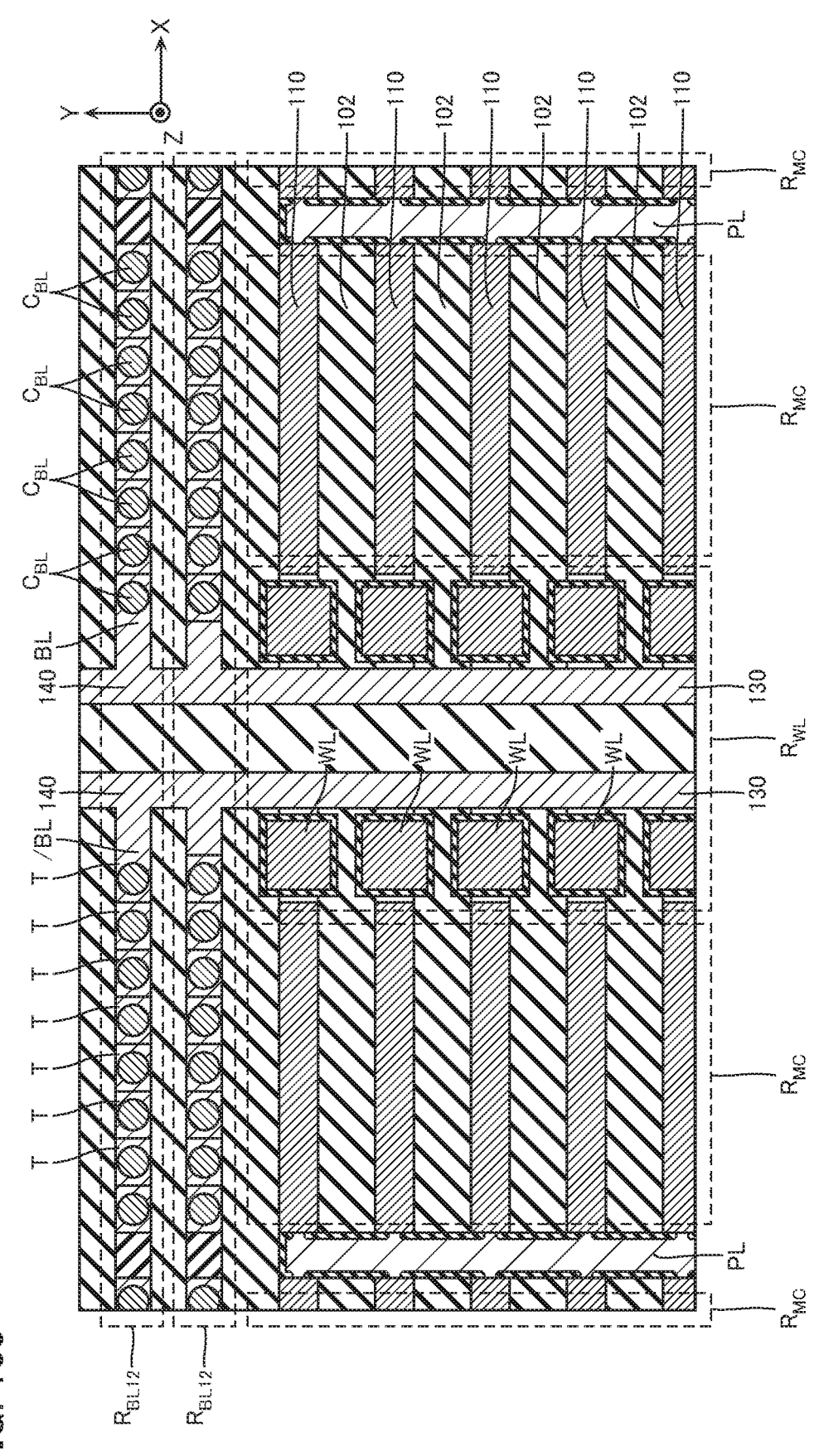
Figure 101:
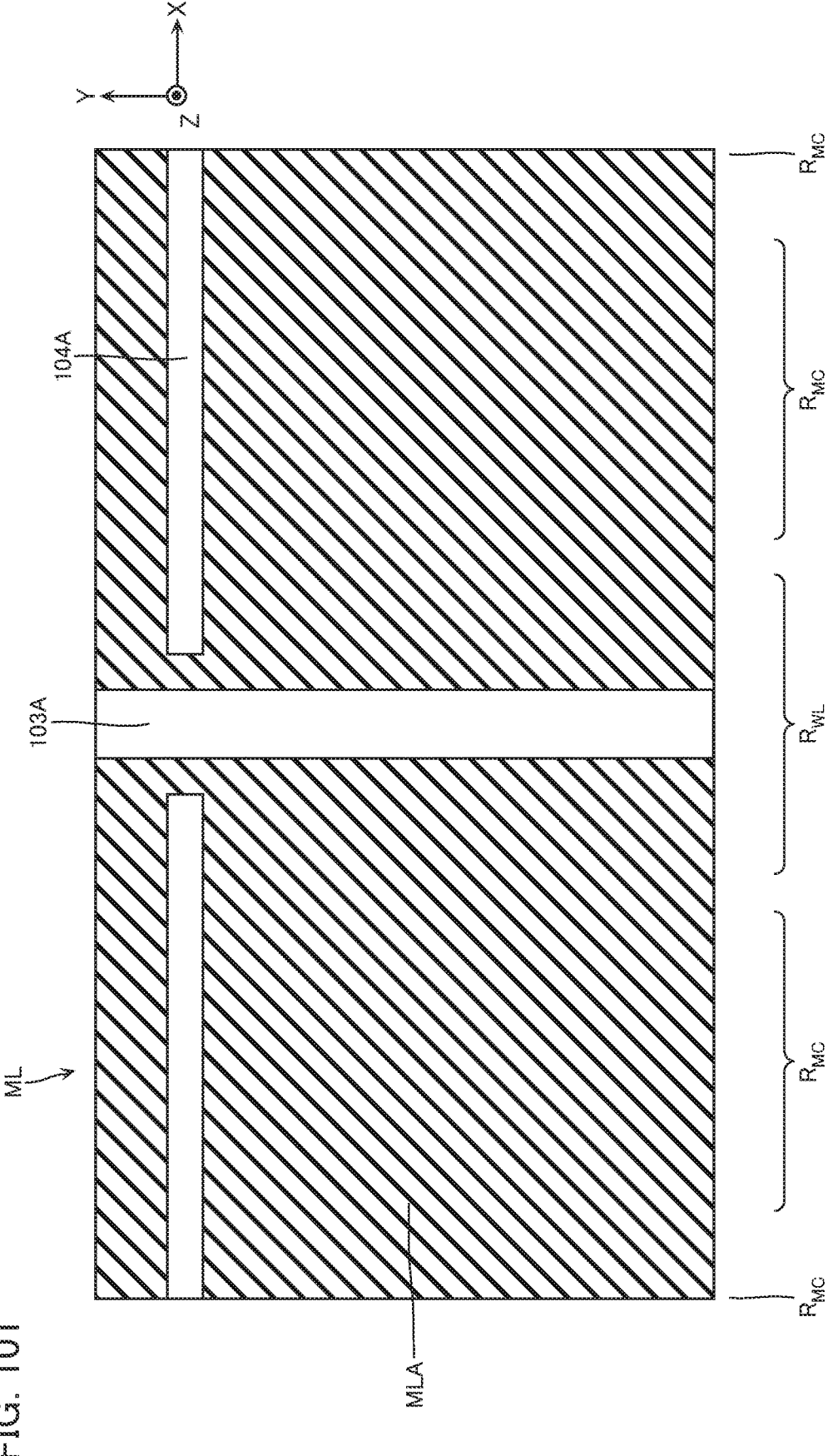
Figure 102:
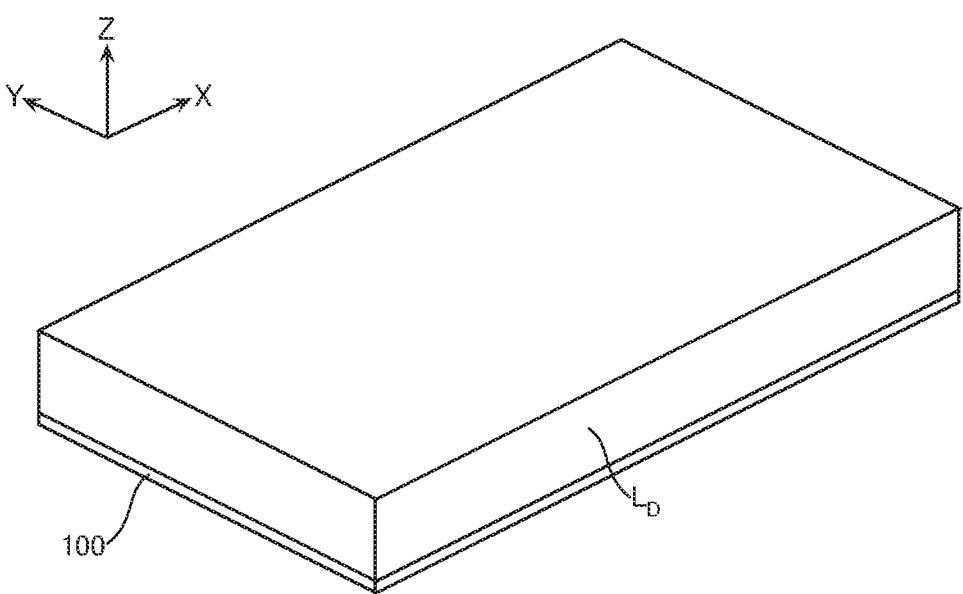
Figure 103:
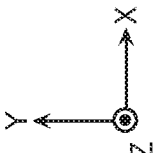
Figure 103:
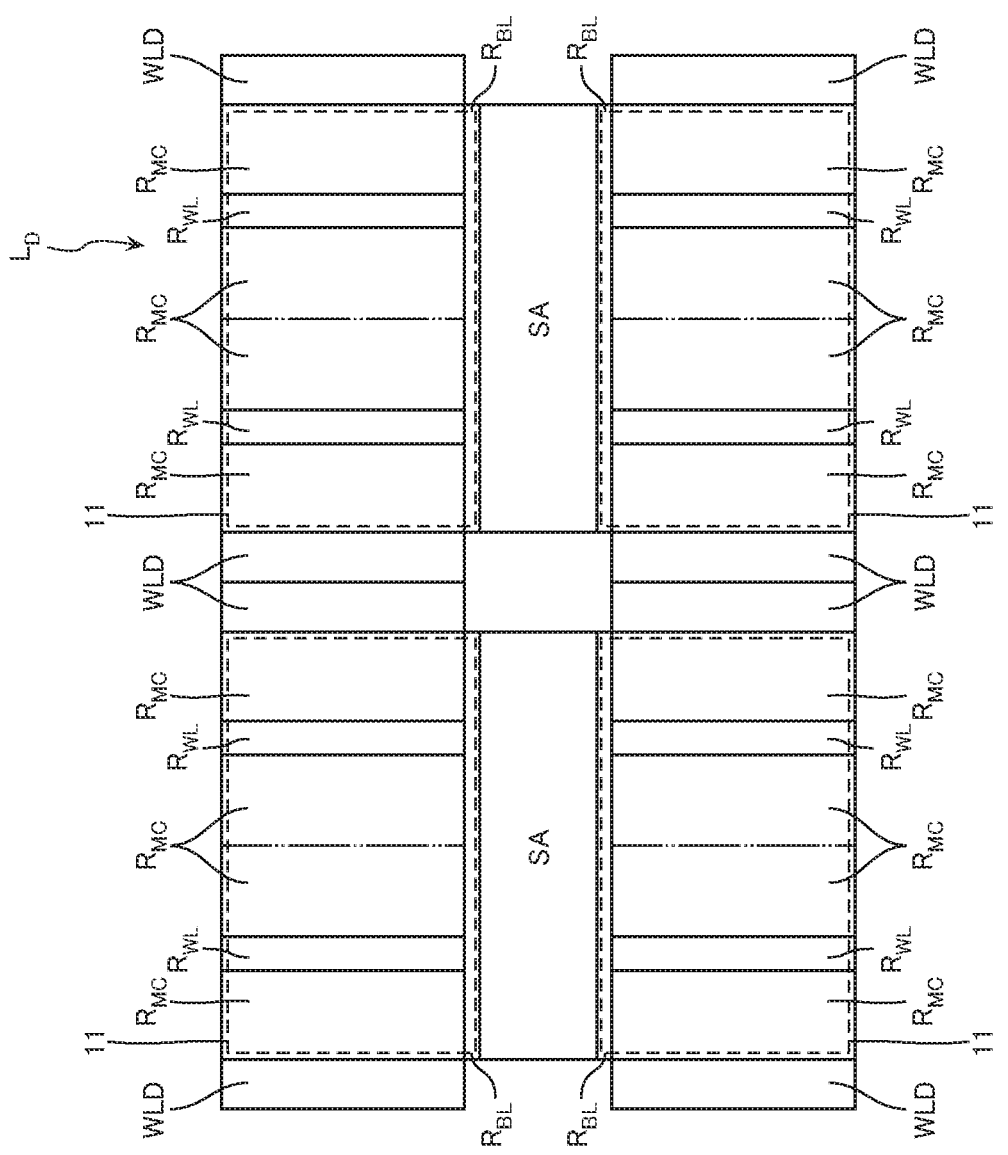
Figure 104:
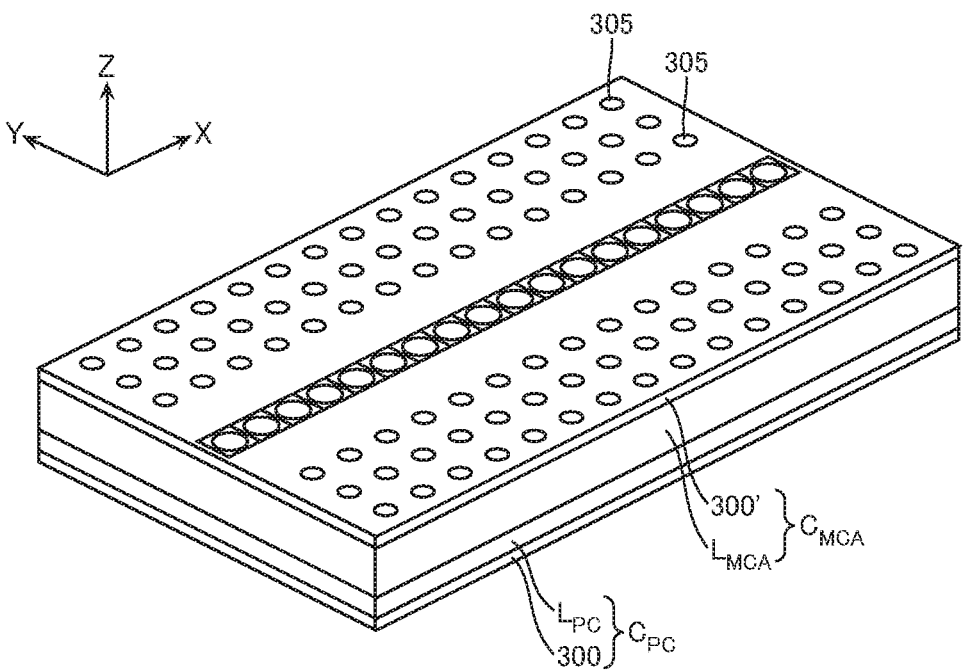
Figure 105:
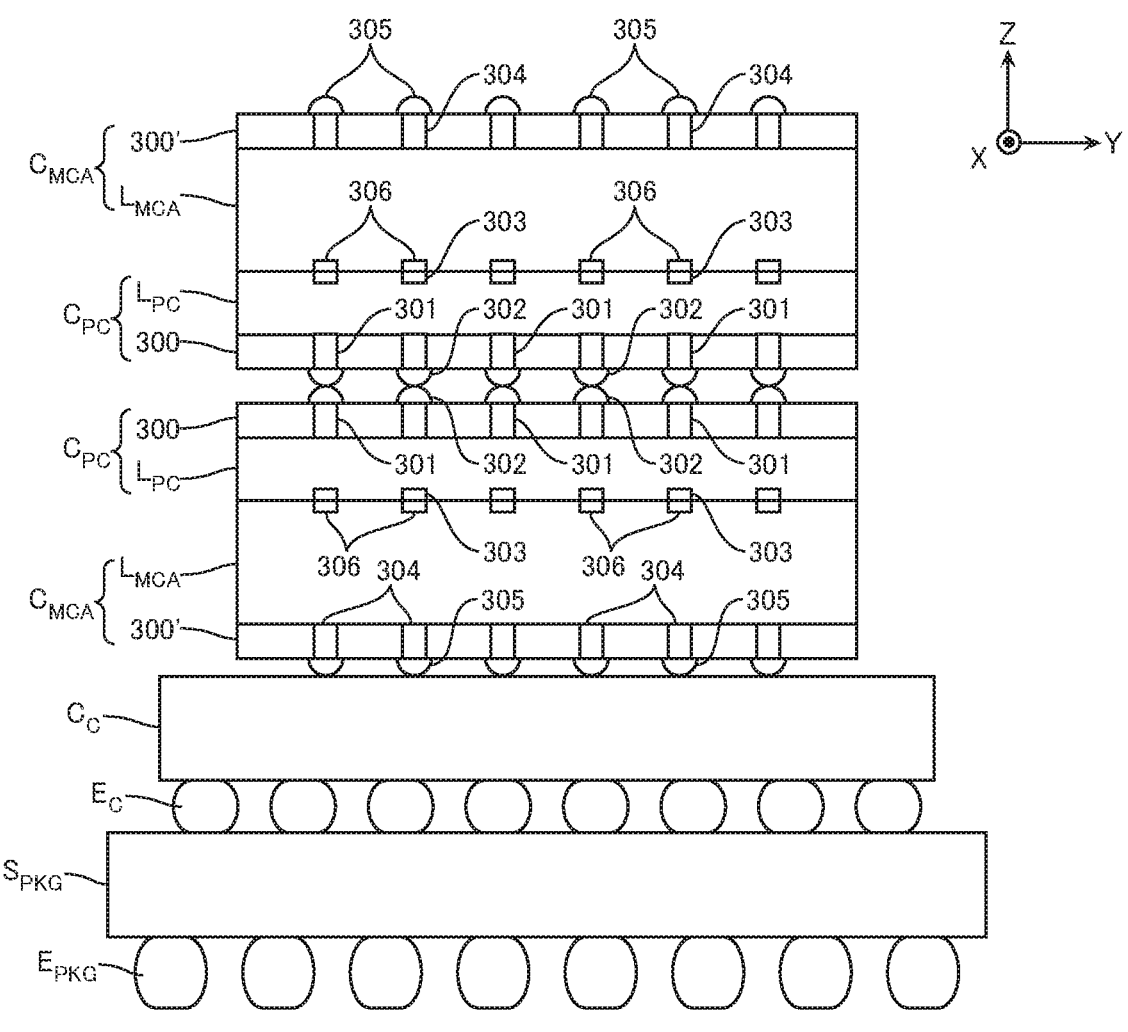
Figure 106:
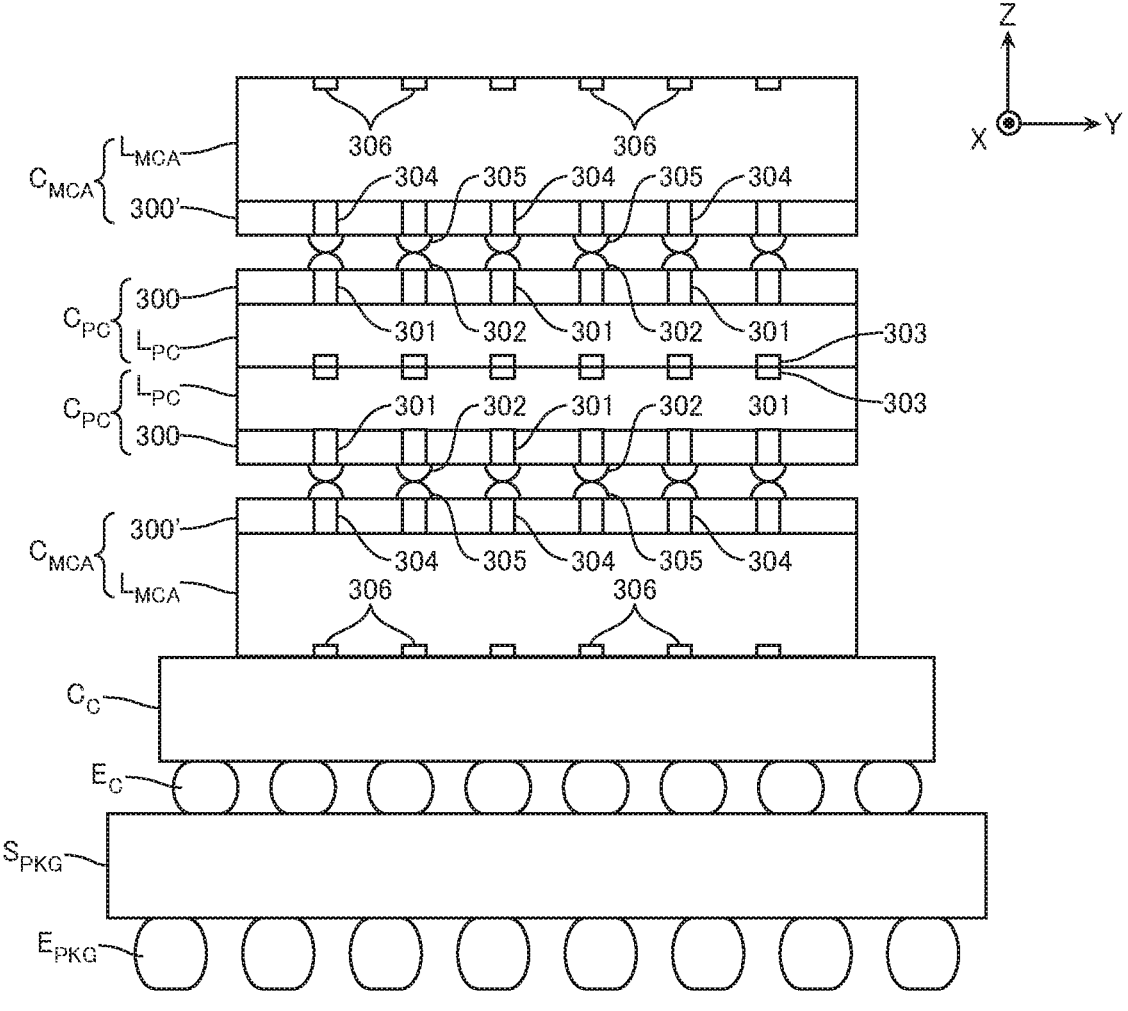
Figure 107:
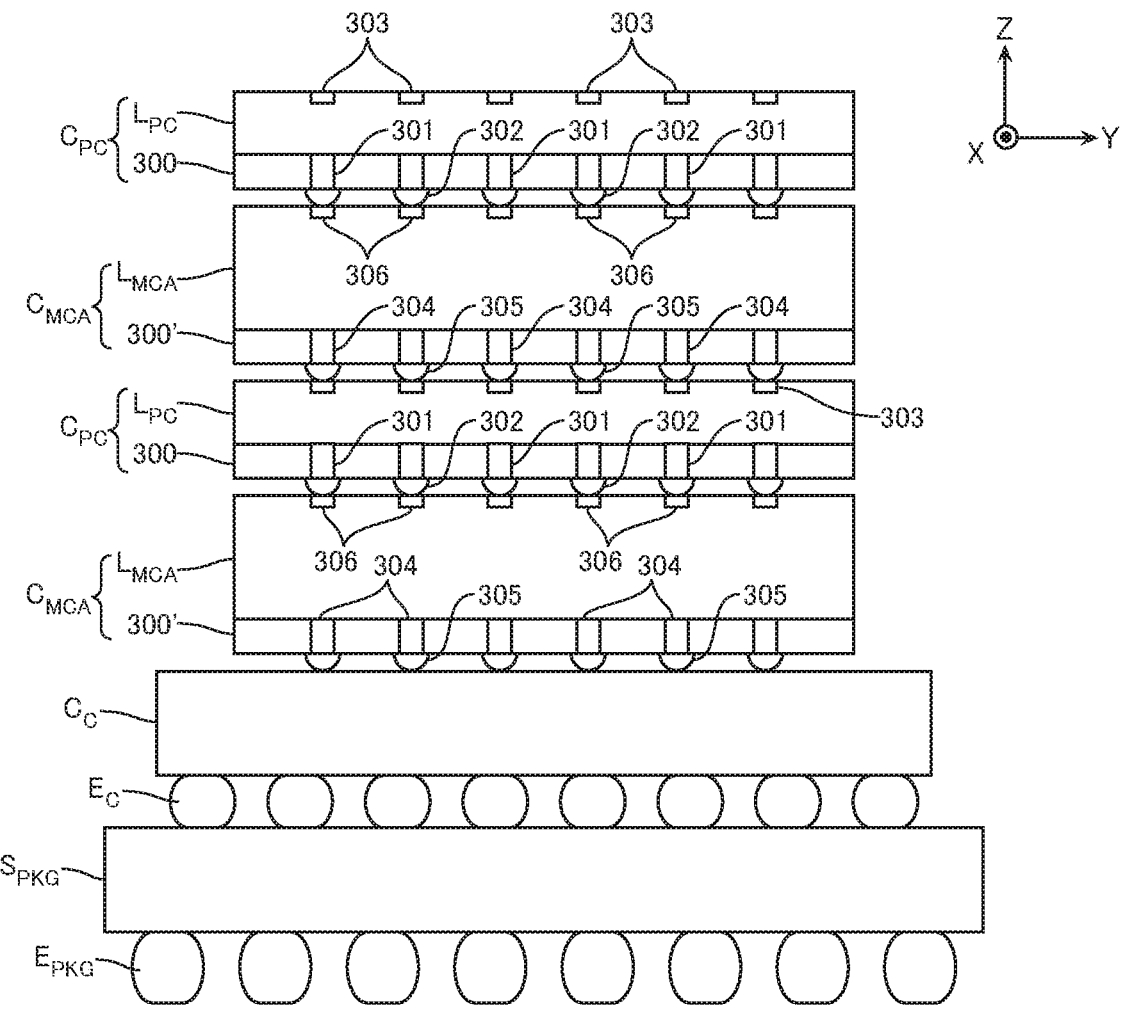
Figure 108:
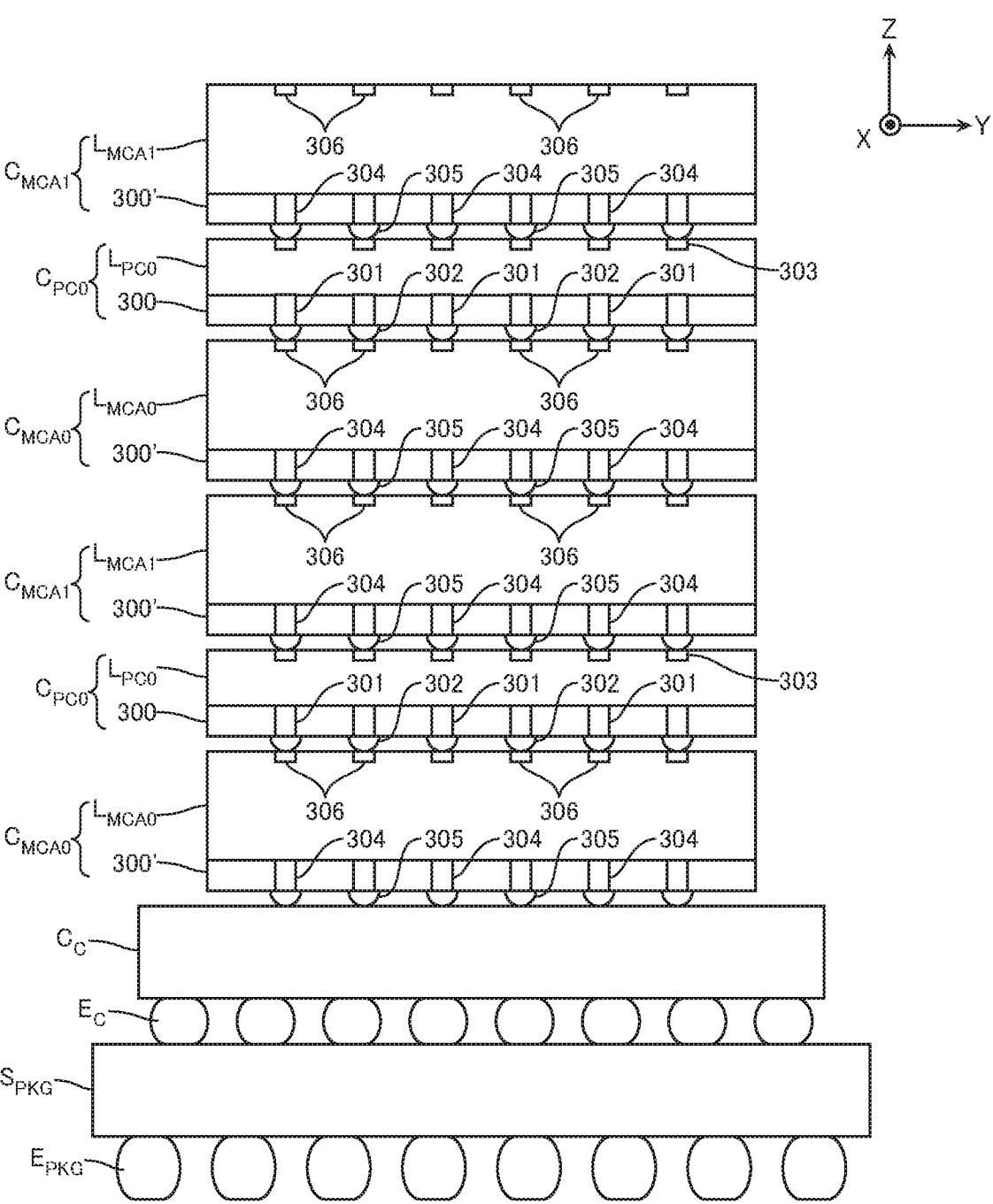
Figure 109:
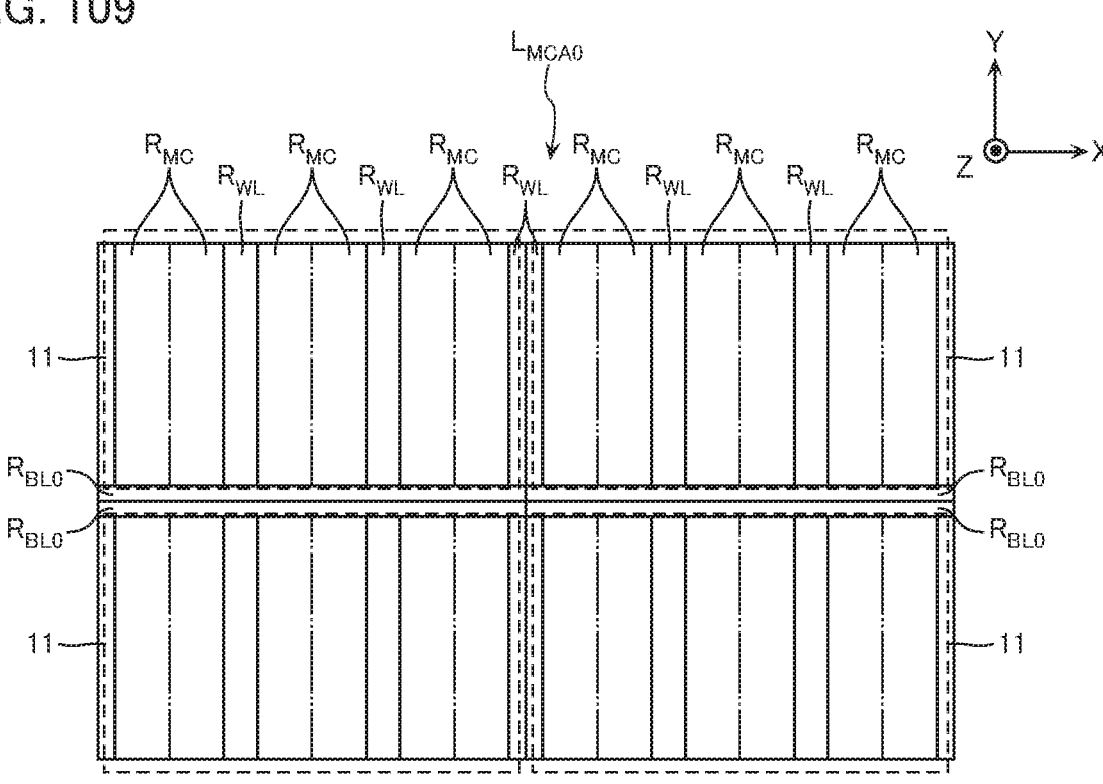
Figure 110:
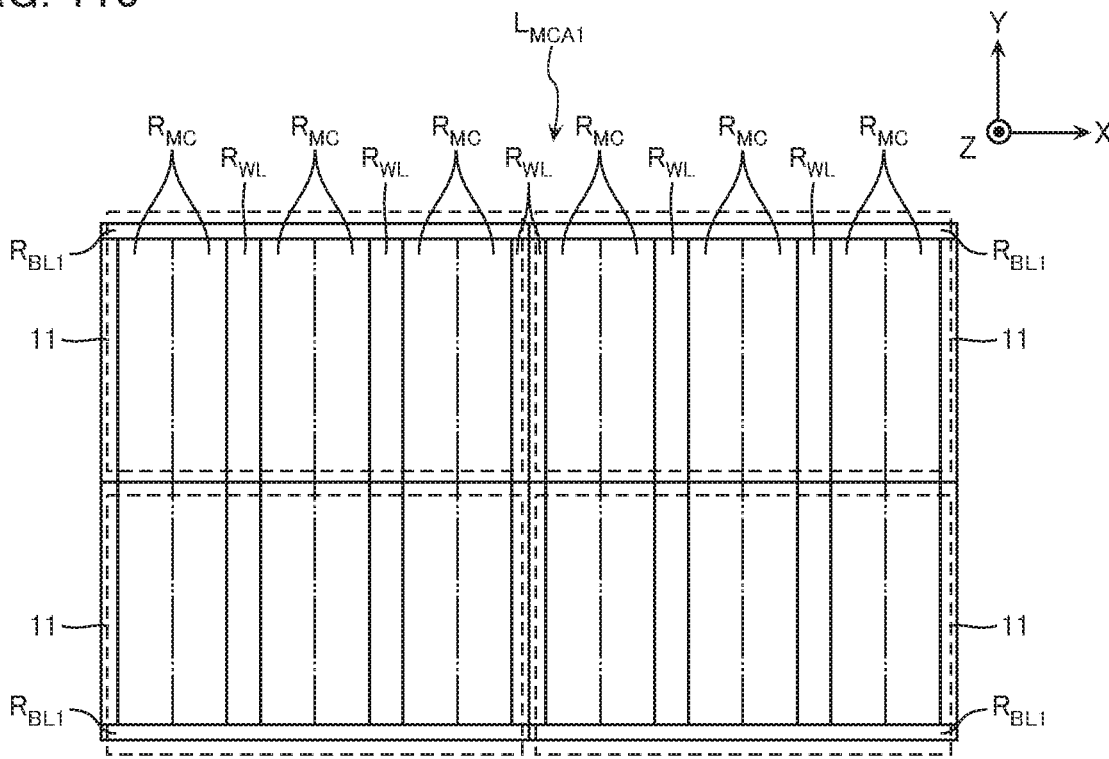
Figure 112:
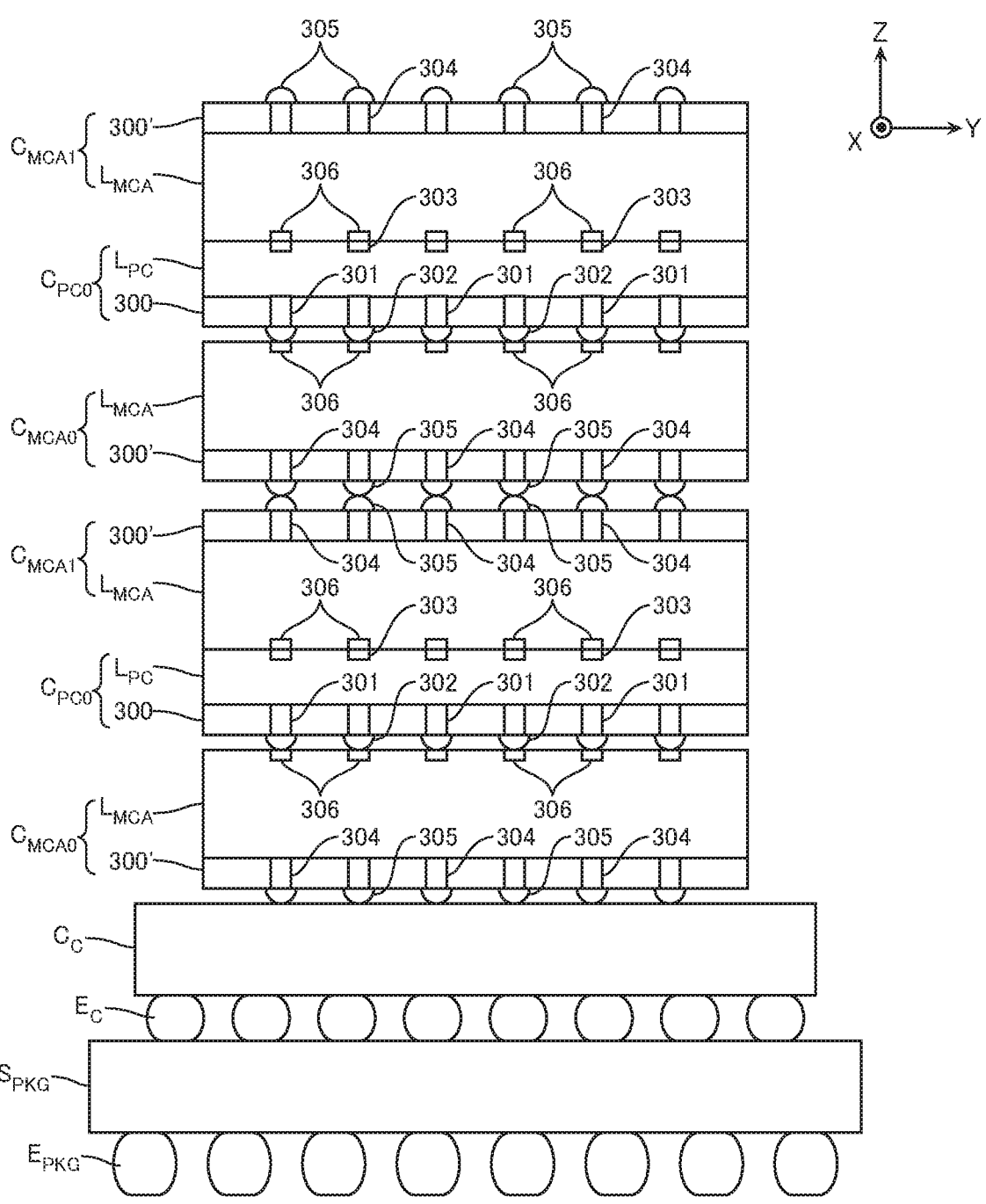
Figure 113:
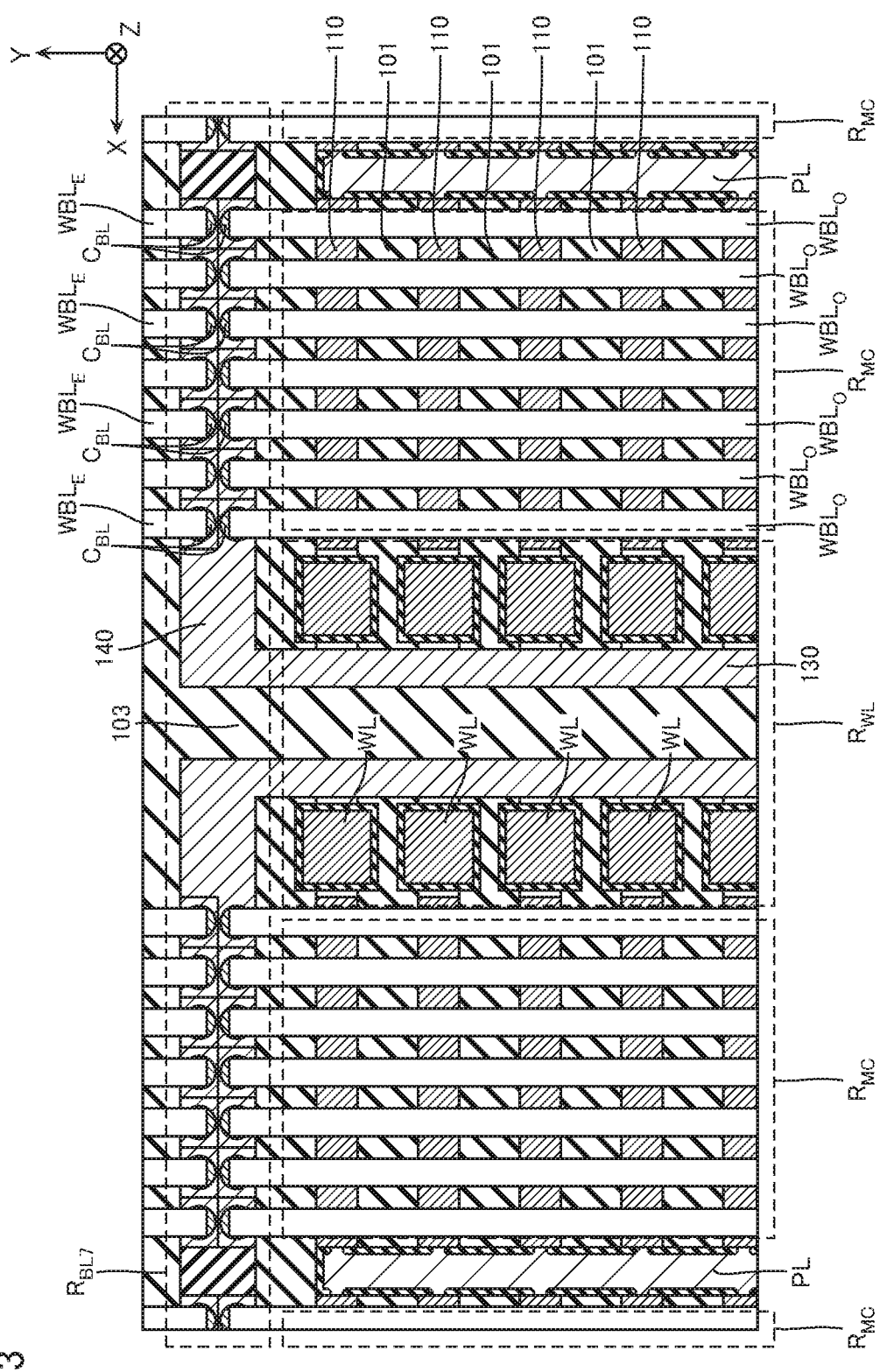
Figure 114:
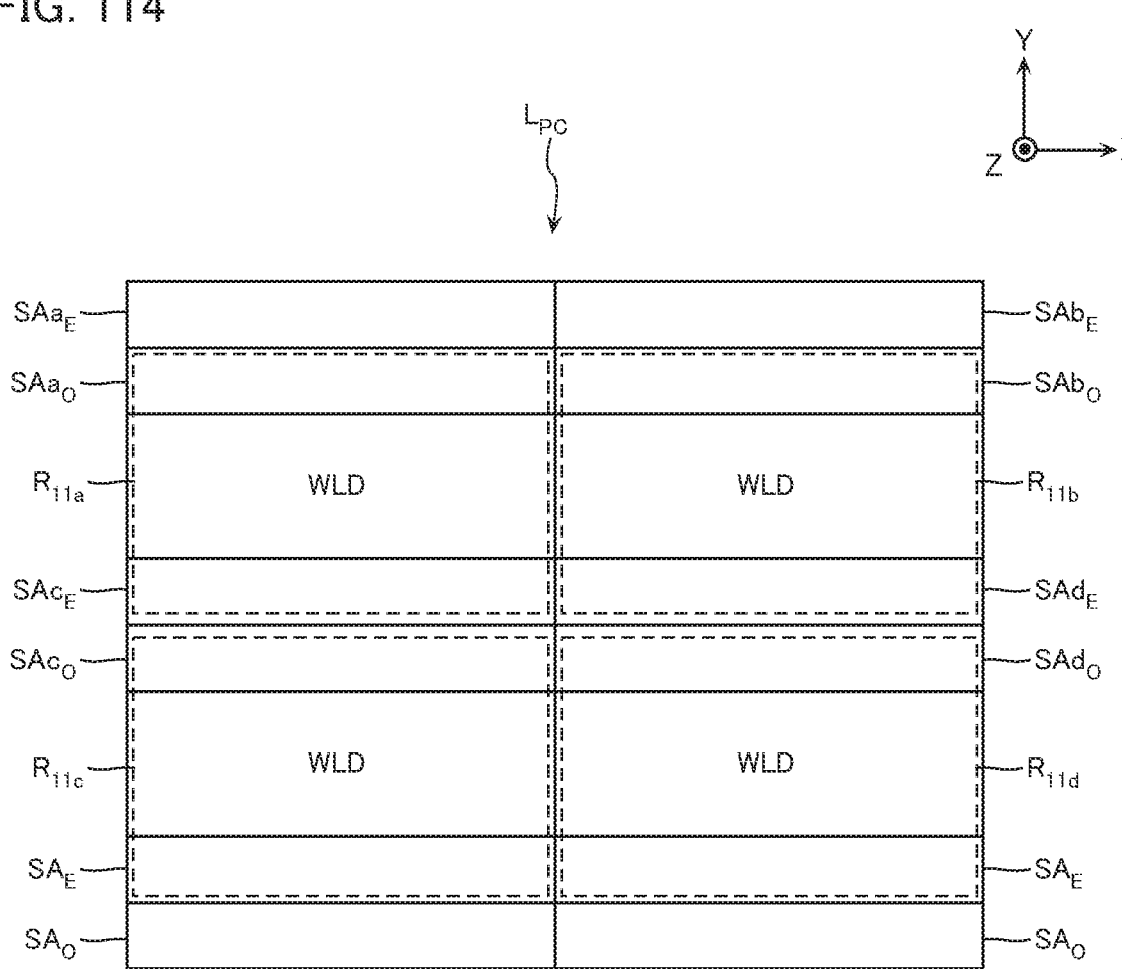
Figure 115:
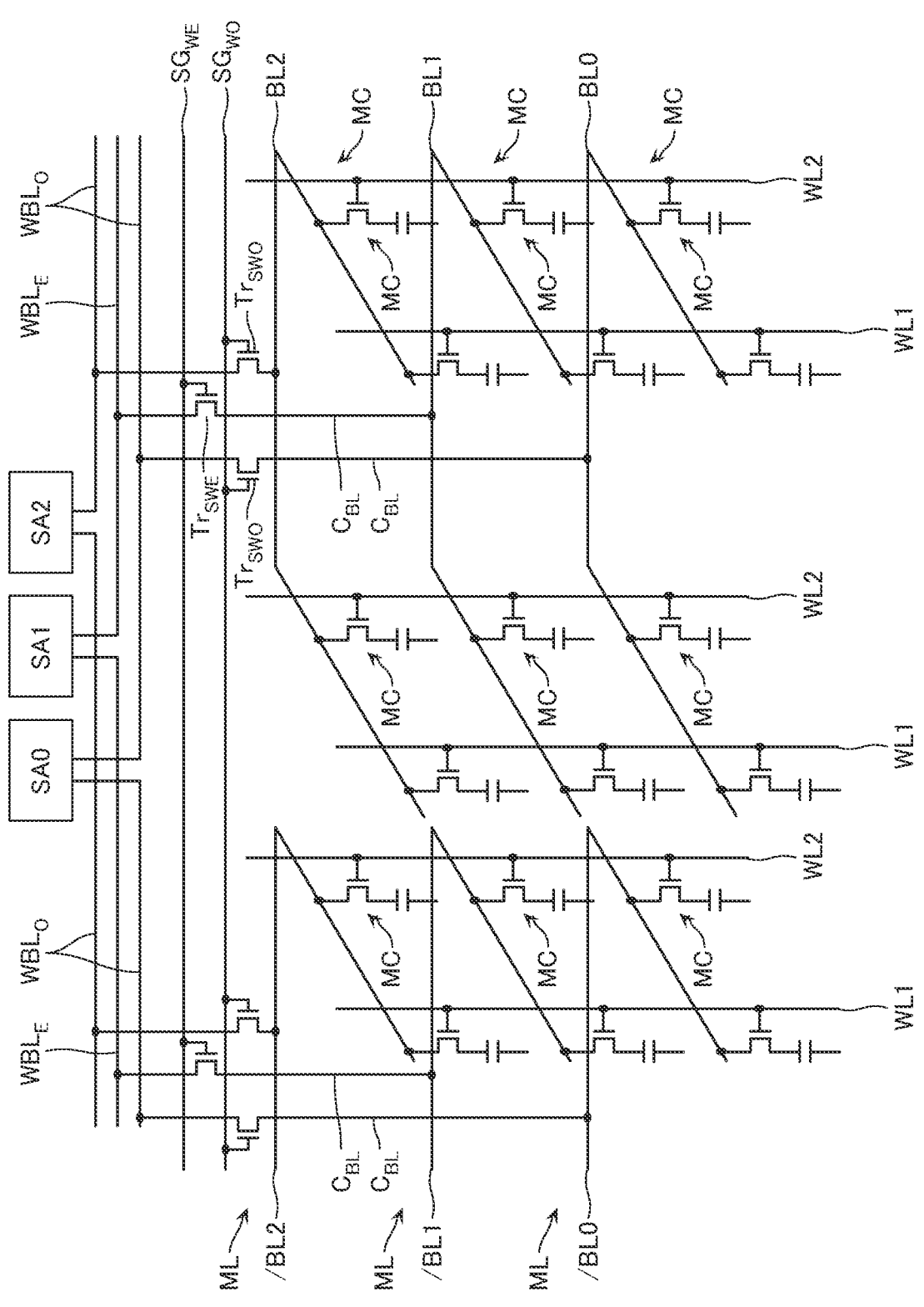
Figure 116:
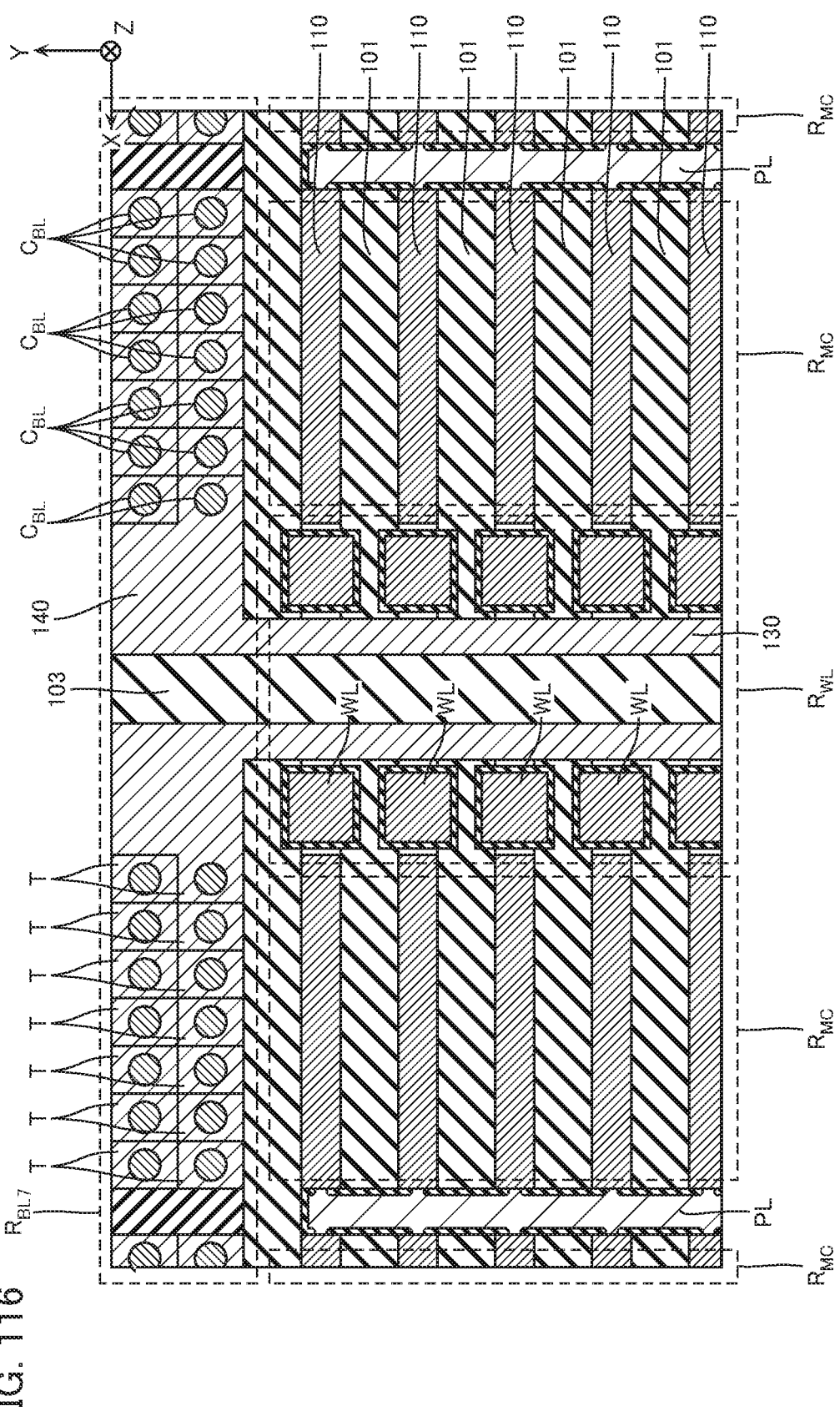
Figure 117:
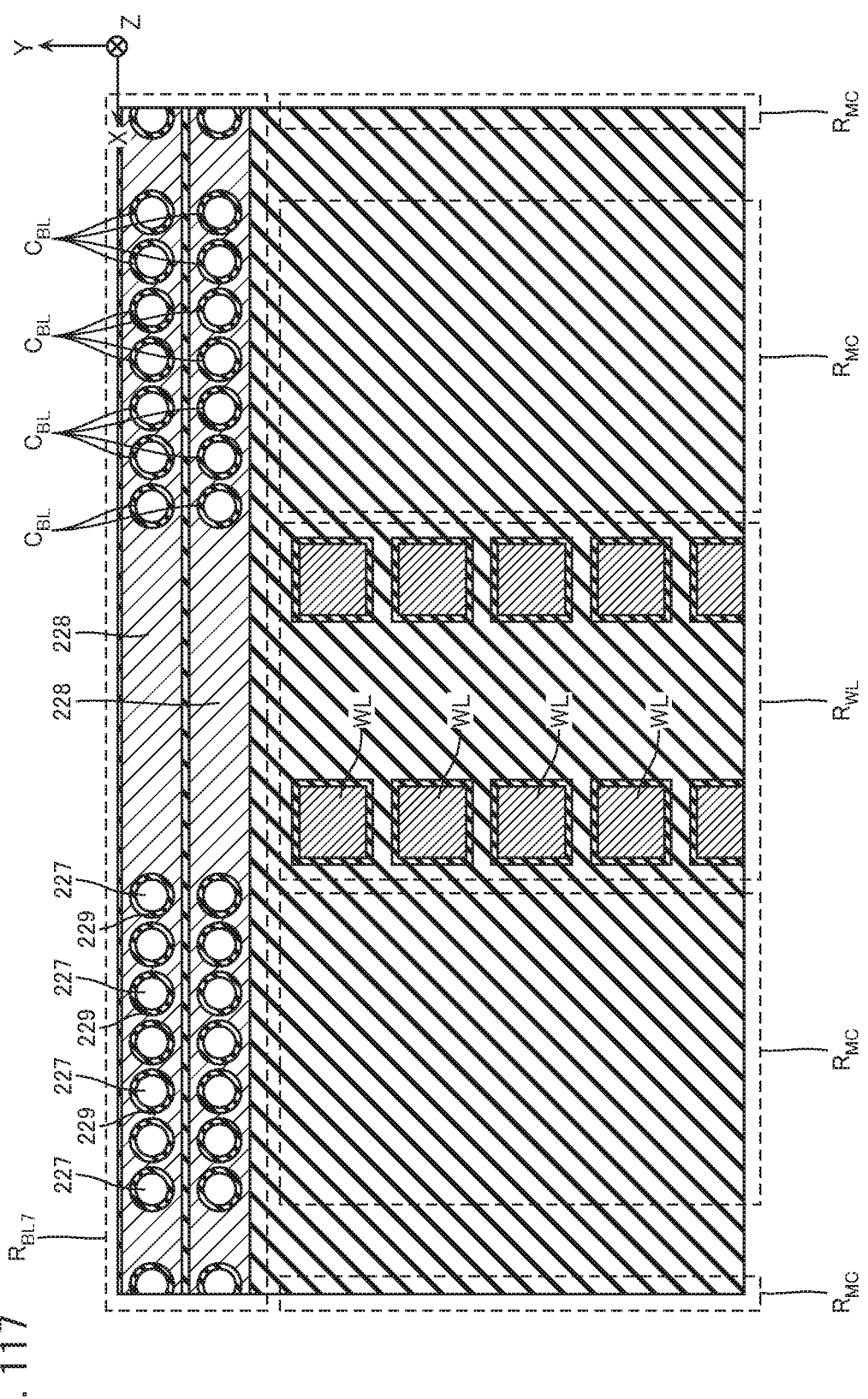
Figure 118:
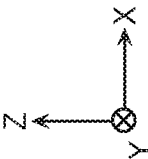
Figure 118:
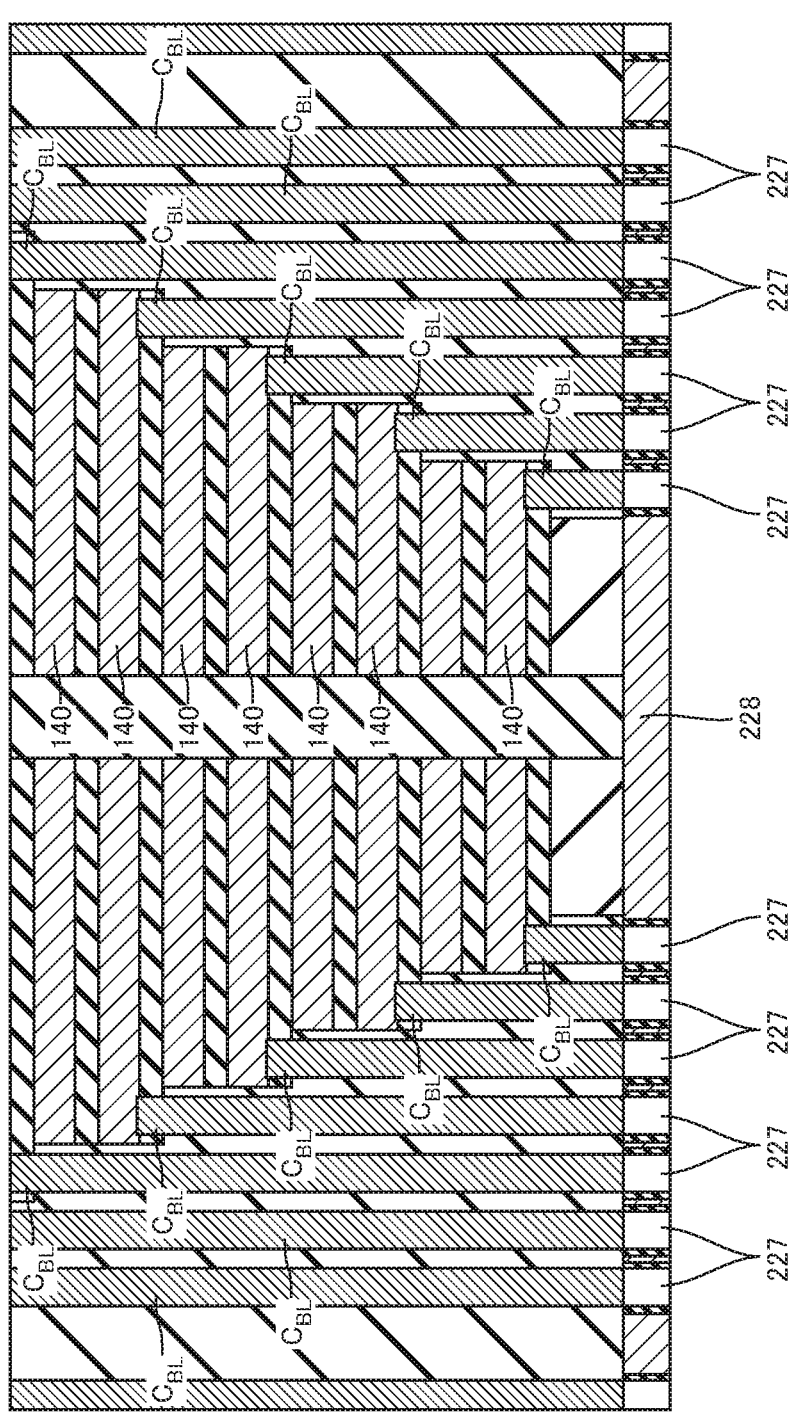
Figure 119:
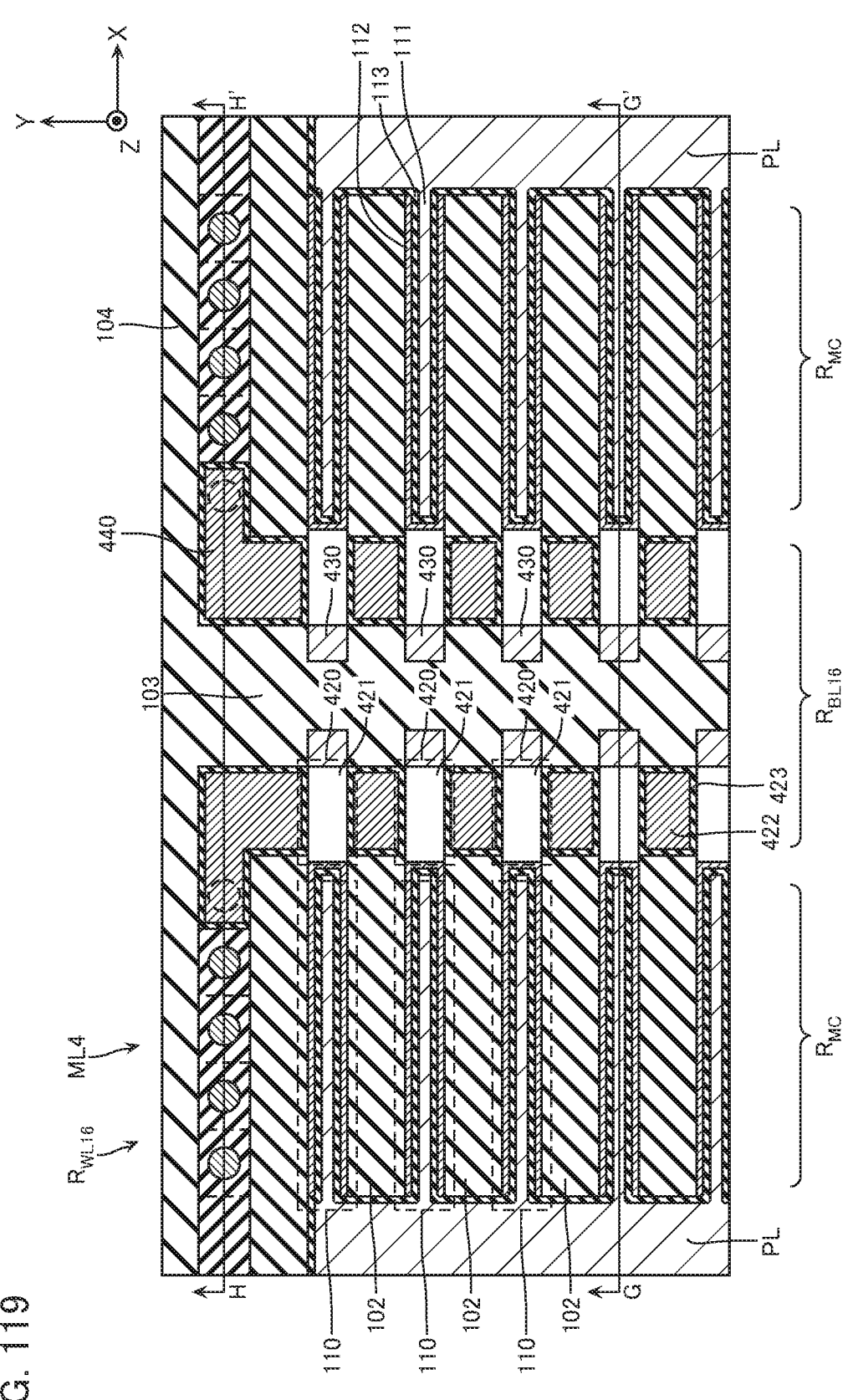
Figure 120:
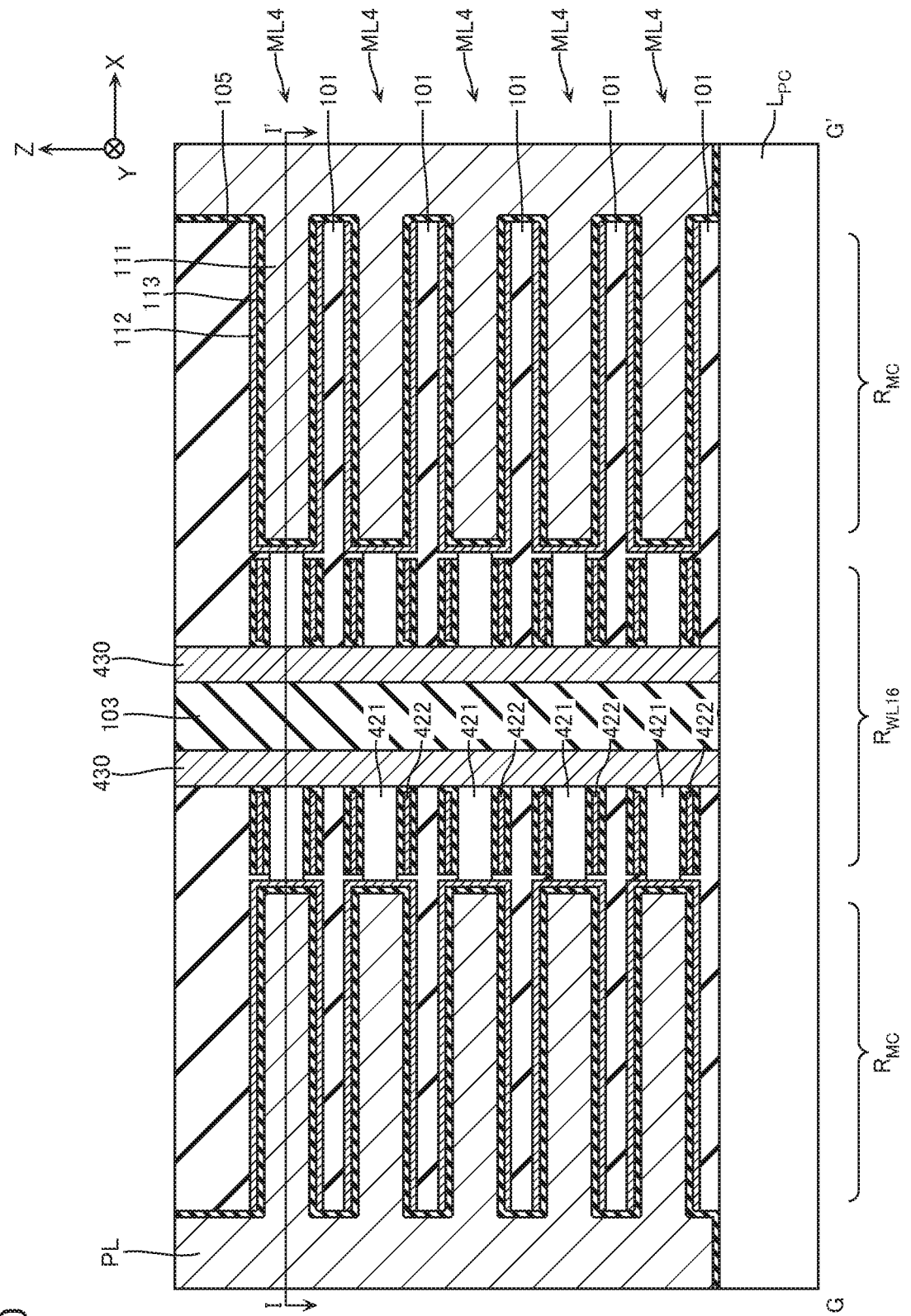
Figure 121:
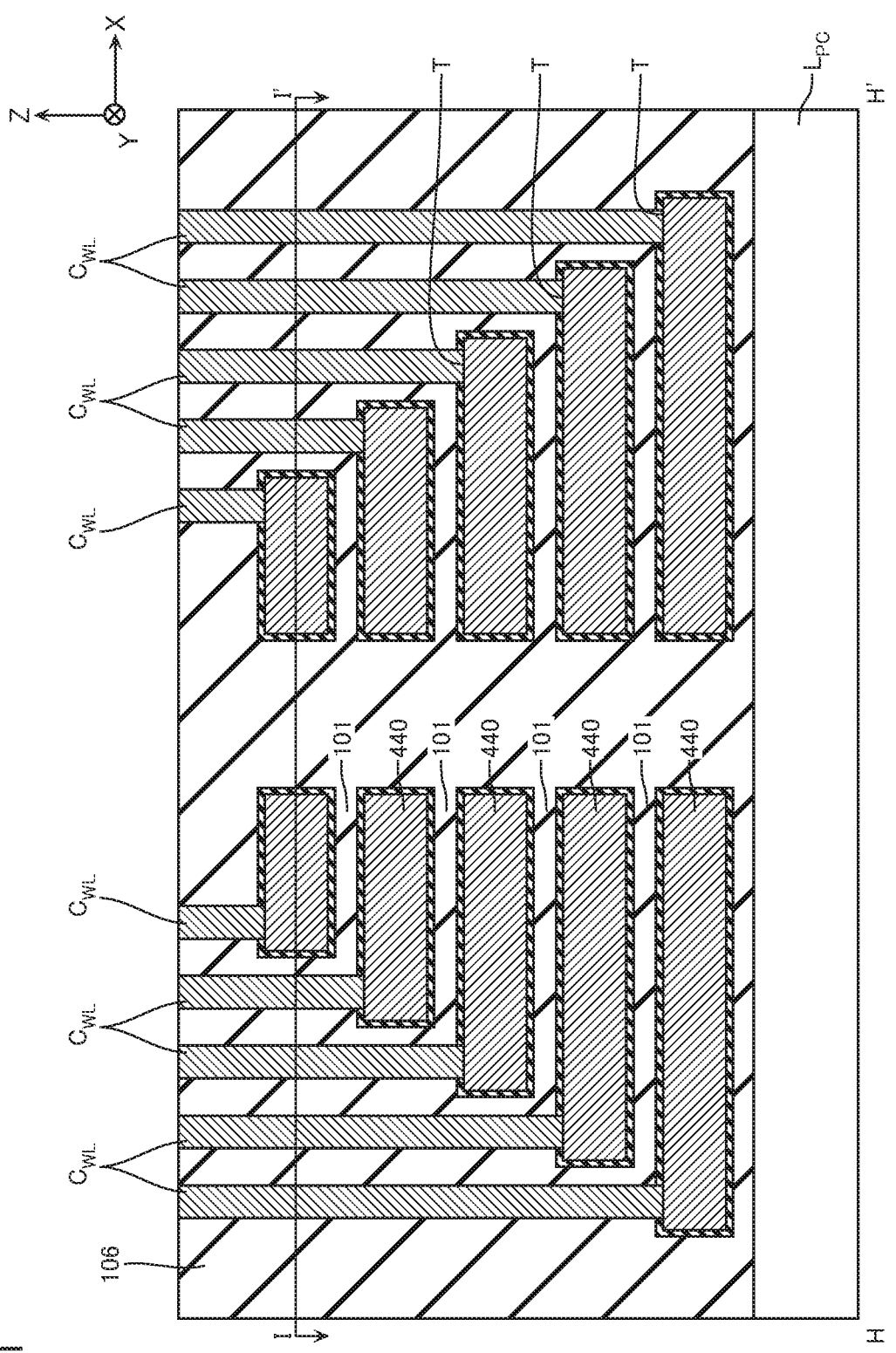
Figure 122:
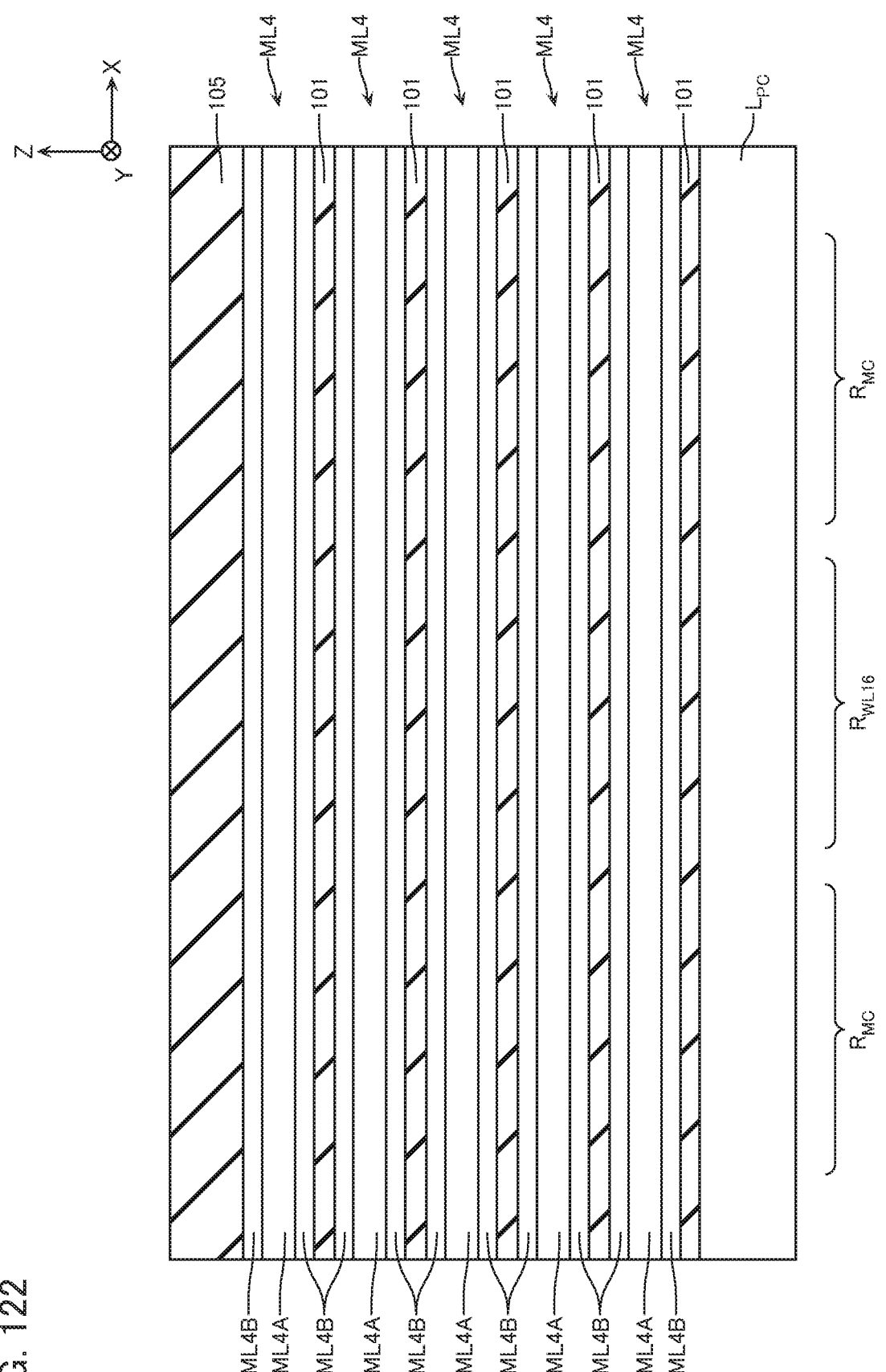
Figure 123:
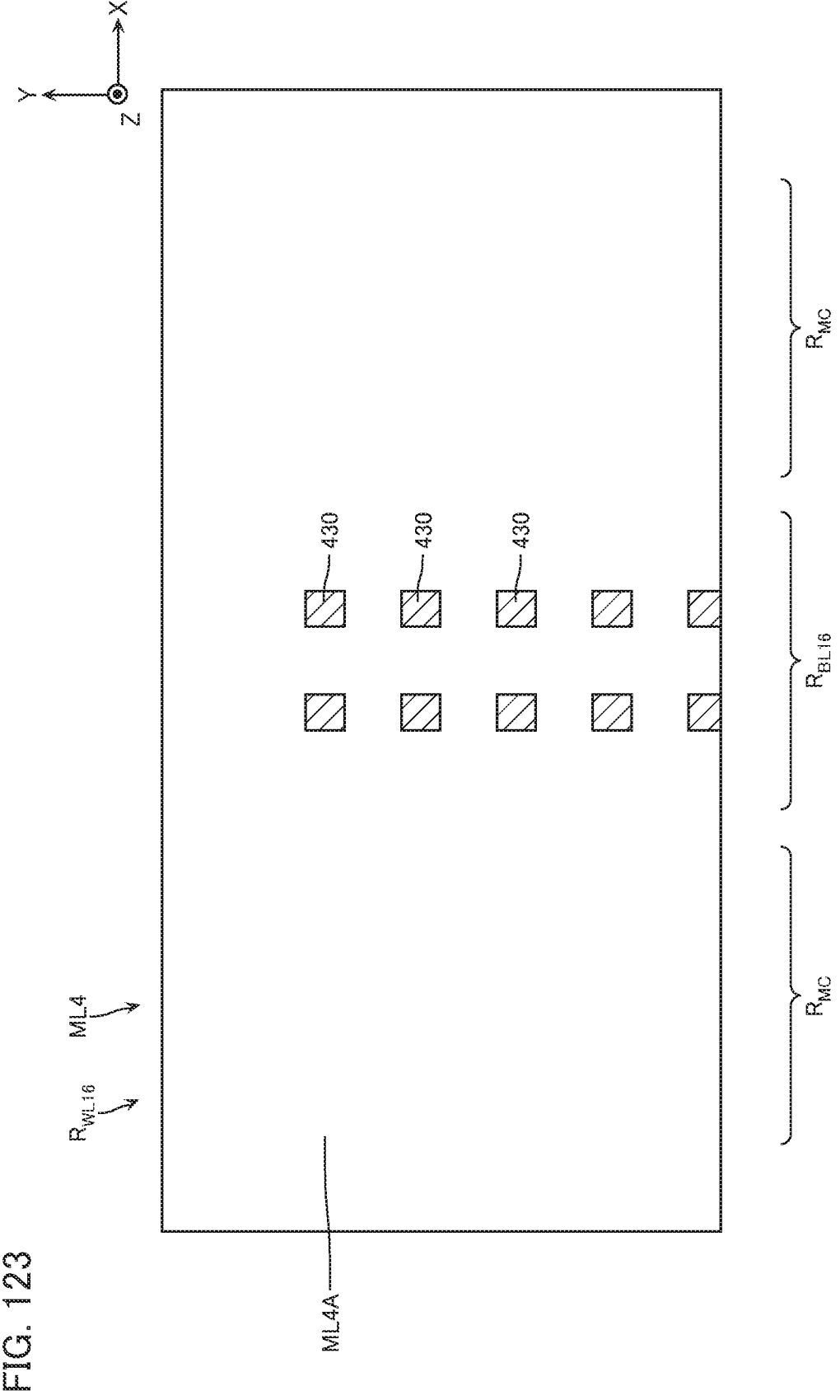
Figure 124:
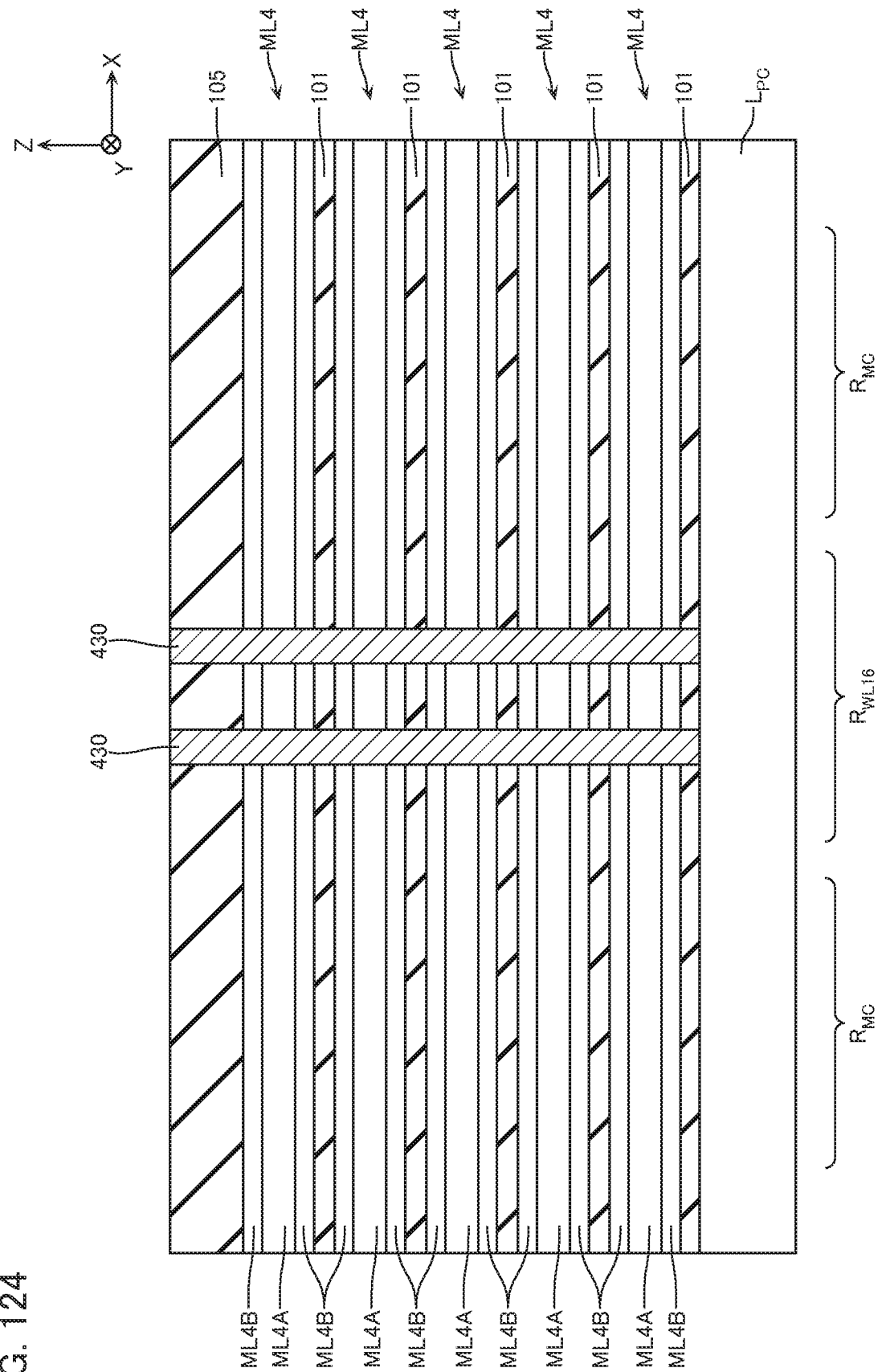
Figure 125:
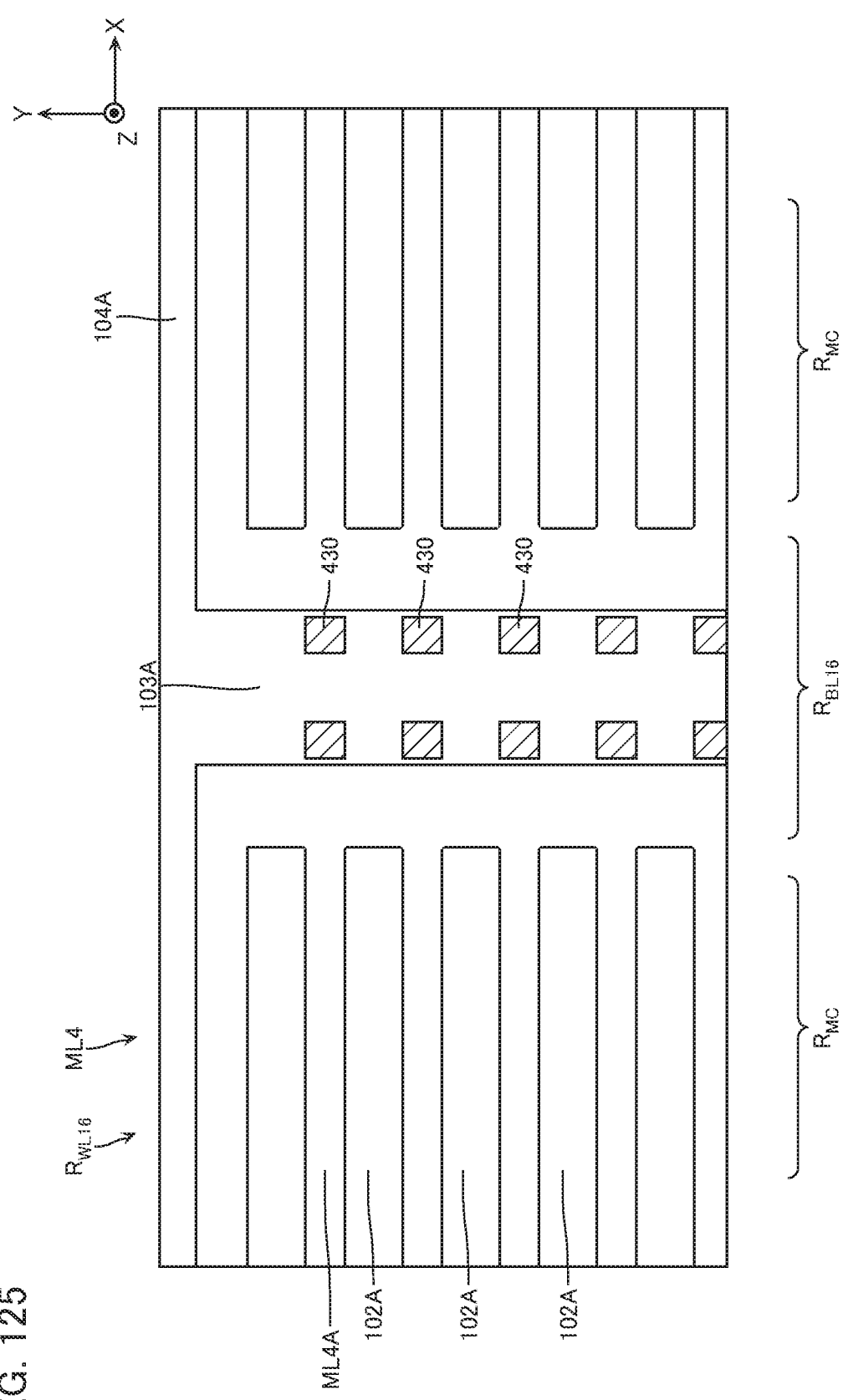
Figure 126:
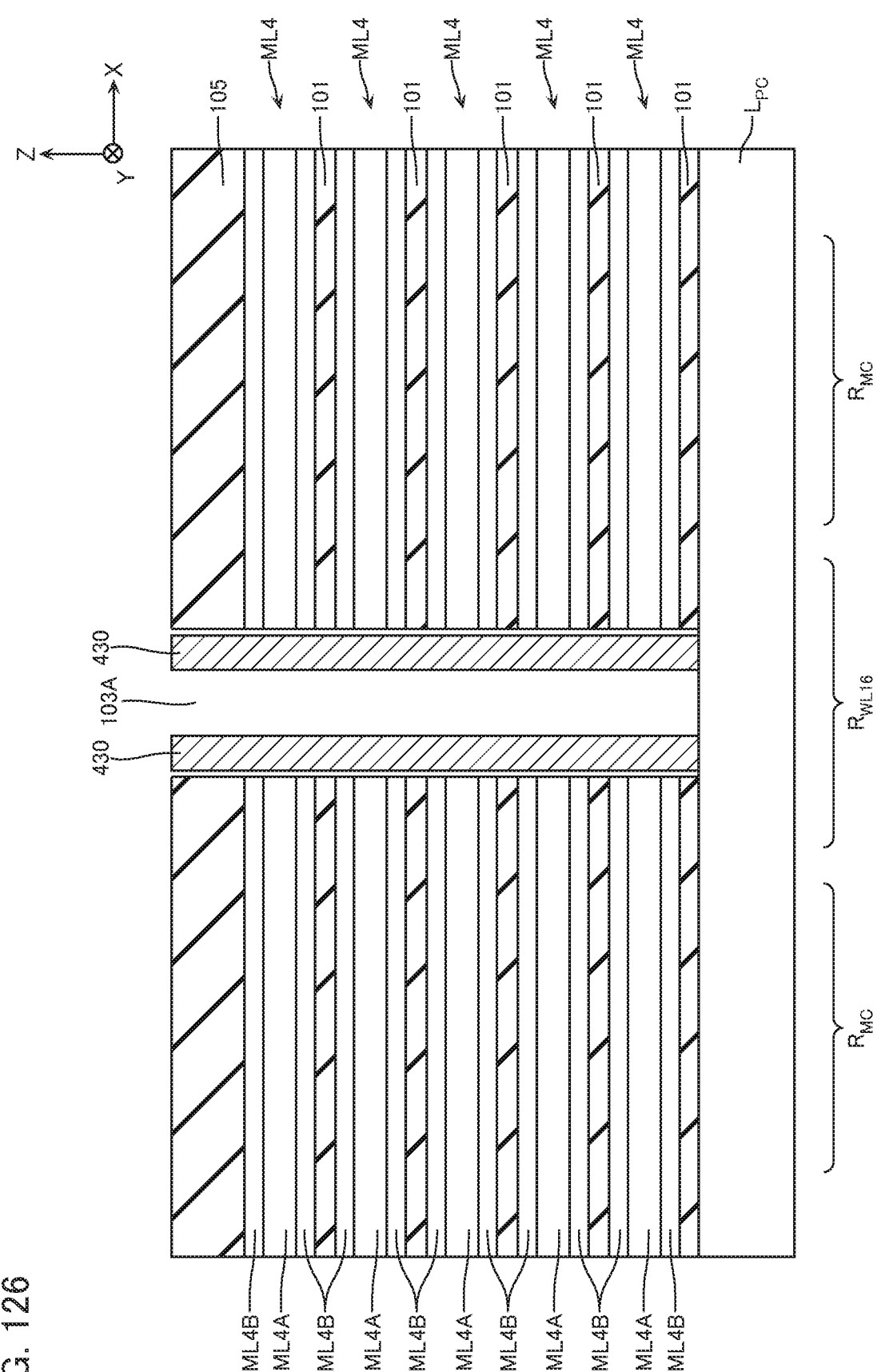
Figure 127:
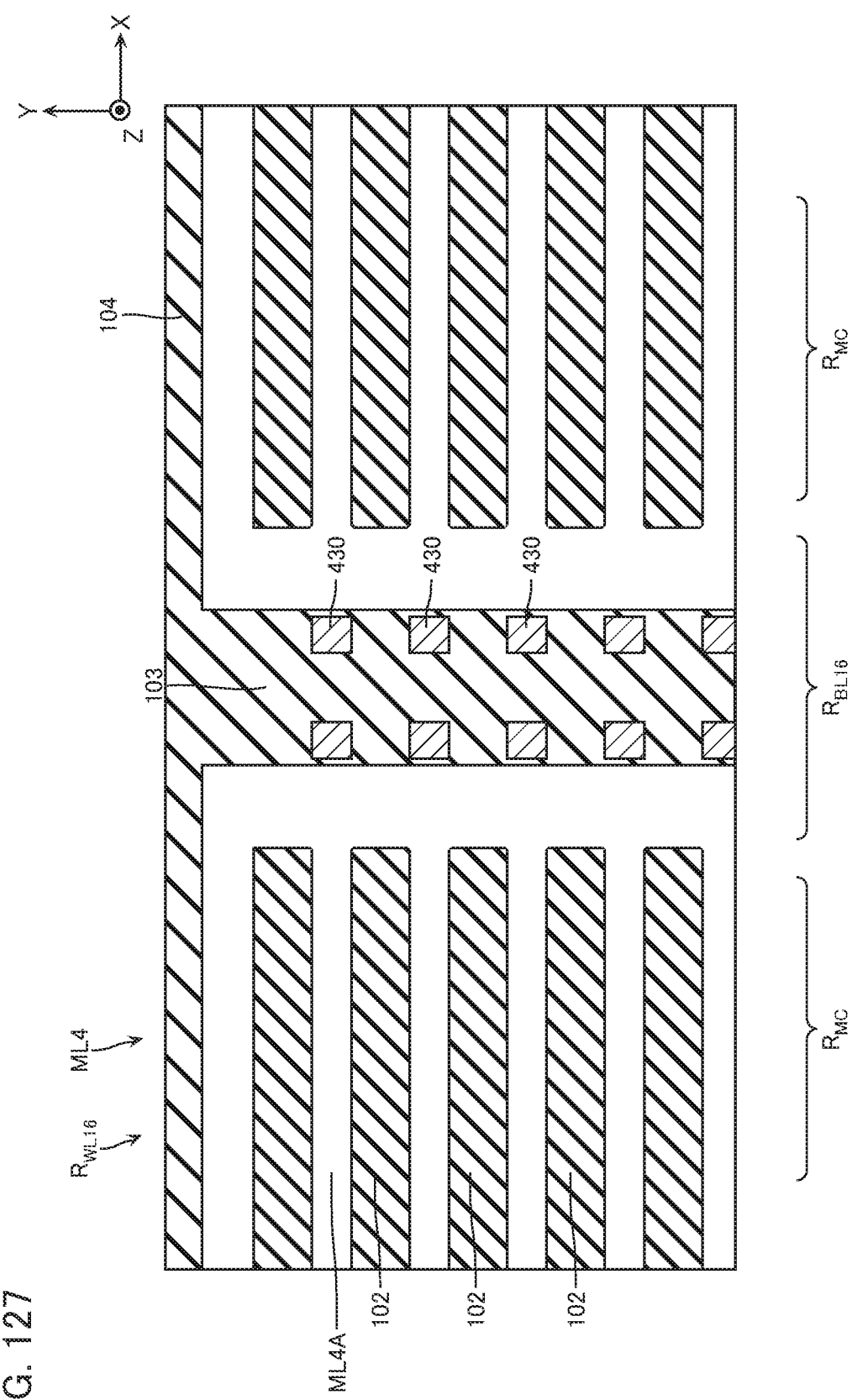
Figure 128:
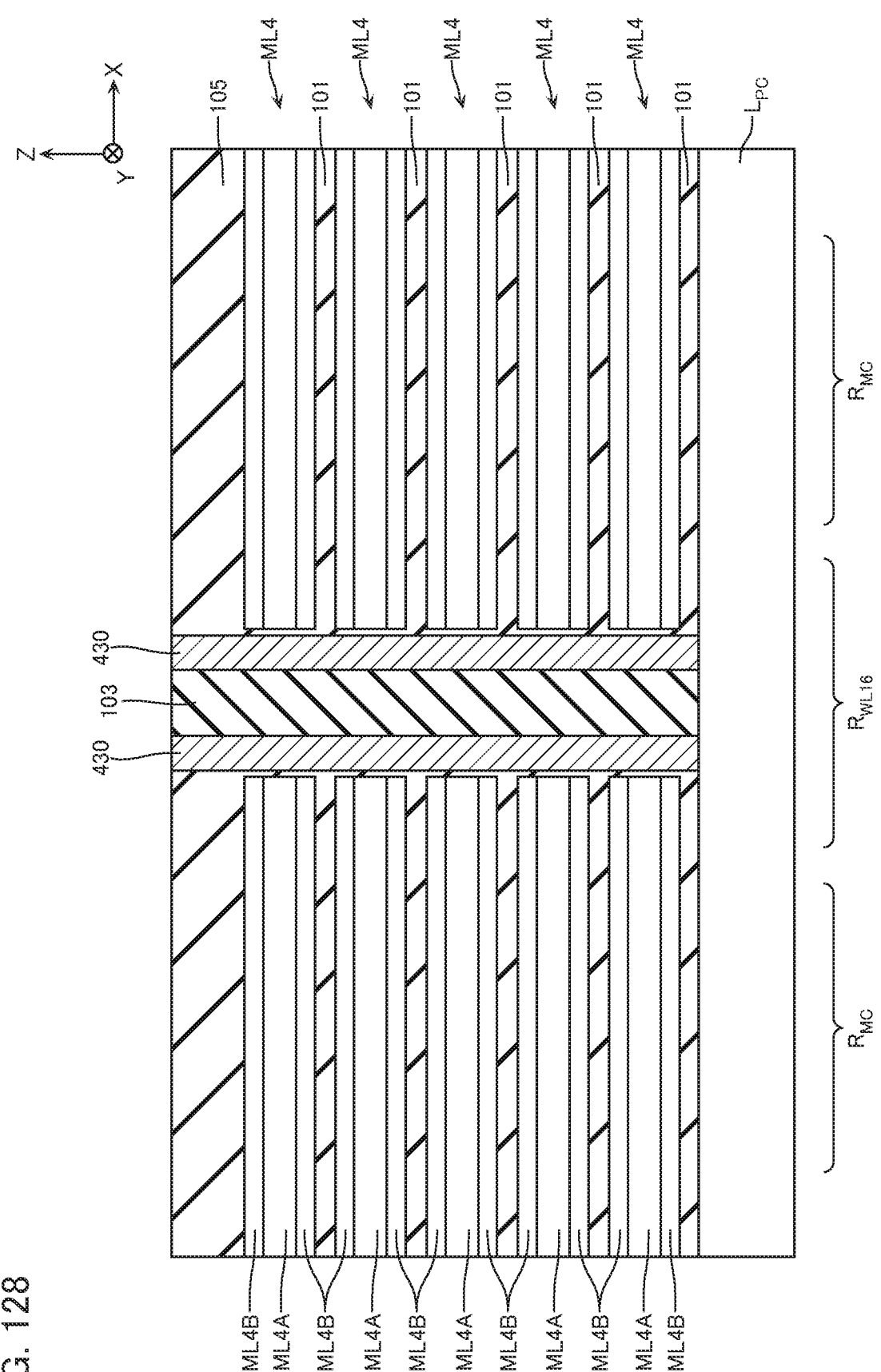
Figure 129:
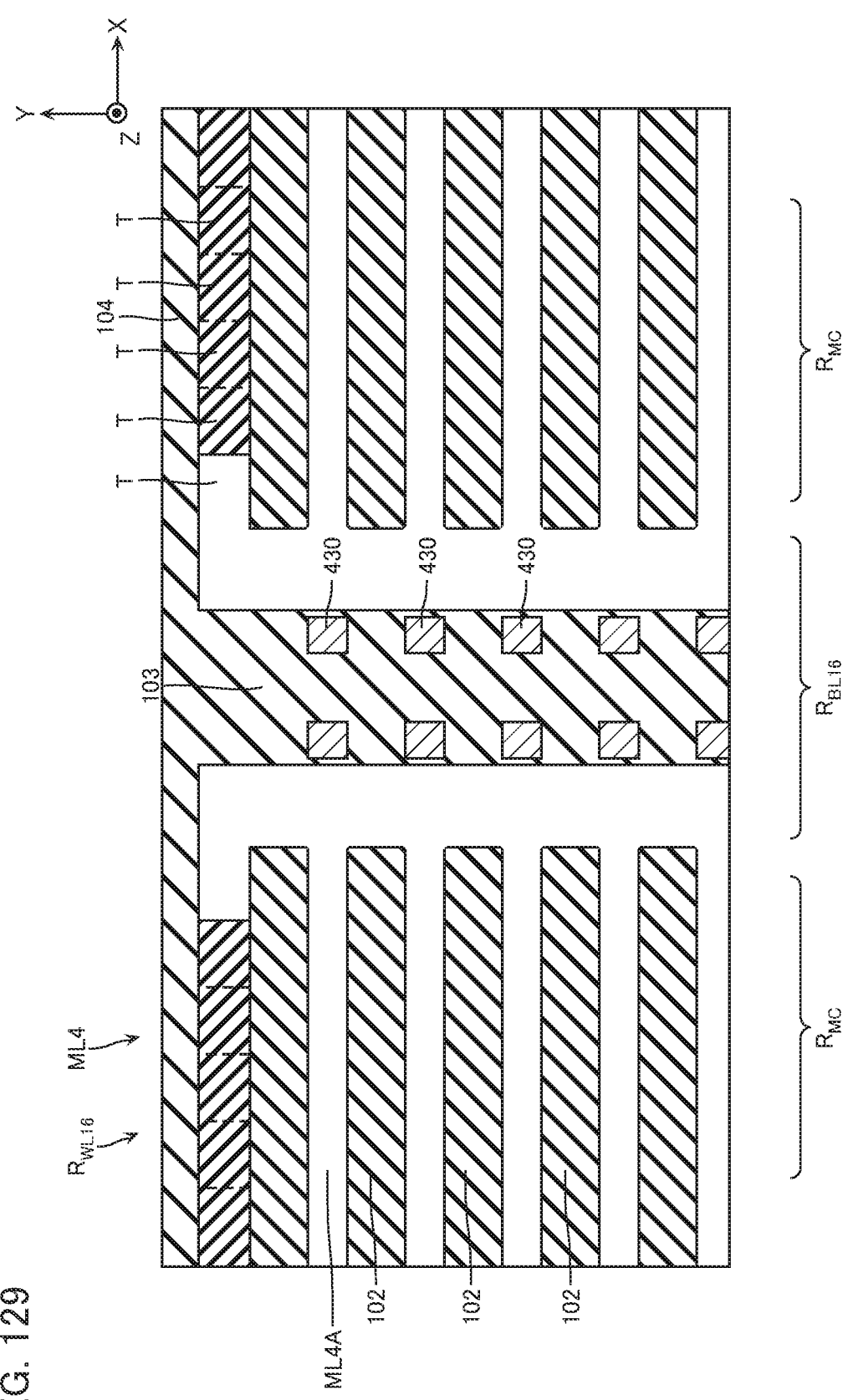
Figure 130:
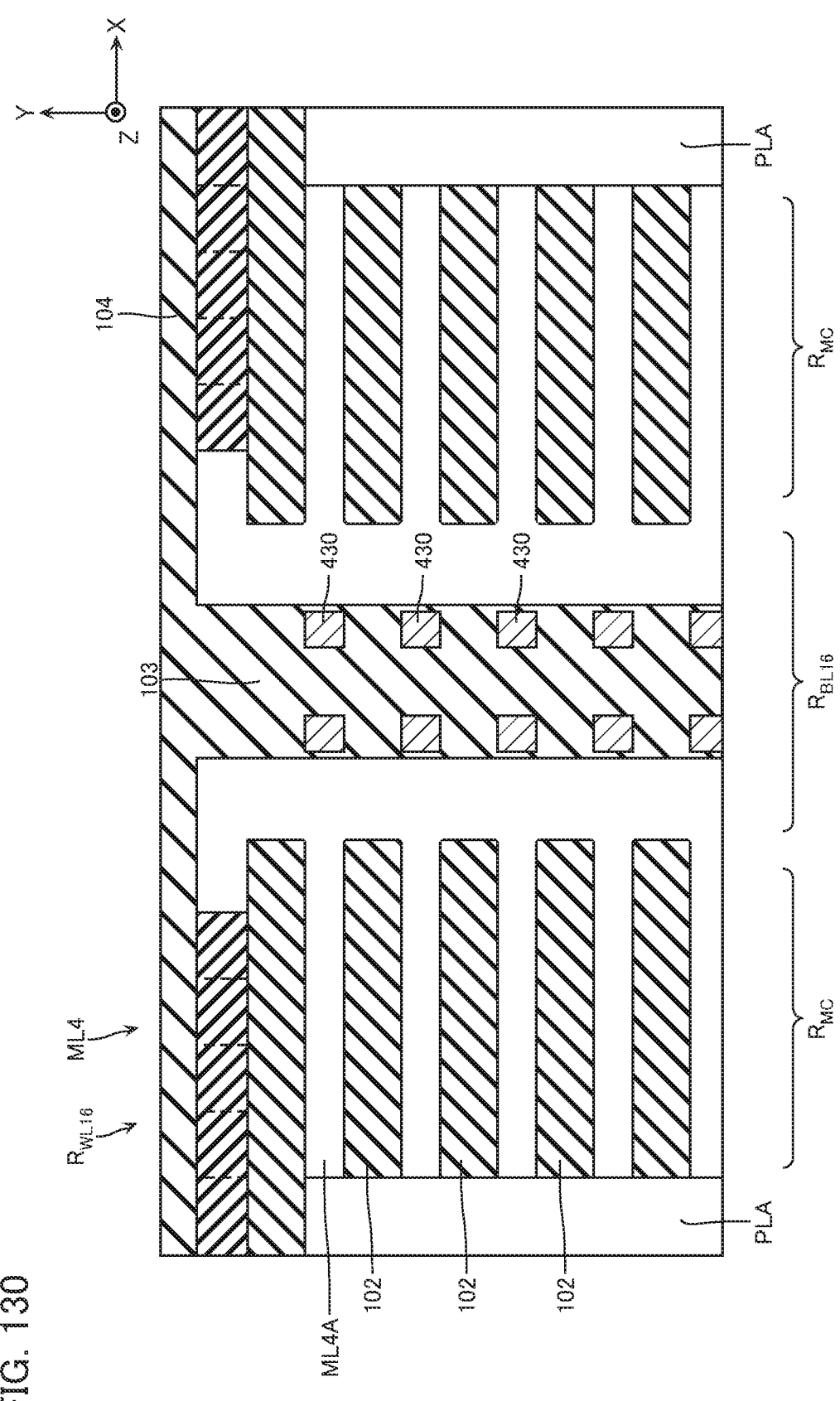
Figure 131:
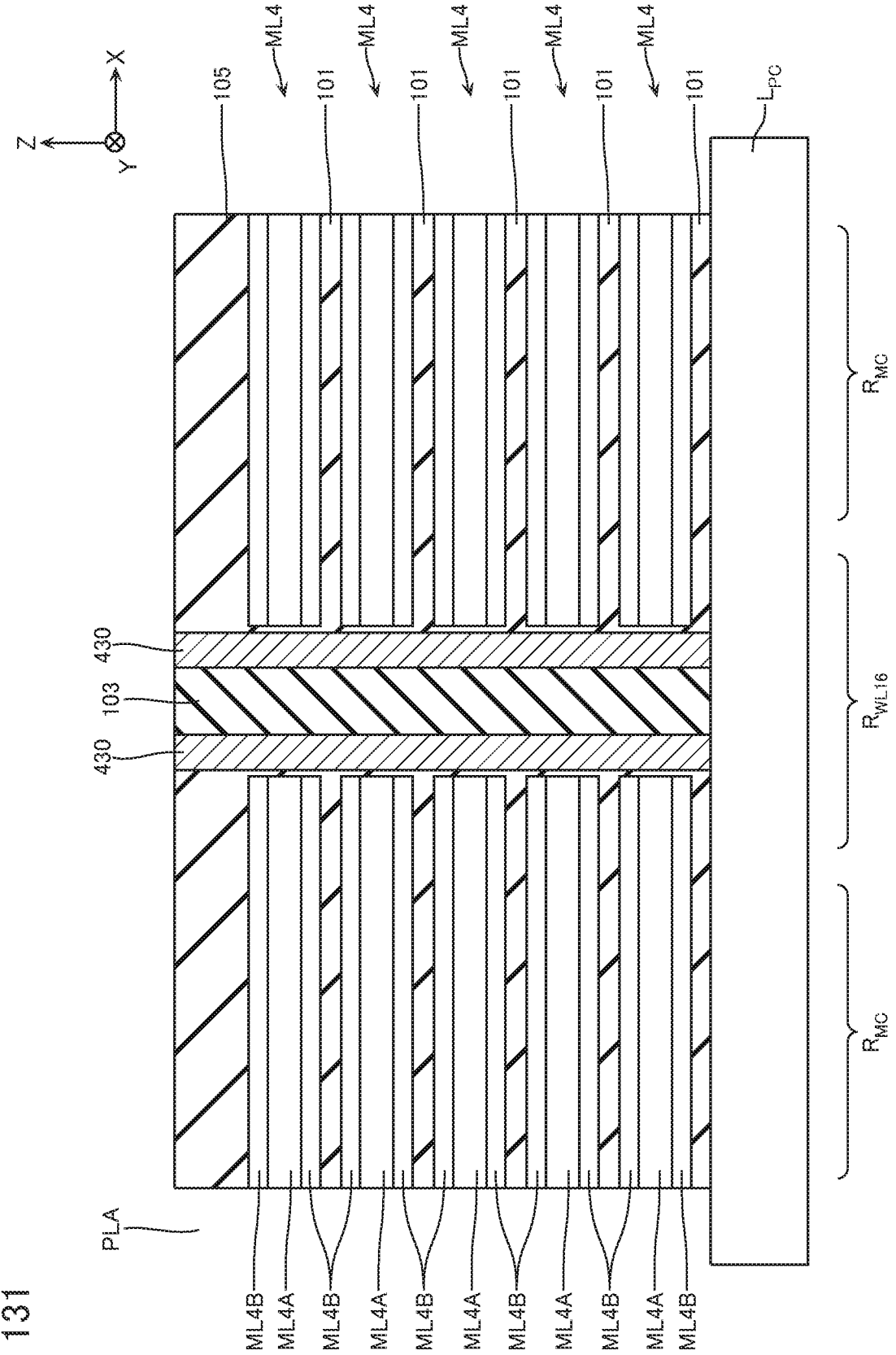
Figure 132:
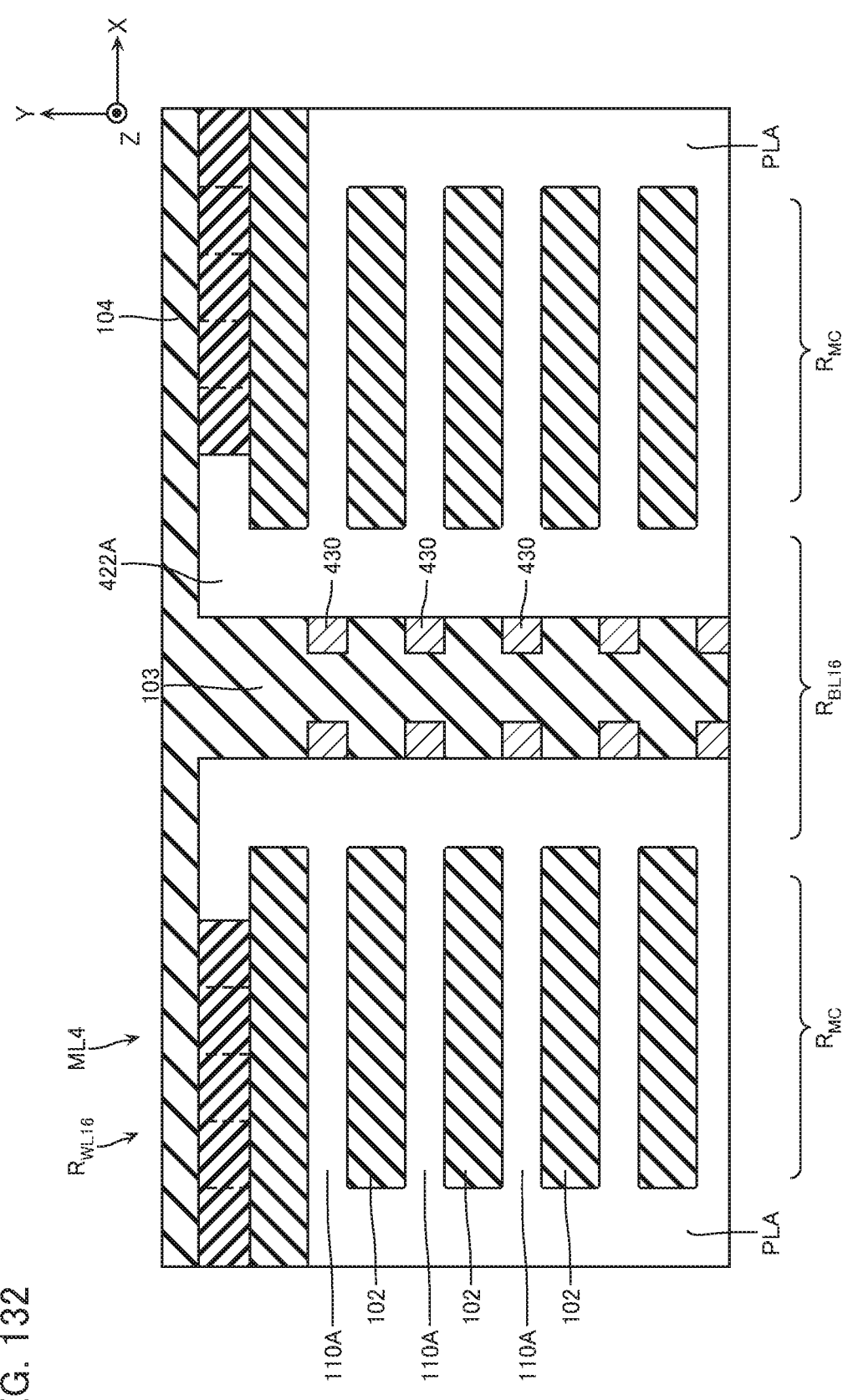
Figure 133:
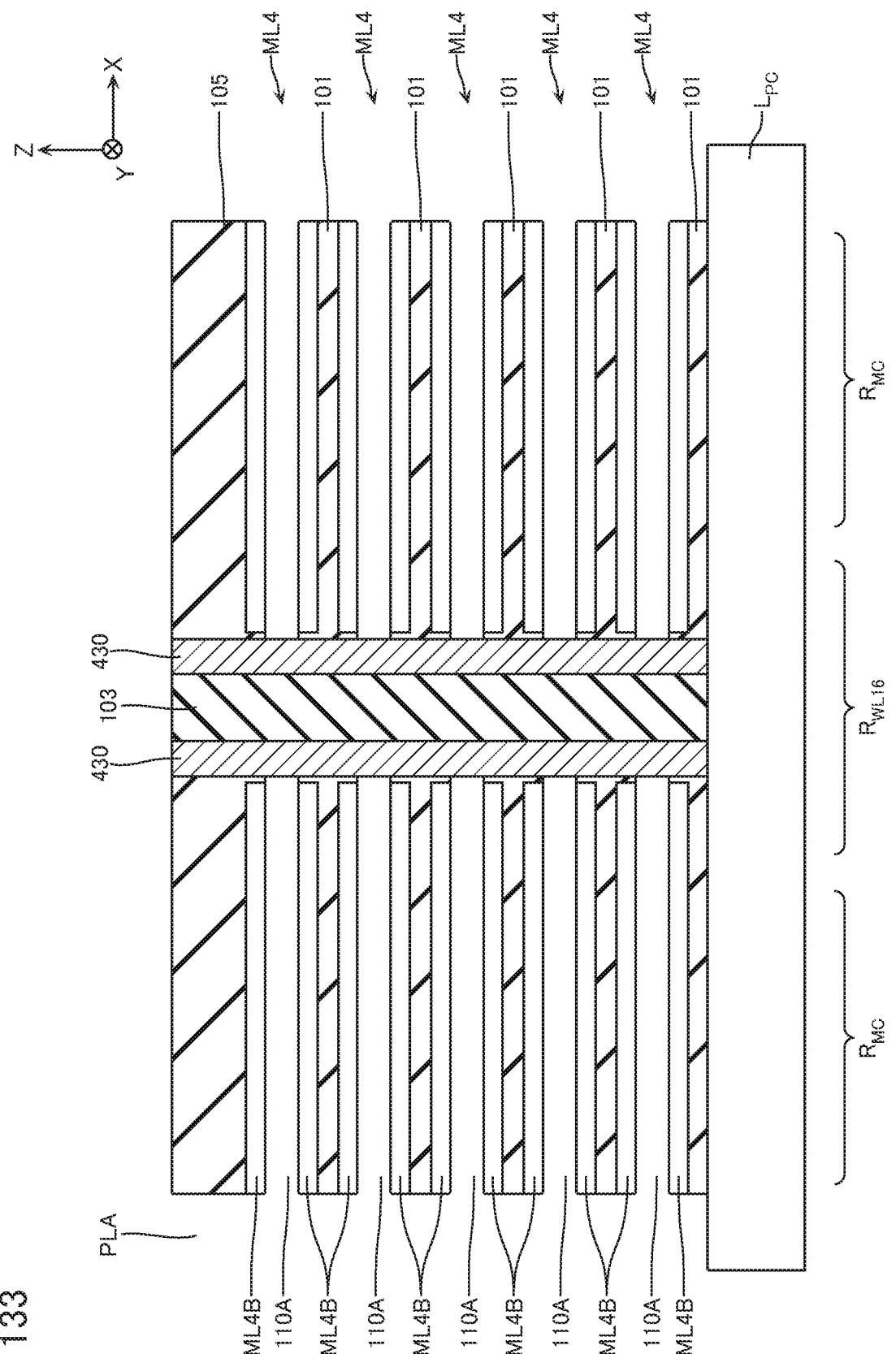
Figure 134:
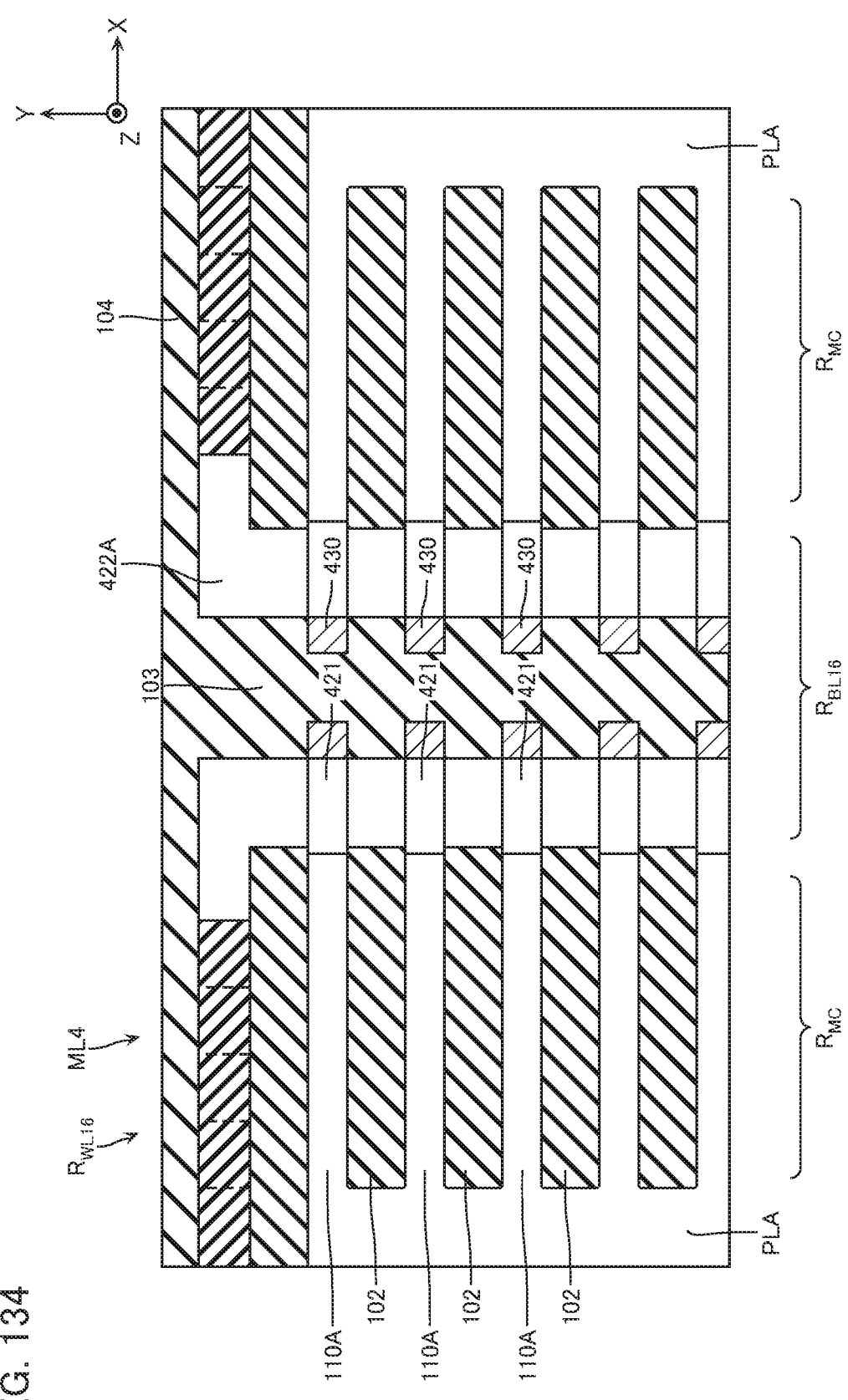
Figure 135:
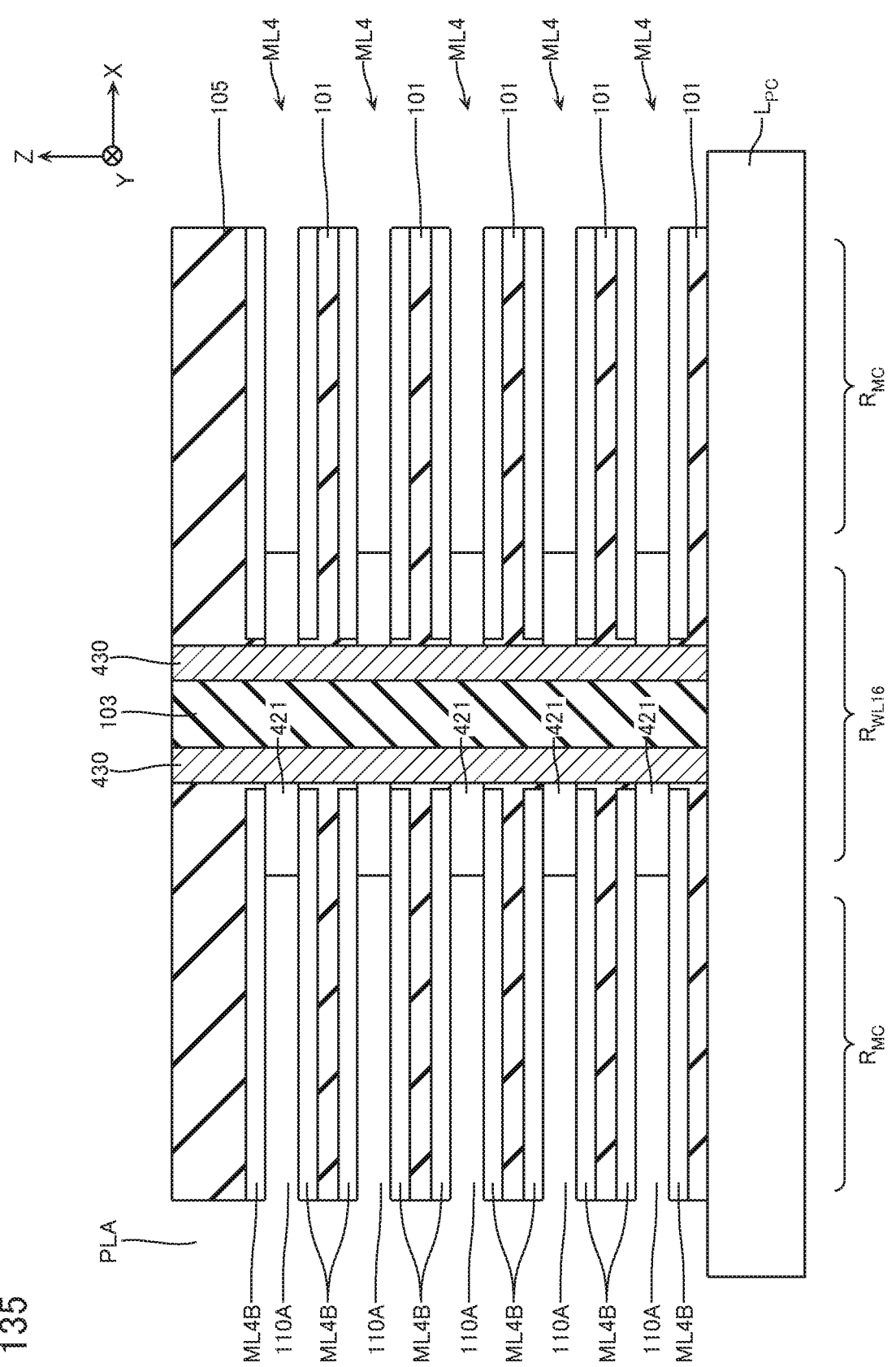
Figure 136:
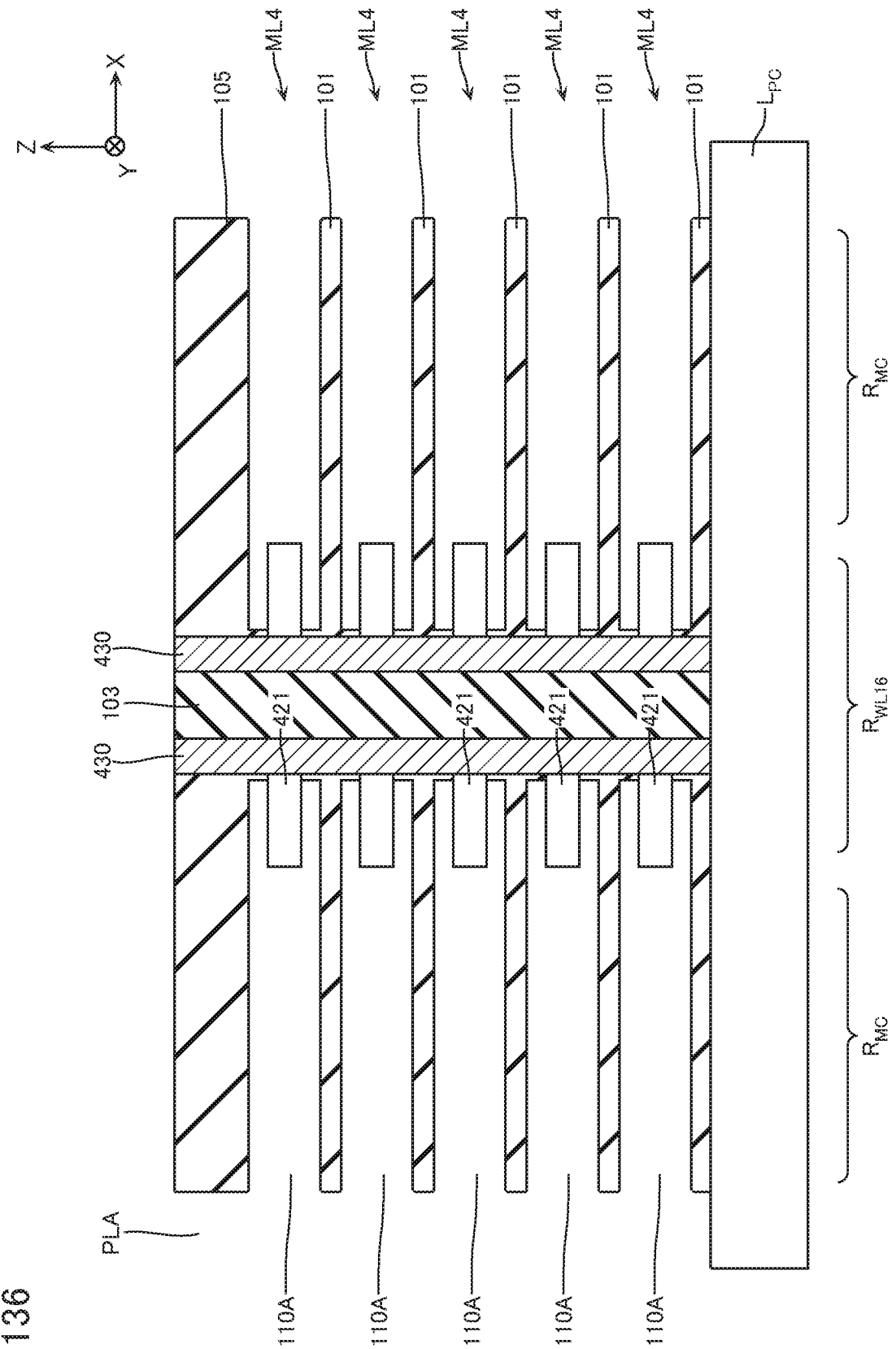
Figure 137:
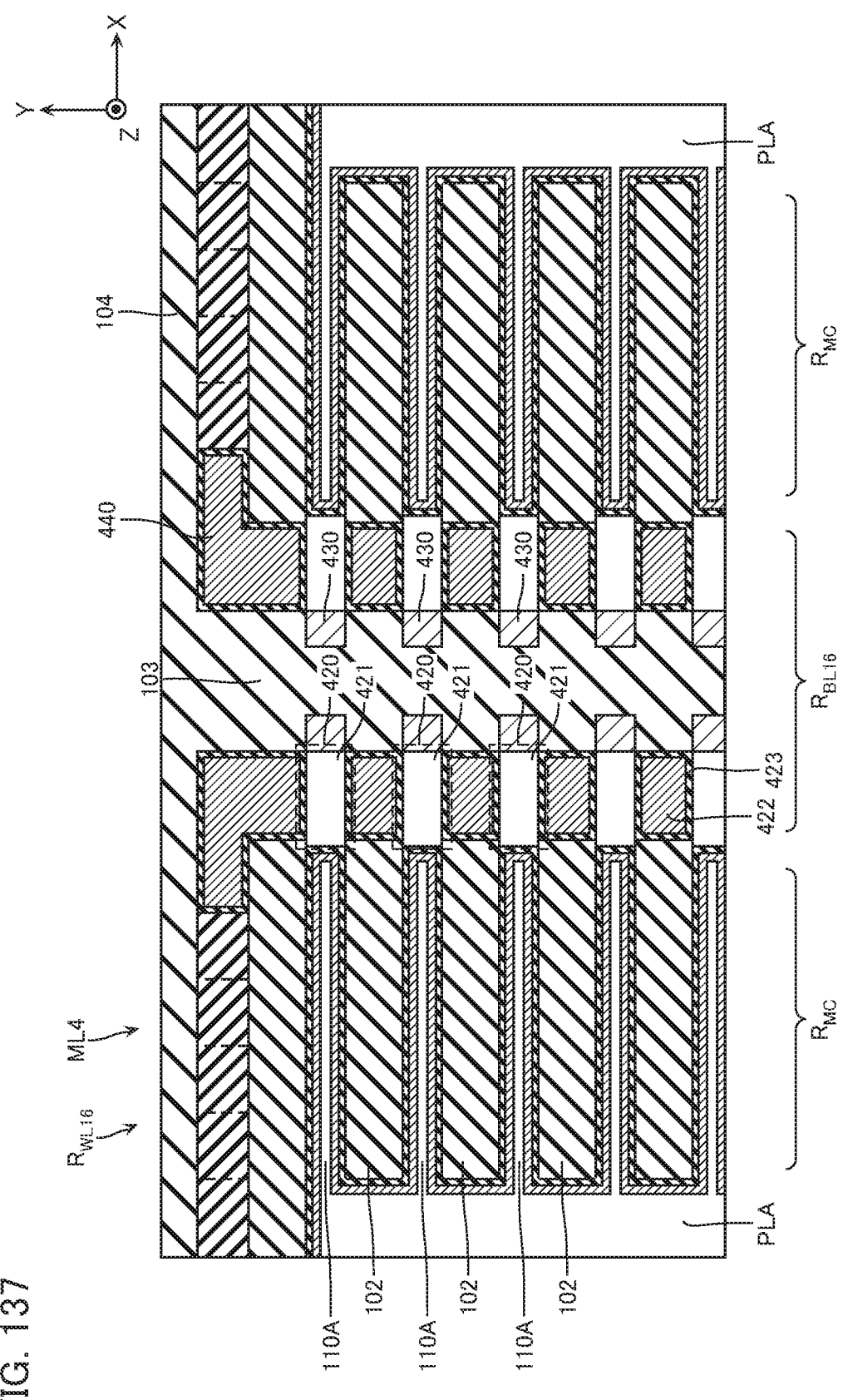
Figure 138:
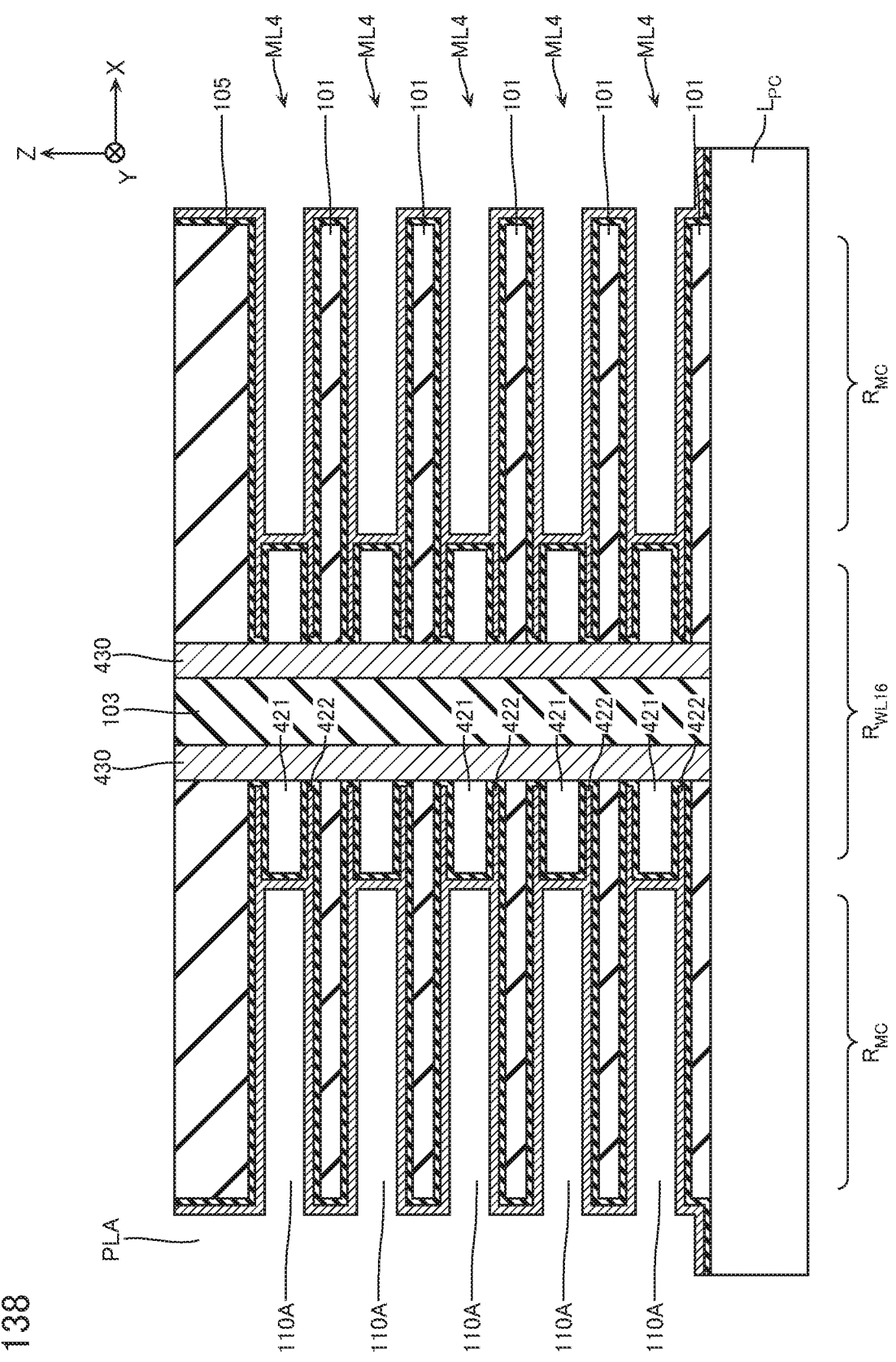
Figure 139:
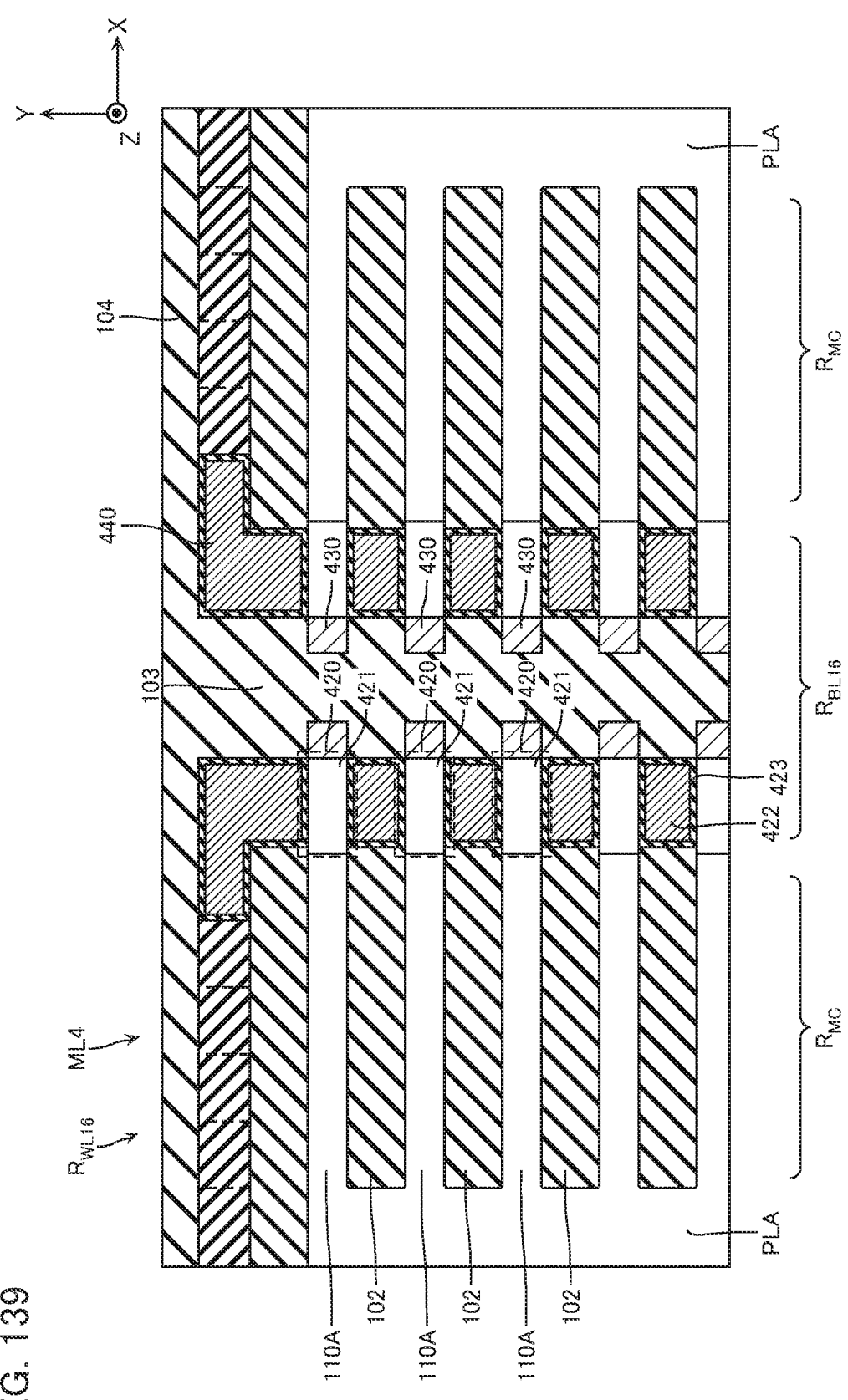
Figure 140:
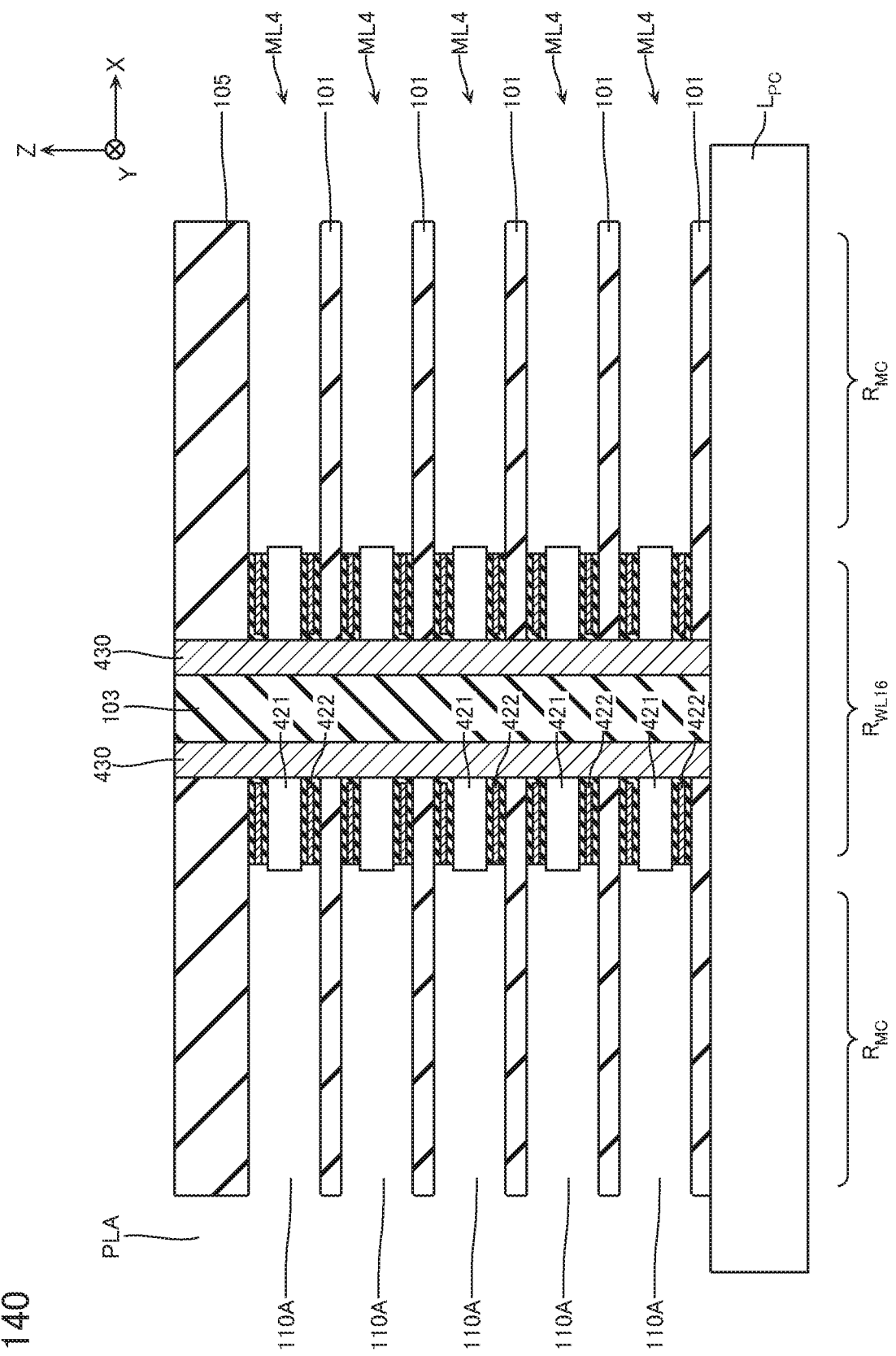
Figure 141:
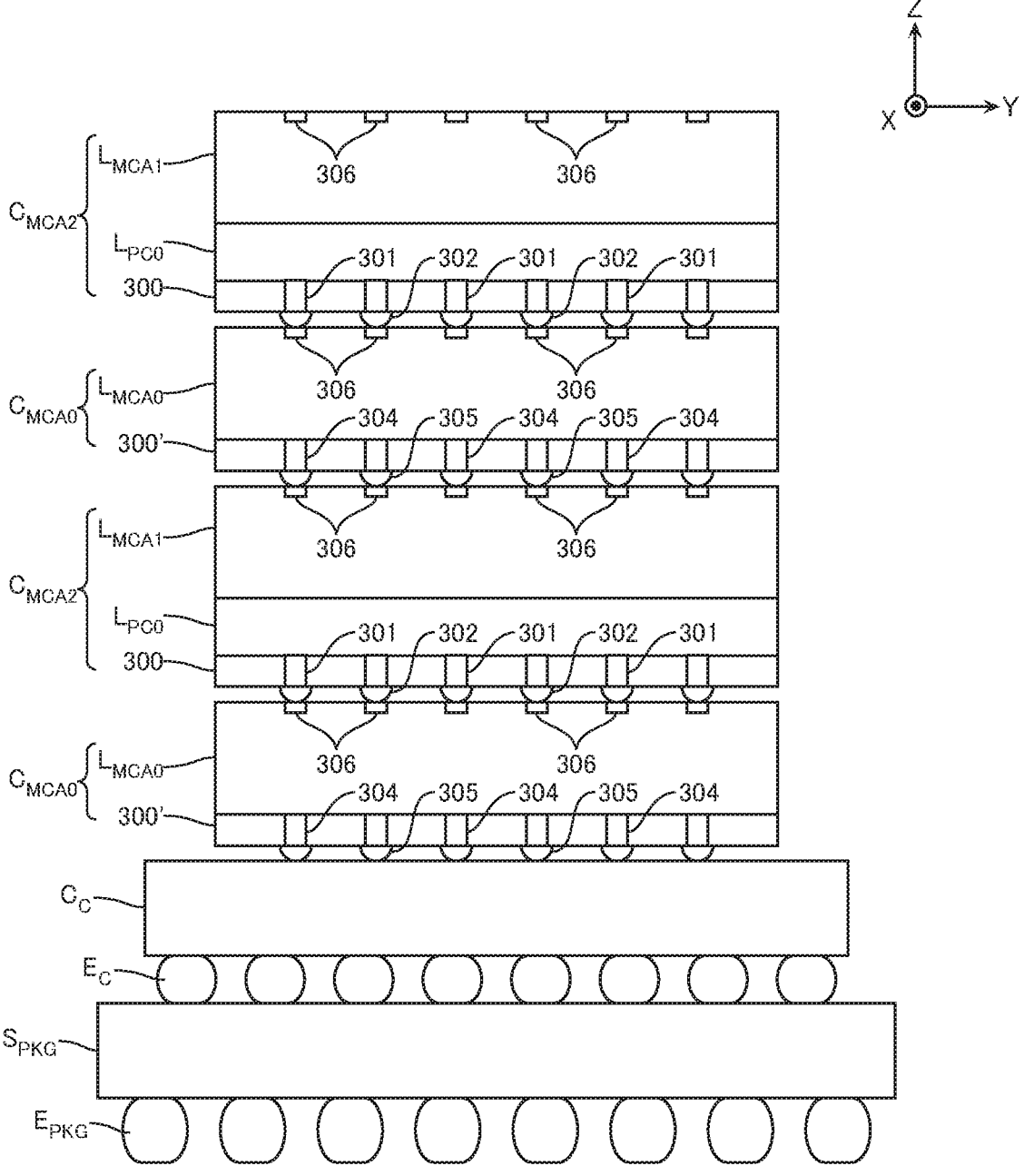
Figure 142:
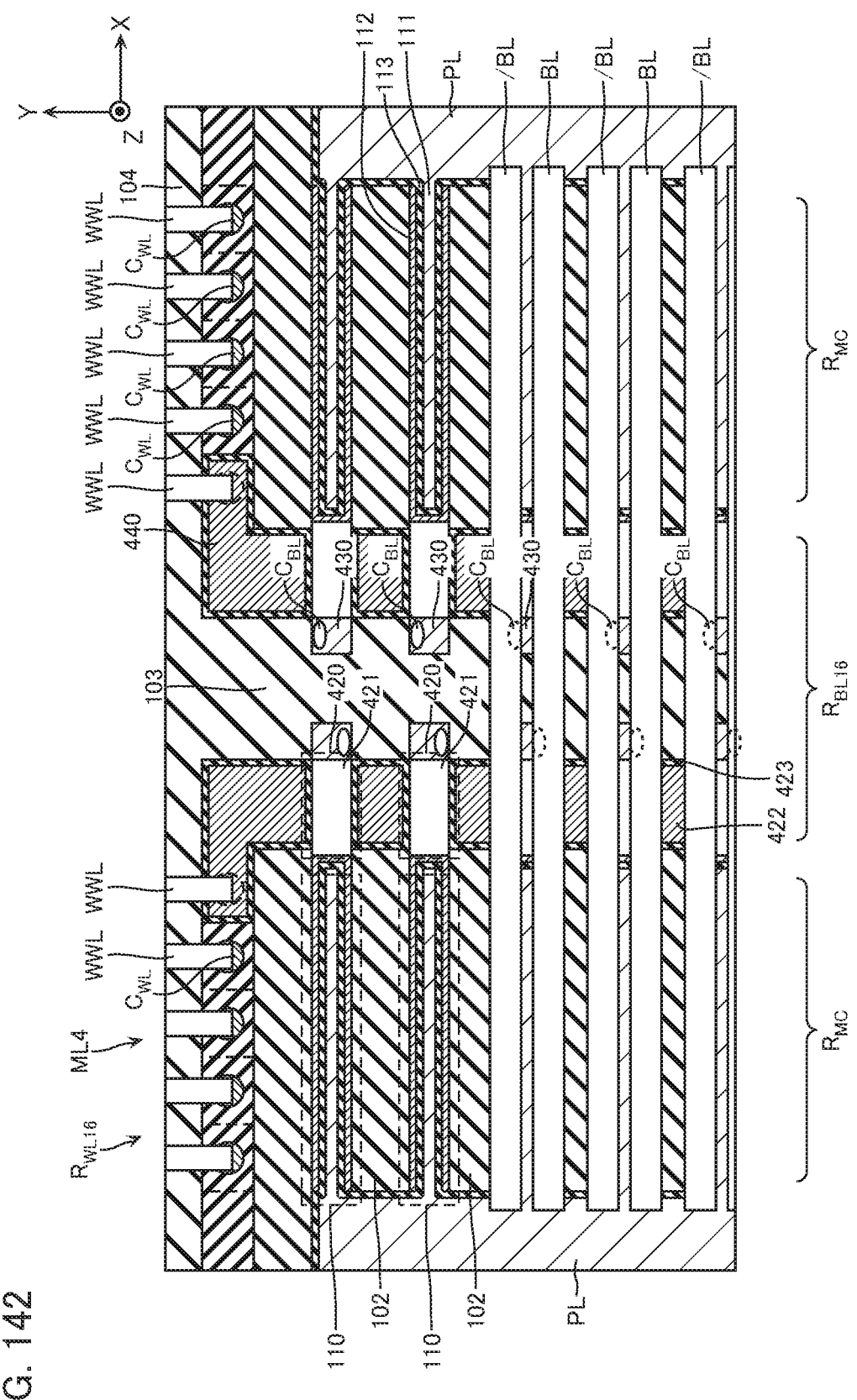
Figure 143:
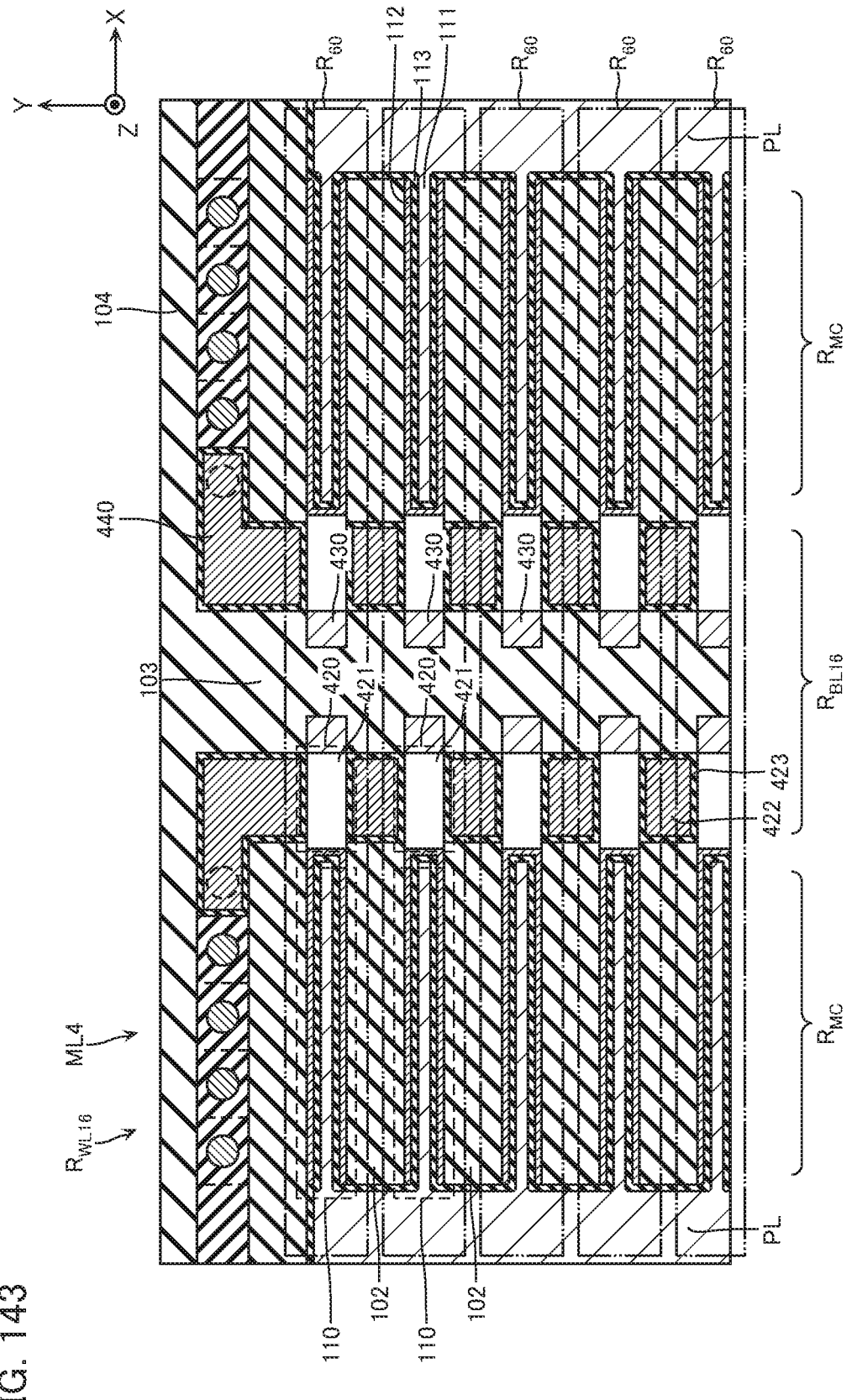
Figure 144:
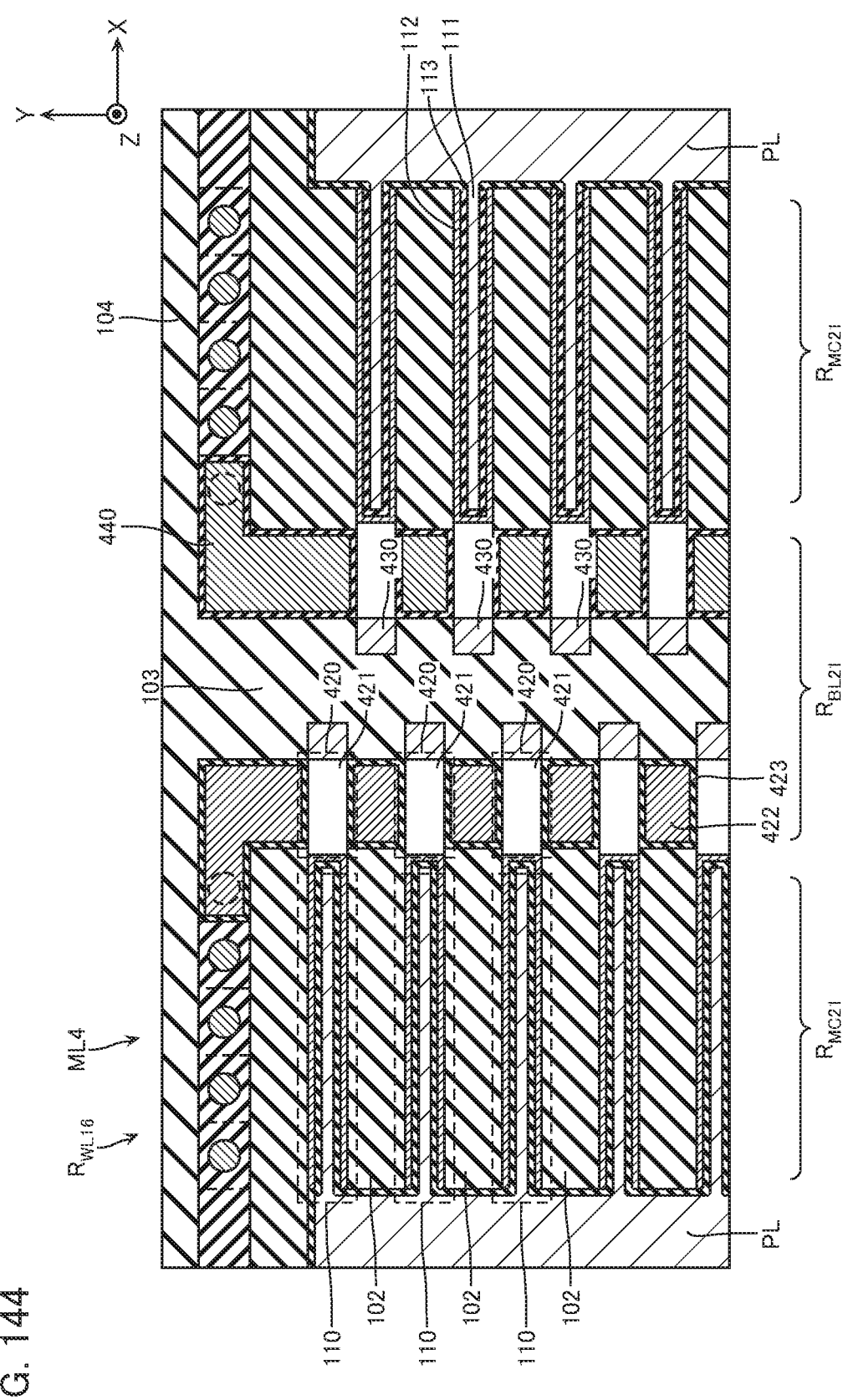
Figure 145:
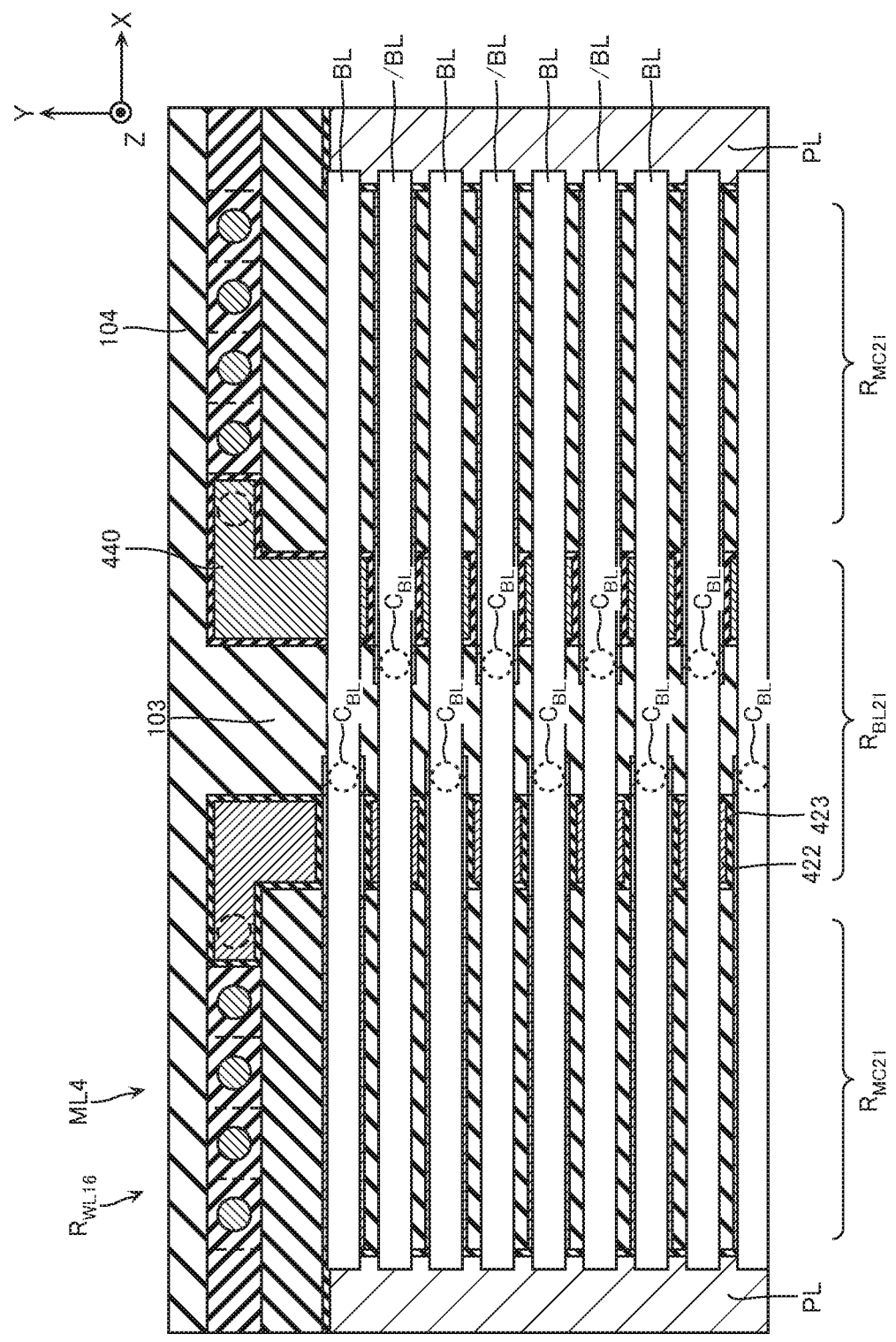
Figure 146:
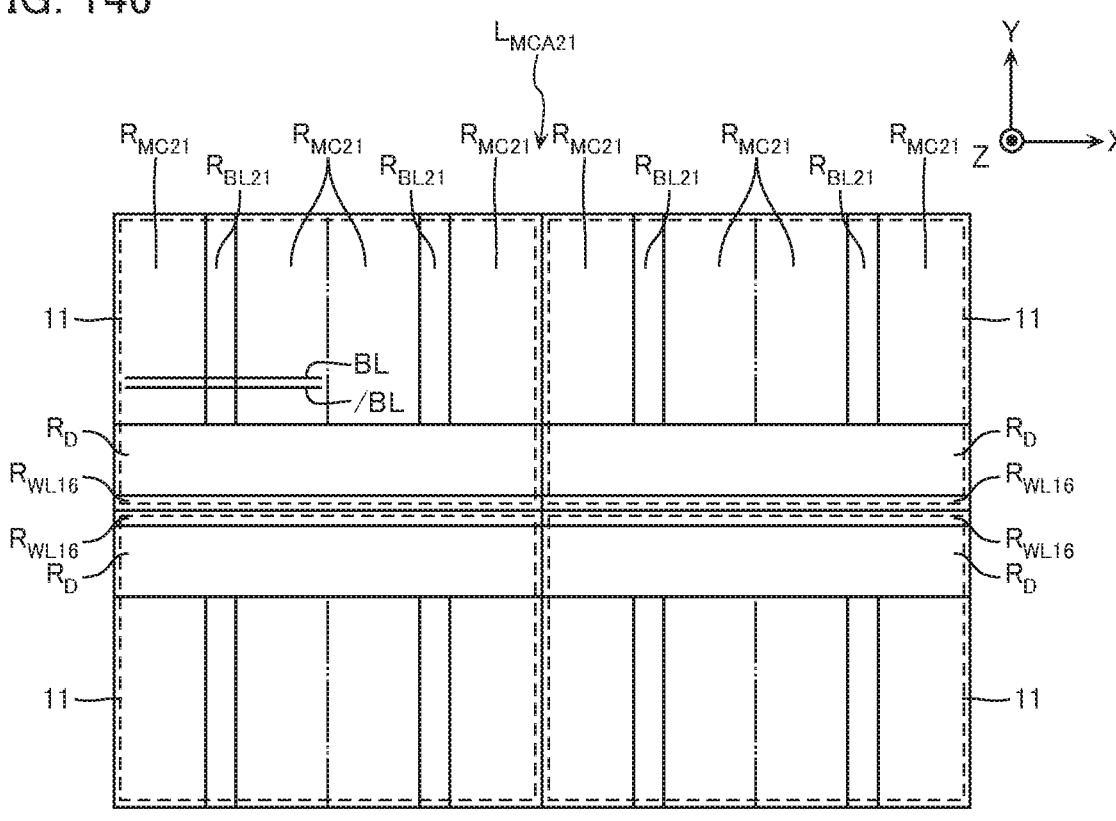
Figure 147:
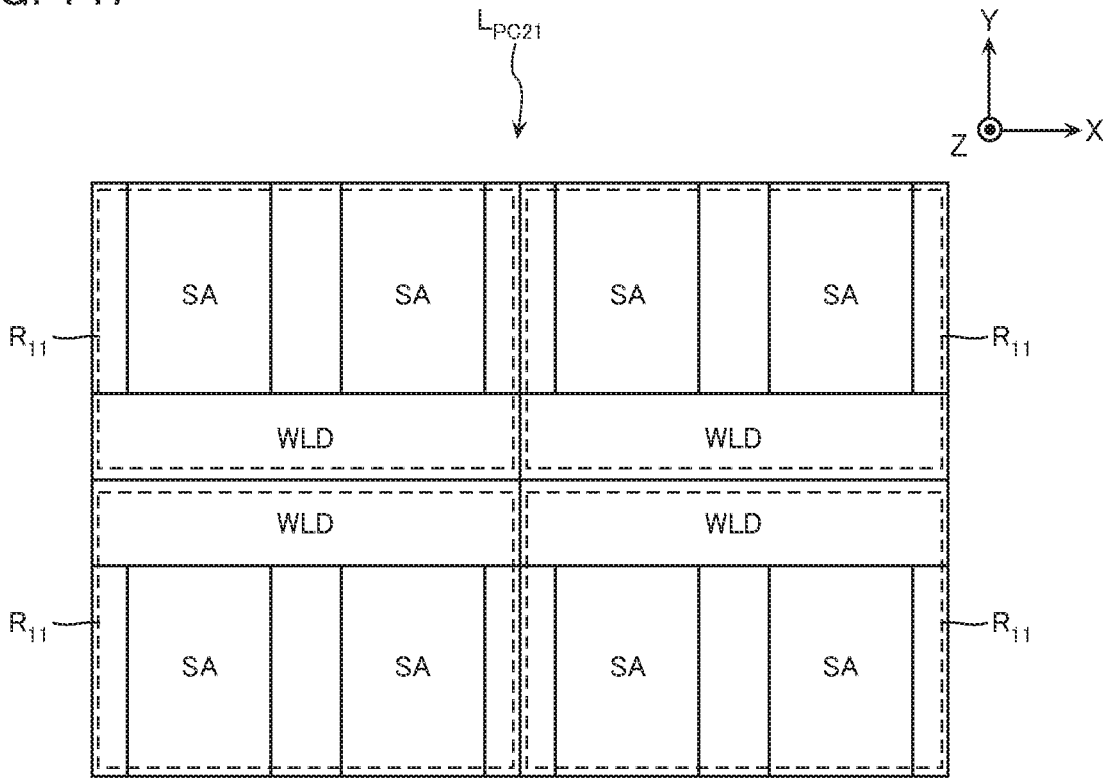
Figure 148:
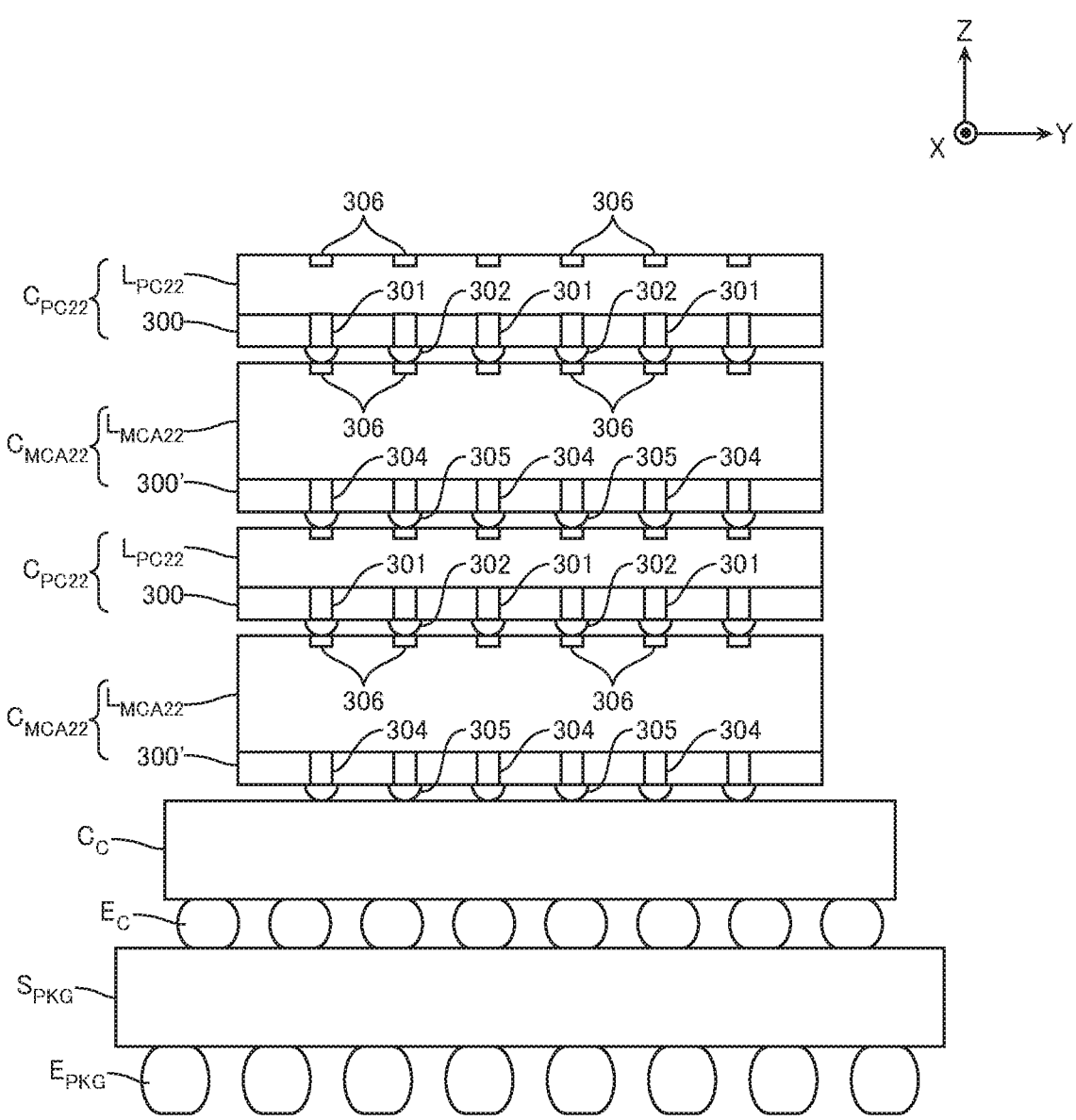
Figure 149:
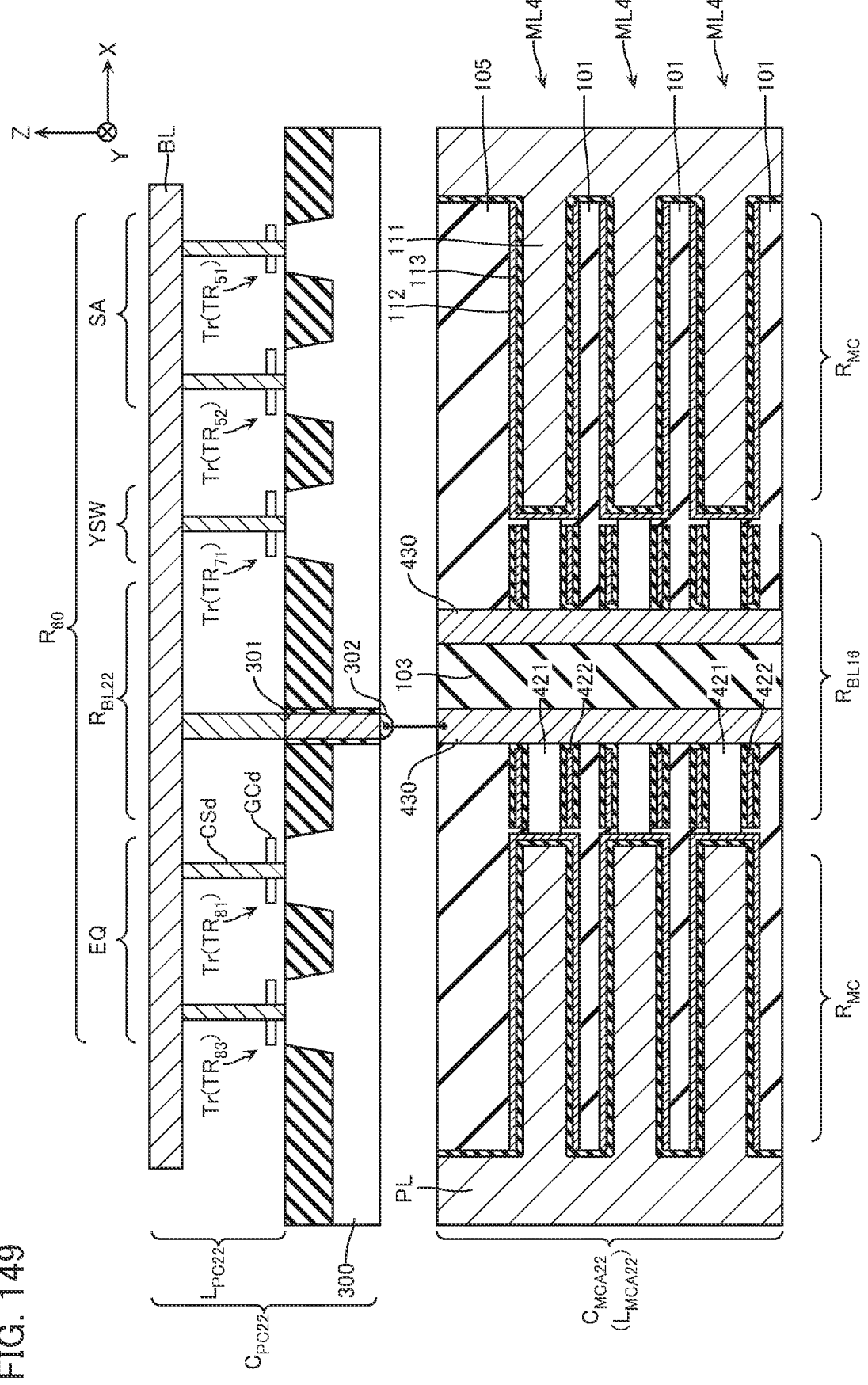
Figure 150:
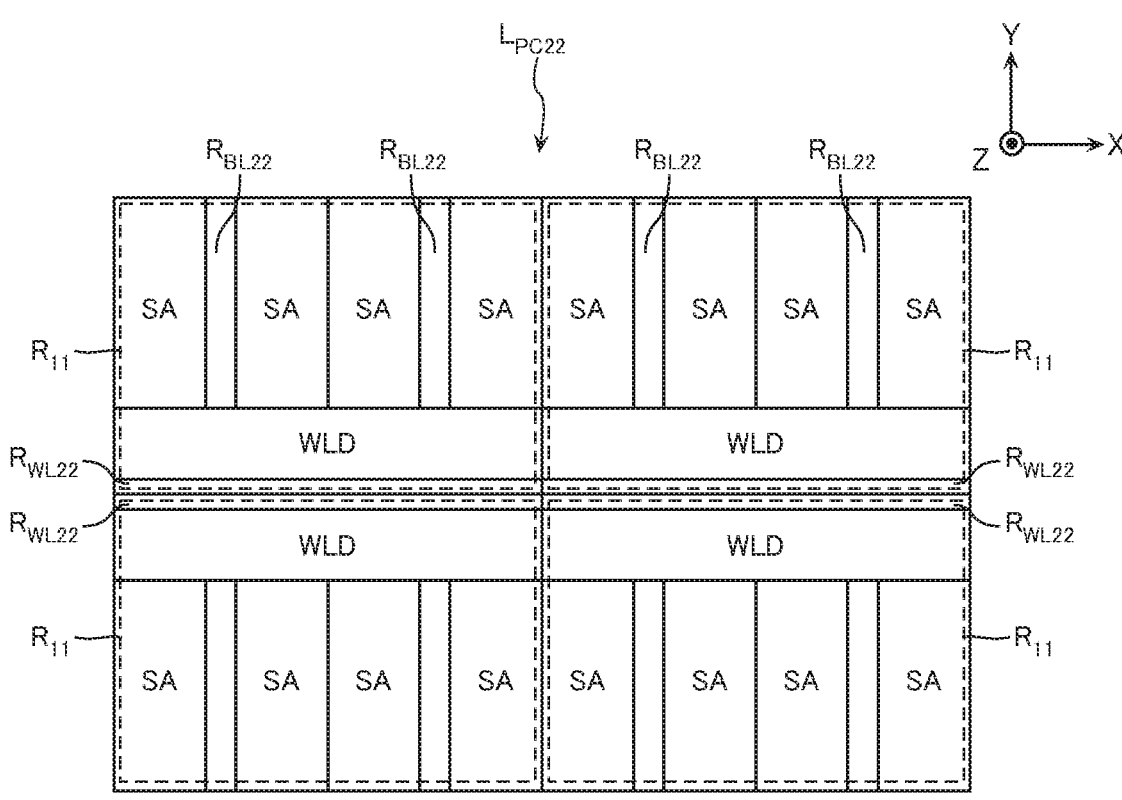
Figure 151:
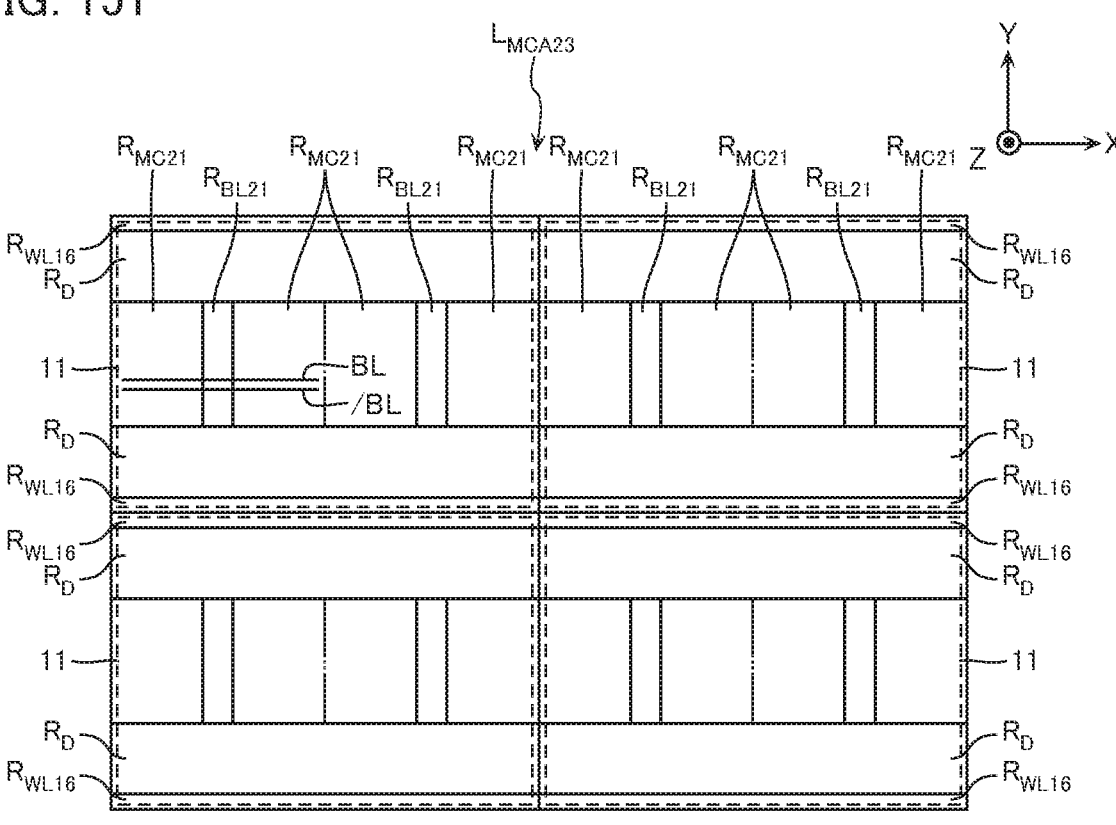
Figure 152:
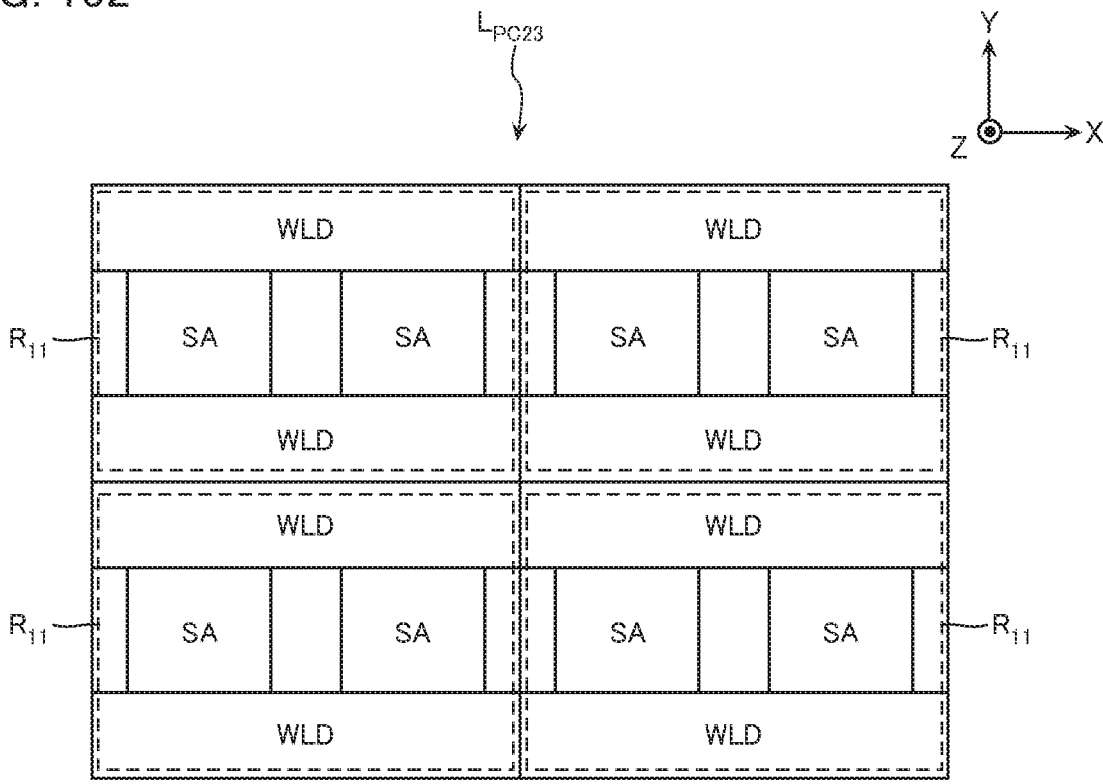
Figure 153:
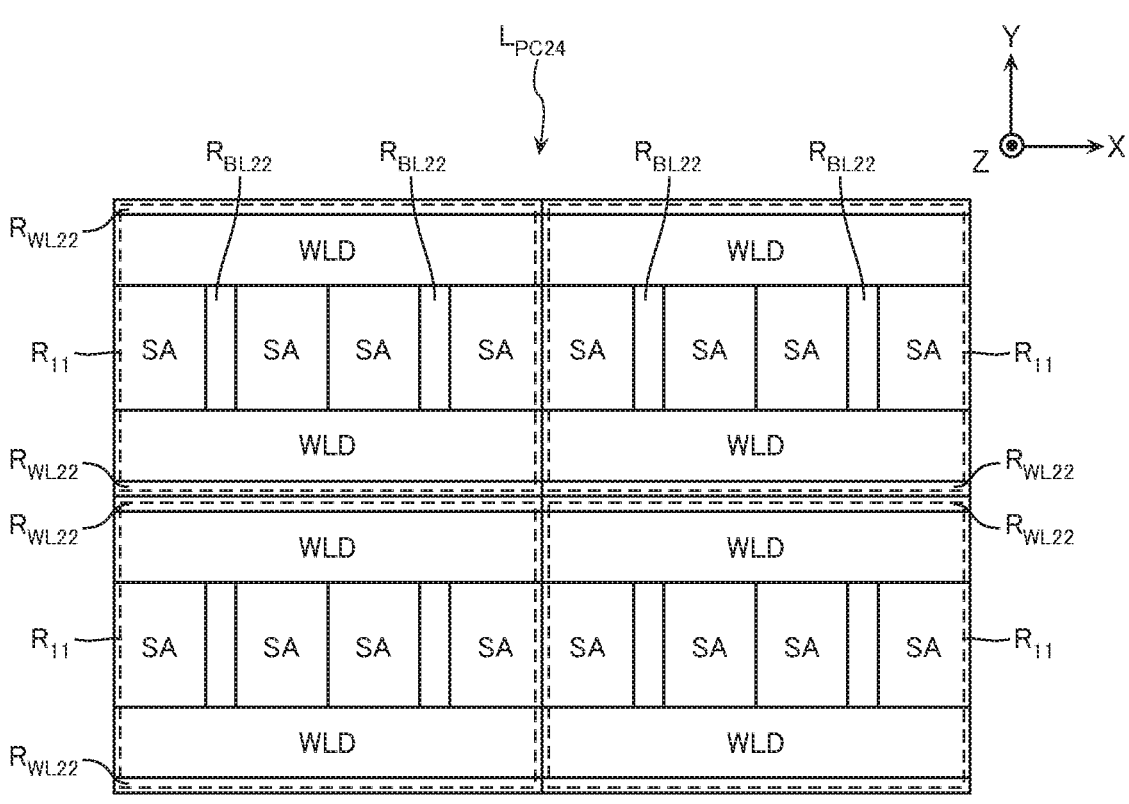
Figure 154:
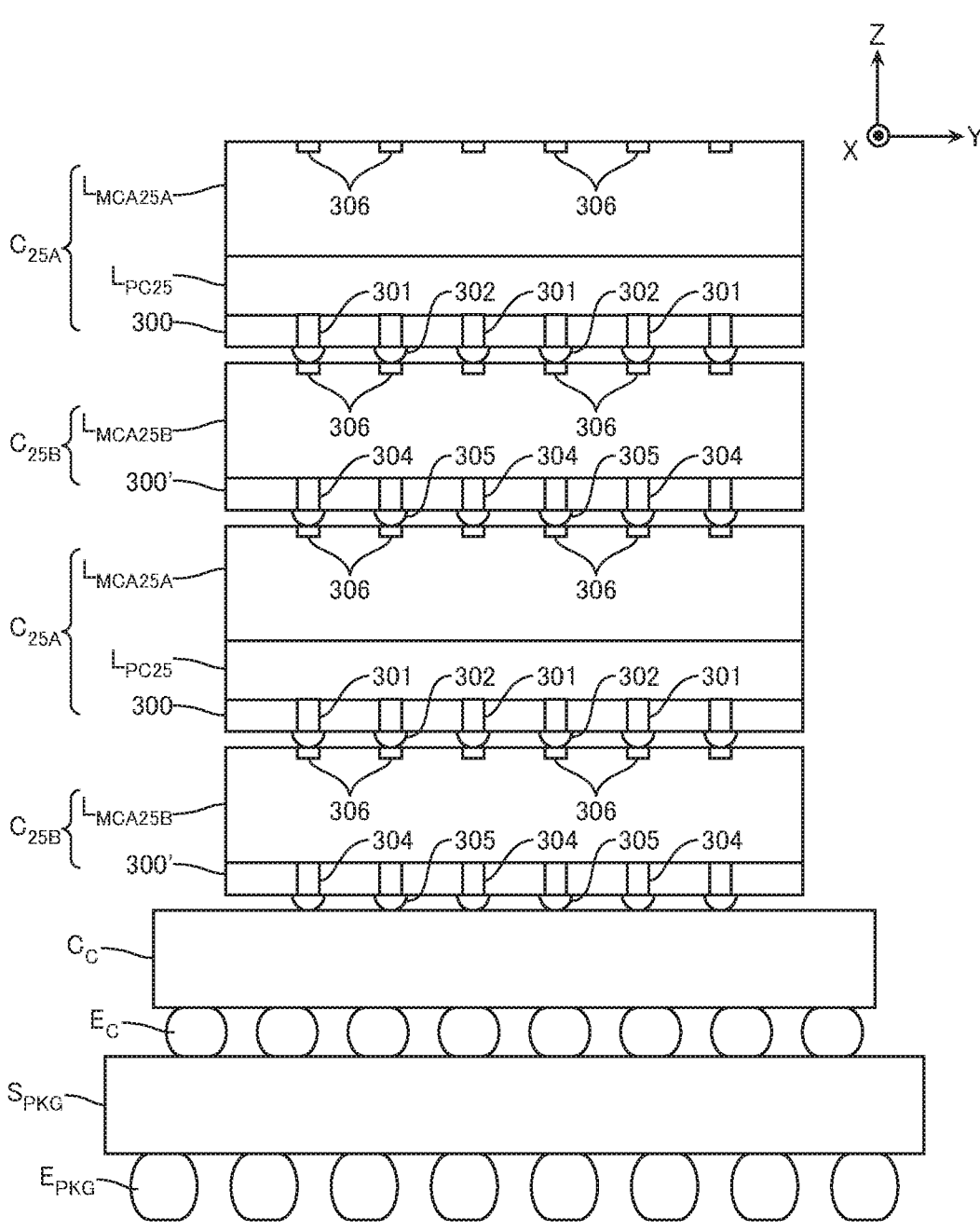
Figure 155:
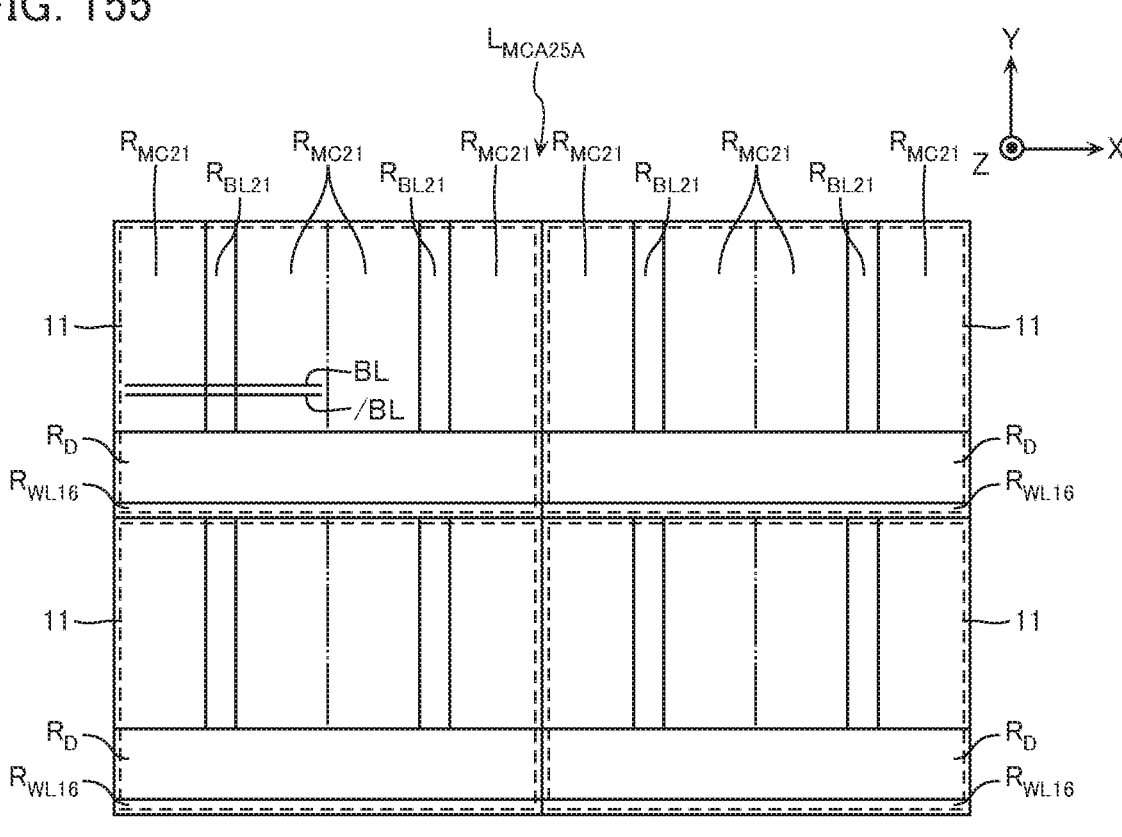
Figure 156:
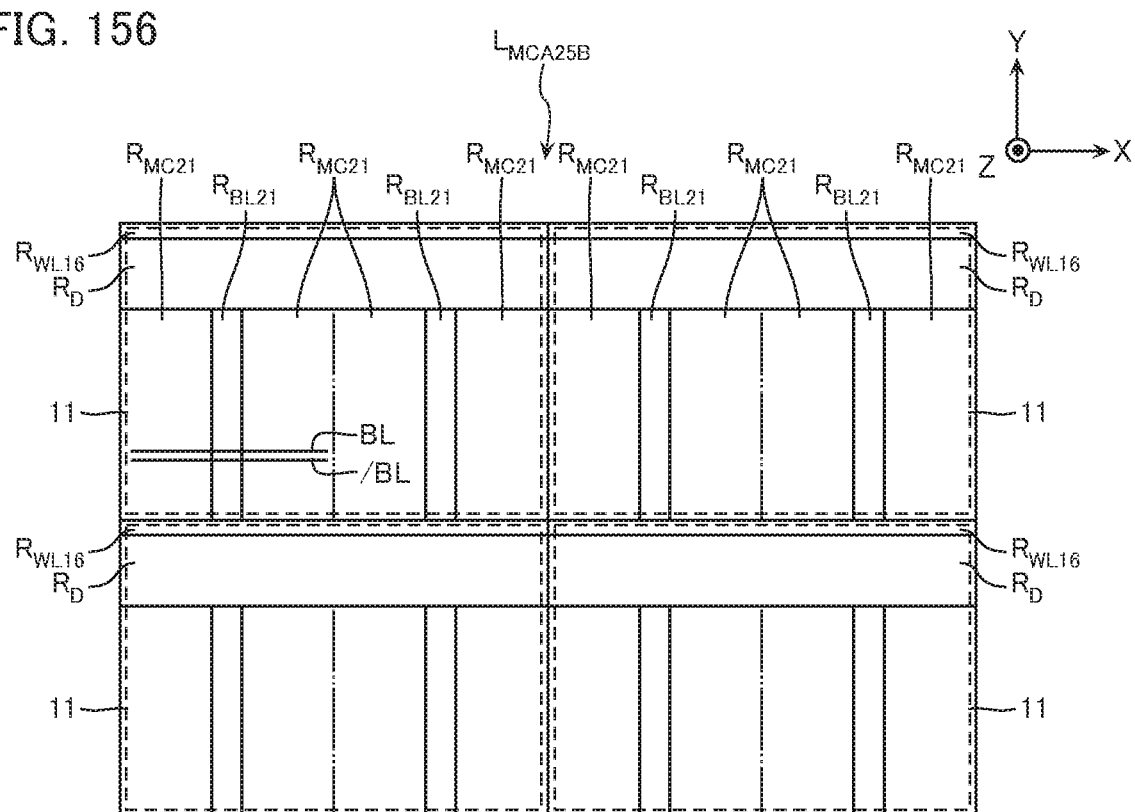
Figure 157:
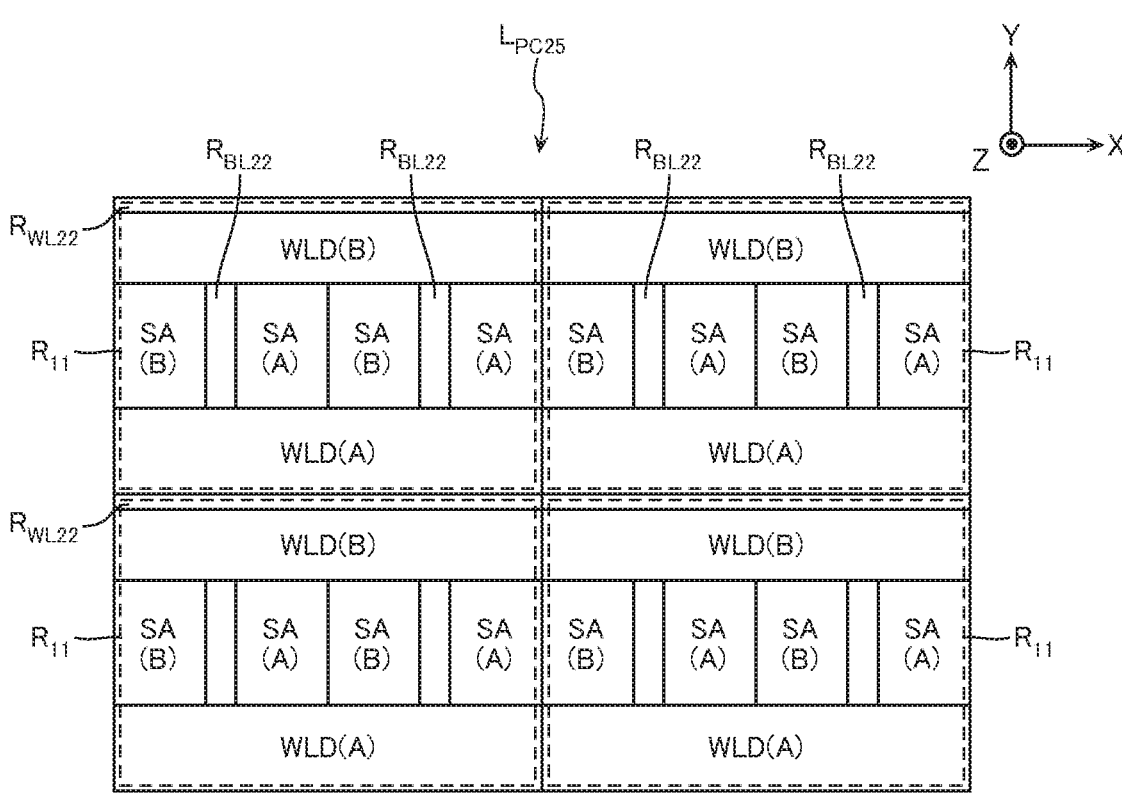
Figure 158:
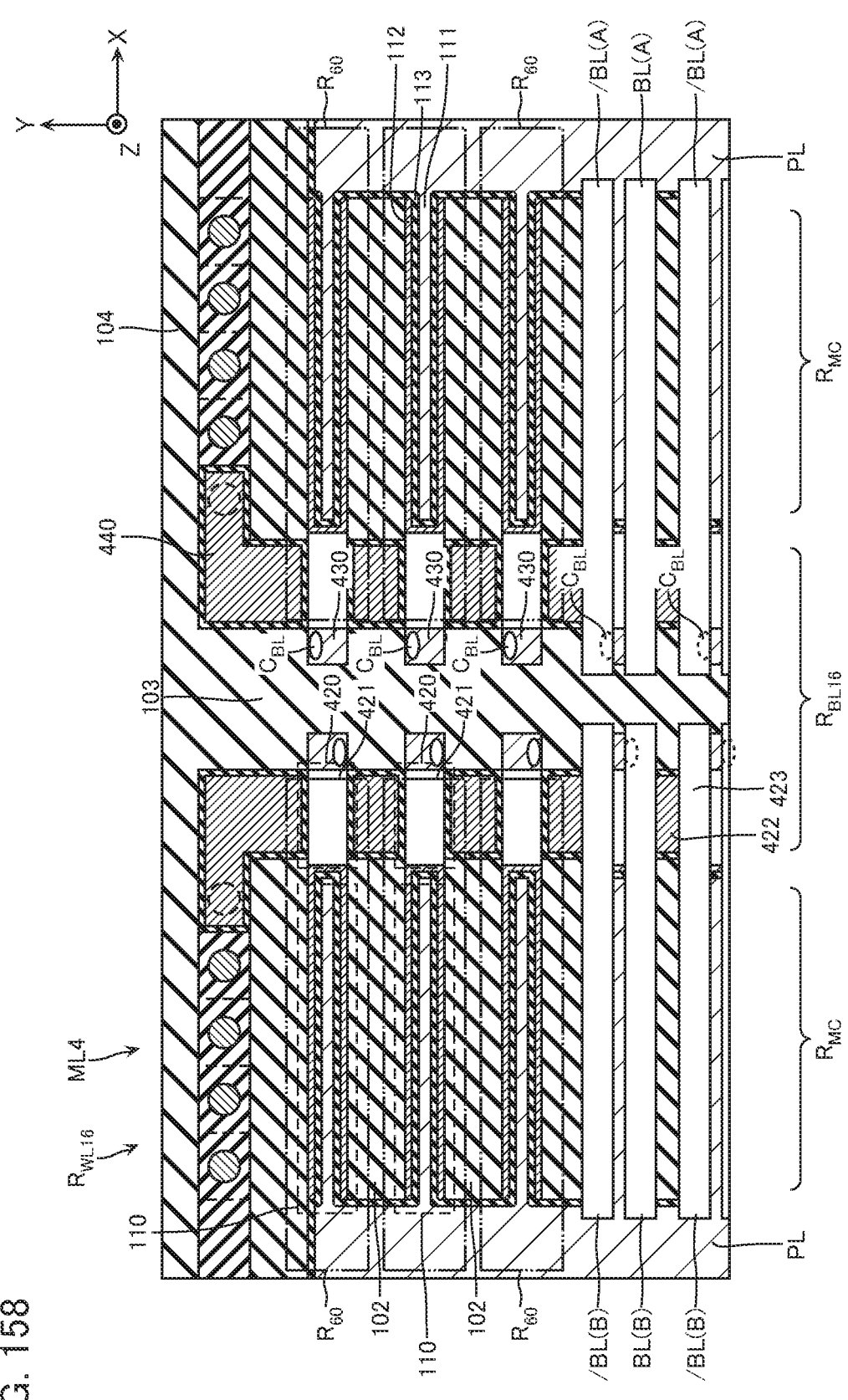
Figure 159:
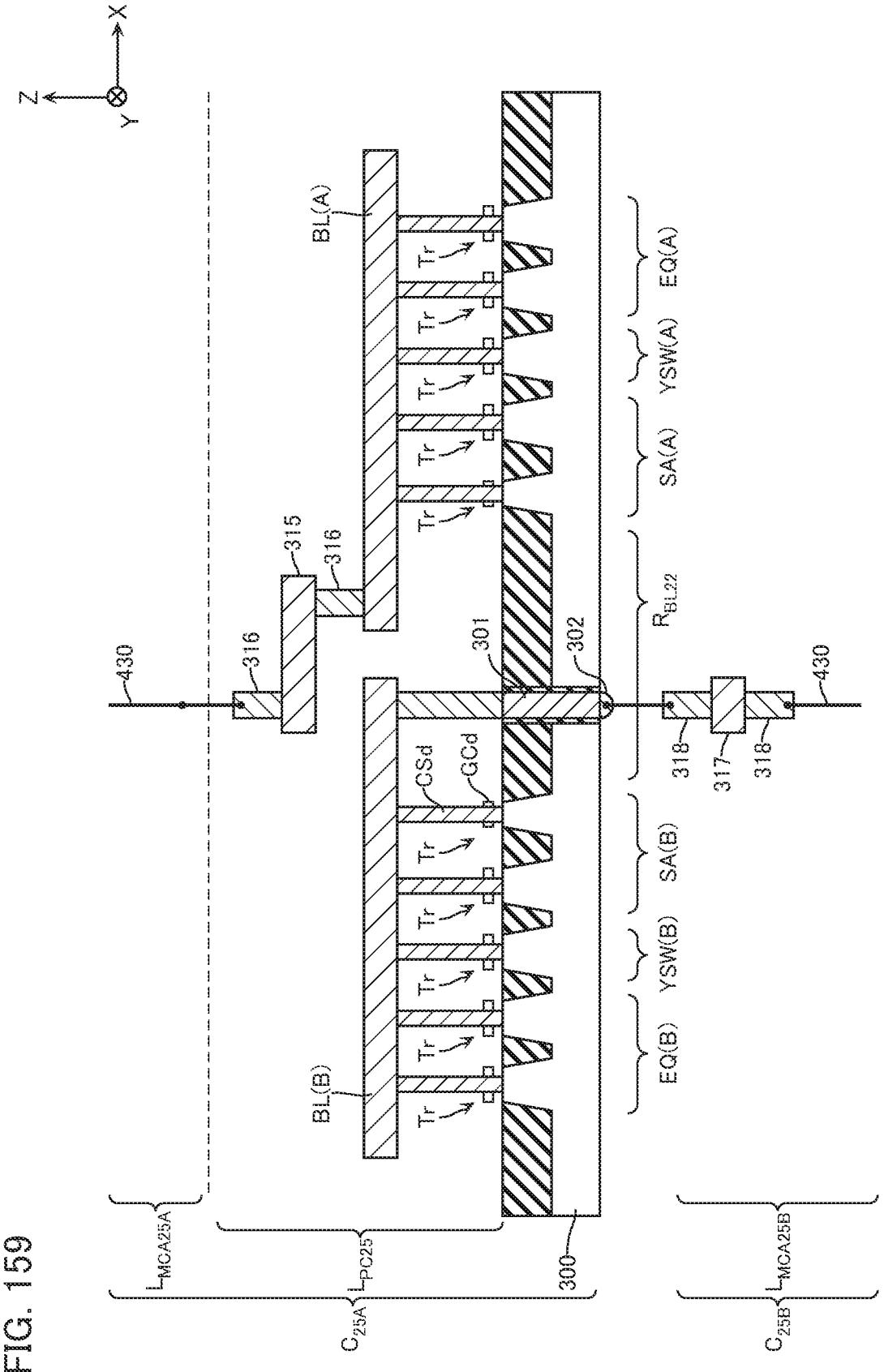
Figure 160:
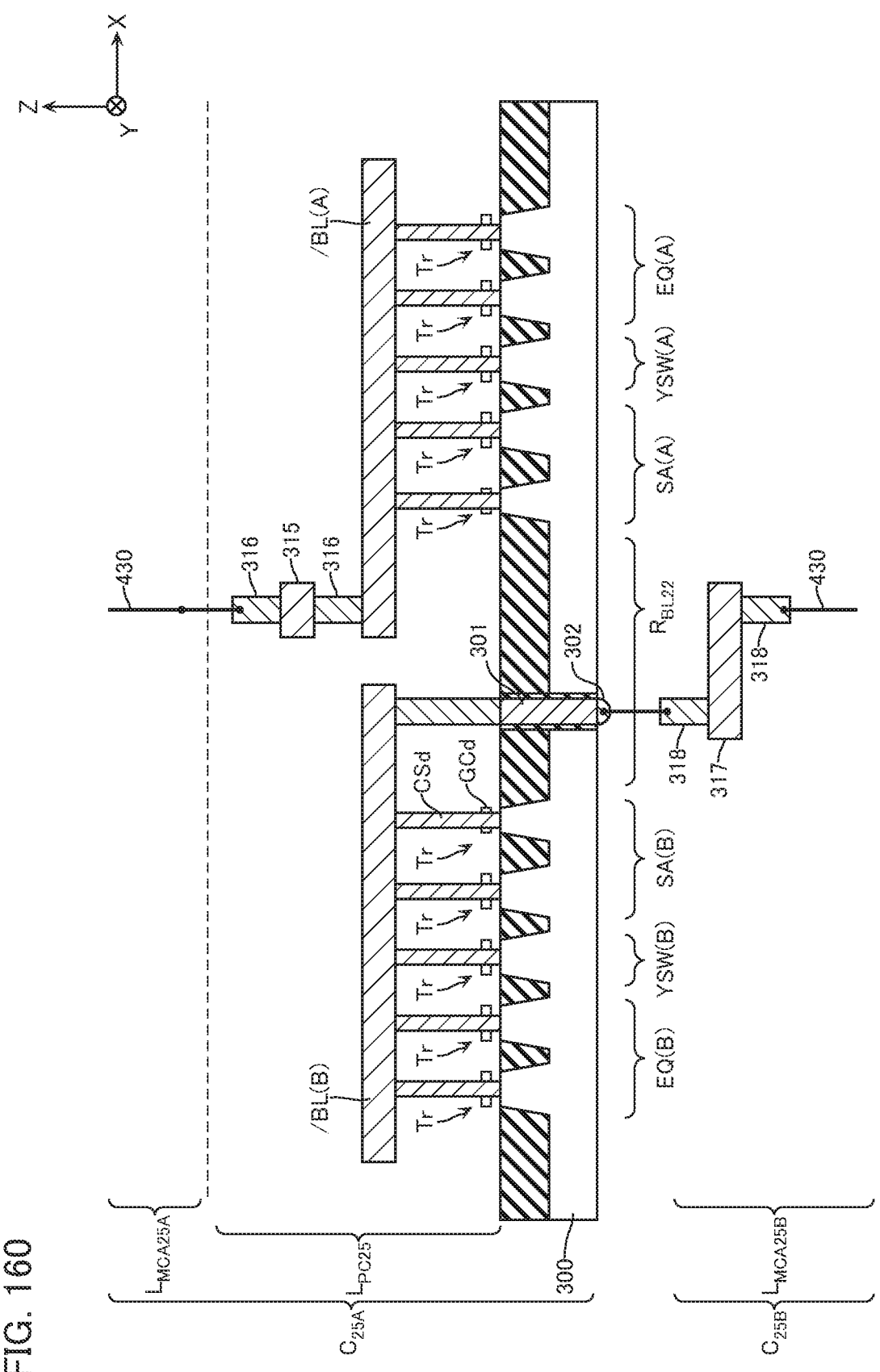
Figure 161:
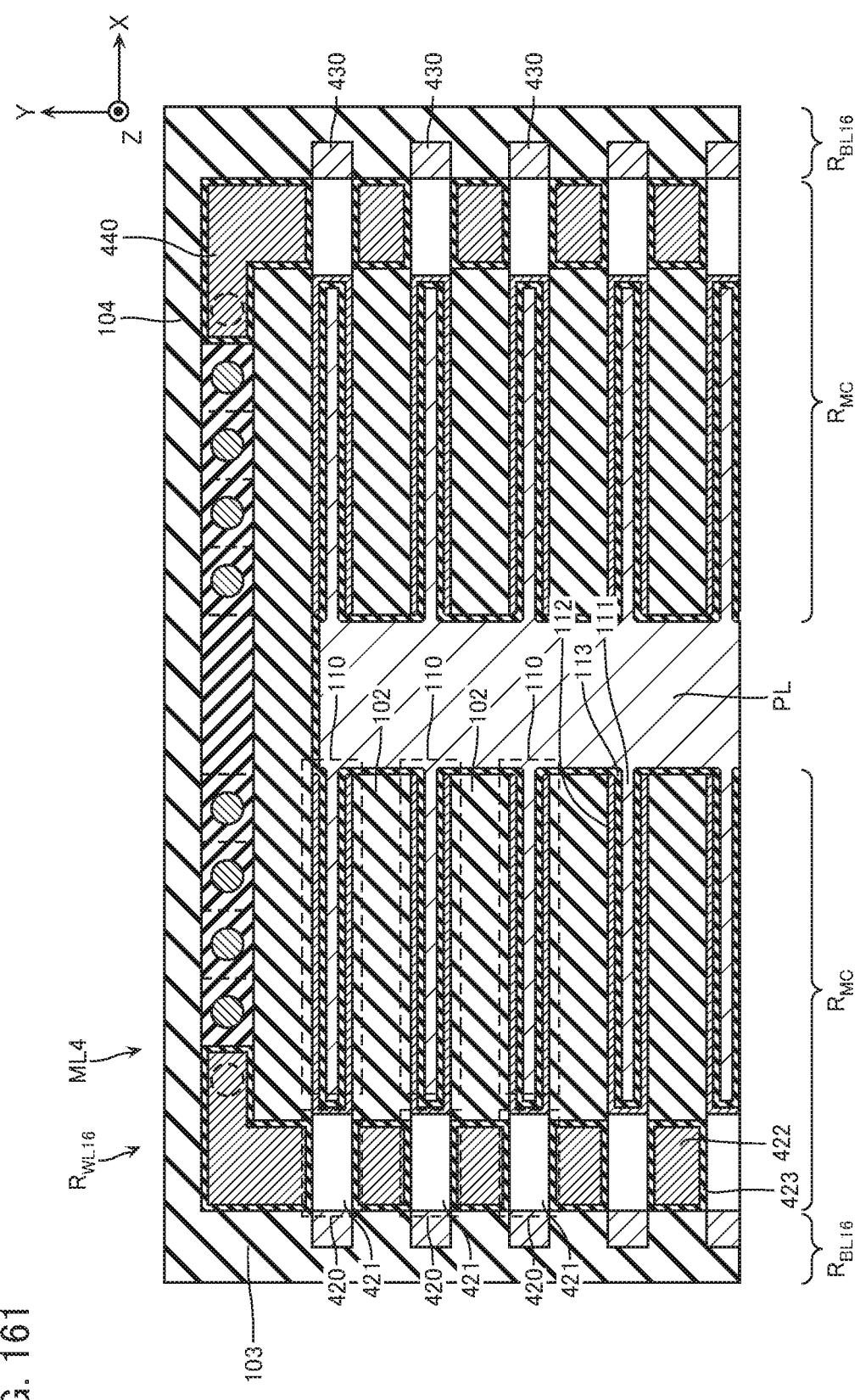
Figure 162:
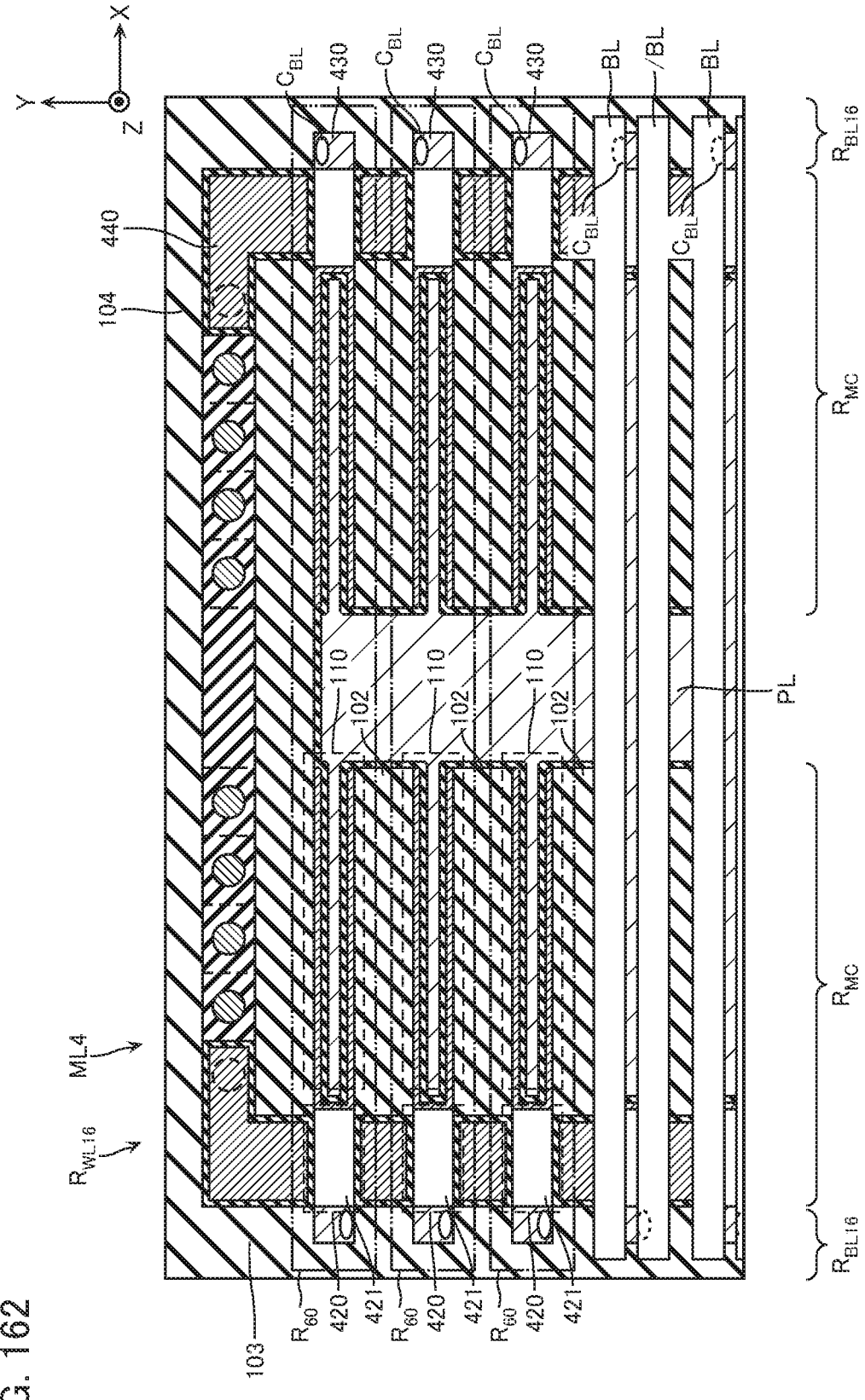
Figure 163:
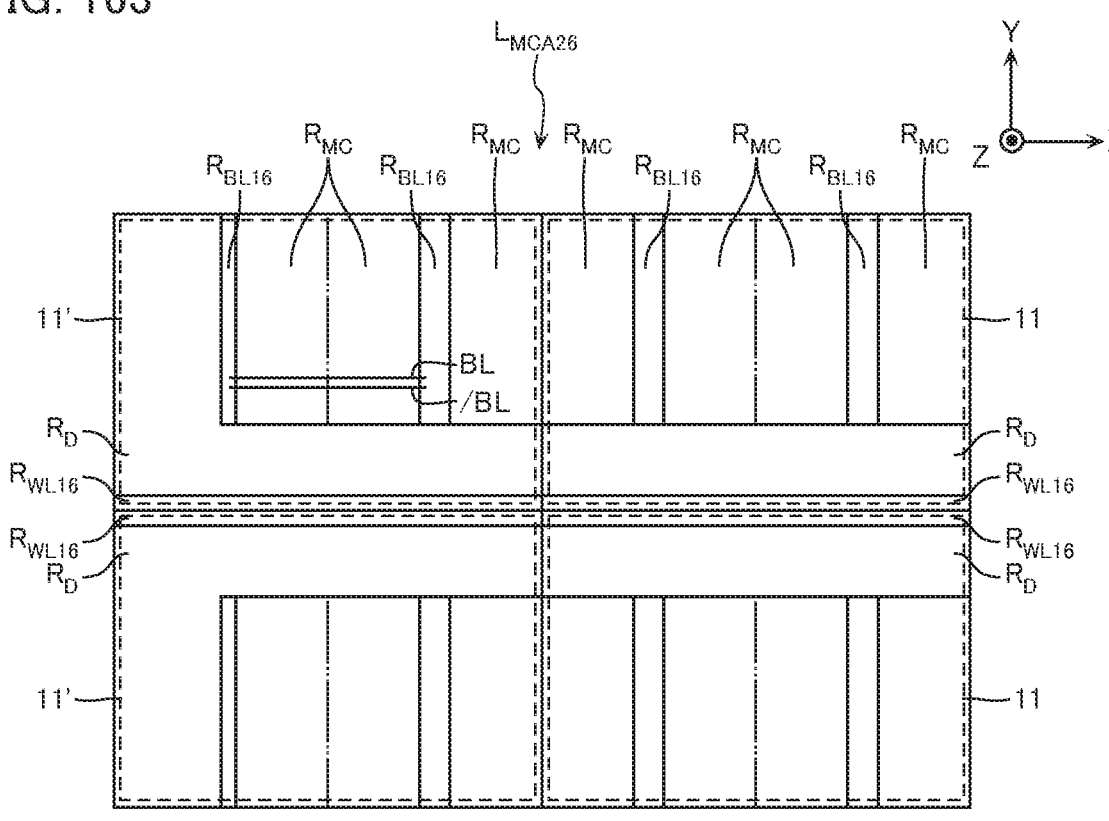
Figure 164:
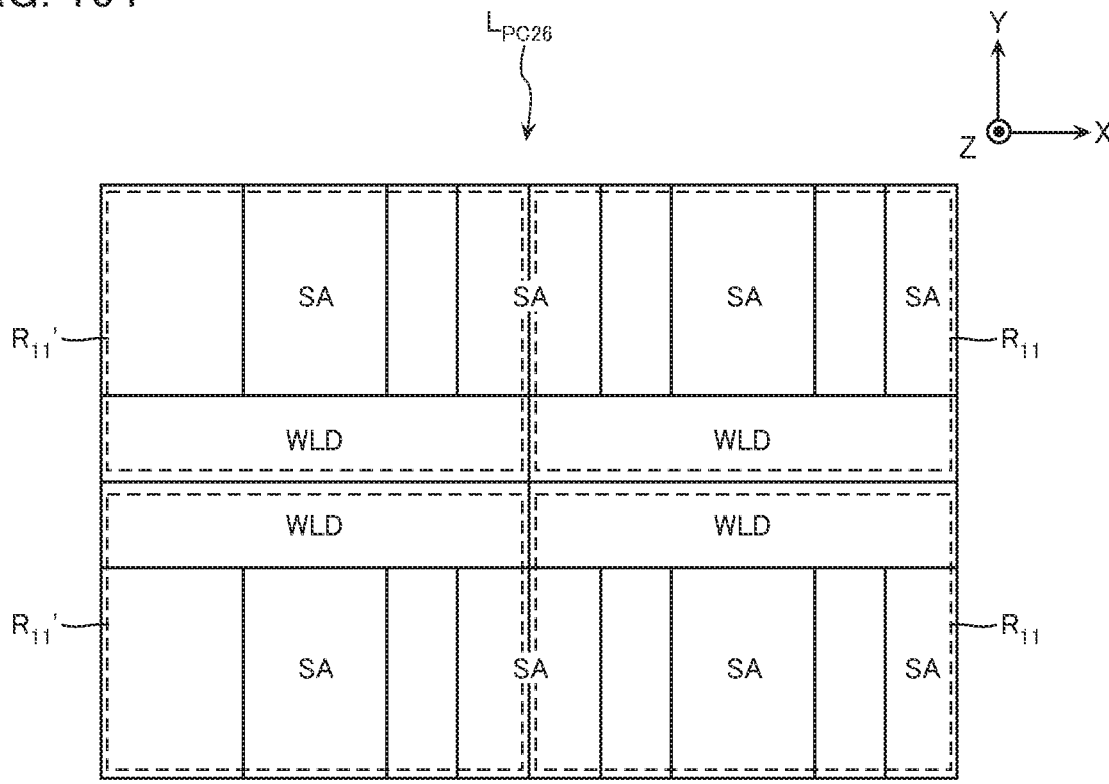
Figure 165:
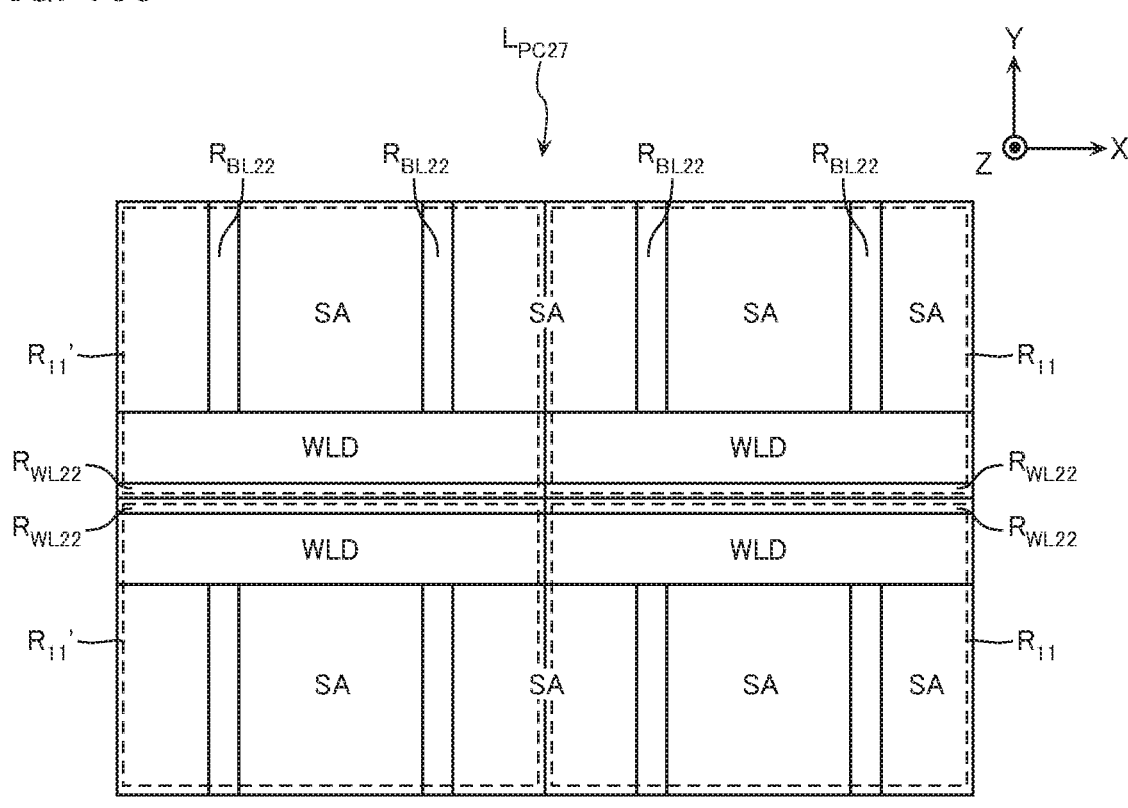
Figure 166:
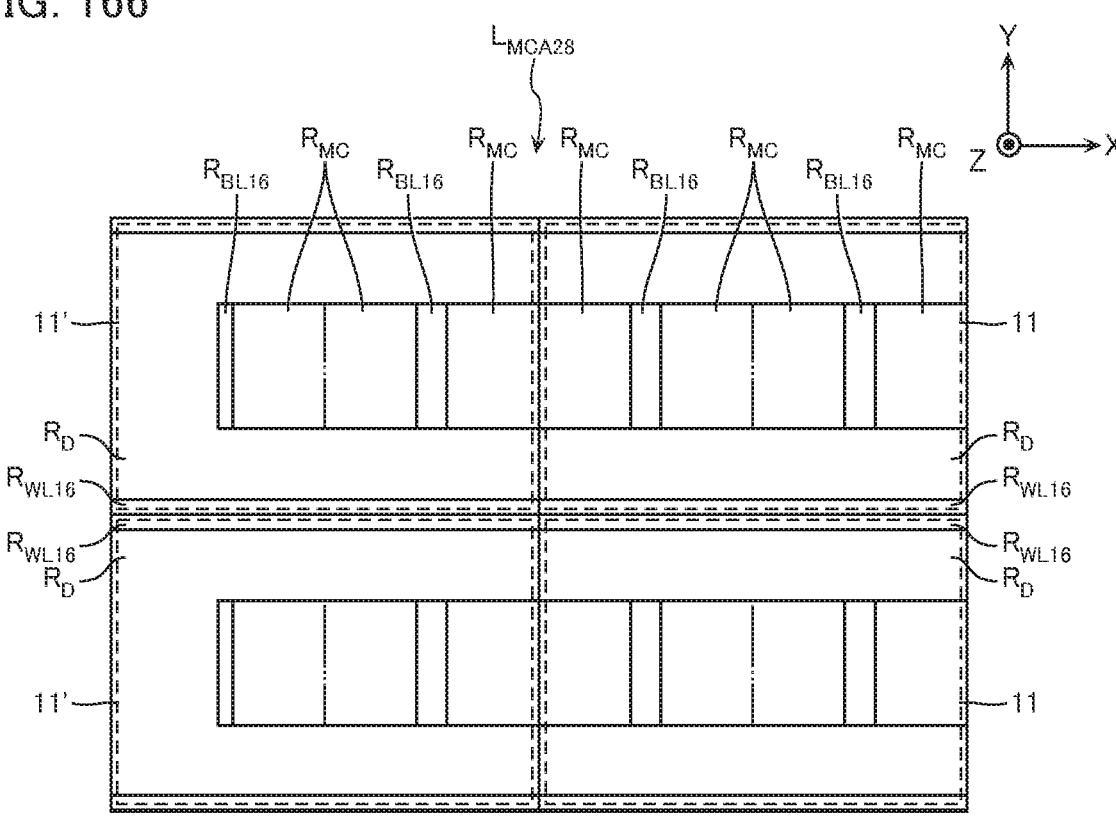
Figure 167:
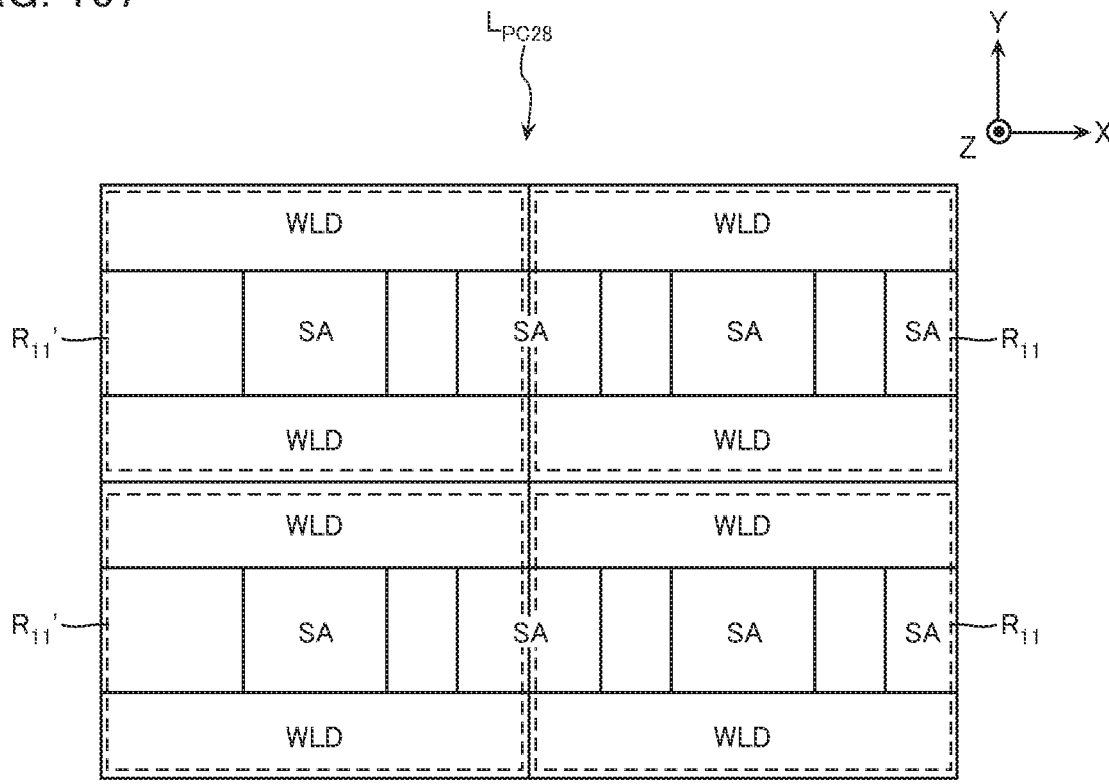
Figure 168:
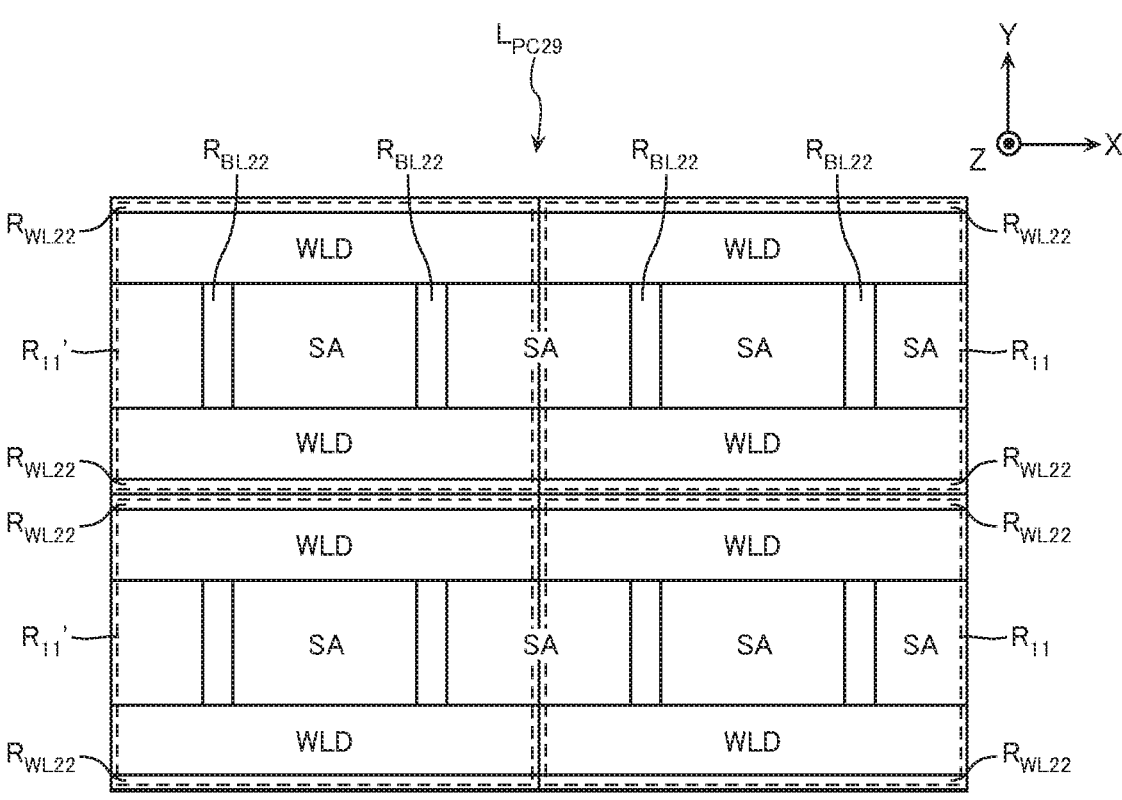
Figure 169:
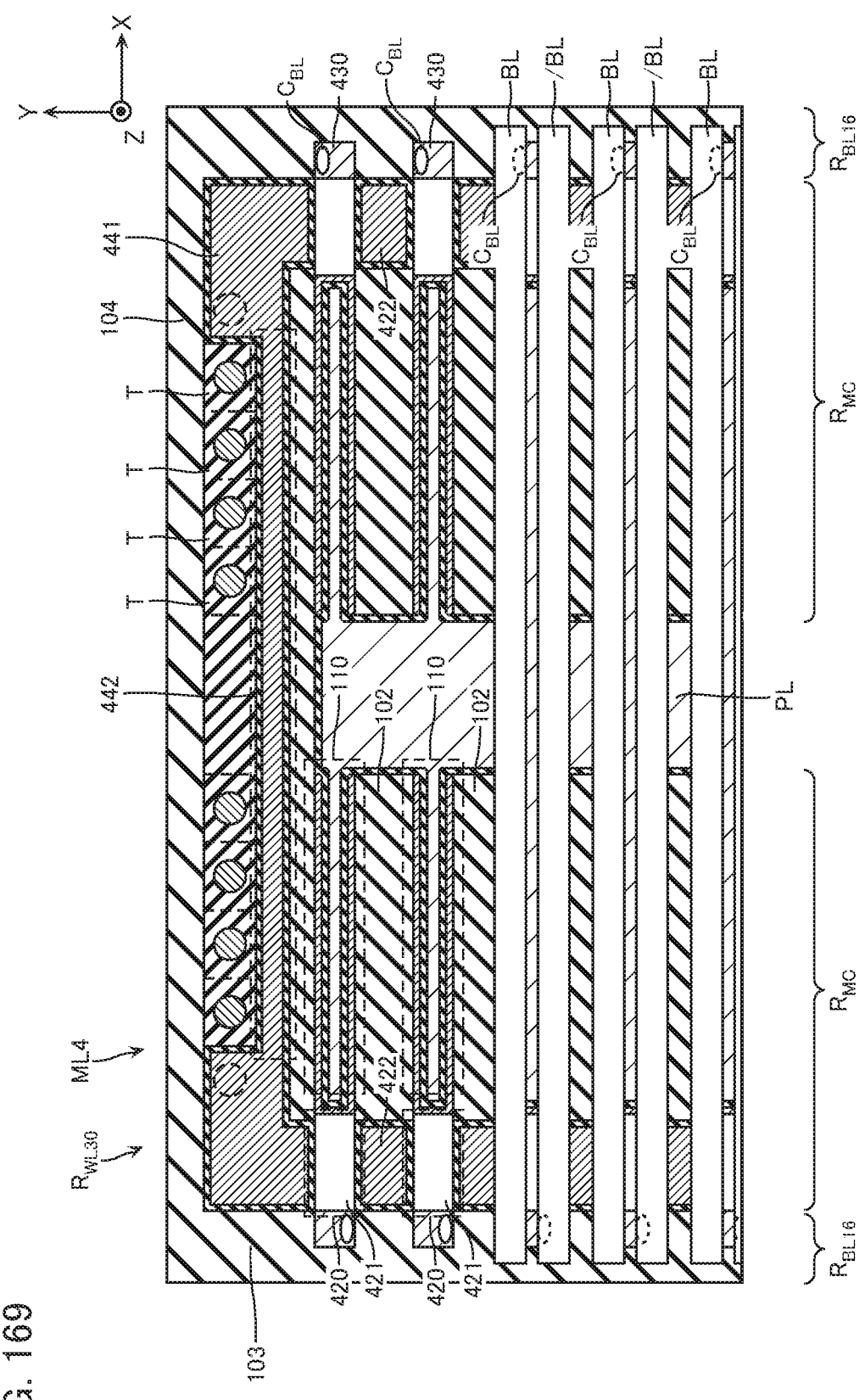
Figure 170:
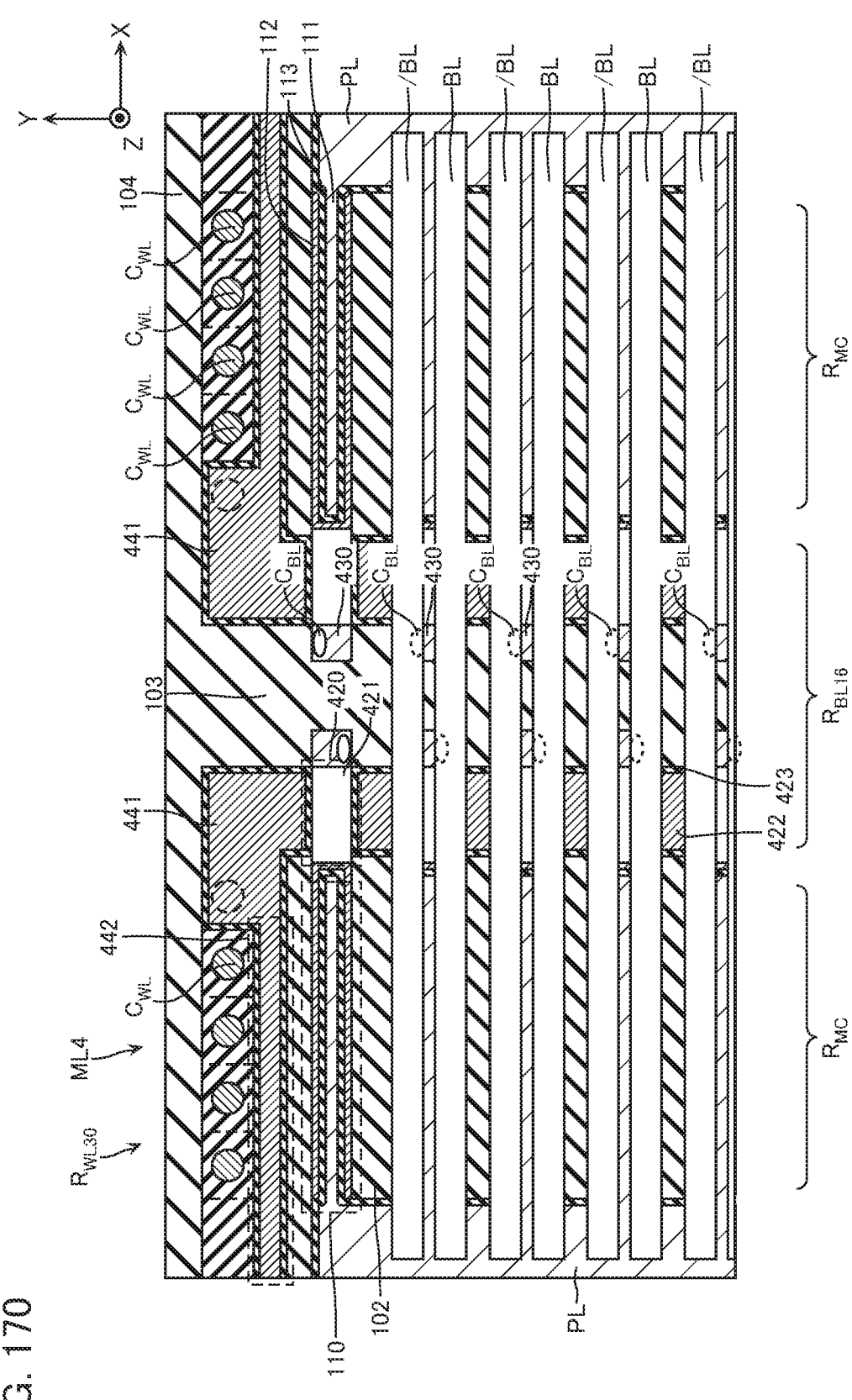
Figure 171:
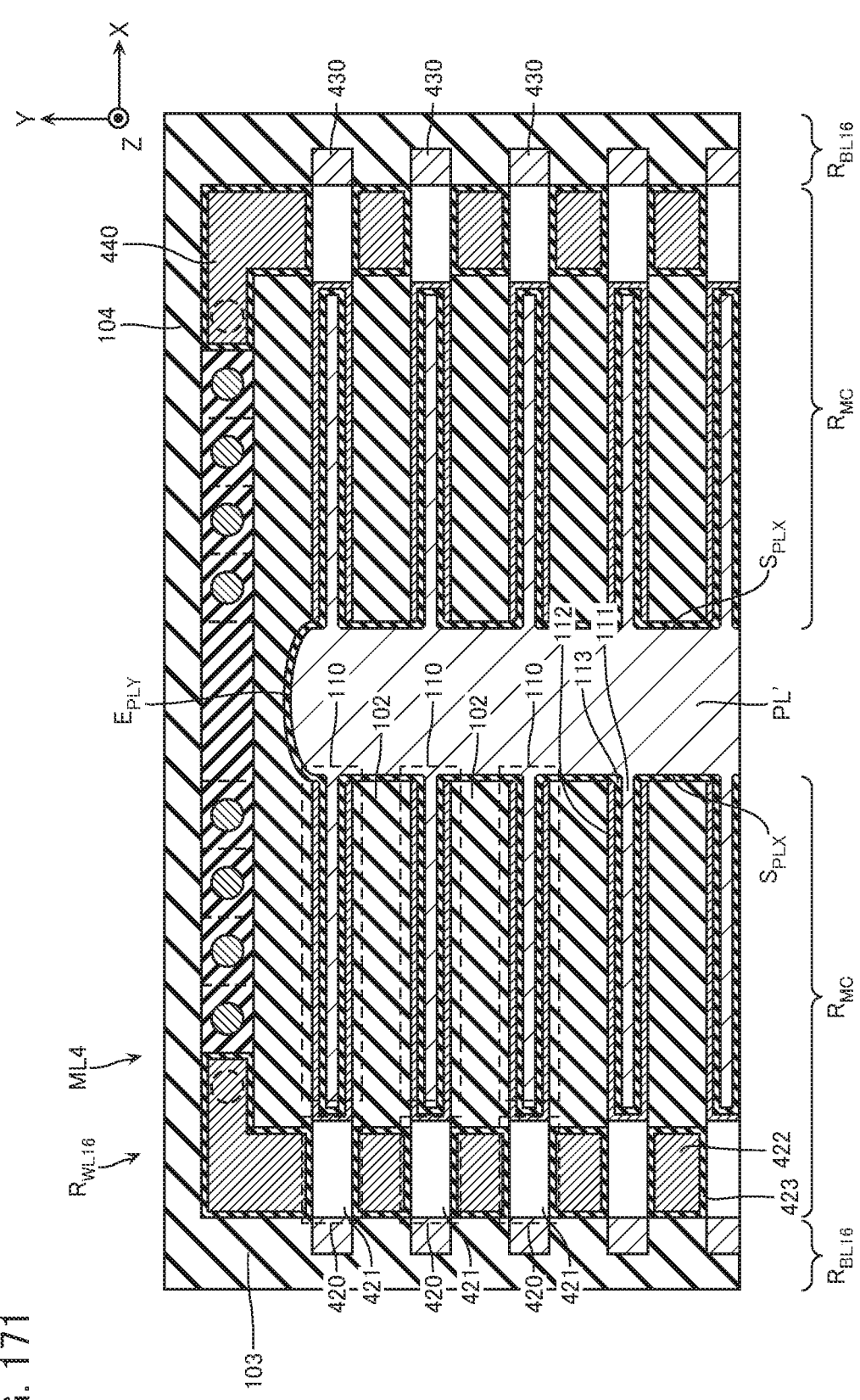
Figure 172:
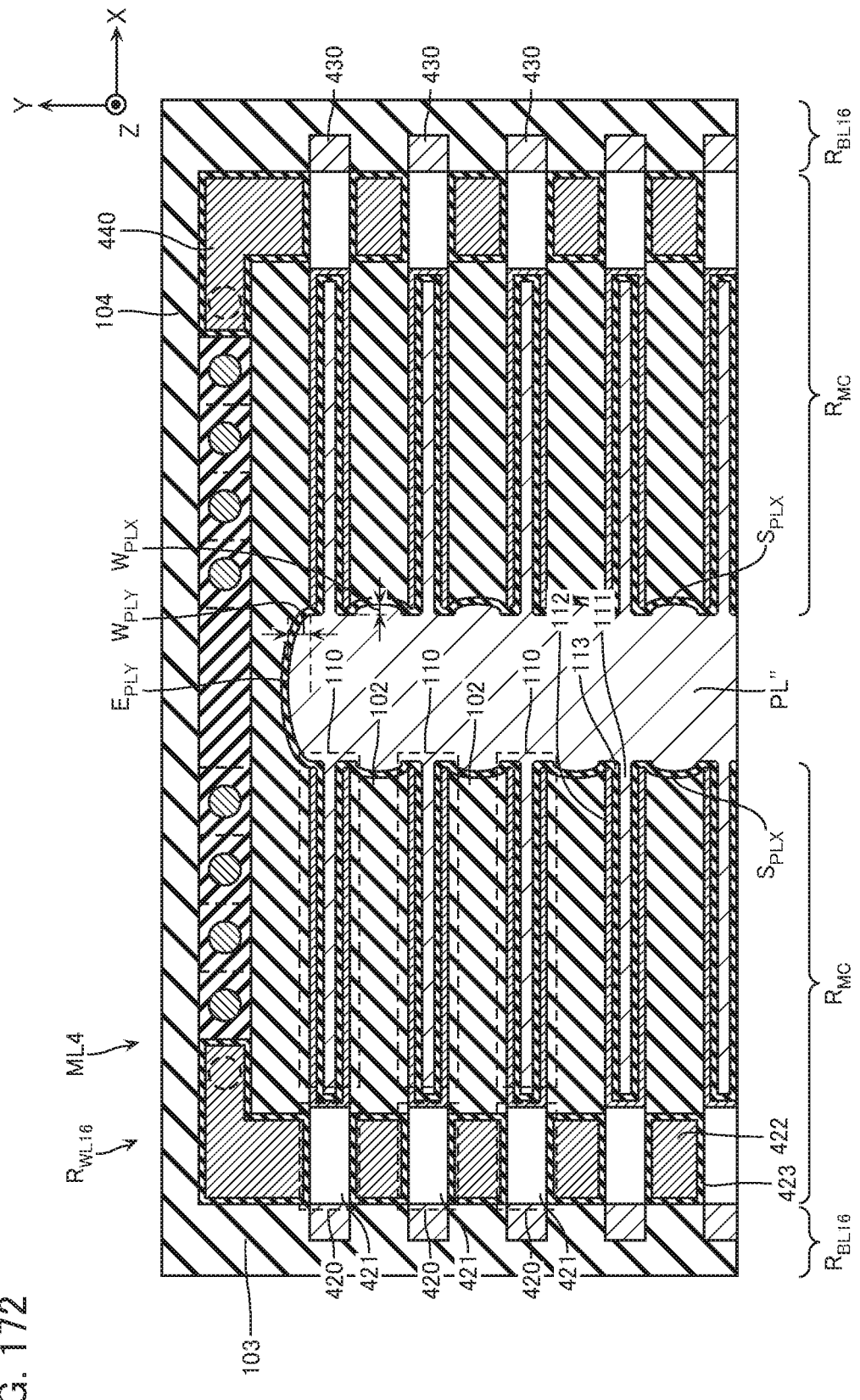
Figure 173:
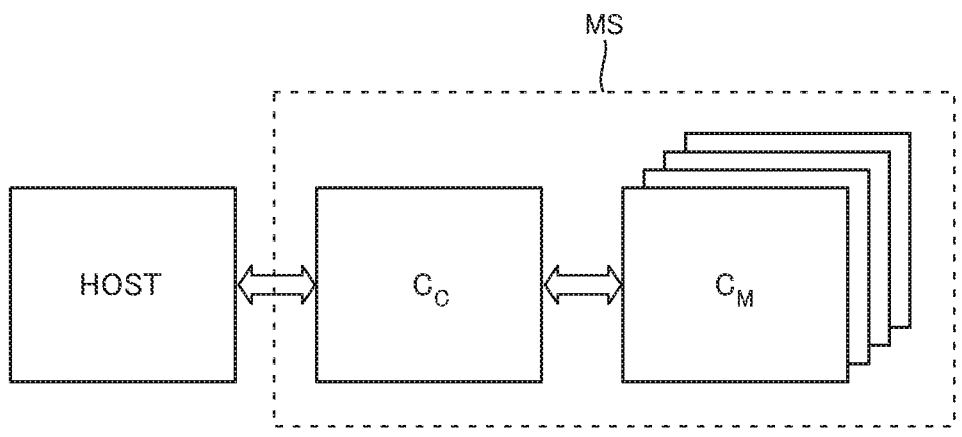

FIG. 74 is a schematic cross-sectional view for describing the manufacturing method;

FIG. 75 is a schematic cross-sectional view for describing the manufacturing method;

Figure 76:
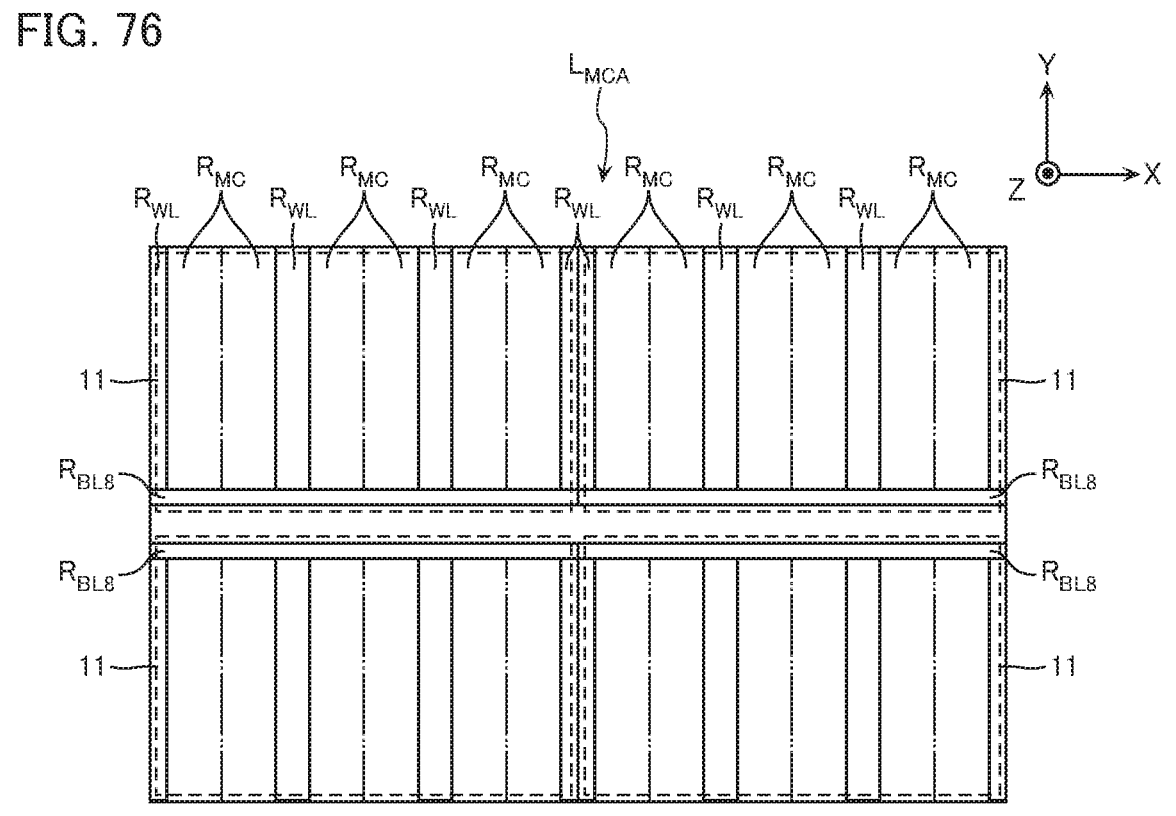

FIG. 76 is a schematic plan view illustrating a part of a configuration of a semiconductor memory device according to an eighth embodiment;

FIG. 77 is a schematic plan view illustrating a part of the configuration of the semiconductor memory device according to the eighth embodiment;

FIG. 78 is a schematic plan view illustrating a part of the configuration of the semiconductor memory device according to the eighth embodiment;

Figure 79:
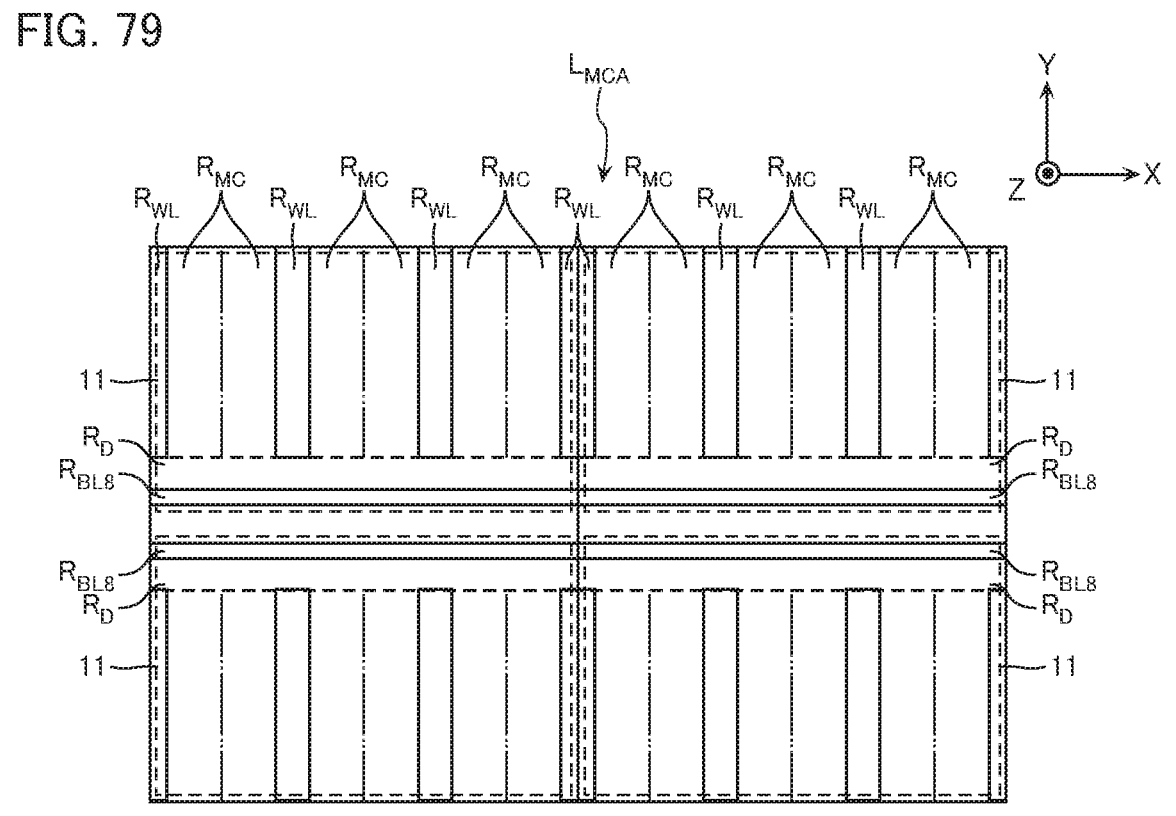

FIG. 79 is a schematic plan view illustrating another exemplary configuration of the semiconductor memory device according to the eighth embodiment;

FIG. 80 is a schematic plan view illustrating a part of a configuration of a semiconductor memory device according to a ninth embodiment;

FIG. 81 is a schematic plan view illustrating another exemplary configuration of the semiconductor memory device according to the ninth embodiment;

FIG. 82 is a schematic plan view illustrating a part of a configuration of a semiconductor memory device according to a tenth embodiment;

FIG. 83 is a schematic plan view illustrating another exemplary configuration of the semiconductor memory device according to the tenth embodiment;

FIG. 84 is a schematic circuit diagram illustrating a part of a configuration of a semiconductor memory device according to an eleventh embodiment;

FIG. 85 is a schematic plan view illustrating a part of the configuration of the semiconductor memory device according to the eleventh embodiment;

FIG. 86 is a schematic XY cross-sectional view illustrating a part of the configuration of the semiconductor memory device according to the eleventh embodiment;

FIG. 87 is a schematic cross-sectional view illustrating a part of the configuration of the semiconductor memory device according to the eleventh embodiment;

FIG. 88 is a schematic plan view for describing a manufacturing method of the semiconductor memory device according to the eleventh embodiment;

FIG. 89 is a schematic plan view for describing the manufacturing method;

FIG. 90 is a schematic plan view for describing the manufacturing method;

FIG. 91 is a schematic plan view for describing the manufacturing method;

FIG. 92 is a schematic plan view for describing the manufacturing method;

FIG. 93 is a schematic plan view for describing the manufacturing method;

FIG. 94 is a schematic plan view for describing the manufacturing method;

FIG. 95 is a schematic plan view for describing the manufacturing method;

FIG. 96 is a schematic plan view for describing the manufacturing method;

FIG. 97 is a schematic plan view for describing the manufacturing method;

FIG. 98 is a schematic plan view for describing the manufacturing method;

FIG. 99 is a schematic plan view for describing the manufacturing method;

FIG. 100 is a schematic plan view illustrating a part of a configuration of a semiconductor memory device according to a twelfth embodiment;

FIG. 101 is a schematic plan view for describing a manufacturing method of the semiconductor memory device according to the twelfth embodiment;

FIG. 102 is a schematic perspective view illustrating a part of a configuration of a semiconductor memory device according to a thirteenth embodiment;

FIG. 103 is a schematic plan view illustrating a part of the configuration of the semiconductor memory device according to the thirteenth embodiment;

FIG. 104 is a schematic perspective view illustrating a part of a configuration of a semiconductor memory device according to a fourteenth embodiment;

FIG. 105 is a schematic cross-sectional view illustrating a part of the configuration of the semiconductor memory device according to the fourteenth embodiment;

FIG. 106 is a schematic cross-sectional view for describing another configuration of the semiconductor memory device according to the fourteenth embodiment;

FIG. 107 is a schematic cross-sectional view for describing another configuration of the semiconductor memory device according to the fourteenth embodiment;

FIG. 108 is a schematic cross-sectional view illustrating a part of a configuration of a semiconductor memory device according to a fifteenth embodiment;

FIG. 109 is a schematic cross-sectional view illustrating a part of the configuration of the semiconductor memory device according to the fifteenth embodiment;

FIG. 110 is a schematic cross-sectional view illustrating a part of the configuration of the semiconductor memory device according to the fifteenth embodiment;

FIG. 111 is a schematic cross-sectional view illustrating a part of the configuration of the semiconductor memory device according to the fifteenth embodiment;

FIG. 112 is a schematic cross-sectional view for describing another configuration of the semiconductor memory device according to the fifteenth embodiment;

FIG. 113 is a schematic bottom view illustrating a part of a configuration of a semiconductor memory device according to a sixteenth embodiment;

FIG. 114 is a schematic bottom view illustrating a part of the configuration of the semiconductor memory device according to the sixteenth embodiment;

FIG. 115 is a schematic circuit diagram illustrating a part of a configuration of a semiconductor memory device according to a seventeenth embodiment;

FIG. 116 is a schematic bottom view illustrating a part of the configuration of the semiconductor memory device according to the seventeenth embodiment;

FIG. 117 is a schematic XY cross-sectional view illustrating a part of the configuration of the semiconductor memory device according to the seventeenth embodiment;

FIG. 118 is a schematic cross-sectional view illustrating a part of the configuration of the semiconductor memory device according to the seventeenth embodiment;

FIG. 119 is a schematic cross-sectional view illustrating a part of a configuration of a semiconductor memory device according to an eighteenth embodiment;

FIG. 120 is a schematic cross-sectional view illustrating a part of the configuration of the semiconductor memory device according to the eighteenth embodiment;

FIG. 121 is a schematic cross-sectional view illustrating a part of the configuration of the semiconductor memory device according to the eighteenth embodiment;

FIG. 122 is a schematic cross-sectional view for describing a manufacturing method of the semiconductor memory device according to the eighteenth embodiment;

FIG. 123 is a schematic cross-sectional view for describing the manufacturing method;

FIG. 124 is a schematic cross-sectional view for describing the manufacturing method;

FIG. 125 is a schematic cross-sectional view for describing the manufacturing method;

FIG. 126 is a schematic cross-sectional view for describing the manufacturing method;

FIG. 127 is a schematic cross-sectional view for describing the manufacturing method;

FIG. 128 is a schematic cross-sectional view for describing the manufacturing method;

FIG. 129 is a schematic cross-sectional view for describing the manufacturing method;

FIG. 130 is a schematic cross-sectional view for describing the manufacturing method;

FIG. 131 is a schematic cross-sectional view for describing the manufacturing method;

FIG. 132 is a schematic cross-sectional view for describing the manufacturing method;

FIG. 133 is a schematic cross-sectional view for describing the manufacturing method;

FIG. 134 is a schematic cross-sectional view for describing the manufacturing method;

FIG. 135 is a schematic cross-sectional view for describing the manufacturing method;

FIG. 136 is a schematic cross-sectional view for describing the manufacturing method;

FIG. 137 is a schematic cross-sectional view for describing the manufacturing method;

FIG. 138 is a schematic cross-sectional view for describing the manufacturing method;

FIG. 139 is a schematic cross-sectional view for describing the manufacturing method;

FIG. 140 is a schematic cross-sectional view for describing the manufacturing method;

FIG. 141 is a schematic cross-sectional view illustrating a part of a configuration of a semiconductor memory device according to a nineteenth embodiment;

FIG. 142 is a schematic XY cross-sectional view for describing a configuration of a semiconductor memory device according to a twentieth embodiment;

FIG. 143 is a schematic XY cross-sectional view for describing the configuration of the semiconductor memory device according to the twentieth embodiment;

FIG. 144 is a schematic XY cross-sectional view for describing a configuration of a semiconductor memory device according to a twenty-first embodiment;

FIG. 145 is a schematic XY cross-sectional view for describing the configuration of the semiconductor memory device according to the twenty-first embodiment;

FIG. 146 is a schematic plan view illustrating a part of a configuration of a memory cell array layer $L_{MCA21}$ of the semiconductor memory device according to the twenty-first embodiment;

FIG. 147 is a schematic plan view illustrating a part of a configuration of a peripheral circuit layer $L_{PC21}$ of the semiconductor memory device according to the twenty-first embodiment;

FIG. 148 is a schematic cross-sectional view illustrating a part of a configuration of a semiconductor memory device according to a twenty-second embodiment;

FIG. 149 is a schematic cross-sectional view illustrating a part of the configuration of the semiconductor memory device according to the twenty-second embodiment;

FIG. 150 is a schematic plan view illustrating a part of a configuration of a peripheral circuit layer $L_{PC22}$ of the semiconductor memory device according to the twenty-second embodiment;

FIG. 151 is a schematic plan view illustrating a part of a configuration of a semiconductor memory device according to a twenty-third embodiment;

FIG. 152 is a schematic plan view illustrating a part of the configuration of the semiconductor memory device according to the twenty-third embodiment;

FIG. 153 is a schematic plan view illustrating a part of a configuration of a semiconductor memory device according to a twenty-fourth embodiment;

FIG. 154 is a schematic cross-sectional view illustrating a part of a configuration of a semiconductor memory device according to a twenty-fifth embodiment;

FIG. 155 is a schematic plan view illustrating a part of the configuration of the semiconductor memory device according to the twenty-fifth embodiment;

FIG. 156 is a schematic plan view illustrating a part of the configuration of the semiconductor memory device according to the twenty-fifth embodiment;

FIG. 157 is a schematic plan view illustrating a part of the configuration of the semiconductor memory device according to the twenty-fifth embodiment;

FIG. 158 is a schematic XY cross-sectional view illustrating a part of the configuration of the semiconductor memory device according to the twenty-fifth embodiment;

FIG. 159 is a schematic cross-sectional view illustrating a part of the configuration of the semiconductor memory device according to the twenty-fifth embodiment;

FIG. 160 is a schematic cross-sectional view illustrating a part of the configuration of the semiconductor memory device according to the twenty-fifth embodiment;

FIG. 161 is a schematic XY cross-sectional view illustrating a part of a configuration of a semiconductor memory device according to a twenty-sixth embodiment;

FIG. 162 is a schematic XY cross-sectional view illustrating a part of the configuration of the semiconductor memory device according to the twenty-sixth embodiment;

FIG. 163 is a schematic plan view illustrating a part of a configuration of a memory cell array layer $L_{MCA26}$ of the semiconductor memory device according to the twenty-sixth embodiment;

FIG. 164 is a schematic plan view illustrating a part of a configuration of a peripheral circuit layer $L_{PC26}$ of the semiconductor memory device according to the twenty-sixth embodiment;

FIG. 165 is a schematic plan view illustrating a part of a configuration of a semiconductor memory device according to a twenty-seventh embodiment;

FIG. 166 is a schematic plan view illustrating a part of a configuration of a semiconductor memory device according to a twenty-eighth embodiment;

FIG. 167 is a schematic plan view illustrating a part of the configuration of the semiconductor memory device according to the twenty-eighth embodiment;

FIG. 168 is a schematic plan view illustrating a part of a configuration of a semiconductor memory device according to a twenty-ninth embodiment;

FIG. 169 is a schematic XY cross-sectional view illustrating a part of a configuration of a semiconductor memory device according to a thirtieth embodiment;

FIG. 170 is a schematic XY cross-sectional view illustrating a part of a configuration of a semiconductor memory device according to a thirty-first embodiment;

FIG. 171 is a schematic XY cross-sectional view for describing a configuration of a semiconductor memory device according to a thirty-second embodiment;

FIG. 172 is a schematic XY cross-sectional view for describing a configuration of a semiconductor memory device according to a thirty-third embodiment; and FIG. 173 is a schematic block diagram for describing a configuration of a semiconductor memory device according to other embodiments.

DETAILED DESCRIPTION

A semiconductor memory device according to one embodiment comprises a substrate, a plurality of first electrodes, a plurality of first wirings, a plurality of first semiconductor layers, a plurality of first memory portions, a plurality of second wirings, a plurality of second semiconductor layers, and a plurality of second memory portions. The substrate includes a first region and a second region arranged in a first direction. The plurality of first electrodes are arranged in a second direction intersecting with a surface of the substrate, and each includes a pair of first parts disposed in the first region, extending in the first direction, and arranged in a third direction intersecting with the first direction and the second direction, and a second part disposed in the second region, extending in the third direction, and electrically connected to the pair of first parts. The plurality of first wirings are arranged in the first direction along a plurality of ones of the pairs of first parts of the plurality of first electrodes, and extend in the second direction. The plurality of first semiconductor layers are arranged in the first direction and the second direction corresponding to the plurality of the ones of the pairs of first parts of the plurality of first electrodes and the plurality of first wirings, opposed to the plurality of the ones of the pairs of first parts of the plurality of first electrodes, and connected to the plurality of first wirings. The plurality of first memory portions are electrically connected to the plurality of first wirings via the plurality of first semiconductor layers. The plurality of second wirings are arranged in the first direction along a plurality of the others of the pairs of first parts of the plurality of first electrodes, and extend in the second direction. The plurality of second semiconductor layers are arranged in the first direction and the second direction corresponding to the plurality of the others of the pairs of first parts of the plurality of first electrodes and the plurality of second wirings, opposed to the plurality of the others of the pairs of first parts of the plurality of first electrodes, and connected to the plurality of second wirings. The plurality of second memory portions are electrically connected to the plurality of second wirings via the plurality of second semiconductor layers.

Next, the semiconductor memory devices according to embodiments are described in detail with reference to the drawings. The following embodiments are only examples, and not described for the purpose of limiting the present invention. The following drawings are schematic, and for convenience of description, a part of a configuration and the like is sometimes omitted. Parts common in a plurality of embodiments are attached by same reference numerals and their descriptions may be omitted.

In this specification, when referring to a "semiconductor memory device", it may mean a diced memory chip, may mean a packaged memory chip, and may mean a memory system including a controller chip, such as a memory card and a Solid State Drive (SSD). Further, it may mean a configuration including a host computer, such as a smartphone, a tablet terminal, and a personal computer.

In this specification, when it is referred that a first configuration "is electrically connected" to a second configuration, the first configuration may be directly connected to the second configuration, and the first configuration may be connected to the second configuration via a wiring, a semiconductor member, a transistor, or the like. For example, when three transistors are connected in series, even when the second transistor is in OFF state, the first transistor is "electrically connected" to the third transistor.

In this specification, a direction parallel to an upper surface of the substrate is referred to as an X-direction, a direction parallel to the upper surface of the substrate and perpendicular to the X-direction is referred to as a Y-direction, and a direction perpendicular to the upper surface of the substrate is referred to as a Z-direction.

In this specification, a direction along a certain plane may be referred to as a first direction, a direction along this certain plane and intersecting with the first direction may be referred to as a second direction, and a direction intersecting with this certain plane may be referred to as a third direction. These first direction, second direction, and third direction may each correspond to any of the X-direction, the Y-direction, and the Z-direction and need not correspond to these directions.

Expressions such as "above" and "below" in this specification are based on the substrate. For example, a direction away from the substrate along the Z-direction is referred to as above and a direction approaching the substrate along the Z-direction is referred to as below. A lower surface and a lower end of a certain configuration mean a surface and an end portion at the substrate side of this configuration. An upper surface and an upper end of a certain configuration mean a surface and an end portion at a side opposite to the substrate of this configuration. A surface intersecting with the X-direction or the Y-direction is referred to as a side surface and the like.

First Embodiment

[Circuit]

Figure 1:
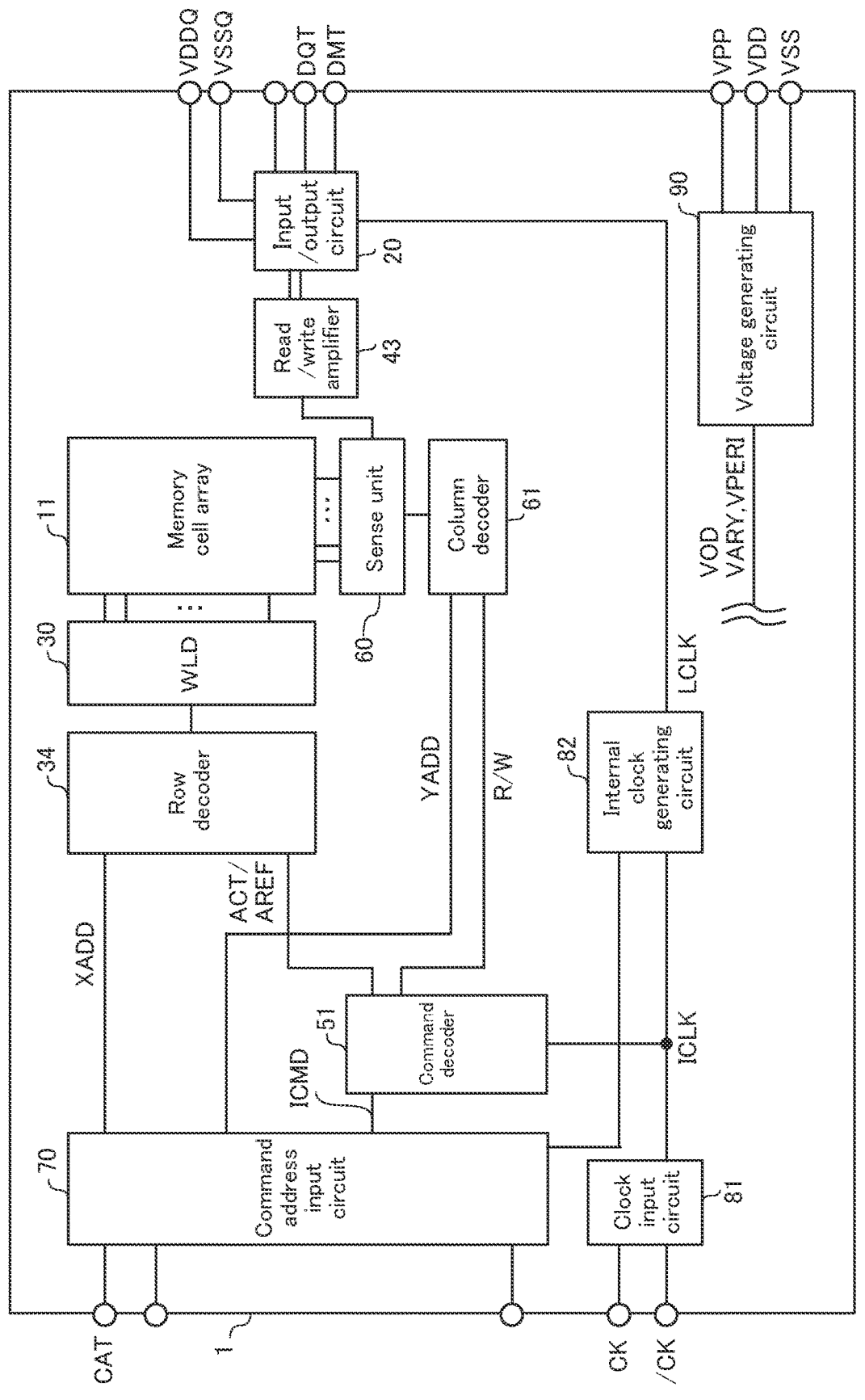
FIG. 1 is a schematic block diagram illustrating an exemplary configuration of a semiconductor memory device according to a first embodiment.
Figure 2:
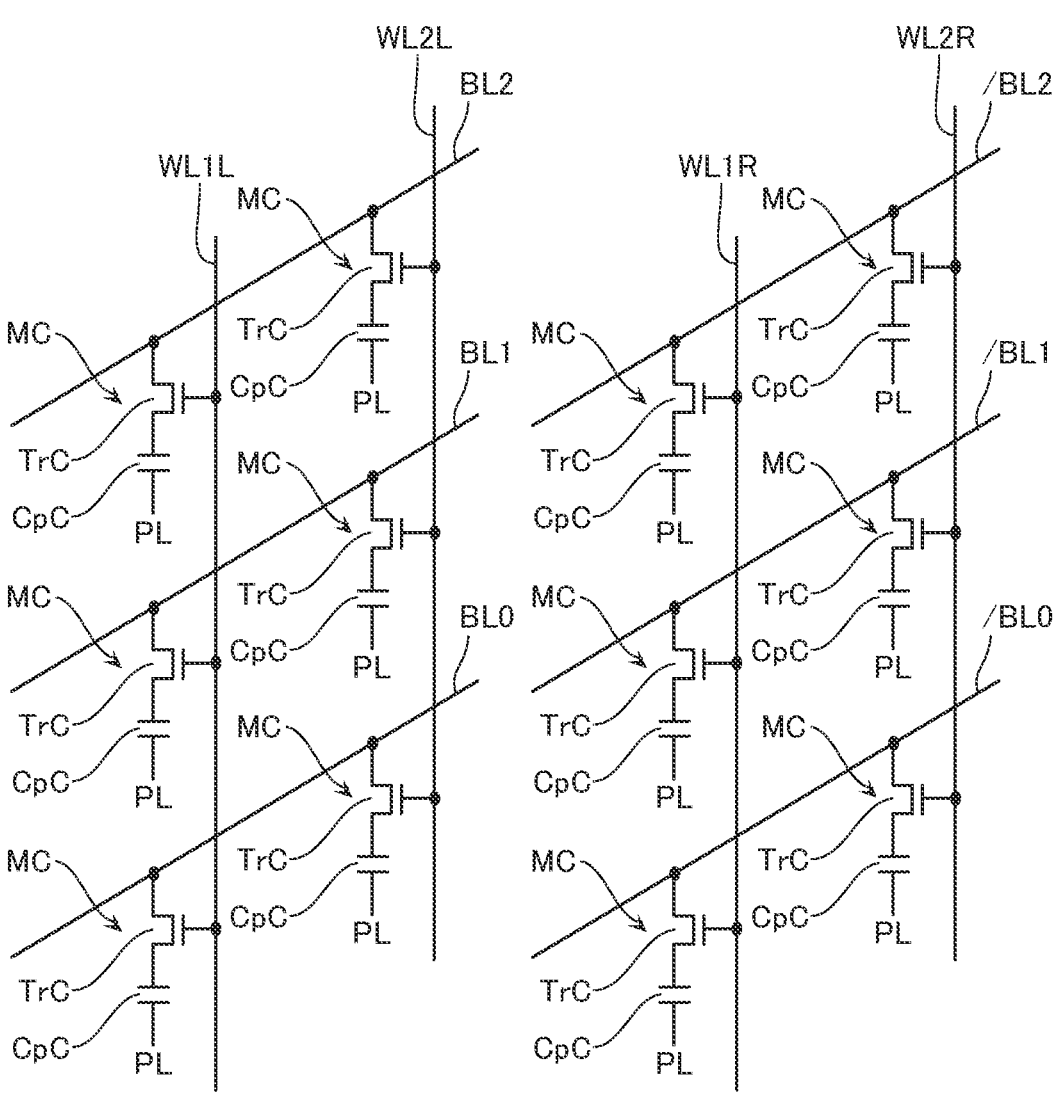
FIG. 2 is a schematic circuit diagram illustrating a part of the configuration of the semiconductor memory device.

FIG. 1 is a schematic block diagram illustrating an exemplary configuration of a semiconductor memory device according to a first embodiment. FIG. 2 is a schematic circuit diagram illustrating an exemplary configuration of a memory cell array according to the first embodiment.

As illustrated in FIG. 1, the semiconductor memory device 1 of the first embodiment includes memory cell arrays 11, an input/output circuit 20, a word line driver 30 (notated as WLD in FIG. 1), a row decoder 34, a read/write amplifier 43, a command decoder 51, a sense unit 60, a column decoder 61, a command address input circuit 70, a clock input circuit 81, an internal clock generating circuit 82, and a voltage generating circuit 90.

The semiconductor memory device 1 includes a plurality of external terminals, such as clock terminals CK, /CK, a command/address terminal CAT, a data terminal DQT, a data mask terminal DMT, and power supply terminals VPP, VDD, VSS, VDDQ, VSSQ.

In the embodiment, configurations other than the memory cell arrays 11 in the semiconductor memory device 1 are referred to as peripheral circuits in some cases.

As illustrated in FIG. 2, each of the memory cell arrays 11 includes a plurality of word lines WL (WL1L, WL2L, WL1R, WL2R), a plurality of bit lines BL (BL0 to BL2), /BL (/BL0 to/BL2), a plurality of memory cells MC connected thereto, and plate lines PL connected to these plurality of memory cells MC.

The memory cells MC each include one cell transistor TrC and one cell capacitor CpC. Such a configuration of the memory cell MC is referred to as "1T1C" in some cases. As illustrated in FIG. 2, the cell transistors TrC have source terminals connected to the bit lines BL, /BL. The cell transistors TrC have drain terminals connected to ones of terminals of the cell capacitors CpC. The cell transistors TrC have gate terminals connected to the word lines WL. The others of terminals of the cell capacitors CpC are connected to the plate lines PL.

When a low level or high level voltage is applied to the word lines WL and a low level or high level voltage is applied to the bit lines BL, /BL, the cell transistors TrC enter an ON state or an OFF state. Accordingly, an electric charge is accumulated in the cell capacitors CpC, or the accumulated electric charge is discharged.

In the semiconductor memory device according to the first embodiment, data is latched by accumulating the electric charge in the cell capacitors CpC. Further, in the semiconductor memory device according to the first embodiment, in order to maintain the electric charge accumulated in the cell capacitors CpC, a process of refreshing the electric charge in the cell capacitors CpC is periodically performed by a refresh circuit. In FIG. 1, the refresh circuit and the like are omitted for convenience of explanation.

The memory cell array 11 is referred to as a bank in some cases. Generally, a DRAM includes a plurality of banks. In the embodiment, a plurality of banks are referred to as the memory cell array 11 in some cases.

The plurality of memory cells MC in the memory cell array 11 are each associated with a memory address. Among the plurality of external terminals, the command/address terminal CAT (FIG. 1) receives a memory address from, for example, an external device, such as a memory controller. The memory address received by the command/address terminal CAT is transferred to the command address input circuit 70. When the command address input circuit 70 receives the memory address, the command address input circuit 70 transmits a decoded row address XADD to the row decoder 34 and transmits a decoded column address YARD to the column decoder 61.

Additionally, the command/address terminal CAT receives a command from, for example, an external device, such as a memory controller. The command received by the command/address terminal CAT is transferred to the command address input circuit 70. When the command address input circuit 70 receives the command, the command address input circuit 70 transmits the received command to the command decoder 51 as an internal command signal ICMD.

The command decoder 51 includes a circuit that decodes the internal command signal ICMD and generates a signal for executing an internal command. The command decoder 51 transmits, for example, an activated command ACT and a refresh command AREF to the row decoder 34. The row decoder 34 selects the word line WL in accordance with the command ACT and the refresh command AREF received from the command decoder 51. The row decoder 34 transmits a signal indicating the selected word line WL to the word line driver 30.

The word line driver 30 is connected to the word lines WL (FIG. 2). The word line driver 30 receives a signal from the row decoder 34 and applies a low level or high level voltage to the word line WL indicated by the signal.

Additionally, the command decoder 51 transmits, for example, a read/write command R/W to the column decoder 61. The column decoder 61 selects the bit lines BL, /BL (FIG. 2) in accordance with the read/write command R/W received from the command decoder 51. The column decoder 61 transmits a signal indicating the selected bit lines BL, /BL to the sense unit 60.

The sense unit 60 is connected to the bit lines BL, /BL. The sense unit 60 receives a signal from the column decoder 61 and applies a low level or high level voltage to the bit lines BL, /BL indicated by the signal.

When data is read, a memory address is received together with a read command by the command/address terminal CAT. Accordingly, the data is read from the memory cell MC in the memory cell array 11 specified by the memory address. The read data is output from the data terminal DQT via the sense unit 60, the read/write amplifier 43, and the input/output circuit 20 to an outside.

When data is written, a memory address is received together with a write command by the command/address terminal CAT, and the data terminal DQT receives write data. The data mask terminal DMT receives a data mask as necessary. The write data is transmitted to the memory cell array 11 via the input/output circuit 20, the read/write amplifier 43, and the sense unit 60. Accordingly, the write data is written to the memory cell MC specified by the memory address.

The read/write amplifier 43 includes various kinds of latch circuits that temporarily latch read data and write data.

The voltage generating circuit 90 is connected to the power supply terminals VPP, VDD, VSS. The voltage generating circuit 90 is applied with power supply voltages from the power supply terminals VPP, VDD, VSS and generates various kinds of internal voltages VOD, VARY, VPERI based on these power supply voltages. The internal voltages VOD, VARY are mainly used in a sense amplifier circuit SA, and the internal voltage VPERI is used in other peripheral circuits.

The input/output circuit 20 is connected to the power supply terminals VDDQ, VSSQ. Dedicated power supply voltages are applied to the power supply terminals VDDQ, VSSQ so that power source noise generated in the input/output circuit 20 is not propagated to other circuit blocks. The power supply voltages applied to the power supply terminals VDDQ, VSSQ may be the same voltages as the power supply voltages applied to the power supply terminals VDD, VSS.

To the clock terminals CK, /CK, complementary external clock signals are input. The external clock signals are supplied to the clock input circuit 81. The clock input circuit 81 generates an internal clock signal ICLK. The internal clock signal ICLK is supplied to the internal clock generating circuit 82 and the command decoder 51.

The internal clock generating circuit 82 generates various internal clock signals LCLK when the internal clock generating circuit 82 is enabled by a clock enable from the command address input circuit 70. The internal clock signals LCLK are used for measuring timings of various internal operations. For example, the internal clock signal LCLK is output to the input/output circuit 20. The input/output circuit 20 transmits and receives data to and from the data terminal DQT based on the input internal clock signal LCLK.

[Configuration of Sense Amplifier Circuit]

Figure 3:
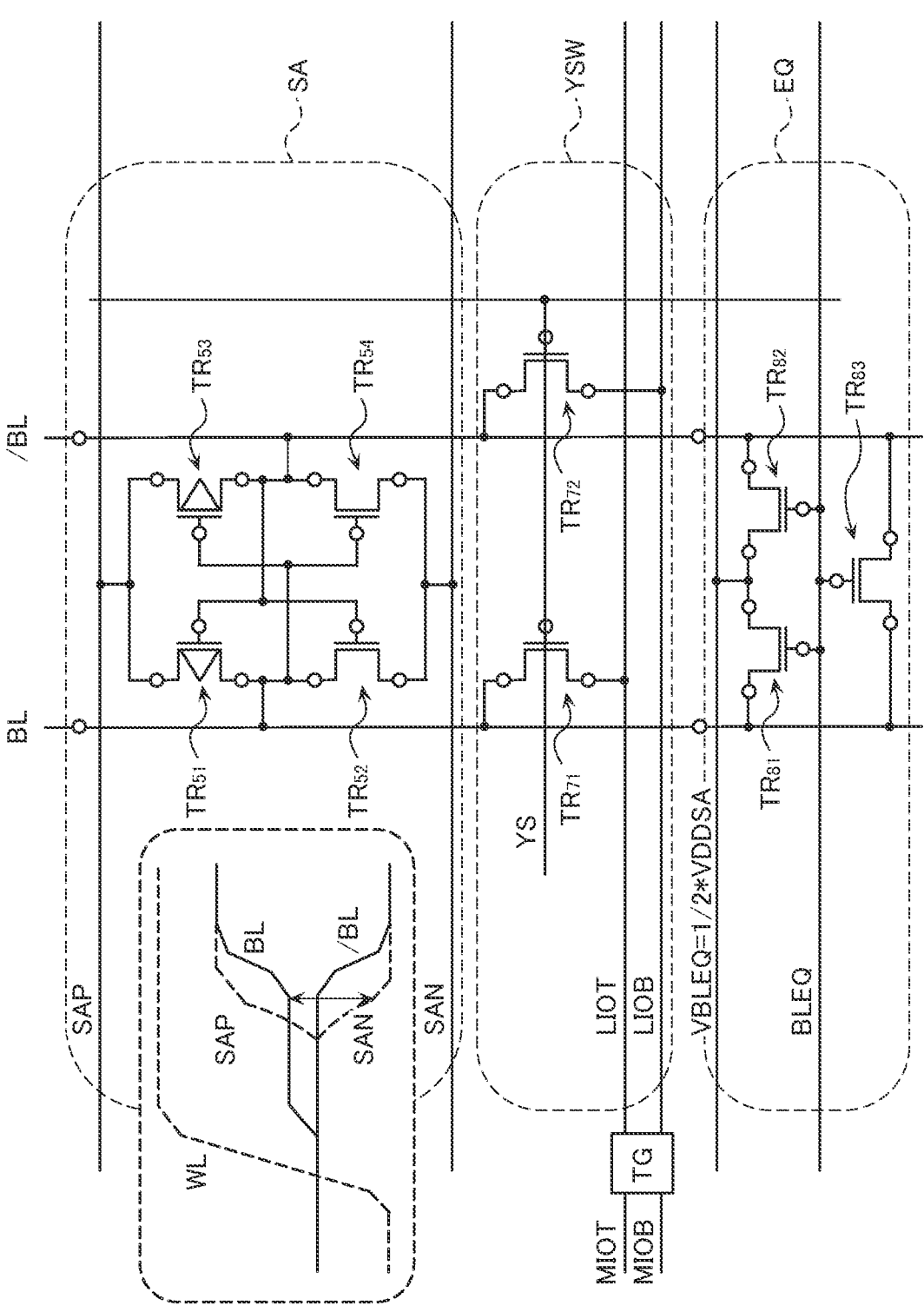
FIG. 3 is a schematic circuit diagram illustrating a part of the configuration of the semiconductor memory device.

Next, an exemplary configuration of the sense amplifier circuit SA in the sense unit 60 is described with reference to FIG. 3. FIG. 3 is a circuit diagram illustrating a circuit configuration example including the sense amplifier circuit SA.

As illustrated in FIG. 3, the bit line BL (FIG. 2) and the bit line /BL (FIG. 2) that becomes paired with the bit line BL are each connected to the sense amplifier circuit SA in the sense unit 60.

The sense amplifier circuit SA includes transistors $TR_{51}$ to $TR_{54}$. The transistors $TR_{51}$, $TR_{53}$ are low withstand voltage P-channel MOS transistors, and the transistors $TR_{52}$, $TR_{54}$ are low withstand voltage N-channel MOS transistors.

The transistor $TR_{51}$ has a source terminal connected to a signal line to which a sense signal SAP is supplied, and the transistor $TR_{51}$ has a drain terminal connected to a drain terminal of the transistor $TR_{52}$. The transistor $TR_{52}$ has a source terminal connected to a signal line to which a sense signal SAN is supplied. The bit line BL is connected between the transistors $TR_{51}$, $TR_{52}$ (a connection point of the drain terminal of the transistor $TR_{51}$ and the drain terminal of the transistor $TR_{52}$).

The transistor $TR_{53}$ has a source terminal connected to the signal line to which the sense signal SAP is supplied, and the transistor $TR_{53}$ has a drain terminal connected to a drain terminal of the transistor $TR_{54}$. The transistor $TR_{54}$ has a source terminal connected to the signal line to which the sense signal SAN is supplied. The bit line /BL is connected between the transistors $TR_{53}$, $TR_{54}$ (a connection point of the drain terminal of the transistor $TR_{53}$ and the drain terminal of the transistor $TR_{54}$).

The transistors $TR_{51}$, $TR_{52}$ have gate terminals (gate electrodes) connected to the drain terminals of the transistors $TR_{53}$, $TR_{54}$, and the transistors $TR_{53}$, $TR_{54}$ have gate terminals (gate electrodes) connected to the drain terminals of the transistors $TR_{51}$, $TR_{52}$.

A column switch YSW is connected to the bit lines BL, /BL at a downstream side with respect to the sense amplifier circuit SA. The column switch YSW includes transistors $TR_{71}$, $TR_{72}$. The transistors $TR_{71}$, $TR_{72}$ are low withstand voltage N-channel MOS transistors.

The transistor $TR_{71}$ has a drain terminal connected to the bit line BL, and the transistor $TR_{71}$ has a source terminal connected to a local input/output line LIOT. The transistor $TR_{72}$ has a drain terminal connected to the bit line /BL, and the transistor $TR_{72}$ has a source terminal connected to a local input/output line LIOB. The transistors $TR_{71}$, $TR_{72}$ have gate terminals (gate electrodes) connected to a signal line to which a column select signal YS is supplied.

Thus, the sense amplifier circuit SA is connected to the local input/output lines LIOT, LIOB via the column switch YSW. A transfer gate TG is connected to the local input/output lines LIOT, LIOB and connected to main input/output lines MIOT, MIOB. The transfer gate TG serves as a switch. The main input/output lines MIOT, MIOB are connected to the read/write amplifier 43 (FIG. 1).

The bit lines BL, /BL at the downstream side with respect to the column switch YSW (FIG. 3) are connected to an equalizing circuit EQ. The equalizing circuit EQ includes transistors $TR_{81}$ to $TR_{83}$. The transistors $TR_{81}$ to $TR_{83}$ are low withstand voltage N-channel MOS transistors.

The transistor $TR_{81}$ has a drain terminal connected to the bit line BL, and the transistor $TR_{81}$ has a source terminal connected to a source terminal of the transistor $TR_{82}$. The transistor $TR_{82}$ has a drain terminal connected to the bit line /BL. A power supply line to which an equalizing voltage VBLEQ is applied is connected to the source terminals of the transistors $TR_{81}$, $TR_{82}$. The equalizing voltage VBLEQ has a magnitude that is ½ of that of a power supply voltage VDDSA for the sense amplifier circuit SA.

The transistor $TR_{83}$ has one terminal connected to the bit line BL, and the transistor $TR_{83}$ has the other terminal connected to the bit line /BL. The transistors $TR_{81}$ to $TR_{83}$ have gate terminals (gate electrodes) connected to a signal line to which an equalizing signal BLEQ is supplied.

Next, an operation of circuits including the above-described sense amplifier circuit SA is described.

Usually, the equalizing signal BLEQ is driven to a high level in a steady state. Accordingly, the transistors $TR_{81}$ to $TR_{83}$ of the equalizing circuit EQ enter the ON state and the bit lines BL, /BL are equalized to a precharge voltage.

Next, when the active command ACT is issued, equalization is released, and based on the input row address XADD, a corresponding word line WL is driven to a VPP level by the word line driver 30. The release of the equalization, that is, a non-active state of the equalizing circuit EQ continues from when the active command ACT is issued until a precharge command is issued.

The word line WL is driven to the VPP level, and the cell transistor TrC of a corresponding memory cell MC enters the ON state. Accordingly, one electrode of the cell capacitor CpC of the memory cell MC is electrically conducted with the bit line BL or the bit line /BL. As a result, depending on an electric charge of the cell capacitor CpC of the memory cell MC, a voltage of the bit line BL or the bit line /BL slightly varies. In the example of FIG. 3, a state where the voltage of the bit line BL slightly rises is illustrated.

Afterwards, the sense signals SAP, SAN vary to a low level and a high level respectively at a predetermined timing, and the sense amplifier circuit SA is activated. As a result, a voltage difference between the bit lines BL, /BL is amplified. In the example of FIG. 3, a state where the bit line BL is driven to a high level and the bit line /BL is driven to a low level is illustrated.

Next, when a read command is issued, in accordance with the column address YADD input in synchronization with the read command, the corresponding column select signal YS varies to a high level. At a point before the column select signal YS is activated, the local input/output lines LIOT, LIOB are precharged to a power supply voltage VCC.

Since the transistors $TR_{71}$, $TR_{72}$ of the column switch YSW enter the ON state once the column select signal YS is activated, the bit lines BL, /BL are electrically conducted with the corresponding local input/output lines LIOT, LIOB. As a result, the local input/output line LIOT is maintained at a precharge level, and the local input/output line LIOB drops from the precharge level to a low level.

When the transfer gate TG enters the ON state, the local input/output lines LIOT, LIOB are electrically conducted with the main input/output lines MIOT, MIOB. As a result, the main input/output line MIOT is maintained at a precharge level, and the main input/output line MIOB drops from the precharge level to a low level.

By the above operation, data is read from the memory cell MC.

[Configuration of Transistor]

Figure 4:
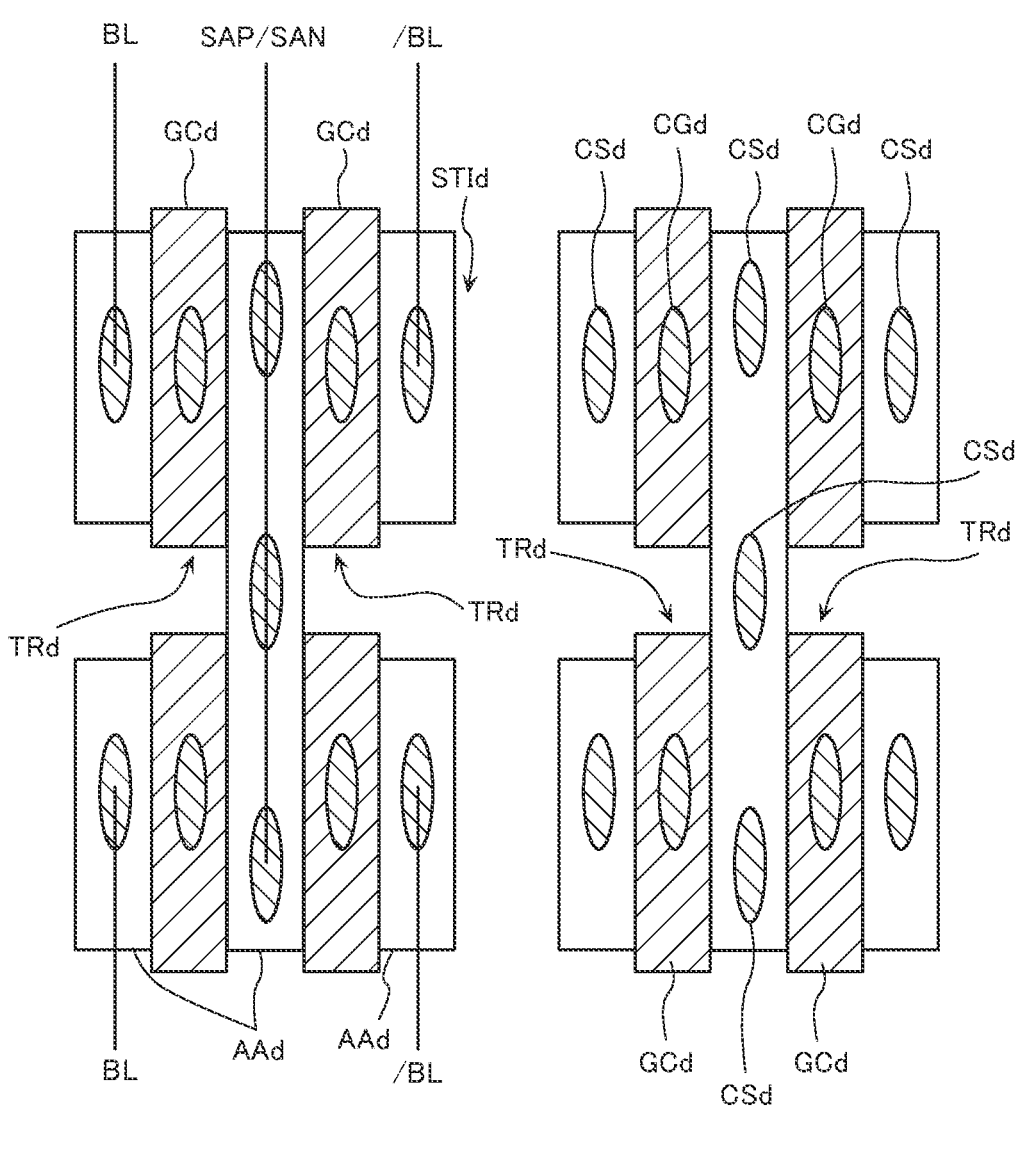
FIG. 4 is a schematic plan view illustrating a part of the configuration of the semiconductor memory device.
Figure 4:
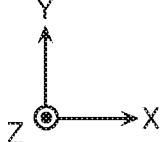

Next, a physical exemplary configuration of transistors TRd included in the sense amplifier circuit SA is described with reference to FIG. 4. FIG. 4 is a schematic diagram illustrating an example of a layout of the transistors TRd included in the sense amplifier circuit SA. The plurality of transistors TRd are formed on a semiconductor substrate (for example, a semiconductor substrate 100 described later with reference to FIG. 5 and the like).

As illustrated in FIG. 4, a plurality of element regions AAd arranged in the X-direction and the Y-direction in a grid shape are disposed on a surface of the semiconductor substrate 100. These plurality of element regions AAd each serve as source regions, drain regions, and channel regions of the plurality of transistors TRd. These plurality of element regions AAd are electrically isolated from one another by element isolation portions STId.

A plurality of gate electrodes GCd arranged in the X-direction are arranged on the individual element region AAd. In the example of FIG. 4, two gate electrodes GCd are arranged on one element region AAd. Note that an element region AAd extends in the Y-direction in a region sandwiched between two gate electrodes GCd and is connected to an adjacent element region AAd.

A gate contact CGd is connected to the gate electrode GCd. A plurality of contact electrodes CSd are connected to one element region AAd.

Contact electrodes CSd that serve as drain terminals are disposed at outsides of two gate electrodes GCd arranged in the X-direction. Each of the contact electrodes CSd that serves as the drain terminal is connected to the bit line BL or the bit line /BL.

Contact electrodes CSd that serve as source terminals are disposed on an inside of the two gate electrodes GCd arranged in the X-direction. The contact electrode CSd that serves as the source terminal is disposed also in a connecting part of the element regions AAd that are connected to one another in the Y-direction.

The contact electrodes CSd that serve as the source terminals mutually shared by the transistors TRd mutually adjacent in the X-direction are connected in common to the signal line to which the sense signal SAP is supplied or the signal line to which the sense signal SAN is supplied. Specifically, when the transistors TRd are P-channel MOS transistors, the contact electrodes CSd at the source side are connected to the signal line to which the sense signal SAP is supplied. When the transistors TRd are N-channel MOS transistors, the contact electrodes CSd at the source side are connected to the signal line to which the sense signal SAN is supplied. The signal line to which the sense signal SAP is supplied or the signal line to which the sense signal SAN is supplied may extend in the X-direction.

[Structure]

Figures 5, 6:
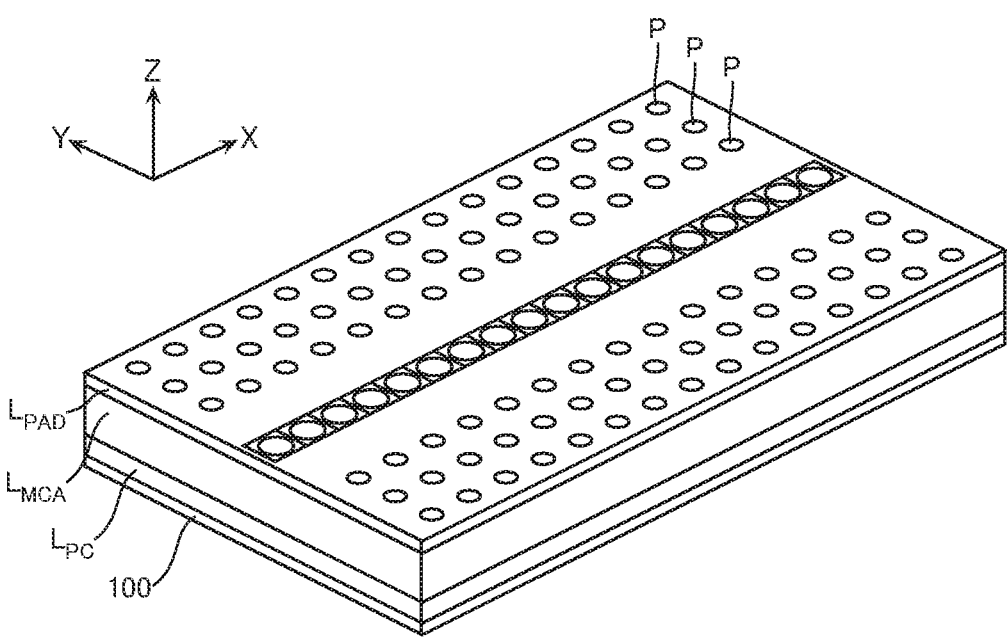
FIG. 5 is a schematic perspective view illustrating a part of the configuration of the semiconductor memory device.
FIG. 6 is a schematic plan view illustrating a part of the configuration of the semiconductor memory device.

FIG. 5 is a schematic perspective view illustrating a part of the configuration of the semiconductor memory device according to the first embodiment. As illustrated in FIG. 5, the semiconductor memory device according to the embodiment includes the semiconductor substrate 100, a peripheral circuit layer $L_{PC}$ disposed above the semiconductor substrate 100, a memory cell array layer $L_{MCA}$ disposed above the peripheral circuit layer $L_{PC}$, and a wiring layer $L_{PAD}$.

For example, the semiconductor substrate 100 contains P-type silicon (Si) containing P-type impurities, such as boron (B). For example, an N-type well region containing N-type impurities, such as phosphorus (P), a P-type well region containing P-type impurities, such as boron (B), and a semiconductor substrate region where the N-type well region and the P-type well region are not disposed are disposed on a surface of the semiconductor substrate 100. Further, the element regions AAd and the element isolation portions STId as described with reference to FIG. 4 are disposed on the surface of the semiconductor substrate 100.

A plurality of electrodes and wiring that constitute peripheral circuits are disposed in the peripheral circuit layer $L_{PC}$. A part of these plurality of electrodes are opposed to the surface of the semiconductor substrate 100 and serve as a part of transistors or capacitors.

A configuration in the memory cell array layer $L_{MCA}$ will be described later.

A plurality of external pad electrodes P arranged in the X-direction and the Y-direction are disposed in the wiring layer $L_{PAD}$. A part of these plurality of external pad electrodes P are used for, for example, supplying electric power. Further, another part of these plurality of external pad electrodes P are used for, for example, transmitting and receiving data. Additionally, further another part of these plurality of external pad electrodes P are used for, for example, controlling the semiconductor memory device. Furthermore, functions are not assigned to further another part of these plurality of external pad electrodes P.

FIG. 6 is a schematic plan view illustrating a configuration of the memory cell array layer $L_{MCA}$. The memory cell array layer $L_{MCA}$ includes a plurality of memory cell arrays 11 arranged in the X-direction and the Y-direction. In the illustrated example, 64 (which is equal to 8×8) memory cell arrays 11 are disposed in the memory cell array layer $L_{MCA}$. In a center in the Y-direction of the memory cell array layer $L_{MCA}$, wirings, such as contacts, are disposed, and the memory cell arrays 11 are not disposed.

Figure 7:
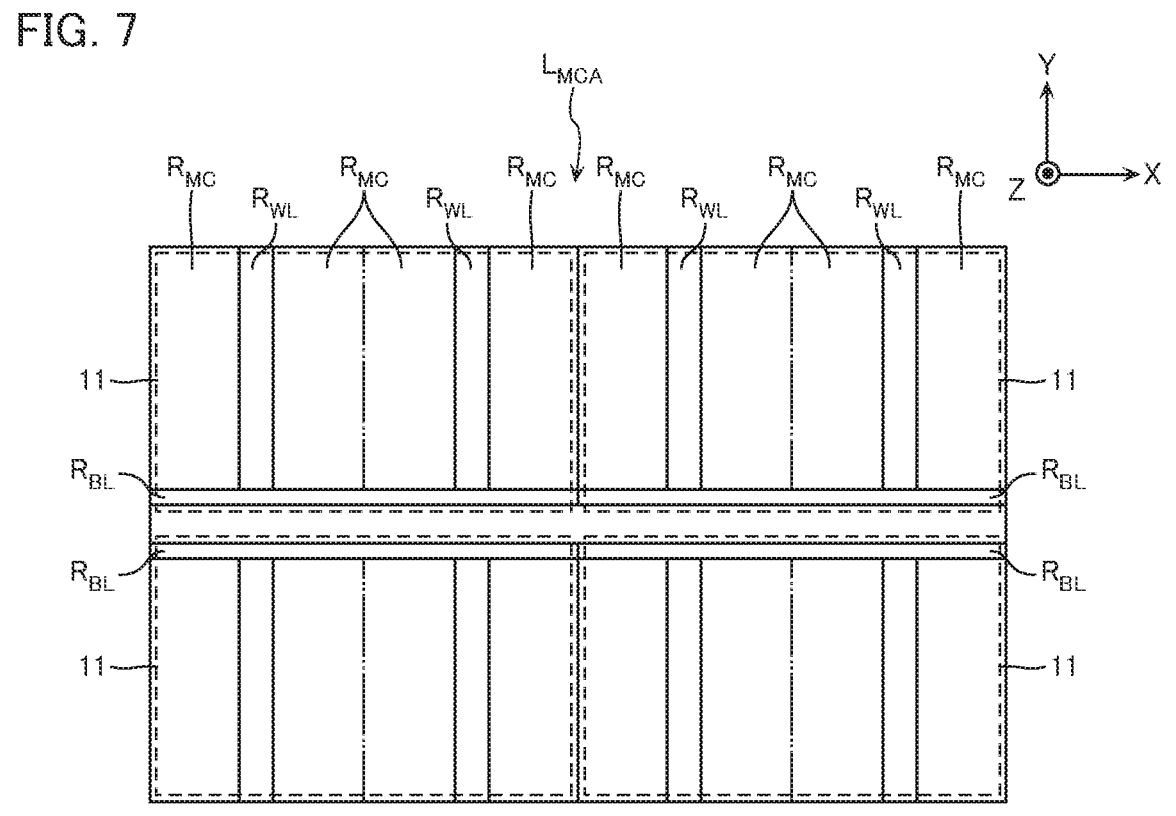

FIG. 7 is a schematic enlarged view of a part illustrated by A in FIG. 6. As illustrated in FIG. 7, the memory cell array 11 includes a plurality of memory cell regions $R_{MC}$ arranged in the X-direction. Word line connecting regions $R_{WL}$ are Disposed in Odd-Numbered Regions counted from an X-direction negative side among regions between the plurality of memory cell regions $R_{MC}$ arranged in the X-direction. A bit line connecting region $R_{BL}$ is disposed in an end portion in the Y-direction of the memory cell array 11.

In the first embodiment, the bit line connecting region $R_{BL}$ is disposed in one end portion in the Y-direction of the memory cell array 11. In the first embodiment, one of two memory cell arrays 11 mutually adjacent in the Y-direction includes the bit line BL, and the other includes the bit line /BL. These bit lines BL, /BL are connected to the common sense amplifier circuit SA. Therefore, in these two memory cell arrays 11, the bit line connecting regions $R_{BL}$ are arranged at a proximity of the common sense amplifier circuit SA. For example, in the example of FIG. 7, the bit line connecting regions $R_{BL}$ of the memory cell arrays 11 disposed on a Y-direction positive side are disposed in end portions on a Y-direction negative side of the memory cell arrays 11. The bit line connecting regions $R_{BL}$ of the memory cell arrays 11 disposed in the Y-direction negative side are disposed in end portions on the Y-direction positive side of the memory cell arrays 11.

Figure 8:
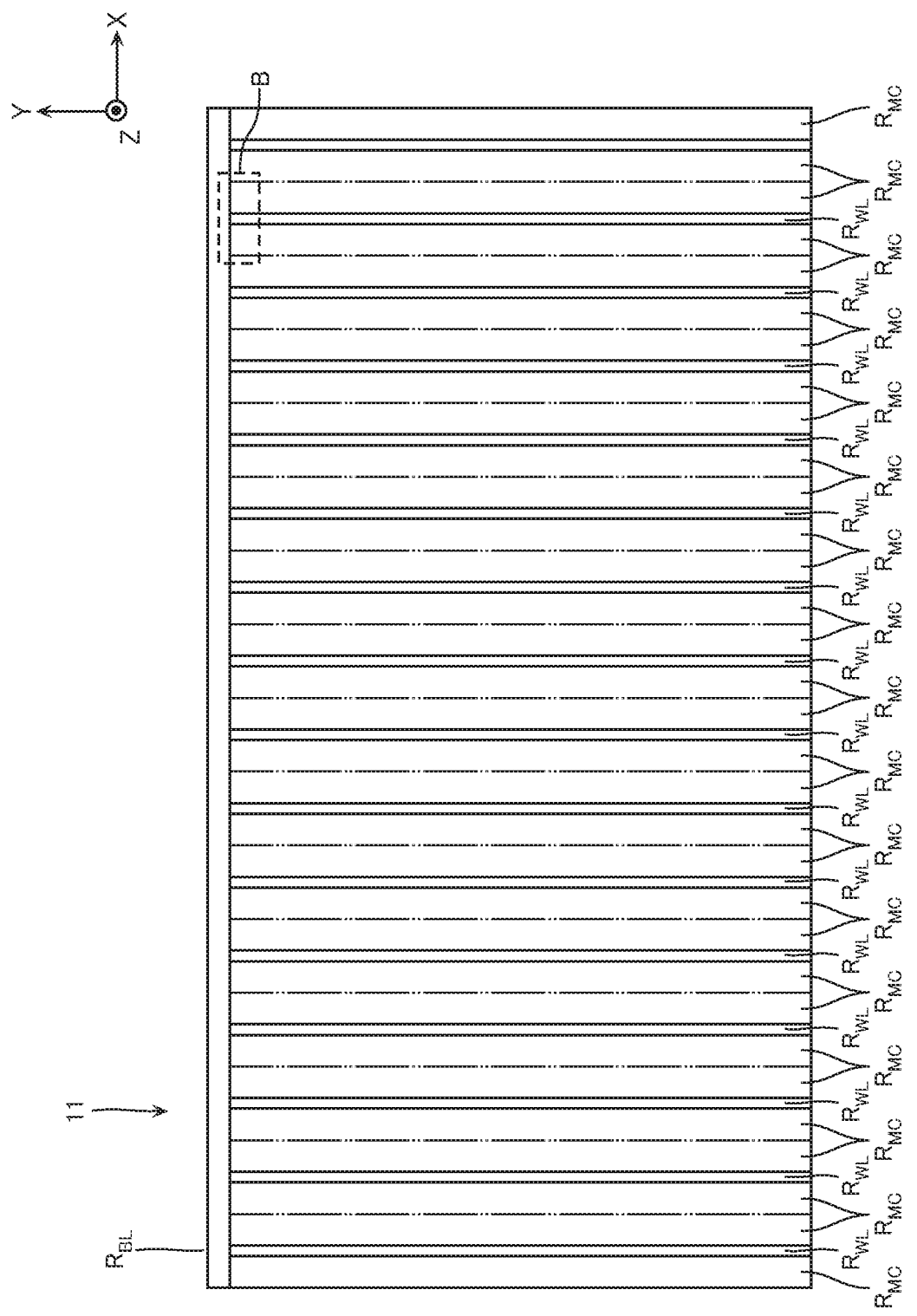
FIG. 8 is a schematic plan view illustrating a part of the configuration of the semiconductor memory device.

FIG. 8 is a schematic plan view illustrating a configuration of the memory cell array 11. While four memory cell regions $R_{MC}$ are disposed in each memory cell array 11 in the example of FIG. 7, the number of the memory cell regions $R_{MC}$ in one memory cell array 11 is not limited to four. As exemplified in FIG. 8, for example, each memory cell array 11 may include more memory cell regions $R_{MC}$ and a plurality of word line connecting regions $R_{WL}$.

Figure 9:
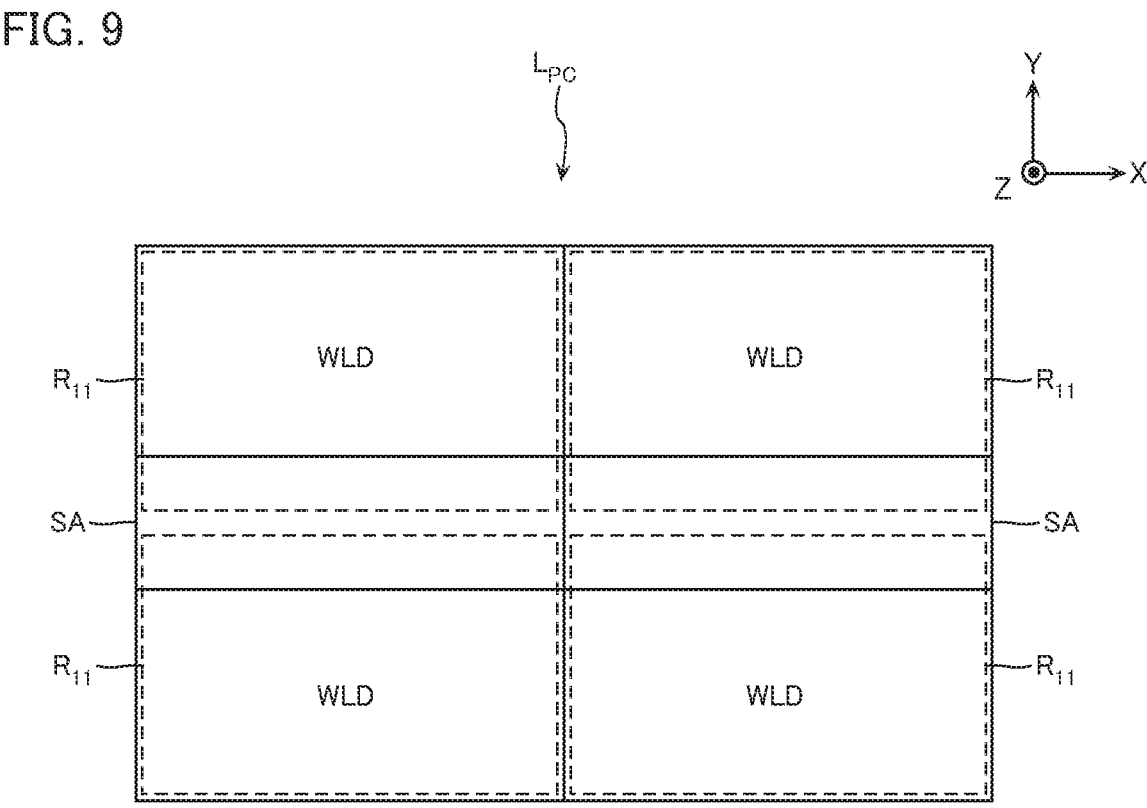
FIG. 9 is a schematic plan view illustrating a part of the configuration of the semiconductor memory device.

FIG. 9 is a schematic plan view illustrating a configuration of the peripheral circuit layer $L_{PC}$. FIG. 9 illustrates the configuration of a region that overlaps with that of FIG. 7 when viewed from the Z-direction. In FIG. 9, four regions $R_{11}$ that overlap with the memory cell arrays 11 when viewed from the Z-direction are illustrated. The peripheral circuit layer $L_{PC}$ includes a plurality of regions $R_{11}$ arranged in the X-direction and the Y-direction, corresponding to the memory cell arrays 11. In each of the regions $R_{11}$, a word line driver WLD (word line driver 30 of FIG. 1) is disposed. Further, the sense amplifier circuits SA are disposed in odd-numbered regions counted from one side in the Y-direction (for example, the Y-direction positive side) among regions between the plurality of word line drivers WLD arranged in the Y-direction. Positions in which the sense amplifier circuits SA are disposed overlap with the bit line connecting regions $R_{BL}$ (FIG. 7) when viewed from the upper side.

Figure 10:
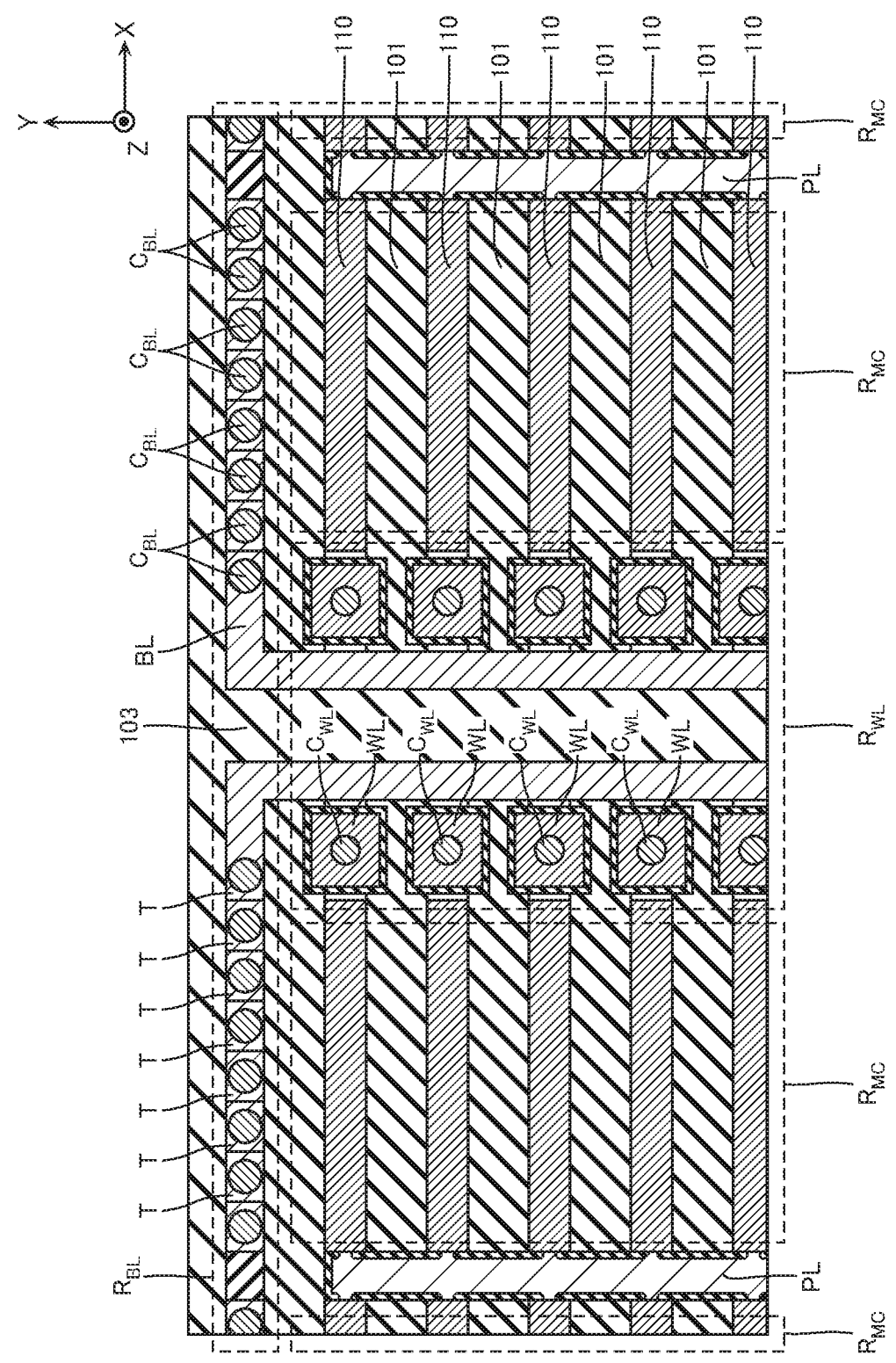
FIG. 10 is a schematic plan view illustrating a part of the configuration of the semiconductor memory device.
Figure 11:
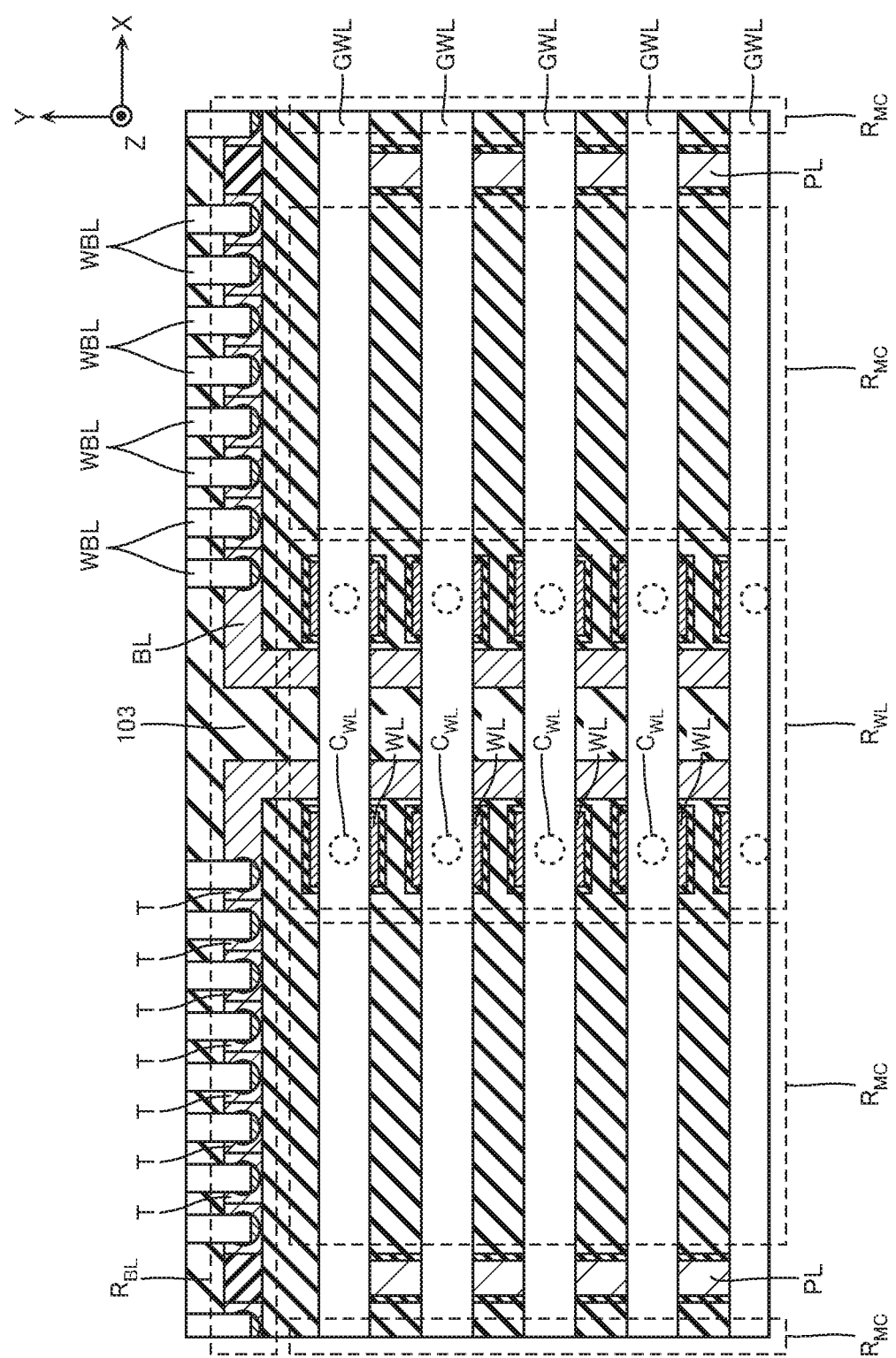
FIG. 11 is a schematic plan view illustrating a part of the configuration of the semiconductor memory device.
Figure 12:
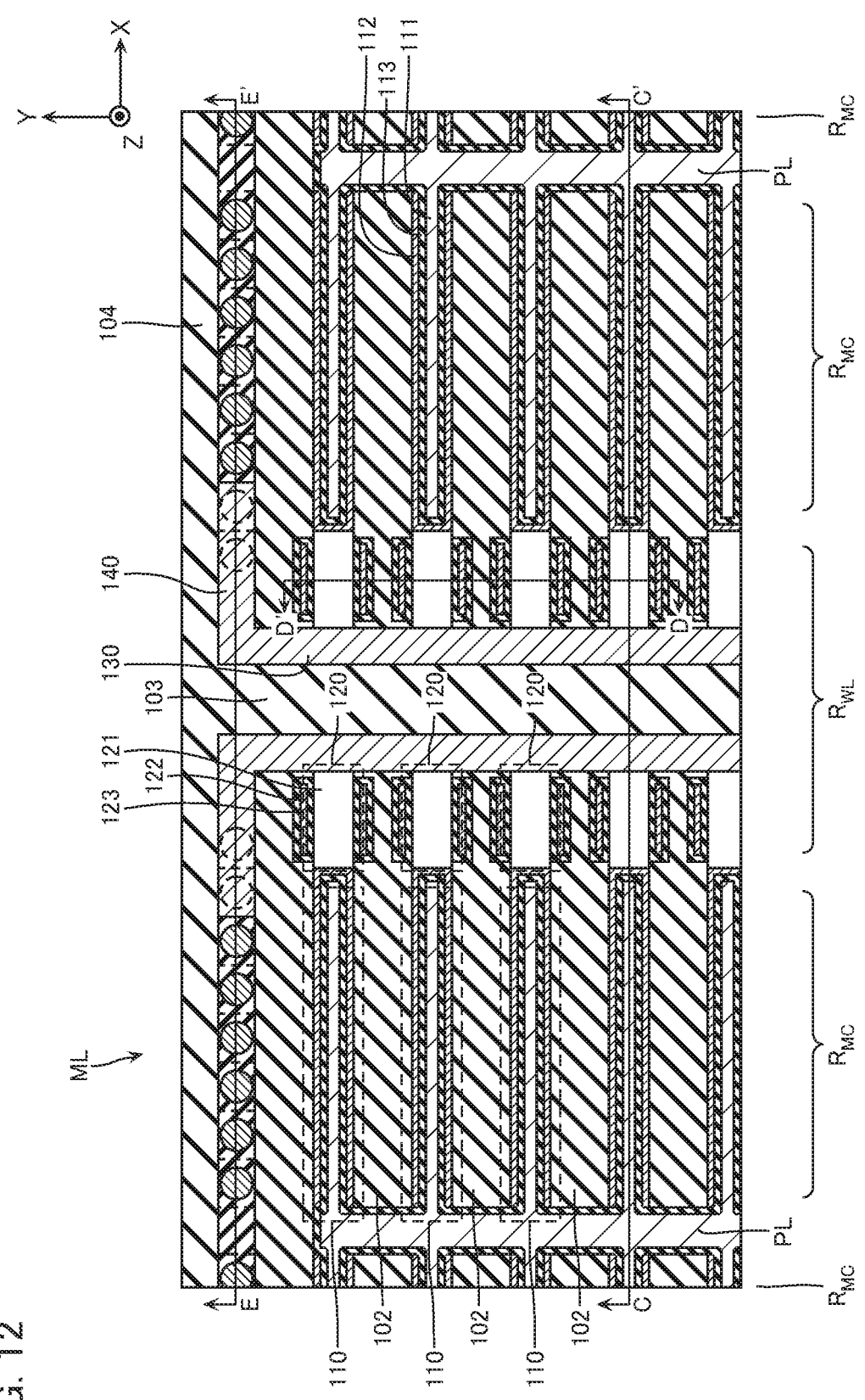
FIG. 12 is a schematic cross-sectional view illustrating a part of the configuration of the semiconductor memory device.
Figure 13:
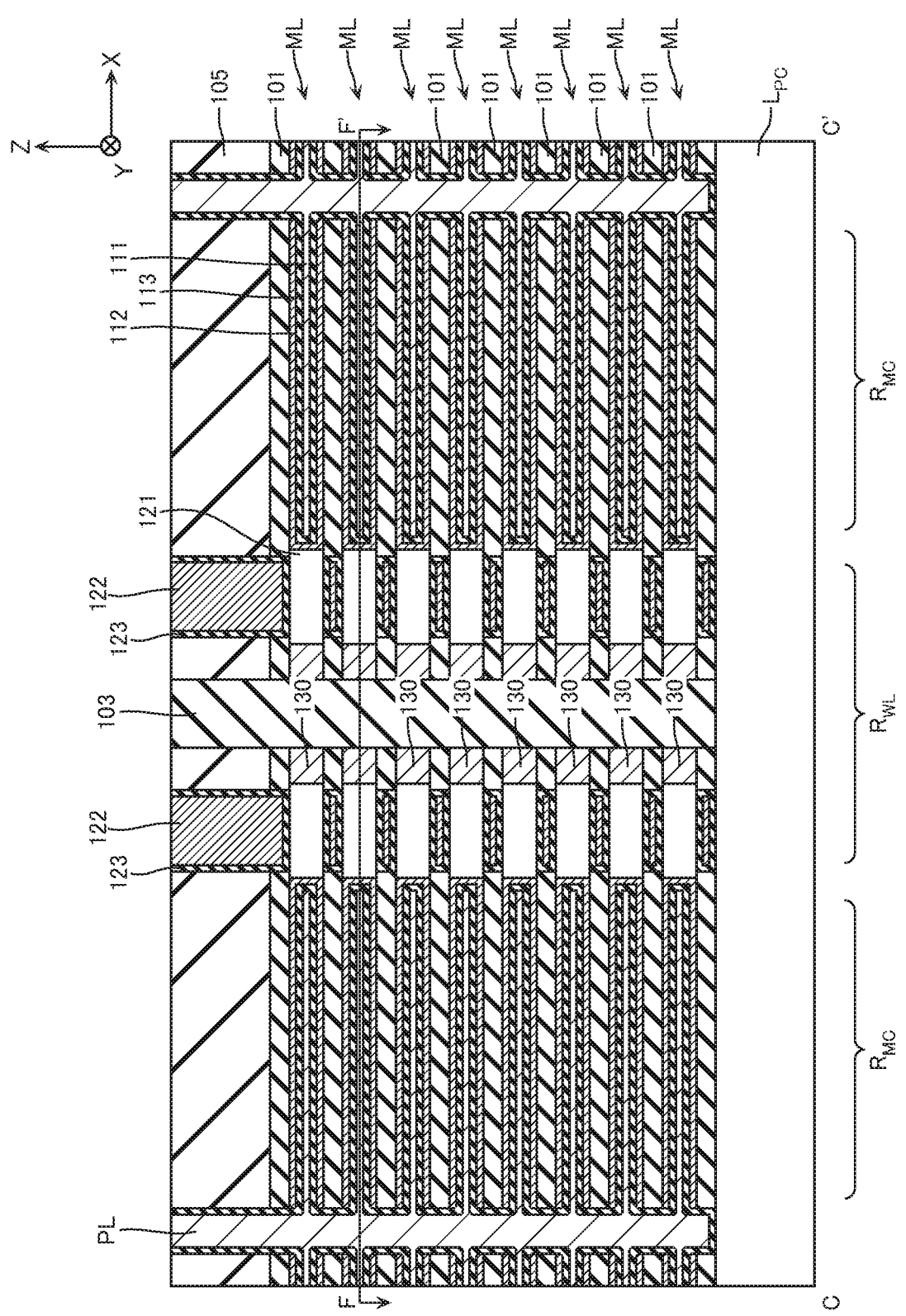
FIG. 13 is a schematic cross-sectional view illustrating a part of the configuration of the semiconductor memory device.
Figure 14:
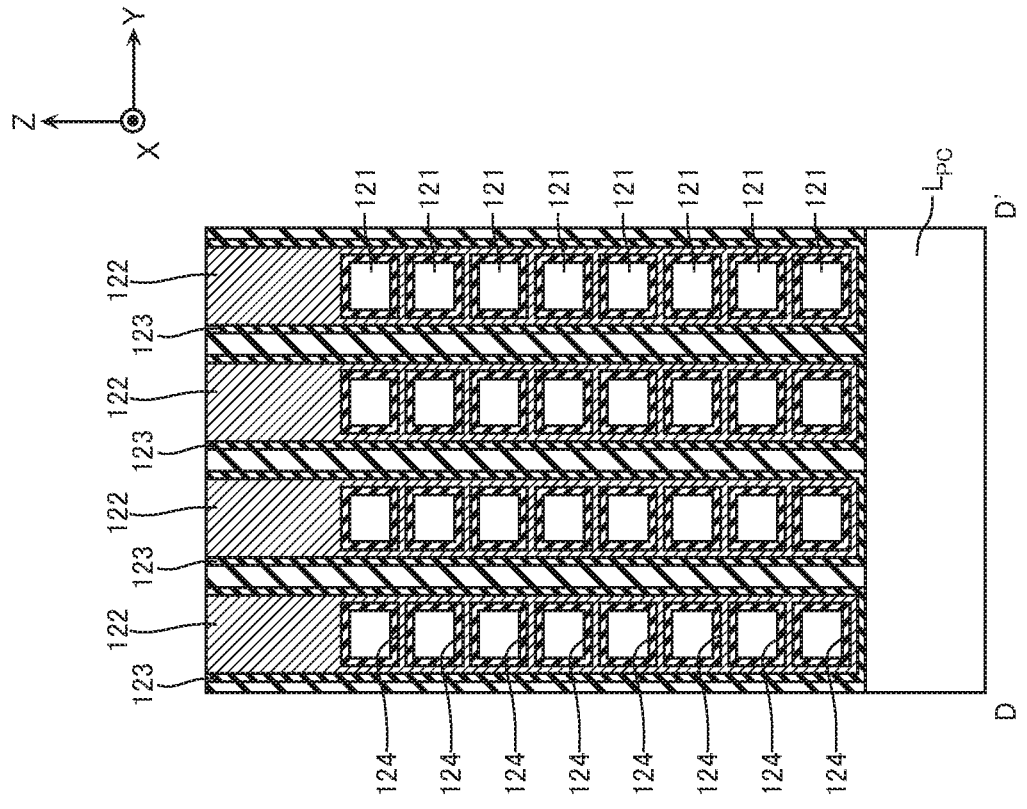
FIG. 14 is a schematic cross-sectional view illustrating a part of the configuration of the semiconductor memory device.
Figure 15:
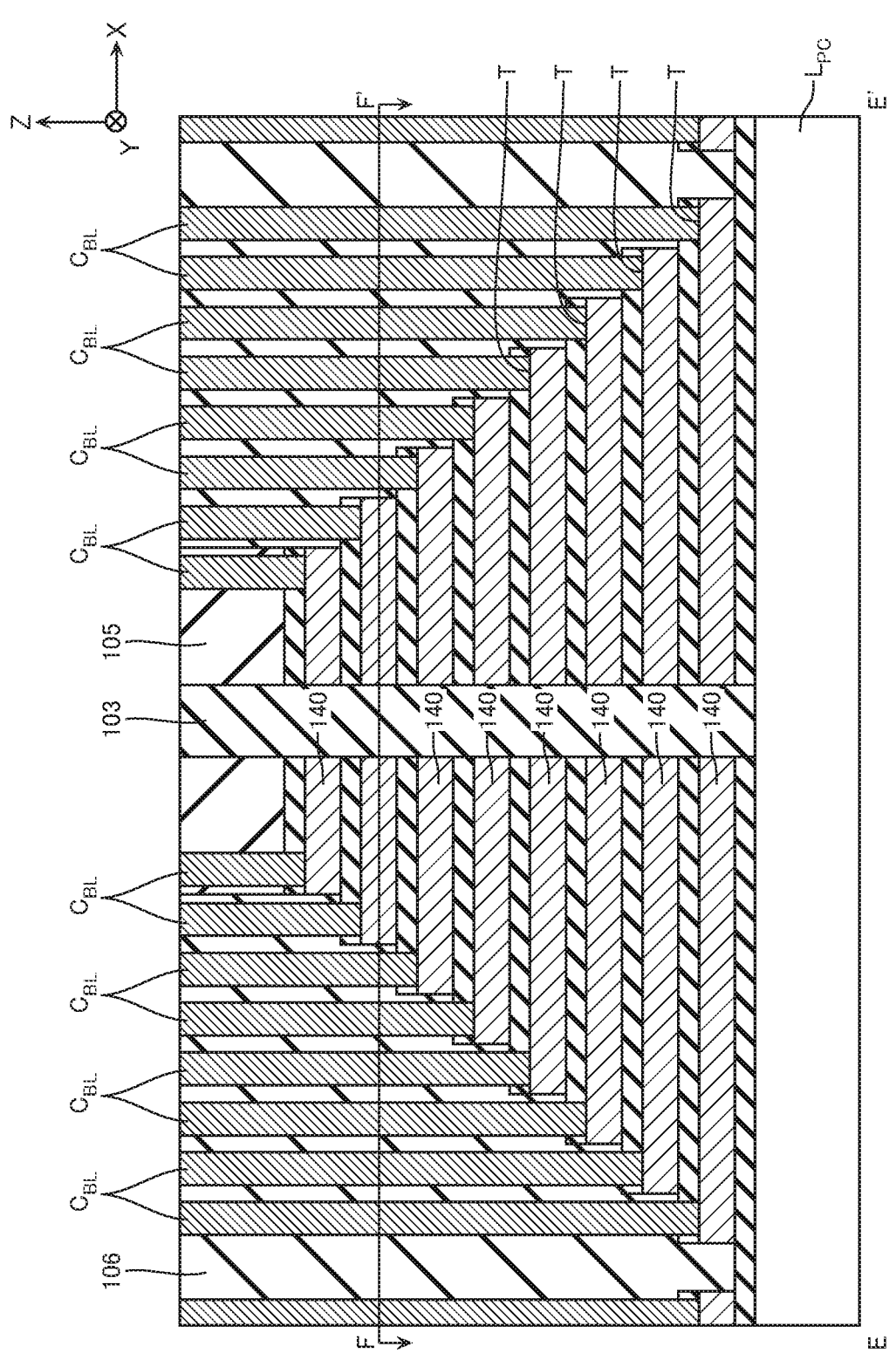
FIG. 15 is a schematic cross-sectional view illustrating a part of the configuration of the semiconductor memory device.

FIG. 10 and FIG. 11 are schematic enlarged views of a part illustrated by B in FIG. 8. FIG. 12 is a schematic XY cross-sectional view illustrating a configuration of a region that overlaps with FIG. 10 and FIG. 11 when viewed from the Z-direction. FIG. 13 is a schematic cross-sectional view of a structure illustrated in FIG. 12 taken along the line C-C' and viewed along an arrow direction. FIG. 14 is a schematic cross-sectional view of the structure illustrated in FIG. 12 taken along the line D-D' and viewed along an arrow direction. FIG. 15 is a schematic cross-sectional view of the structure illustrated in FIG. 12 taken along the line E-E' and viewed along an arrow direction. Note that, FIG. 12 is a schematic cross-sectional view of a structure illustrated in FIG. 13 and FIG. 15 taken along the line F-F' and viewed along an arrow direction.

As illustrated in FIG. 13, for example, the memory cell array 11 includes a plurality of memory layers ML and insulating layers 101 of silicon oxide ($SiO_2$) or the like alternately arranged in the Z-direction. Insulating layers 105 of silicon oxide ($SiO_2$) or the like are disposed above these plurality of memory layers ML and insulating layers 101.

As illustrated in FIG. 12, the memory layer ML includes a plurality of capacitor structures 110 and insulating layers 102 of silicon oxide ($SiO_2$) or the like that are disposed in the memory cell regions $R_{MC}$ and alternately arranged in the Y-direction. The capacitor structure 110 includes electrodes 111, 112 and an insulating layer 113 disposed therebetween.

The electrodes 111 serve as one electrodes of the cell capacitors CpC (FIG. 2). The electrode 111 extends in the X-direction. The electrode 111 has one end portion in the X-direction connected to the plate line PL. For example, the electrodes 111, 112 may contain polysilicon (Poly-Si), tungsten (W), tungsten nitride (WN), tungsten silicide (WSi), tungsten silicon nitride (WSiN), molybdenum (Mo), molybdenum nitride (MoN), iridium (Ir), iridium oxide (IrO), ruthenium (Ru), ruthenium oxide (RuO), tantalum nitride (TaN), titanium nitride (TiN), titanium silicon nitride (TiSiN), ruthenium titanium nitride (RuTiN), or the like, may contain another conductive material, or may contain a stacked film of a plurality of conductive materials.

The plate lines PL extend in the Y-direction and the Z-direction and separate the plurality of memory layers ML in the X-direction. Side surfaces on one side and on the other side in the X-direction of the plate line PL are each connected to the plurality of electrodes 111 corresponding to the plurality of memory layers ML and the plurality of capacitor structures 110. The plate line PL may contain, for example, a material similar to that of the electrode 111.

The electrodes 112 serve as the other electrodes of the cell capacitors CpC (FIG. 2). The electrode 112 is opposed to outer circumferential surfaces (an upper surface, a lower surface and both side surfaces in the Y-direction) of the electrode 111 and extends in the X-direction along the outer circumferential surfaces of the electrode 111. The electrode 112 has one end portion in the X-direction connected to a semiconductor layer 121 described later. The electrode 112 may contain, for example, a material similar to that of the electrode 111.

The insulating layer 113 is disposed between the electrodes 111, 112. The insulating layer 113 insulates the electrode 111 from the electrode 112. For example, the insulating layer 113 may contain aluminum oxide (AlO), zirconium oxide (ZrO), hafnium oxide (HfO), niobium oxide (NbO), tantalum oxide (TaO), barium strontium titanate (BST), lead zirconate titanate (PZT), strontium bismuth tantalate (SBT), or another insulating metal oxide, may contain another insulating material, or may be their mixture, such as ZrHfO, ZrAlO, and ZrNbO. The insulating layer 113 may contain a stacked film of a plurality of insulating materials, such as a stacked film (ZAZ) of zirconium oxide, aluminum oxide, and zirconium oxide, and a stacked film of ZrHfO, ZrAlO, and ZrNbO. The insulating layer 113 may be ferroelectric.

As illustrated in FIG. 12, the memory layer ML includes a plurality of transistor structures 120 that are disposed in the word line connecting region $R_{WL}$ and arranged in the Y-direction. The transistor structure 120 includes the semiconductor layer 121. In the word line connecting region $R_{WL}$, conductive layers 122 and insulating layers 123 disposed on outer circumferential surfaces of the conductive layers 122 are disposed.

The semiconductor layers 121 serve as channel regions and the like of the cell transistors TrC (FIG. 2). The semiconductor layer 121 extends in the X-direction. For example, the semiconductor layer 121 may contain silicon (Si), germanium (Ge), carbon (C), zinc tin oxide (ZnSnO: generally referred to as "ZTO"), indium zinc oxide (InZnO: generally referred to as "IZO"), indium gallium zinc oxide (InGaZnO: generally referred to as "IGZO"), indium gallium silicon oxide (InGaSiO: generally referred to as "IGSO"), indium tungsten oxide (InWO: generally referred to as "IWO"), or another semiconductor material, or may contain a stacked film of a plurality of semiconductor materials.

The conductive layers 122 each serve as gate electrodes of the plurality of cell transistors TrC (FIG. 2) arranged in the Z-direction and the word line WL. A plurality of conductive layers 122 are disposed corresponding to the plurality of transistor structures 120 arranged in the Y-direction. As illustrated in FIG. 14, the conductive layers 122 penetrate the plurality of memory layers ML to extend in the Z-direction. The conductive layer 122 includes opposed surfaces 124 opposed to outer circumferential surfaces (upper surfaces, lower surfaces and both side surfaces in the Y-direction) of the plurality of transistor structures 120. The opposed surface 124 covers the outer circumferential surfaces of the semiconductor layers 121 over the whole circumference on a YZ cross-sectional surface as exemplified in FIG. 14. For example, the conductive layer 122 may contain polysilicon (Poly-Si), tungsten (W), tungsten nitride (WN), tungsten silicide (WSi), tungsten silicon nitride (WSiN), molybdenum (Mo), molybdenum nitride (MoN), iridium (Ir), iridium oxide (IrO), ruthenium (Ru), ruthenium oxide (RuO), tantalum nitride (TaN), titanium nitride (TiN), titanium silicon nitride (TiSiN), ruthenium titanium nitride (RuTiN), or the like, may contain another conductive material, or may contain a stacked film of a plurality of conductive materials.

As illustrated in FIG. 10, a plurality of contact electrodes $C_{WL}$ connected to the respective plurality of conductive layers 122 are disposed in the word line connecting region $R_{WL}$. As illustrated in FIG. 11, the plurality of conductive layers 122 arranged in the X-direction are connected to a common global word line GWL, extracted in the X-direction, and connected to the word line driver WLD.

The insulating layers 123 each serve as gate insulating films of the cell transistors TrC. The insulating layer 123 includes a part that covers the outer circumferential surfaces of the conductive layer 122 and parts disposed between the semiconductor layers 121 and the conductive layer 122. The insulating layer 123 insulates the semiconductor layers 121 from the conductive layer 122. For example, the insulating layer 123 may contain aluminum oxide (AlO), zirconium oxide (ZrO), hafnium oxide (HfO), niobium oxide (NbO), tantalum oxide (TaO), barium strontium titanate (BST), lead zirconate titanate (PZT), strontium bismuth tantalate (SBT), or another insulating metal oxide, may contain another insulating material, or may be their mixture, such as ZrHfO, ZrAlO, and ZrNbO. The insulating layer 123 may contain a stacked film of a plurality of insulating materials. The insulating layer 123 may contain, for example, a material similar to that of the insulating layer 113.

As illustrated in FIG. 12, the memory layer ML includes two conductive layers 130 that are disposed in one of the word line connecting regions $R_{WL}$, are arranged in the X-direction, and extend in the Y-direction. An insulating layer 103 of silicon oxide (SiO$_2$) or the like is disposed between the two conductive layers 130 arranged in the X-direction.

The conductive layers 130 serve as the bit lines BL, /BL. For example, the conductive layer 130 may contain polysilicon (Poly-Si), tungsten (W), tungsten nitride (WN), tungsten silicide (WSi), tungsten silicon nitride (WSiN), molybdenum (Mo), molybdenum nitride (MoN), iridium (Ir), iridium oxide (IrO), ruthenium (Ru), ruthenium oxide (RuO), tantalum nitride (TaN), titanium nitride (TiN), titanium silicon nitride (TiSiN), ruthenium titanium nitride (RuTiN), or the like, may contain another conductive material, or may contain a stacked film of a plurality of conductive materials, such as a stacked film of titanium nitride (TiN) and tungsten (W).

As illustrated in FIG. 12, the memory layer ML includes conductive layers 140 that are disposed in the bit line connecting region $R_{BL}$ and extend in the X-direction. An insulating layer 104 of silicon oxide (SiO$_2$) or the like is disposed on side surfaces in the Y-direction of the conductive layers 140.

In the example of FIG. 12, the conductive layers 140 are connected to end portions in the Y-direction of the conductive layers 130. The conductive layer 140 may contain, for example, a material similar to that of the conductive layer 130. In the example of FIG. 12, the plurality of conductive layers 140 arranged in the X-direction are electrically independent for each memory cell region $R_{MC}$.

In the embodiment, the conductive layers 130, 140 are parts of one continuous conductive layer. That is, one conductive layer 130 is continuous to one conductive layer 140. In FIG. 12, approximately L-shaped conductive layers are exemplified. The conductive layer 130 is a part of this conductive layer, which is disposed in the word line connecting region $R_{WL}$. The conductive layer 140 is a part of this conductive layer, which is disposed in the bit line connecting region $R_{BL}$.

As illustrated in FIG. 10, for example, a plurality of terrace portions T of the conductive layers 140, and a plurality of contact electrodes $C_{BL}$ connected to these plurality of terrace portions T are disposed in the bit line connecting region $R_{BL}$.

As illustrated in FIG. 15, for example, the terrace portion T of one conductive layer 140 means a part that does not overlap with other conductive layers 140 disposed at higher positions than a position at which the one conductive layer

140 is disposed of an upper surface of the one conductive layer 140 when viewed from an upper side (Z-direction positive side). Insulating layers 106 of silicon oxide ($SiO_2$) or the like are disposed above the plurality of terrace portions T.

The contact electrodes $C_{BL}$ are arranged in the X-direction corresponding to the plurality of terrace portions T. Each of the contact electrodes $C_{BL}$ penetrates the insulating layer 106 and the insulating layer 101 to extend in the Z-direction and has a lower end connected to the terrace portion T of the conductive layer 140. For example, the contact electrode $C_{BL}$ may contain titanium nitride (TiN) or the like, may contain another conductive material, or may contain a stacked film of a plurality of conductive materials, such as a stacked film of titanium nitride (TiN) and tungsten (W). As illustrated in FIG. 11, these plurality of contact electrodes $C_{BL}$ are each connected to one of a plurality of wirings WBL and extracted in the Y-direction. These plurality of wirings WBL are arranged in the X-direction and extend in the Y-direction.

[Effect]

As described with reference to FIG. 12 and the like, the semiconductor memory device according to the first embodiment includes the conductive layers 130 extending in the Y-direction and the conductive layers 140 extending in the X-direction as configurations that serve as the bit lines BL. In the bit line connecting region $R_{BL}$, the plurality of contact electrodes $C_{BL}$ arranged in the X-direction are disposed, and these plurality of contact electrodes $C_{BL}$ are connected to the respective terrace portions T of the conductive layers 140. With such a configuration, because the memory cell array layer $L_{MCA}$ has a rectangular shape, for example, compared with a configuration in which the plurality of contact electrodes $C_{BL}$ are arranged in the Y-direction, a layout of an entire chip is facilitated and it contributes to saving space in some cases.

[Manufacturing Method]

FIG. 16 to FIG. 50 are schematic cross-sectional views for describing a manufacturing method of the semiconductor memory device according to the first embodiment. FIG. 17, FIG. 19, FIG. 21, FIG. 23, FIG. 25, FIG. 27, FIG. 29 to FIG. 31, FIG. 33, FIG. 35, FIG. 37, FIG. 39, FIG. 41, FIG. 43, FIG. 45, and FIG. 48 illustrate the part illustrated in FIG. 12. FIG. 16, FIG. 18, FIG. 20, FIG. 22, FIG. 24, FIG. 26, FIG. 32, FIG. 34, FIG. 36, FIG. 38, FIG. 40, FIG. 42, FIG. 44, FIG. 46, and FIG. 49 illustrate the part illustrated in FIG. 13. FIG. 47 and FIG. 50 illustrate the part illustrated in FIG. 14. FIG. 28 illustrates the part illustrated in FIG. 15.

Figure 16:
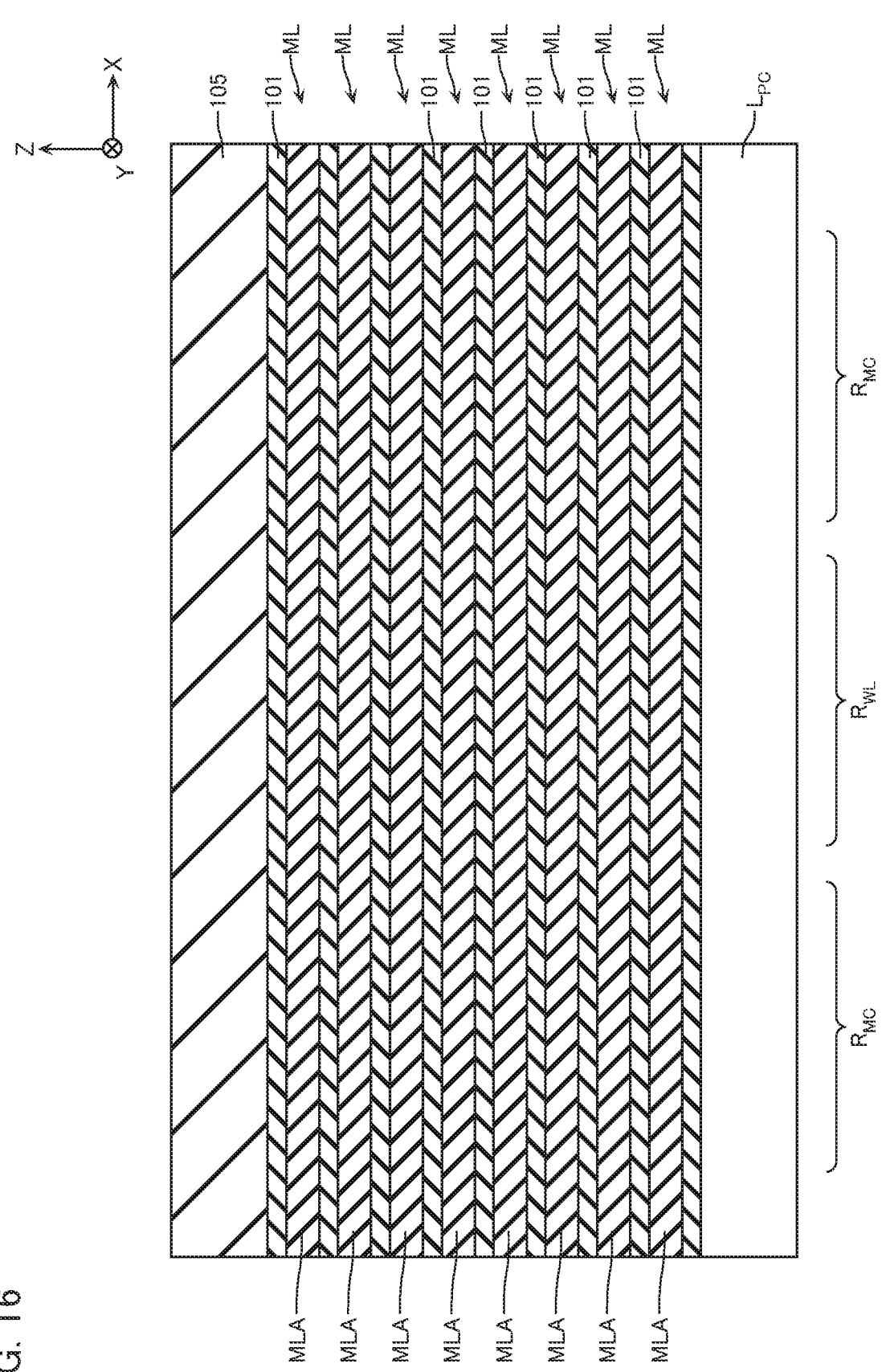
FIG. 16 is a schematic cross-sectional view for describing a manufacturing method of the semiconductor memory device according to the first embodiment.

In the manufacturing method, as illustrated in FIG. 16, for example, the plurality of insulating layers 101 and a plurality of sacrifice layers MLA are formed alternately. The sacrifice layer MLA contains, for example, silicon nitride ($Si_3N_4$) or the like. The insulating layer 105 is formed above these configurations. This process is performed by, for example, a method, such as Chemical Vapor Deposition (CVD).

Figure 17:
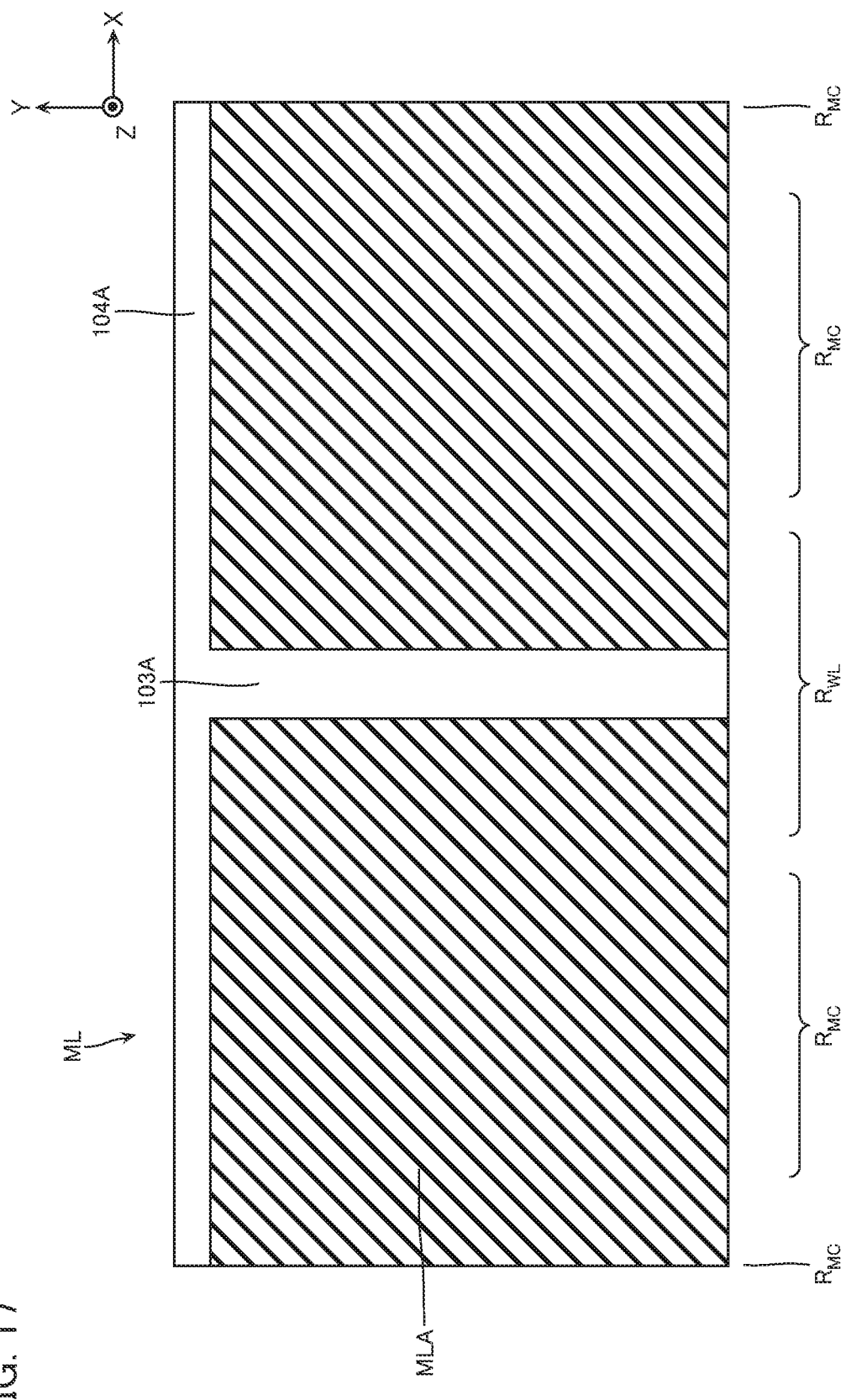
FIG. 17 is a schematic cross-sectional view for describing the manufacturing method.
Figure 18:
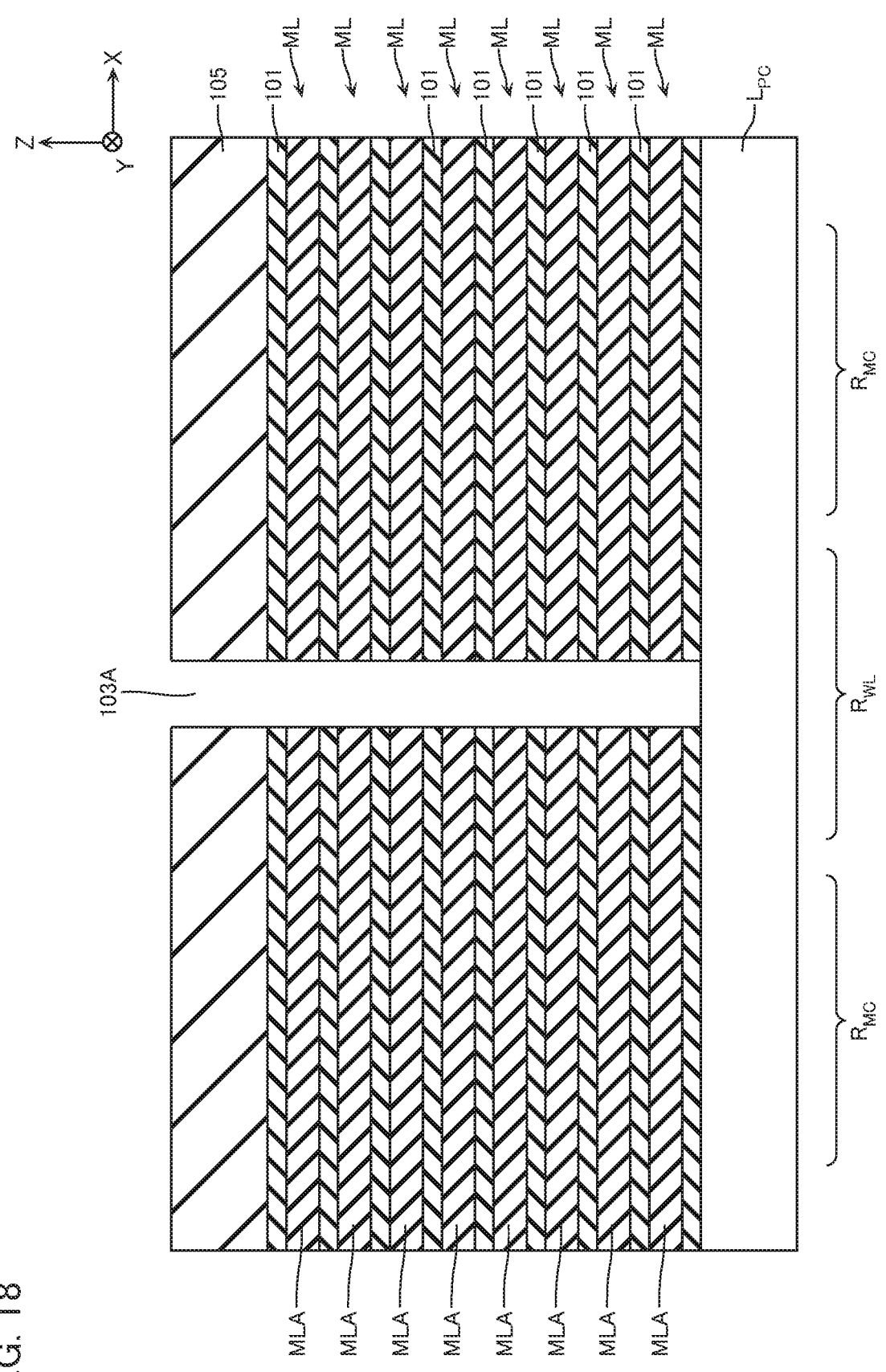
FIG. 18 is a schematic cross-sectional view for describing the manufacturing method.

Next, as illustrated in FIG. 17 and FIG. 18, for example, openings 103A, 104A are formed in positions corresponding to the insulating layers 103, 104. As illustrated in FIG. 17, the opening 103A extends in the Y-direction and the opening 104A extends in the X-direction. As illustrated in FIG. 18, the opening 103A extends in the Z-direction, penetrates the plurality of insulating layers 101 and the plurality of sacrifice layers MLA arranged in the Z-direction, and separates these configurations in the X-direction. Although not illustrated, the opening 104A also extends in the Z-direction, penetrates the plurality of insulating layers 101 and the plurality of sacrifice layers MLA arranged in the Z-direction, and separates these configurations in the Y-direction. This process is performed by, for example, a method, such as Reactive Ion Etching (RIE).

Figure 19:
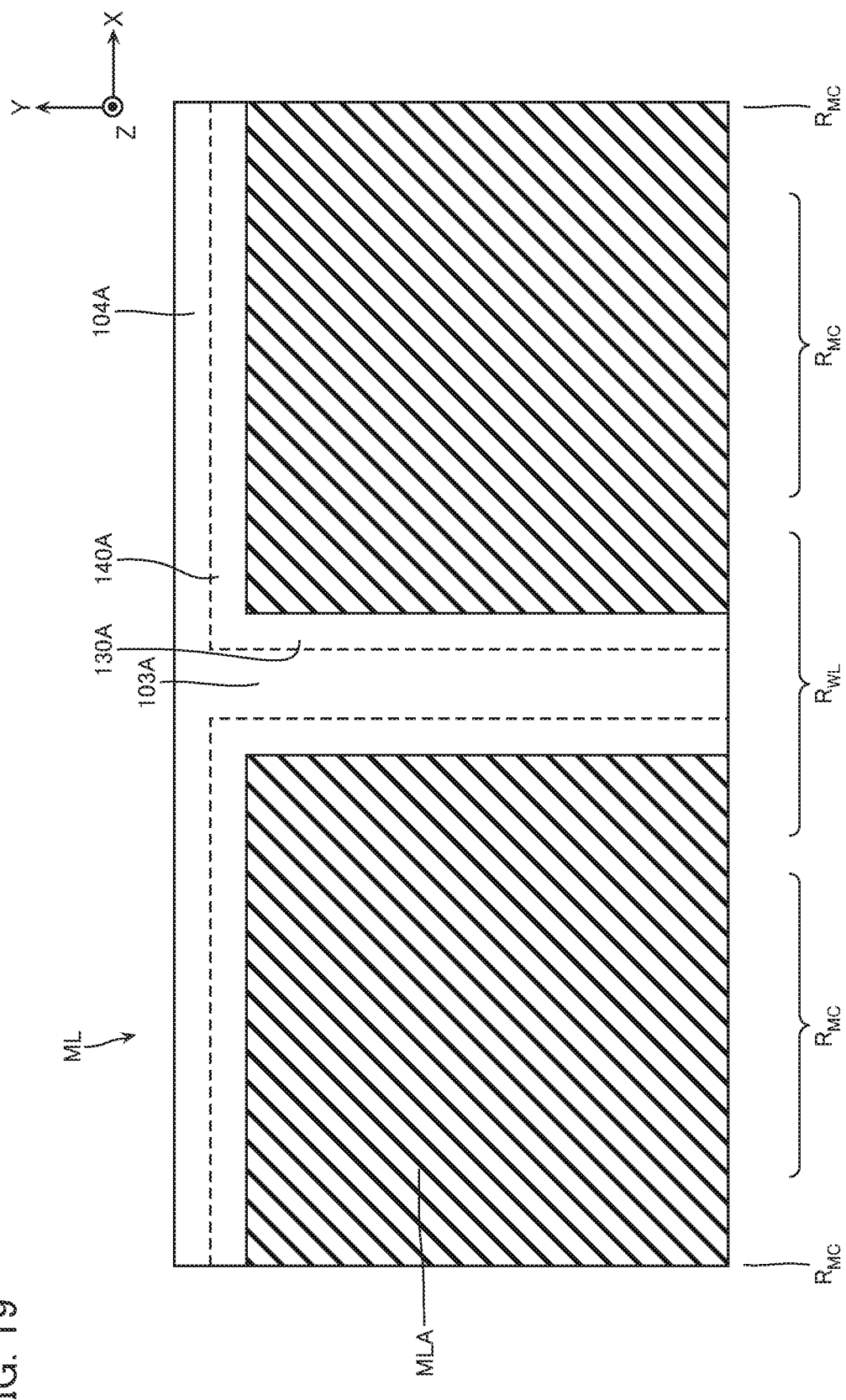
FIG. 19 is a schematic cross-sectional view for describing the manufacturing method.
Figure 20:
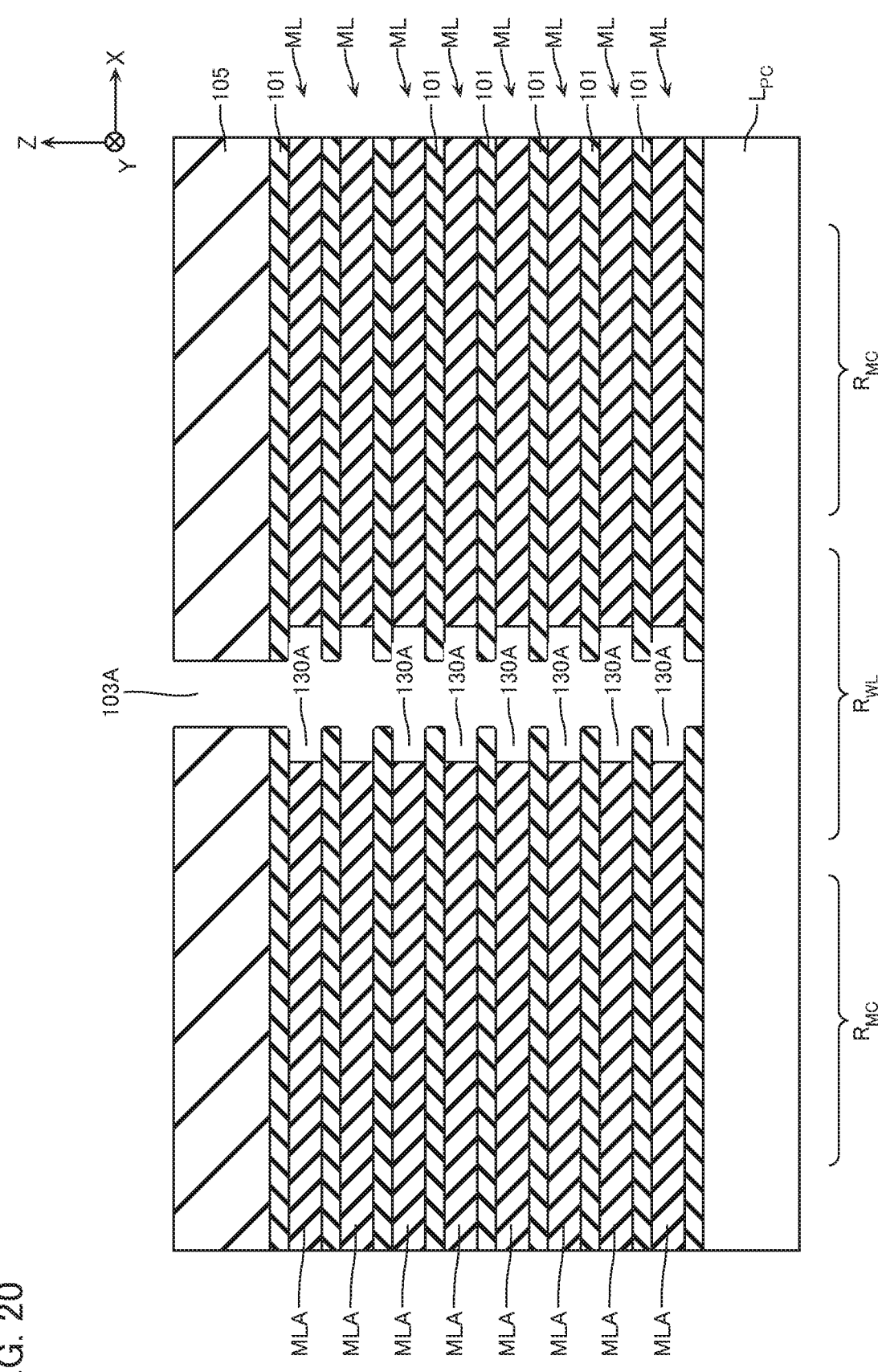
FIG. 20 is a schematic cross-sectional view for describing the manufacturing method.

Next, as illustrated in FIG. 19 and FIG. 20, for example, the sacrifice layers MLA are partially removed via the openings 103A, 104A. Accordingly, at a proximity of the openings 103A, 104A, recessed portions 130A, 140A are formed, and upper surfaces and lower surfaces of the insulating layers 101 are partially exposed. The recessed portions 130A extend in the Y-direction along the opening 103A. The recessed portions 140A extend in the X-direction along the opening 104A. This process is performed by, for example, a method, such as wet etching.

Figure 21:
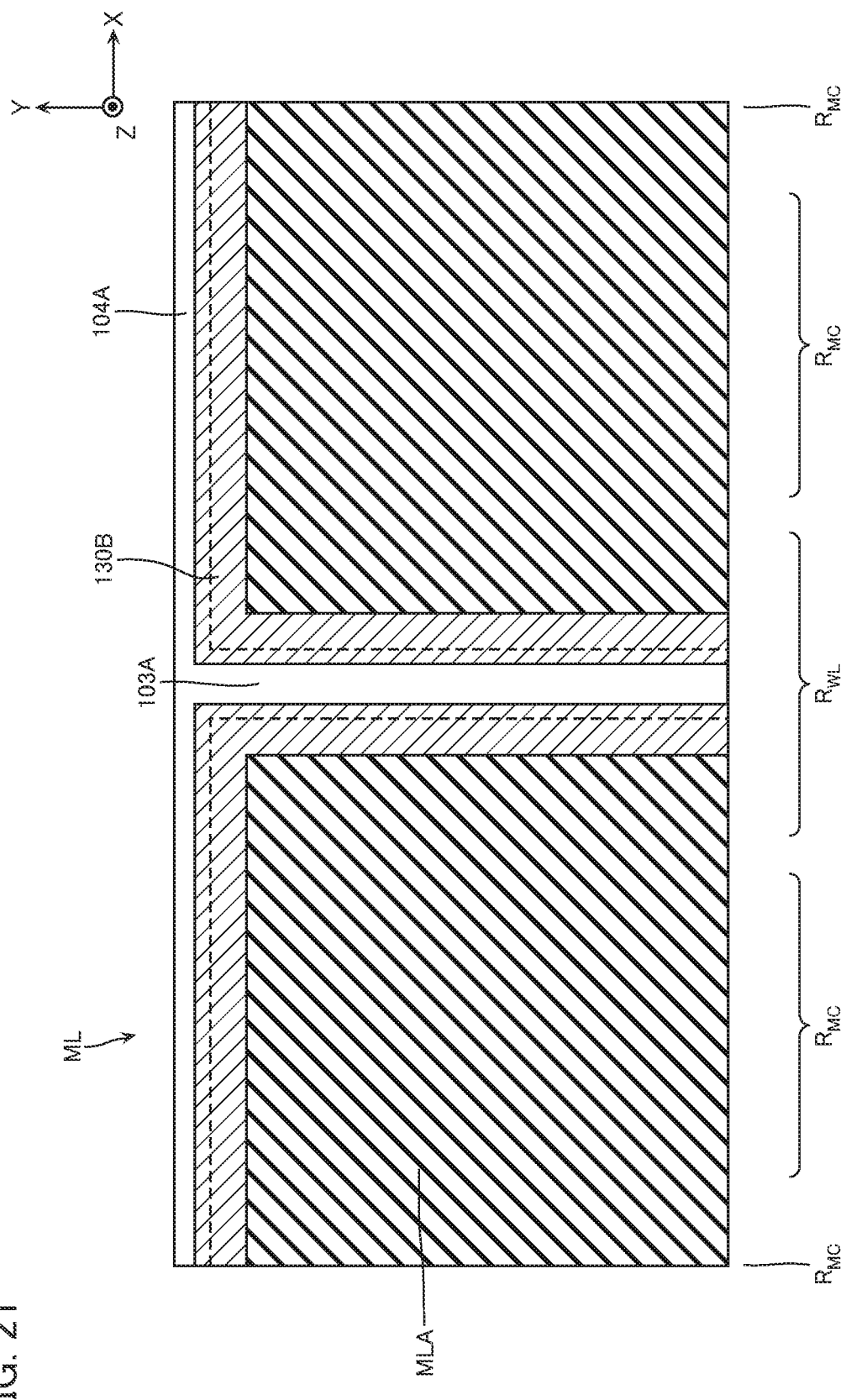
FIG. 21 is a schematic cross-sectional view for describing the manufacturing method.
Figure 22:
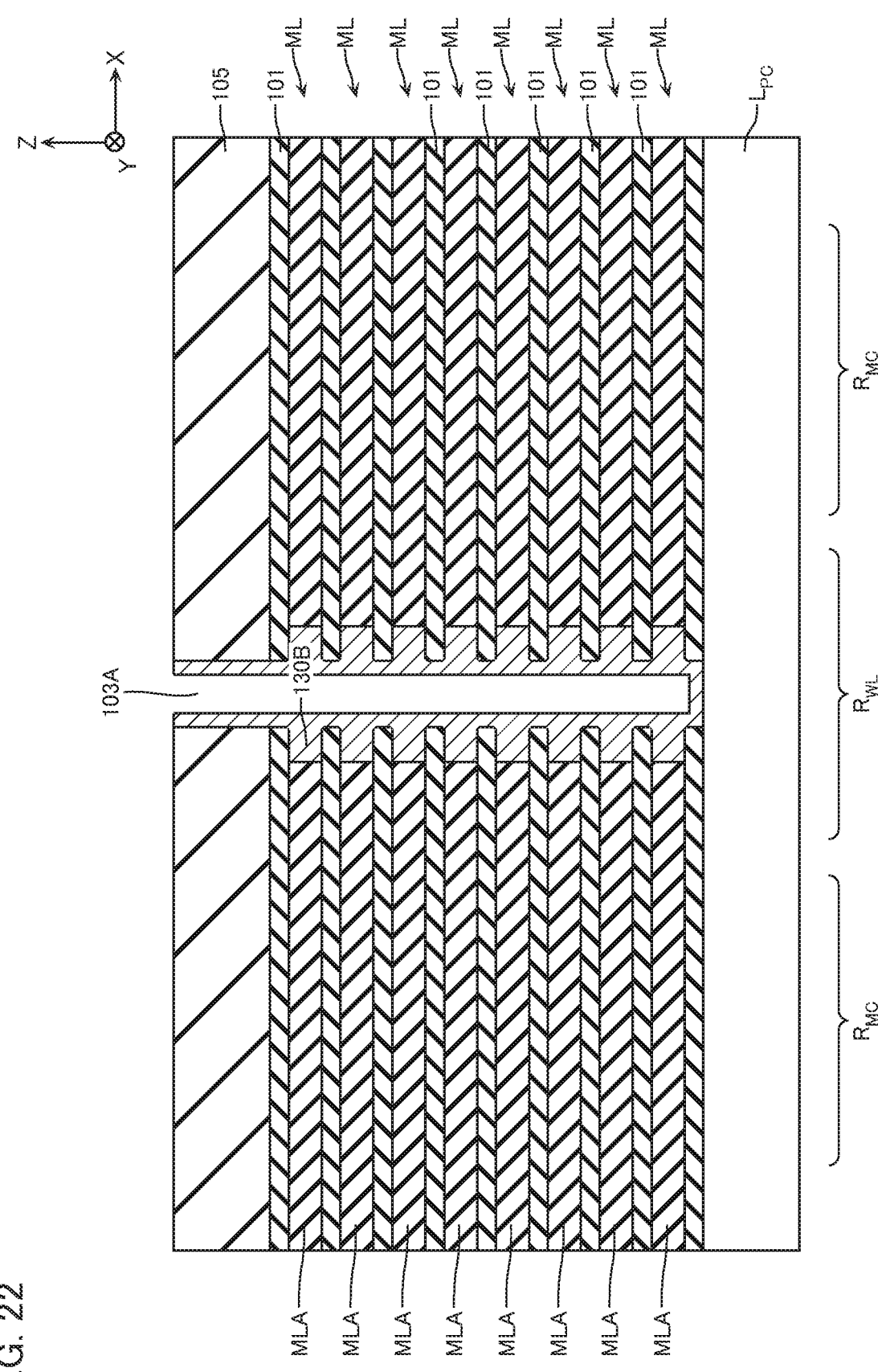
FIG. 22 is a schematic cross-sectional view for describing the manufacturing method.

Next, as illustrated in FIG. 21 and FIG. 22, for example, conductive layers 130B are formed. The conductive layers 130B are formed to be thick enough to fill the recessed portions 130A, 140A. Further, the conductive layers 130B are formed to be thin enough not to fill the openings 103A, 104A. This process is performed by, for example, a method, such as CVD.

Figure 23:
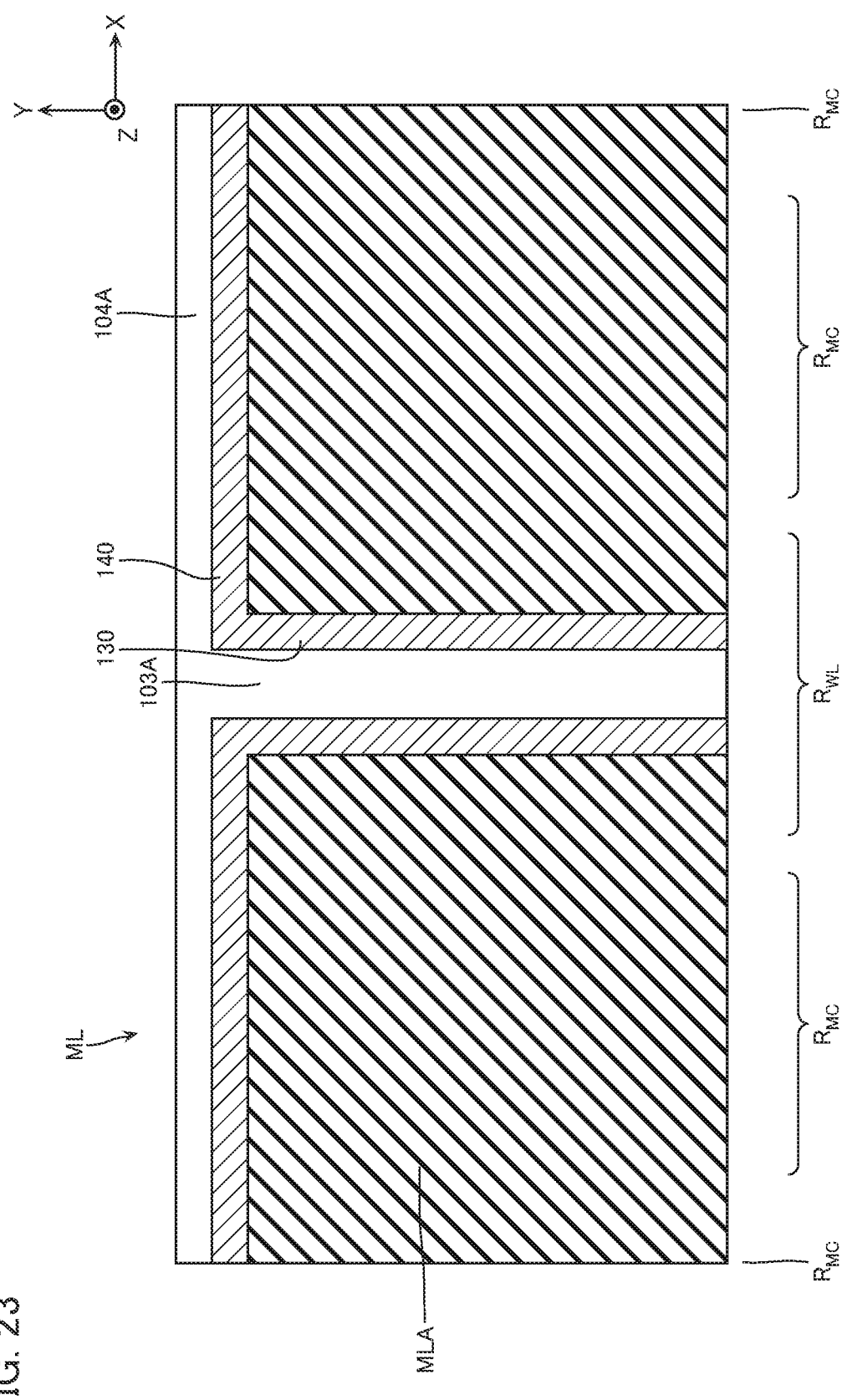
FIG. 23 is a schematic cross-sectional view for describing the manufacturing method.
Figure 24:
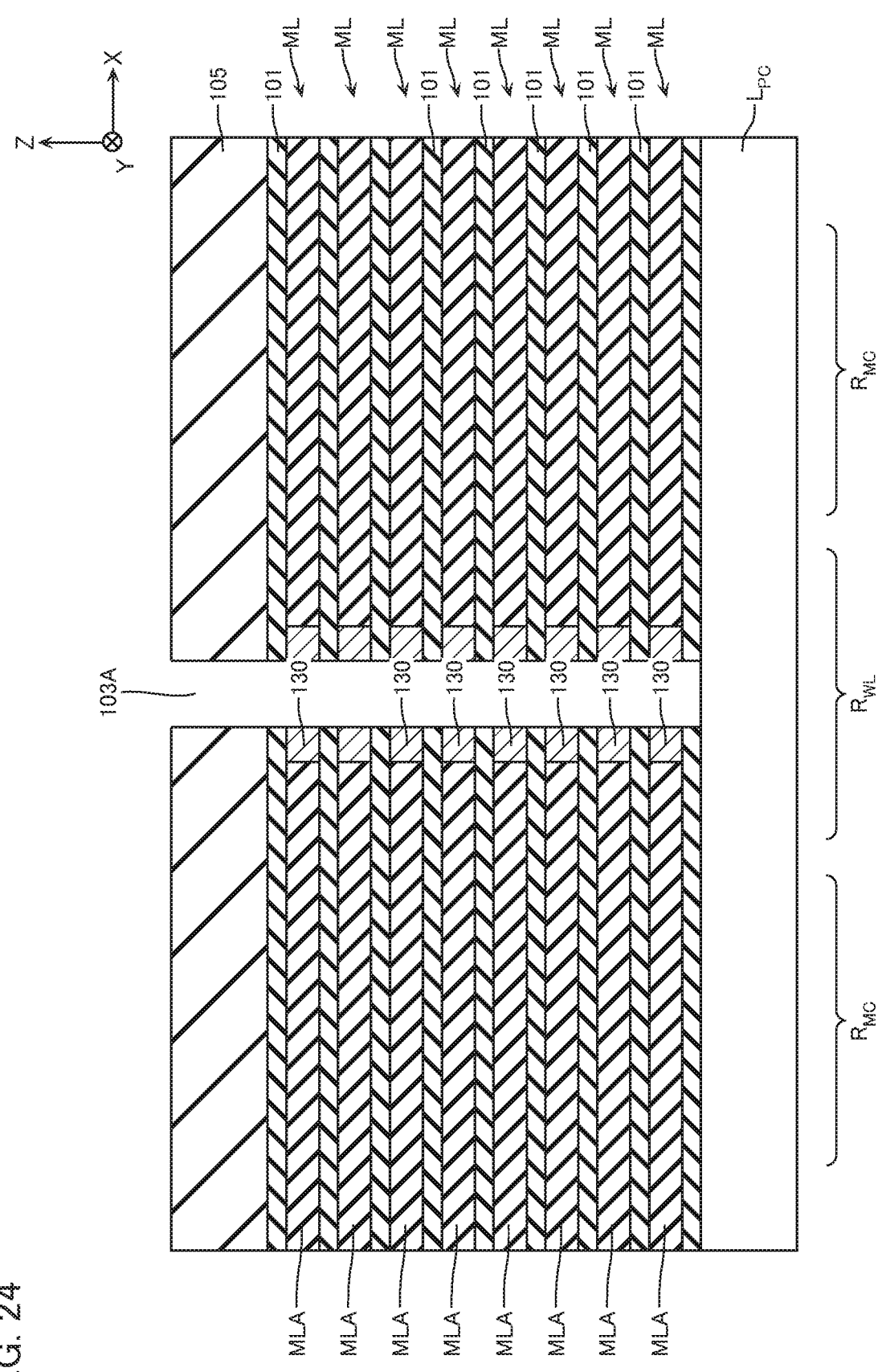
FIG. 24 is a schematic cross-sectional view for describing the manufacturing method.

Next, as illustrated in FIG. 23 and FIG. 24, for example, the conductive layers 130B are partially removed to form the plurality of conductive layers 130, 140. In this process, the conductive layers 130B are removed to the extent that parts of the conductive layers 130B formed in the recessed portions 130A, 140A remain, and side surfaces in the X-direction and the Y-direction of the plurality of insulating layers 101 are exposed. This process is performed by, for example, a method, such as wet etching.

Figure 25:
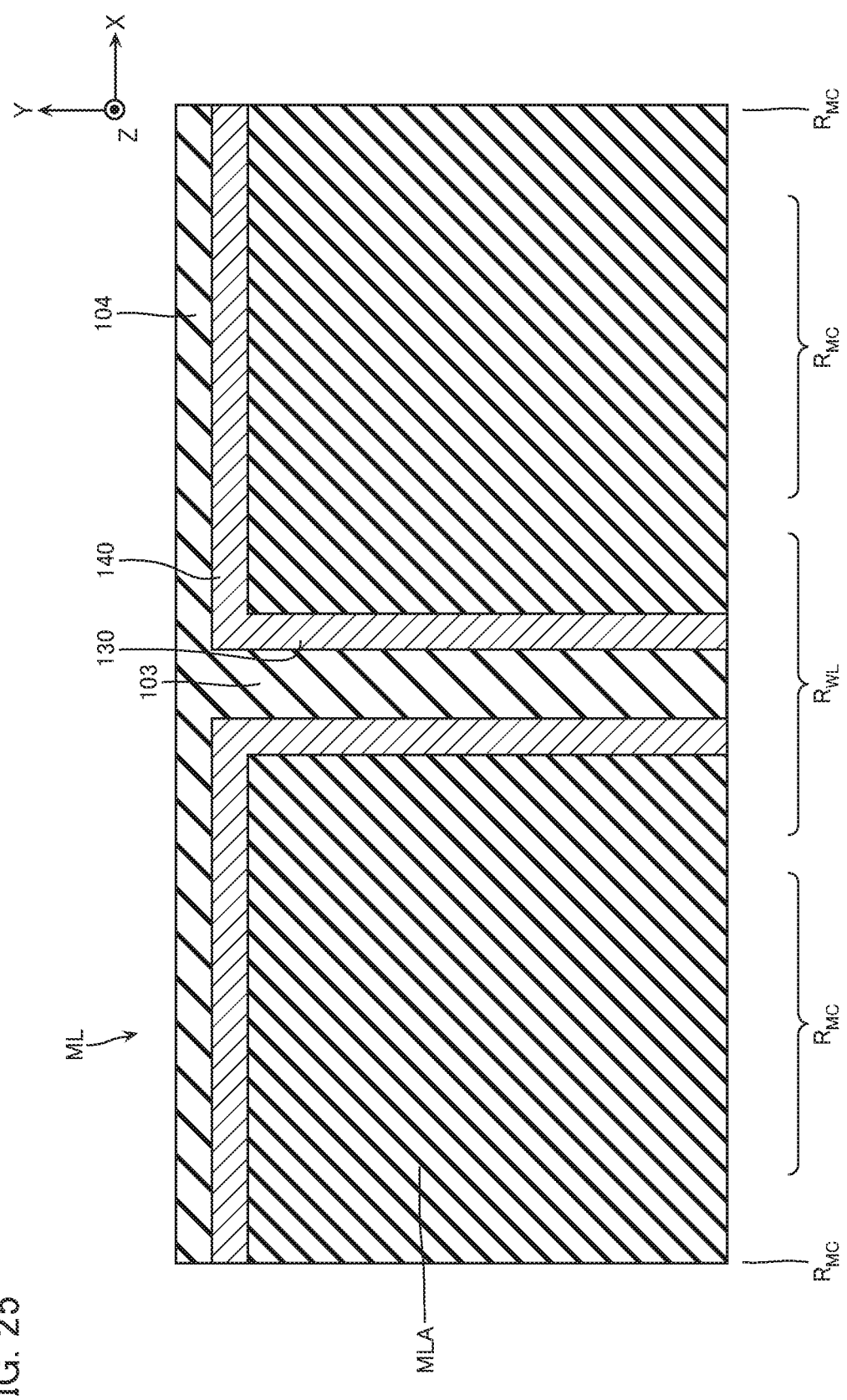
FIG. 25 is a schematic cross-sectional view for describing the manufacturing method.
Figure 26:
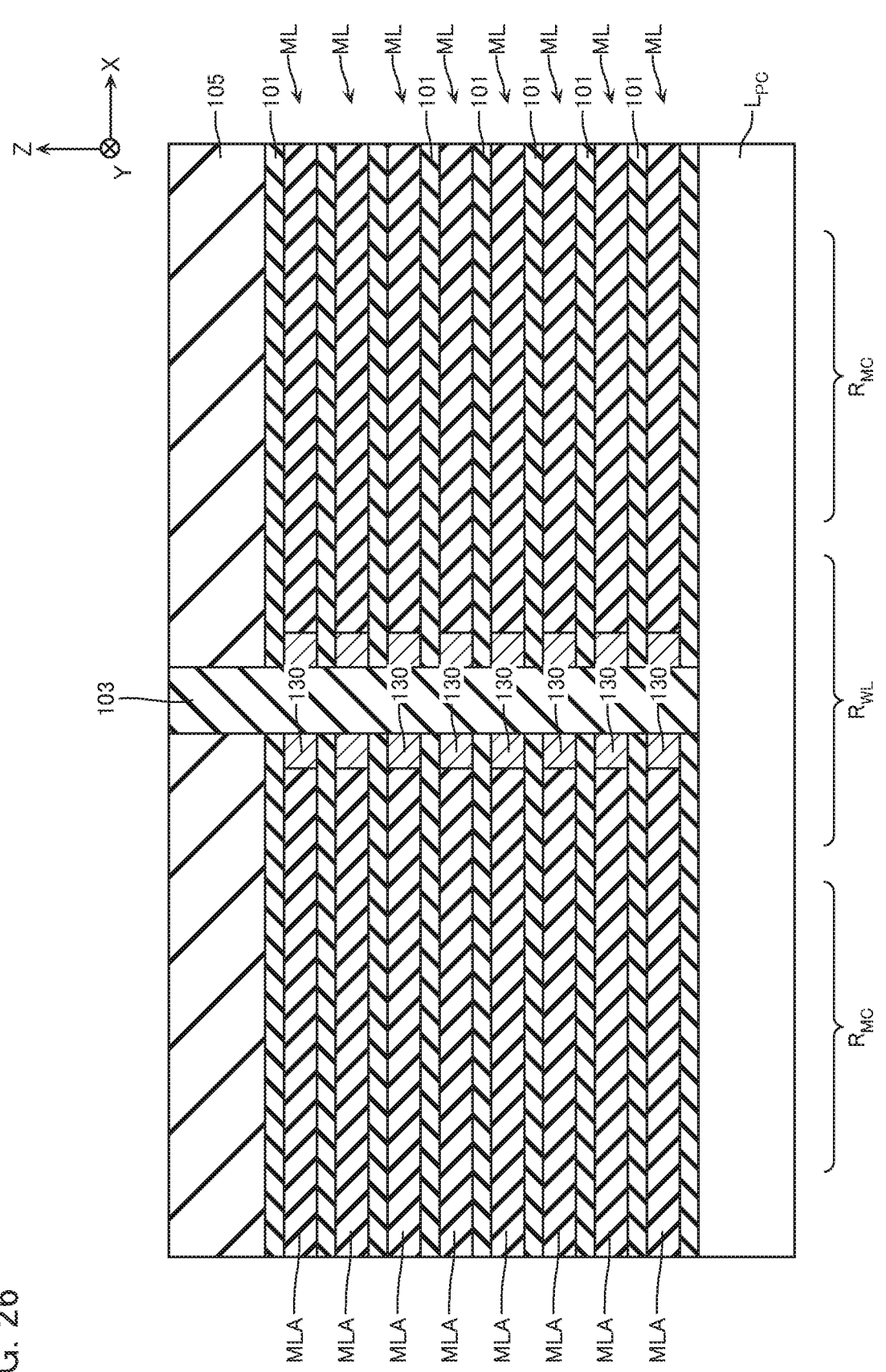
FIG. 26 is a schematic cross-sectional view for describing the manufacturing method.

Next, as illustrated in FIG. 25 and FIG. 26, for example, the insulating layers 103, 104 are formed. This process is performed by, for example, a method, such as CVD.

Figure 27:
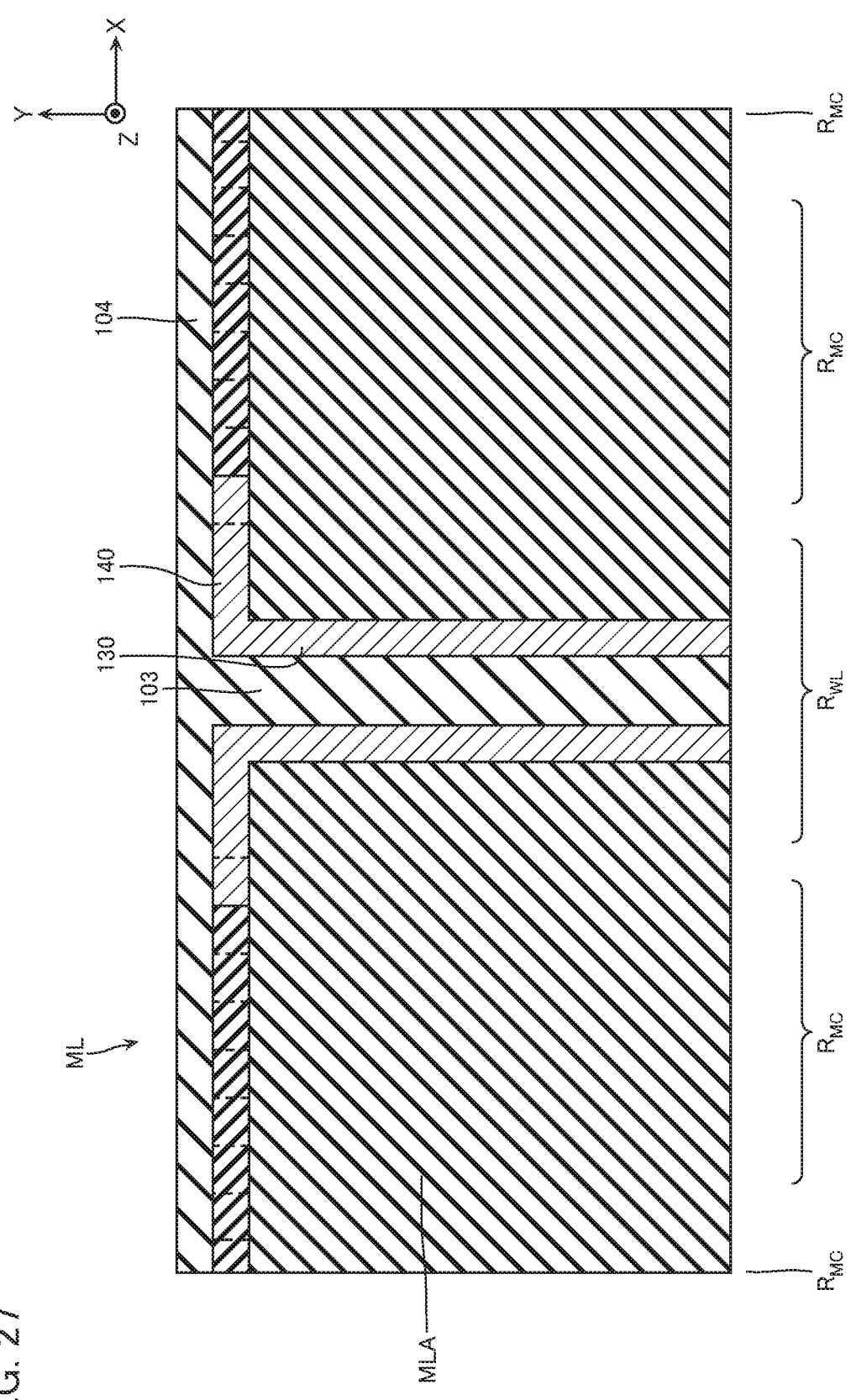
FIG. 27 is a schematic cross-sectional view for describing the manufacturing method.
Figure 28:
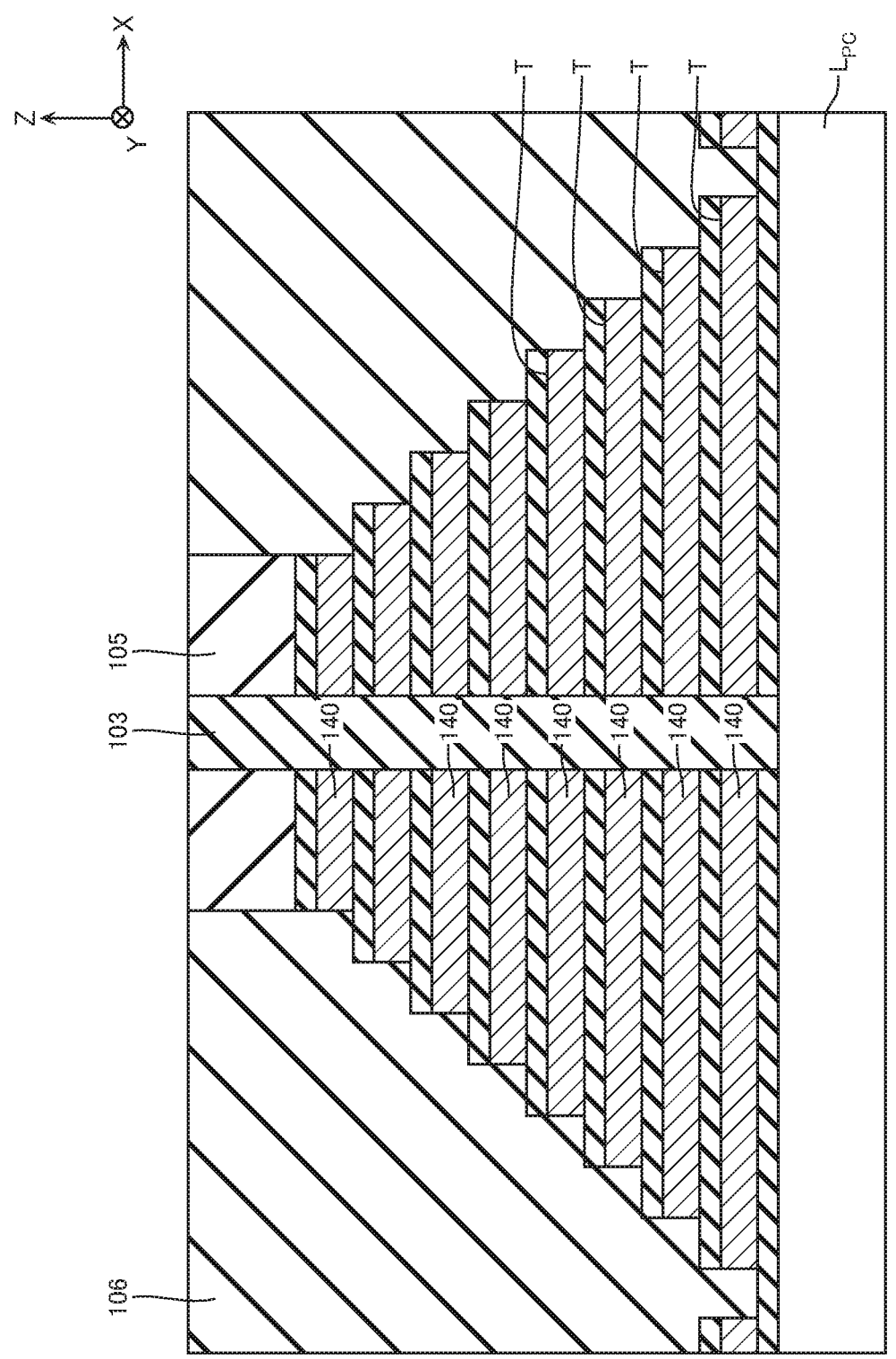
FIG. 28 is a schematic cross-sectional view for describing the manufacturing method.

Next, as illustrated in FIG. 27 and FIG. 28, for example, the conductive layers 140 are partially removed to form the plurality of terrace portions T. In this process, for example, slimming of a resist and removal of the conductive layers 140 and the insulating layers 101 by a method, such as etching, are repeatedly performed. The insulating layers 106 are formed above the plurality of terrace portions T. This process is performed by, for example, a method, such as CVD.

Figure 29:
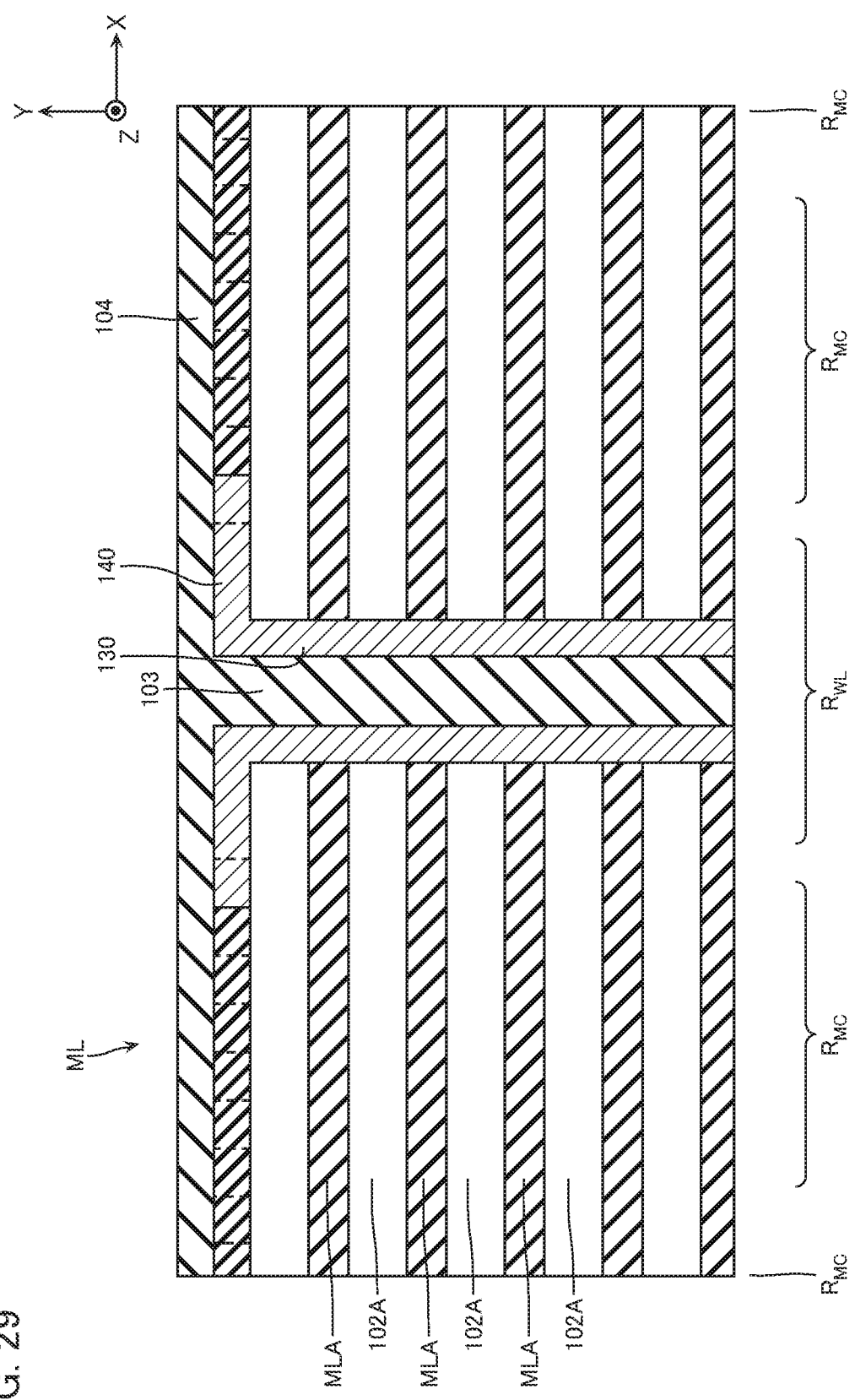
FIG. 29 is a schematic cross-sectional view for describing the manufacturing method.

Next, as illustrated in FIG. 29, for example, openings 102A are formed in positions corresponding to the insulating layers 102. The openings 102A extend in the X-direction and are arranged in the Y-direction. The opening 102A penetrates the plurality of insulating layers 101 and the plurality of sacrifice layers MLA arranged in the Z-direction and separates these configurations in the Y-direction. This process is performed by, for example, a method, such as RIE.

Figure 30:
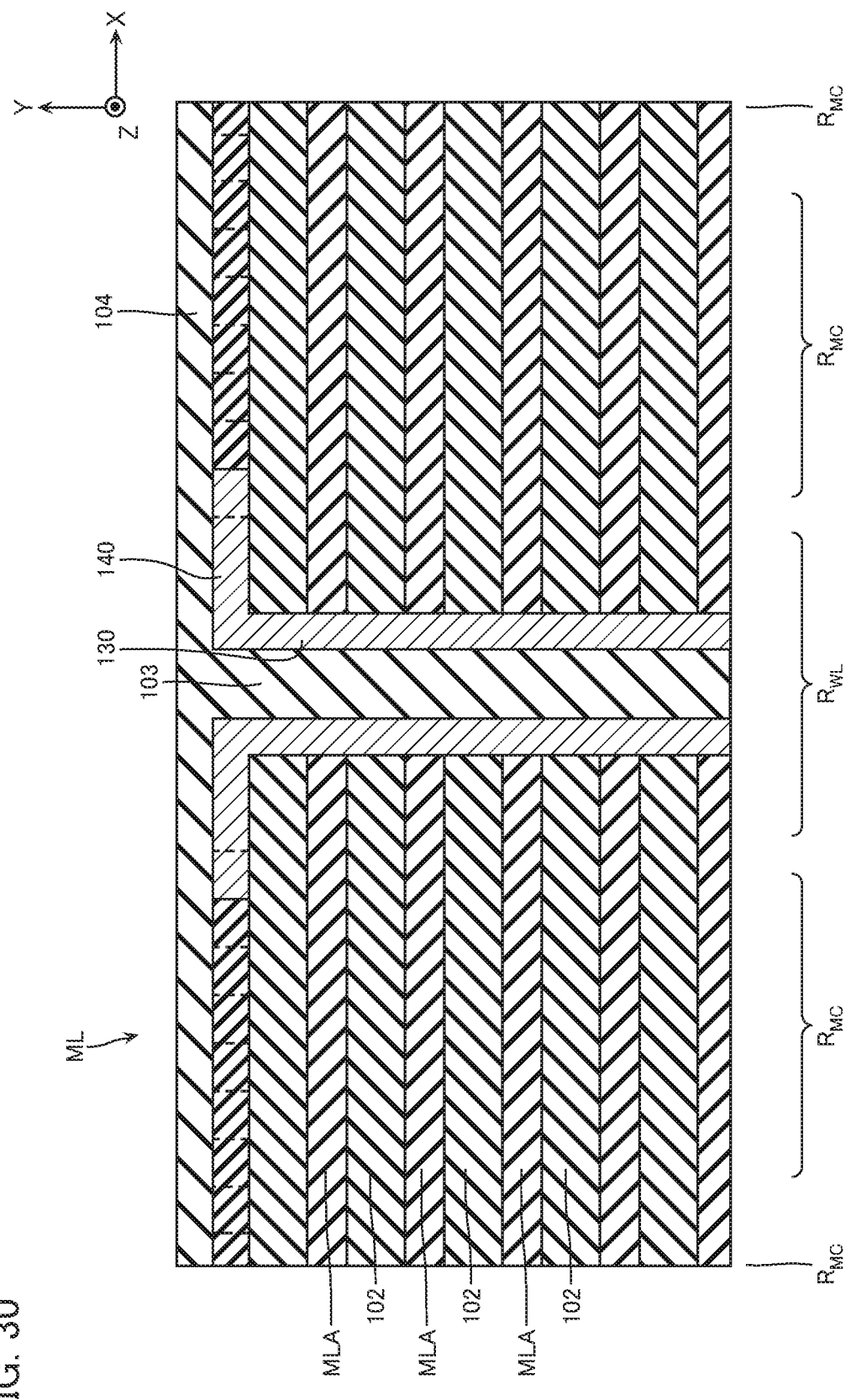
FIG. 30 is a schematic cross-sectional view for describing the manufacturing method.

Next, as illustrated in FIG. 30, for example, the insulating layers 102 are formed. This process is performed by, for example, a method, such as CVD.

Figure 31:
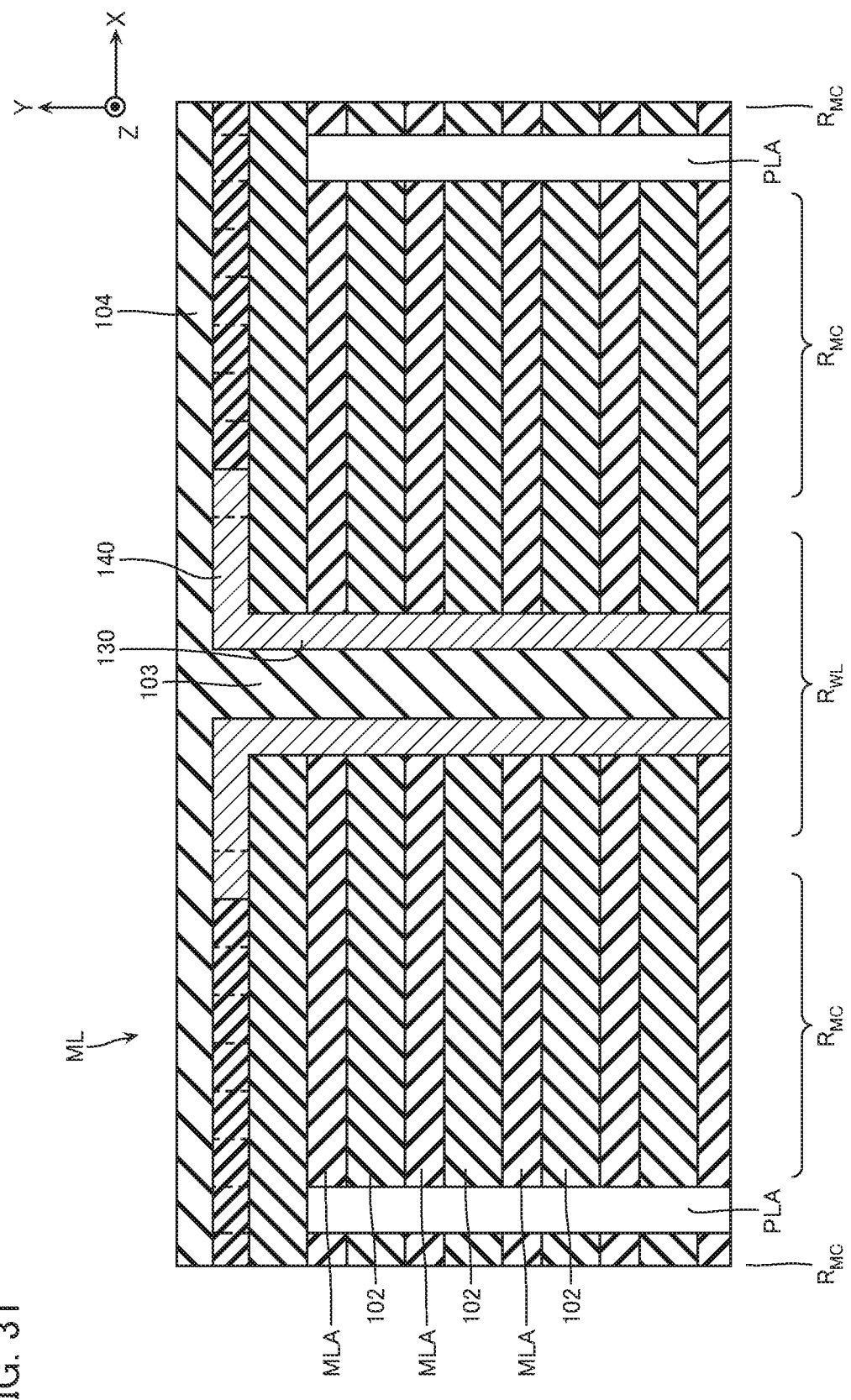
FIG. 31 is a schematic cross-sectional view for describing the manufacturing method.
Figure 32:
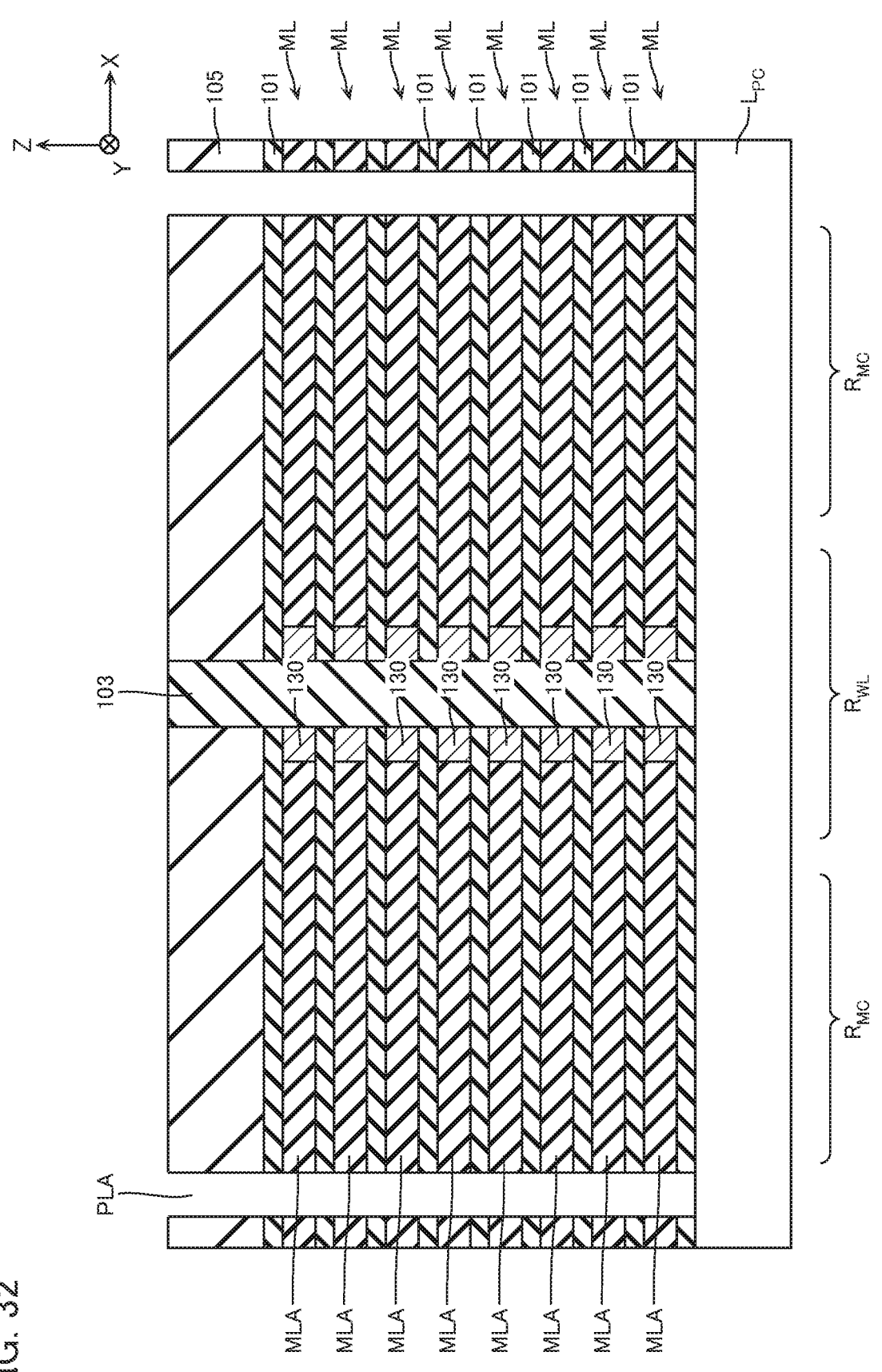
FIG. 32 is a schematic cross-sectional view for describing the manufacturing method.

Next, as illustrated in FIG. 31 and FIG. 32, for example, openings PLA are formed in positions corresponding to the plate lines PL. As illustrated in FIG. 31, for example, the openings PLA extend in the Y-direction. The opening PLA penetrates the plurality of insulating layers 101 and the plurality of sacrifice layers MLA arranged in the Z-direction and separates these configurations in the X-direction. This process is performed by, for example, a method, such as RIE.

Figure 33:
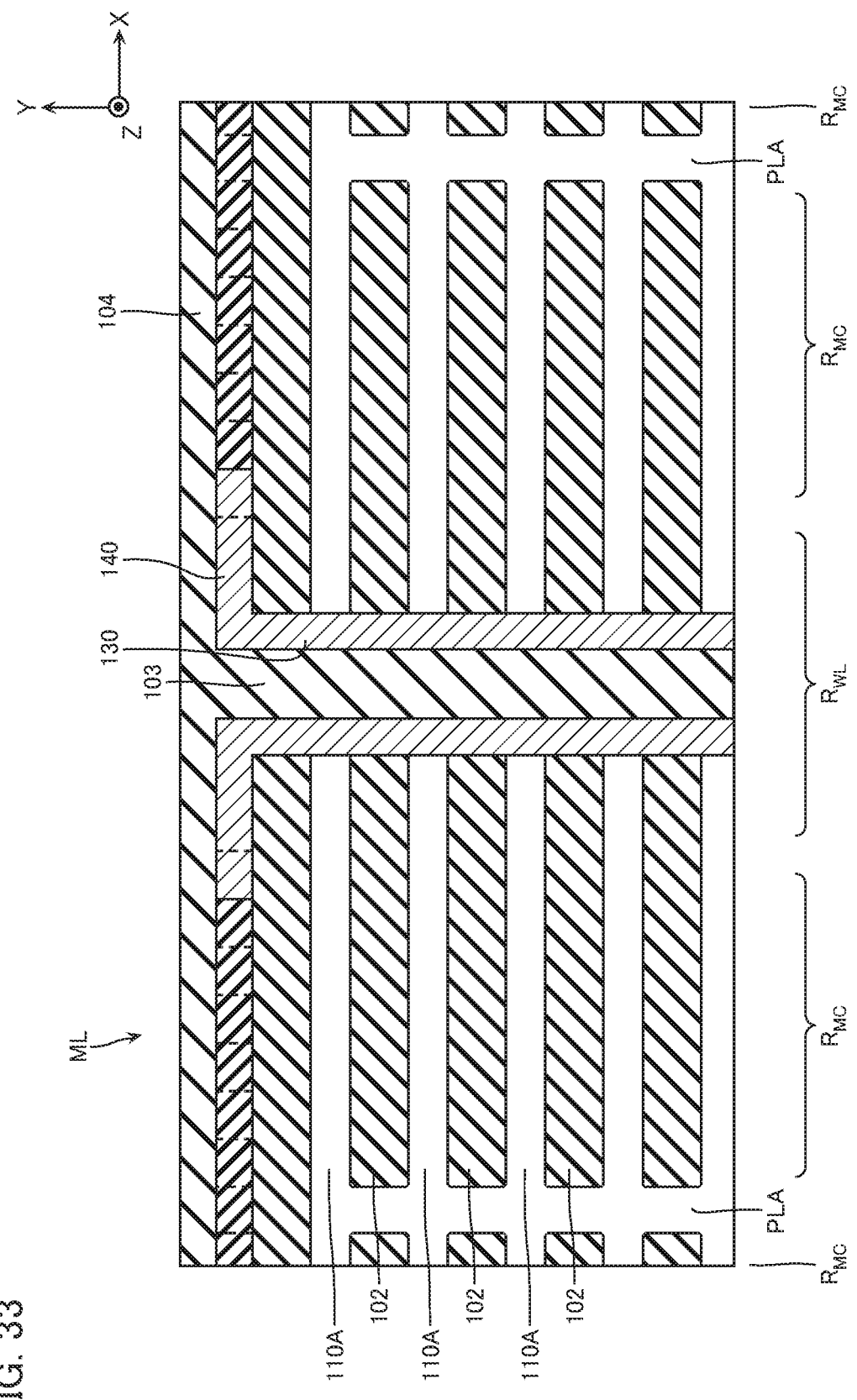
FIG. 33 is a schematic cross-sectional view for describing the manufacturing method.
Figure 34:
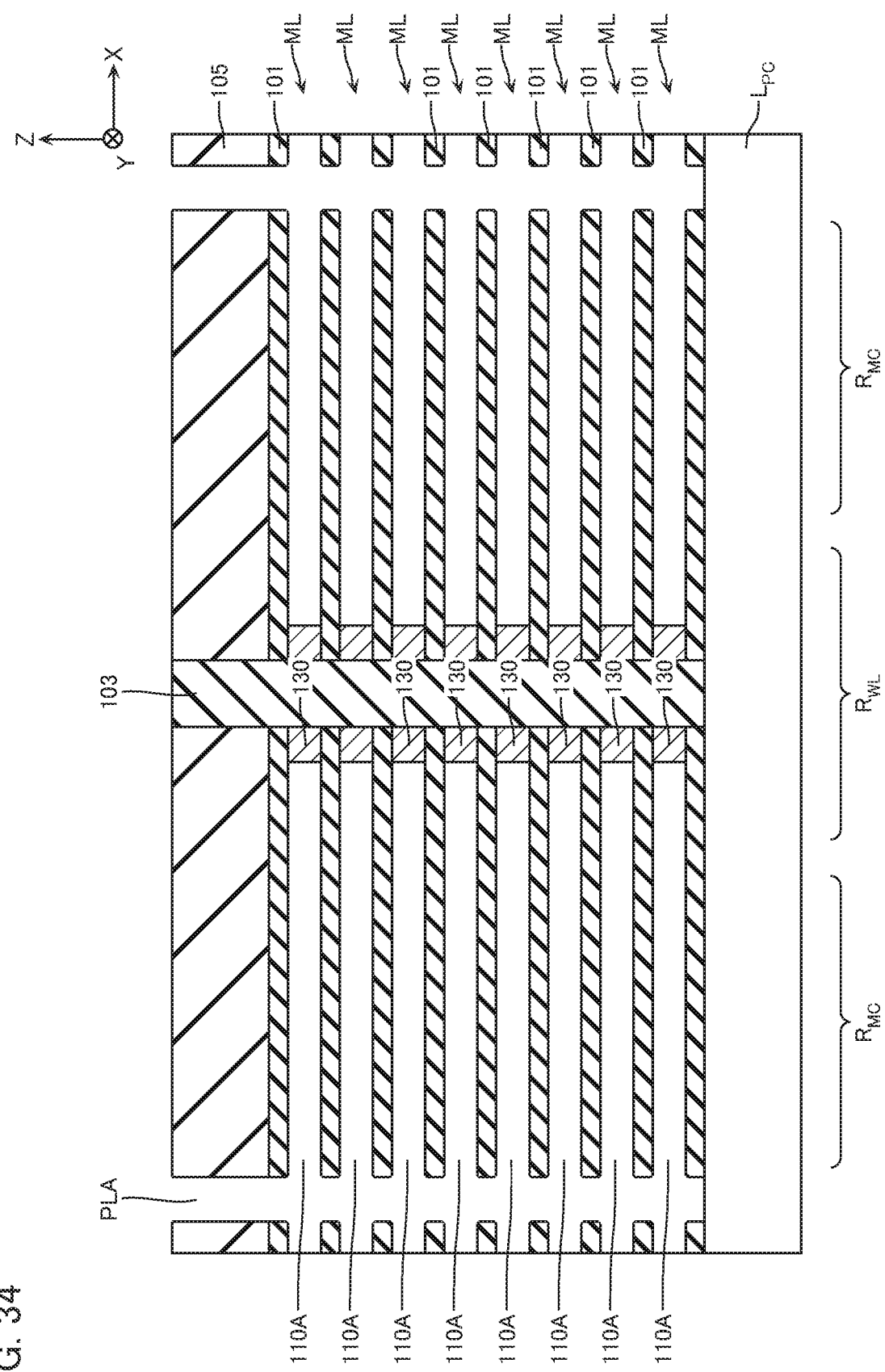
FIG. 34 is a schematic cross-sectional view for describing the manufacturing method.

Next, as illustrated in FIG. 33 and FIG. 34, for example, the sacrifice layers MLA are removed via the openings PLA, and the upper surfaces and the lower surfaces of the insulating layers 101, both side surfaces in the Y-direction of the insulating layers 102, and side surfaces in the X-direction of the conductive layers 130 are exposed. Accordingly, openings 110A are formed in positions corresponding to the capacitor structures 110 and the semiconductor layers 121. This process is performed by, for example, a method, such as wet etching.

Figure 35:
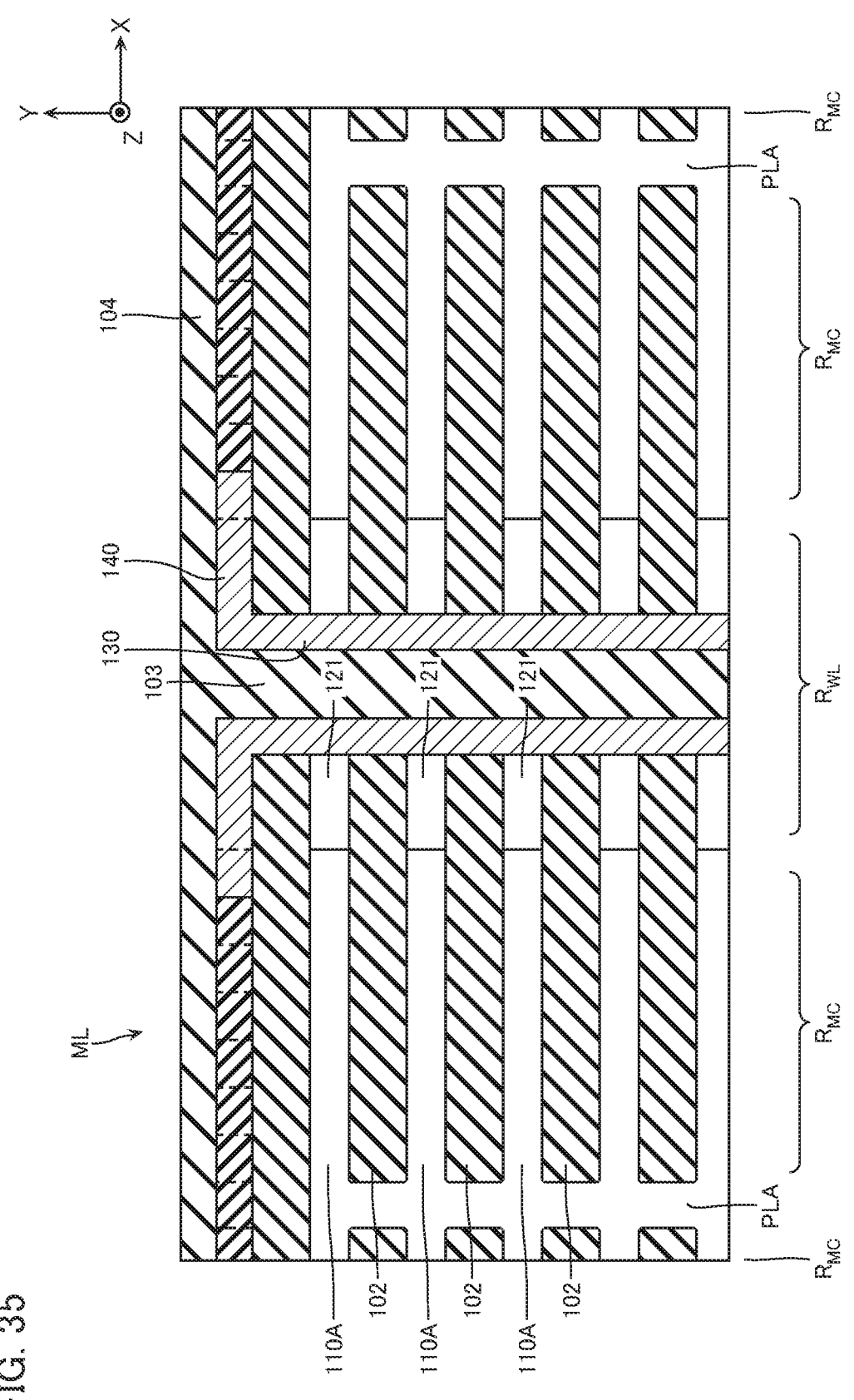
FIG. 35 is a schematic cross-sectional view for describing the manufacturing method.
Figure 36:
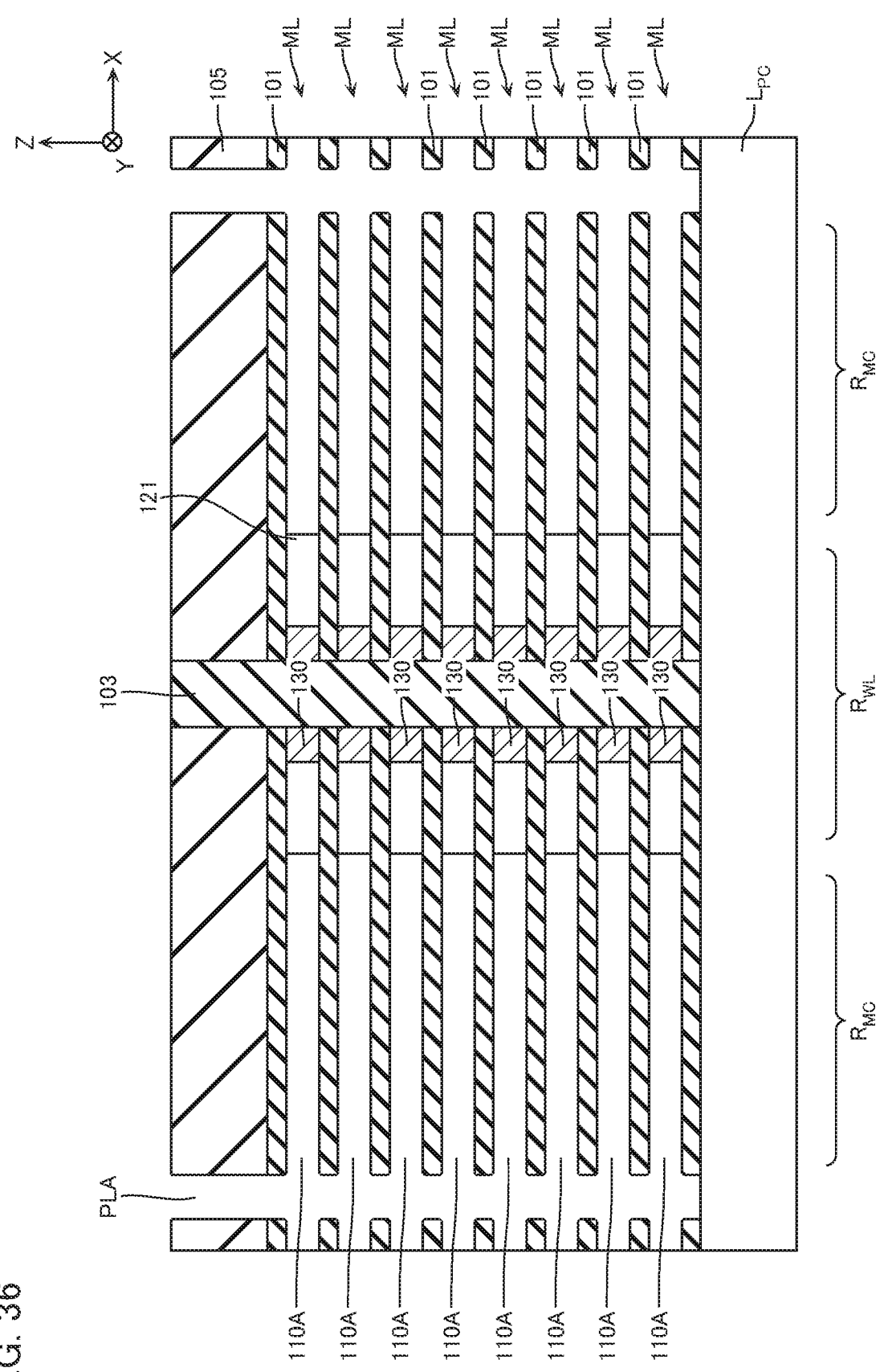
FIG. 36 is a schematic cross-sectional view for describing the manufacturing method.

Next, as illustrated in FIG. 35 and FIG. 36, for example, the semiconductor layers 121 are formed. This process may be performed by, for example, epitaxial growth from the exposed surfaces of the conductive layers 130 or Metal Induced Lateral Crystallization (MILC), which is a solid-phase crystallization technology using a metal as a growth end of crystallization, may be performed by another crystal growth method, or may be performed by a method other than crystal growth methods. Crystalline semiconductor layers 121 may be formed in one process, or non-crystalline semiconductor layers 121 may be formed and then crystallized by heat treatment. The semiconductor layers 121 may be polycrystalline or monocrystalline.

Figure 37:
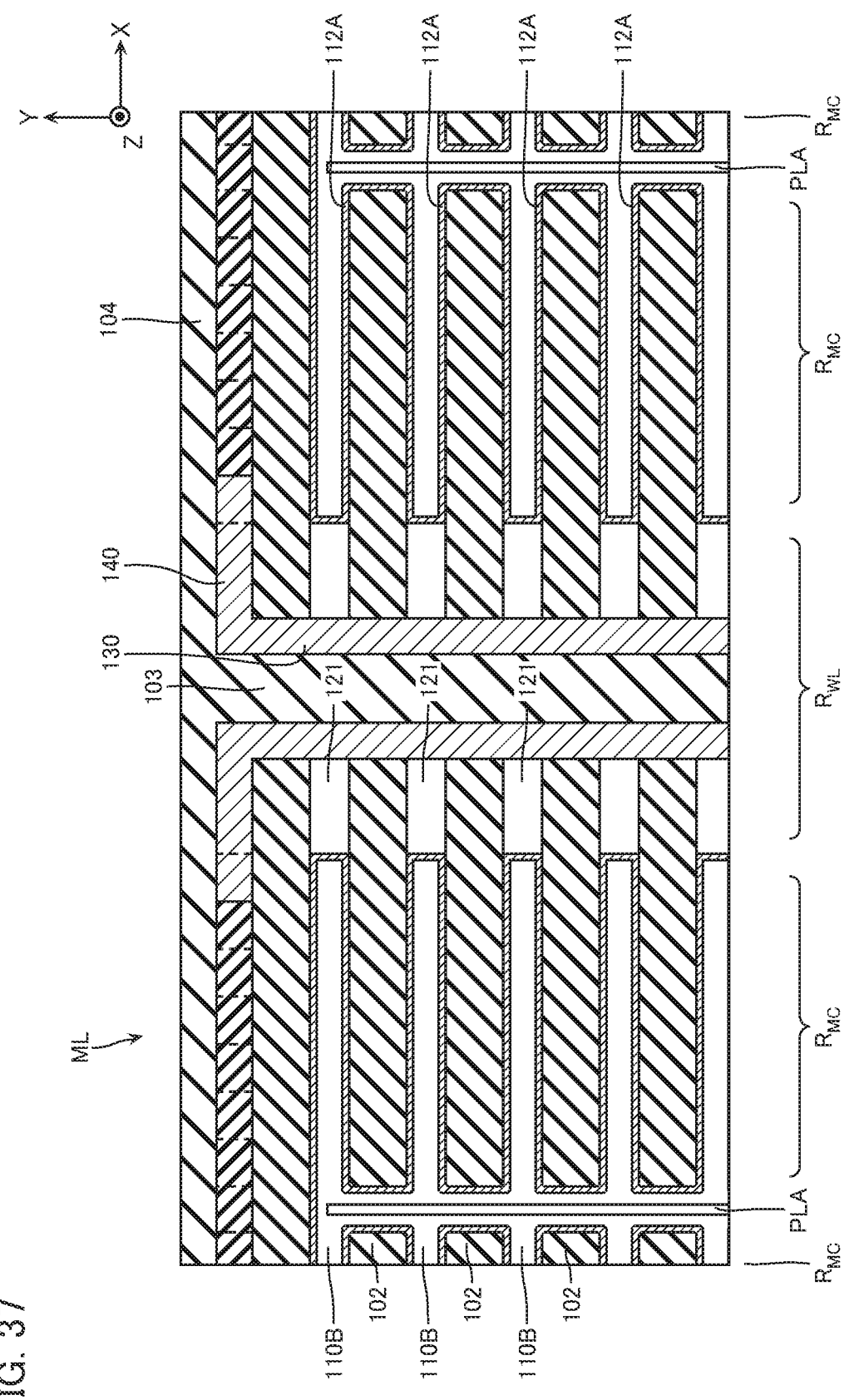
FIG. 37 is a schematic cross-sectional view for describing the manufacturing method.
Figure 38:
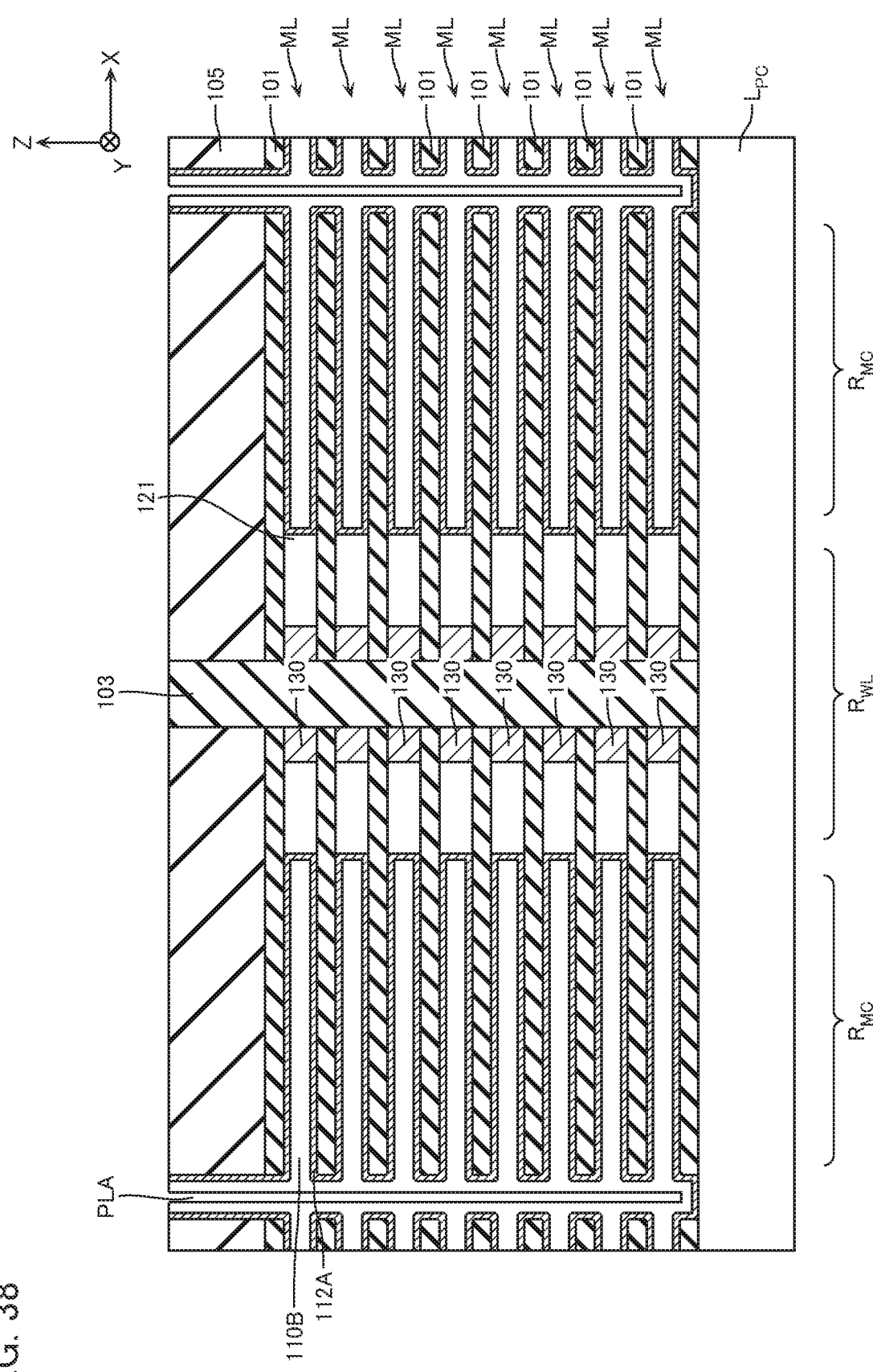
FIG. 38 is a schematic cross-sectional view for describing the manufacturing method.

Next, as illustrated in FIG. 37 and FIG. 38, for example, conductive layers 112A and sacrifice layers 110B are formed inside the openings PLA and the openings 110A. The conductive layers 112A and the sacrifice layers 110B are formed to be thick enough to fill the openings 110A. Further, the conductive layers 112A and the sacrifice layers 110B are formed to be thin enough not to fill the openings PLA. This process is performed by, for example, a method, such as CVD.

Figure 39:
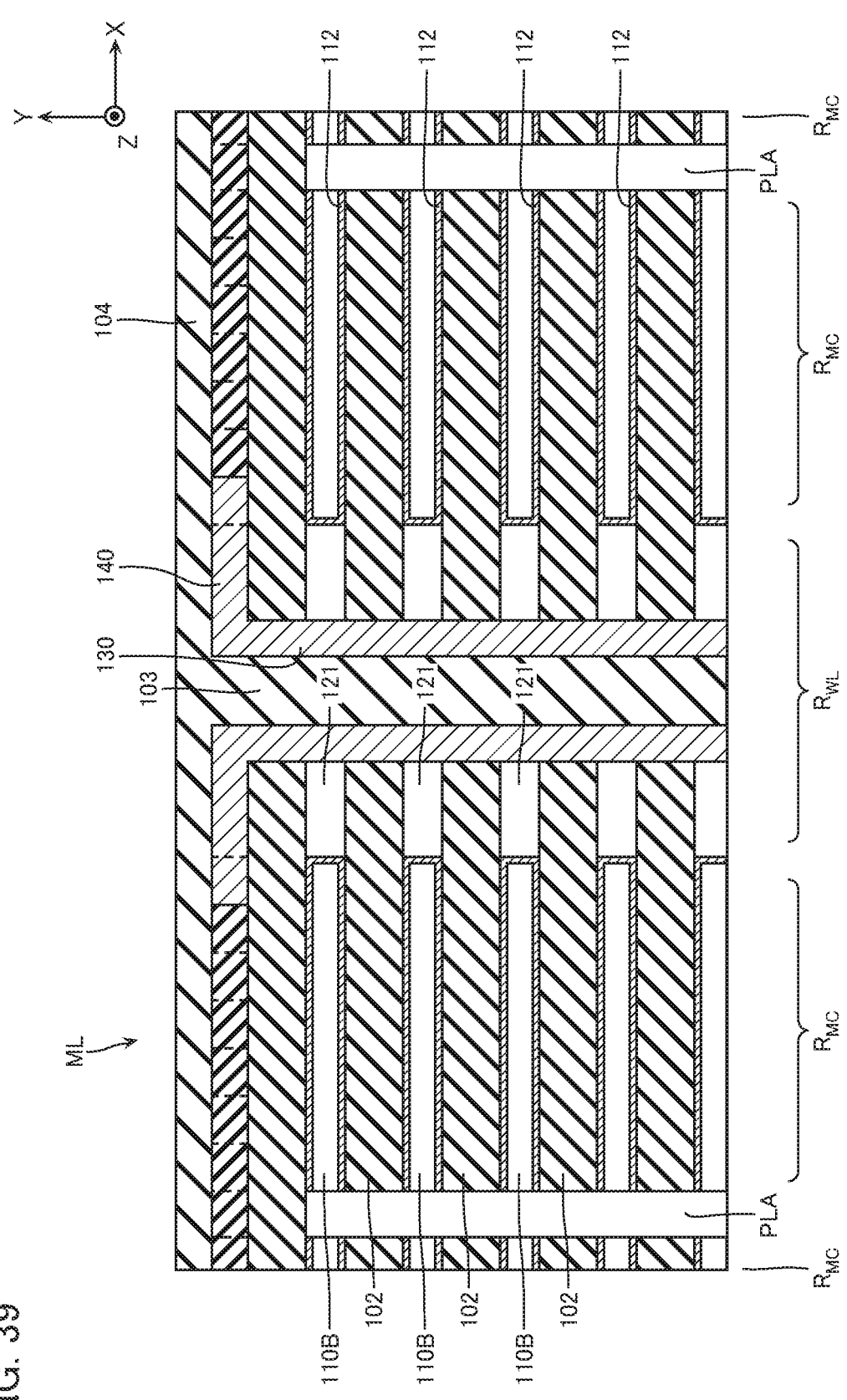
FIG. 39 is a schematic cross-sectional view for describing the manufacturing method.
Figure 40:
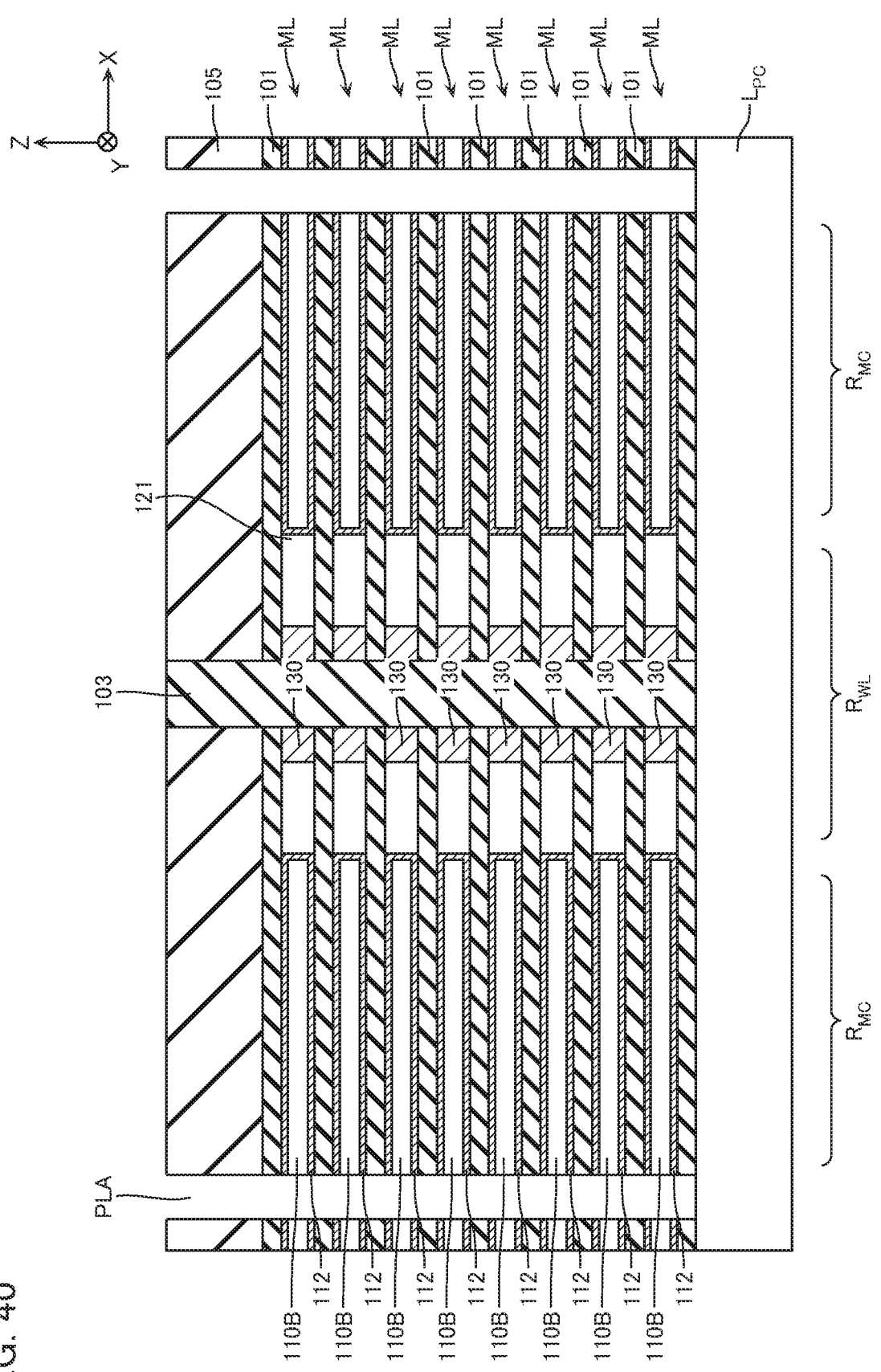
FIG. 40 is a schematic cross-sectional view for describing the manufacturing method.

Next, as illustrated in FIG. 39 and FIG. 40, for example, the conductive layers 112A and the sacrifice layers 110B are partially removed. In this process, the conductive layers 112A and the sacrifice layers 110B are removed to the extent that parts of the conductive layers 112A and the sacrifice layers 110B formed in the openings 110A remain, and side surfaces in the X-direction of the plurality of insulating layers 101, 102 are exposed in the openings PLA. With this process, the plurality of conductive layers 112A are formed. This process is performed by, for example, a method, such as wet etching.

Figure 41:
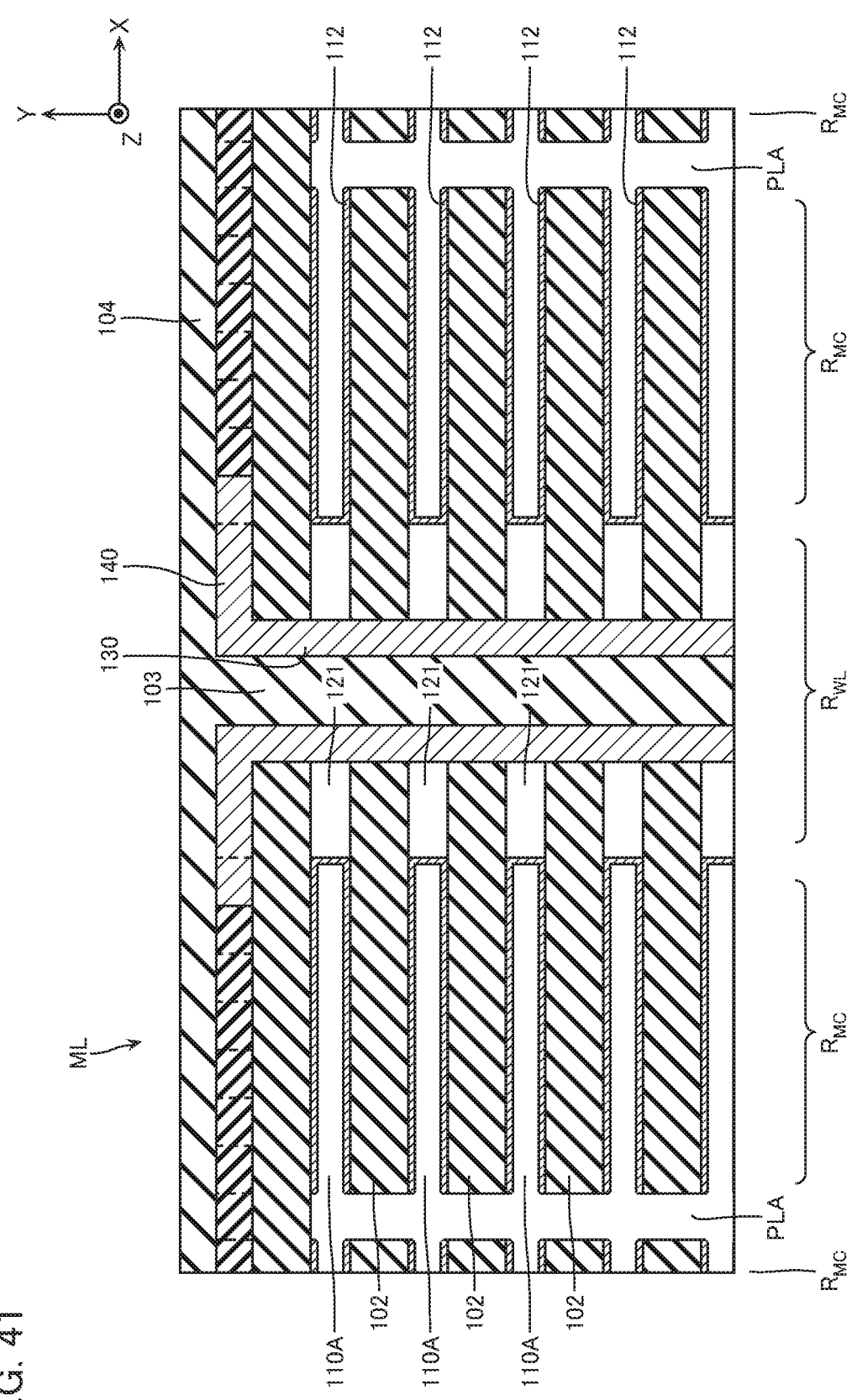
FIG. 41 is a schematic cross-sectional view for describing the manufacturing method.
Figure 42:
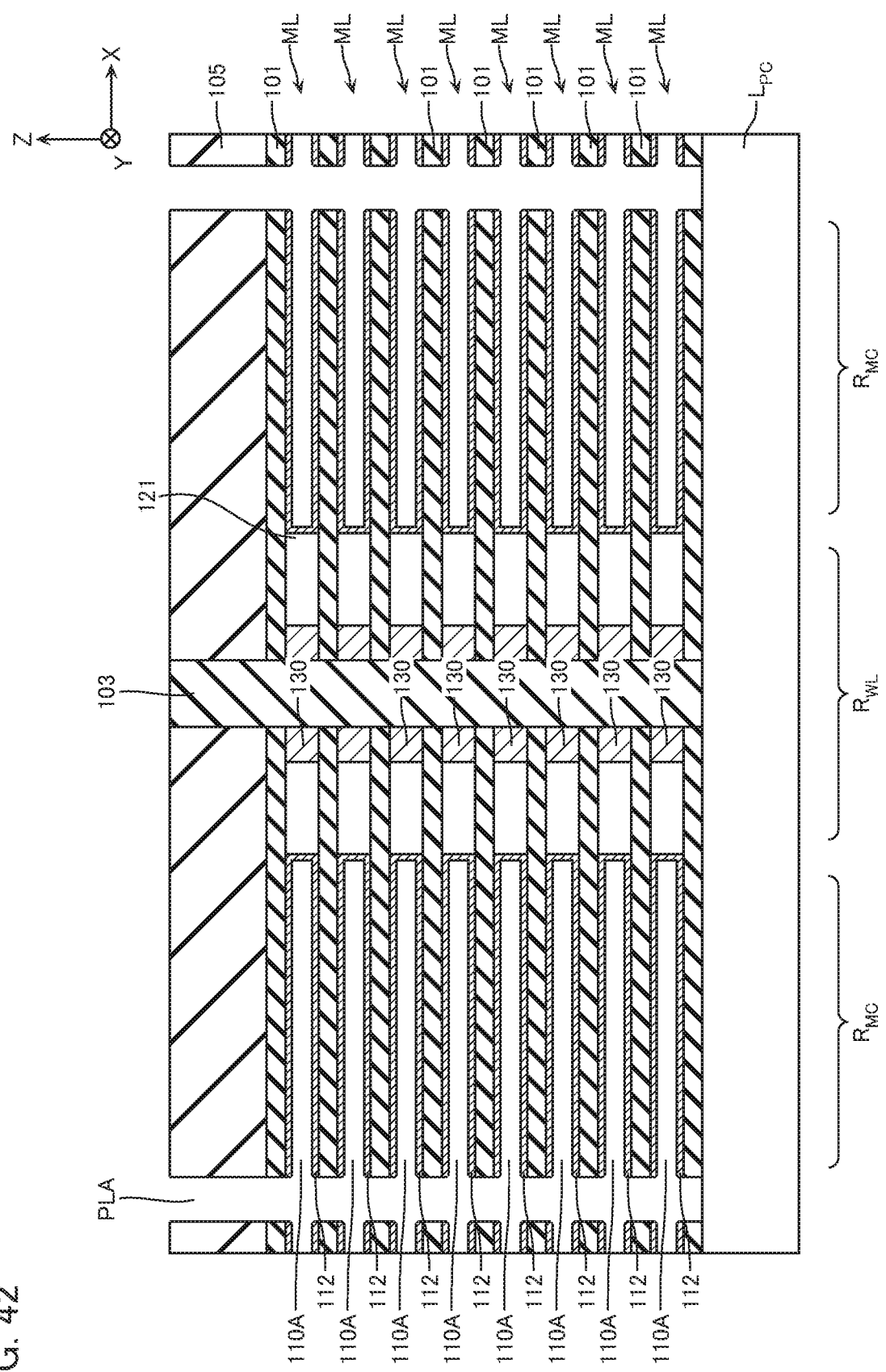
FIG. 42 is a schematic cross-sectional view for describing the manufacturing method.

Next, as illustrated in FIG. 41 and FIG. 42, for example, the sacrifice layers 110B are removed. This process is performed by, for example, a method, such as wet etching.

Figure 43:
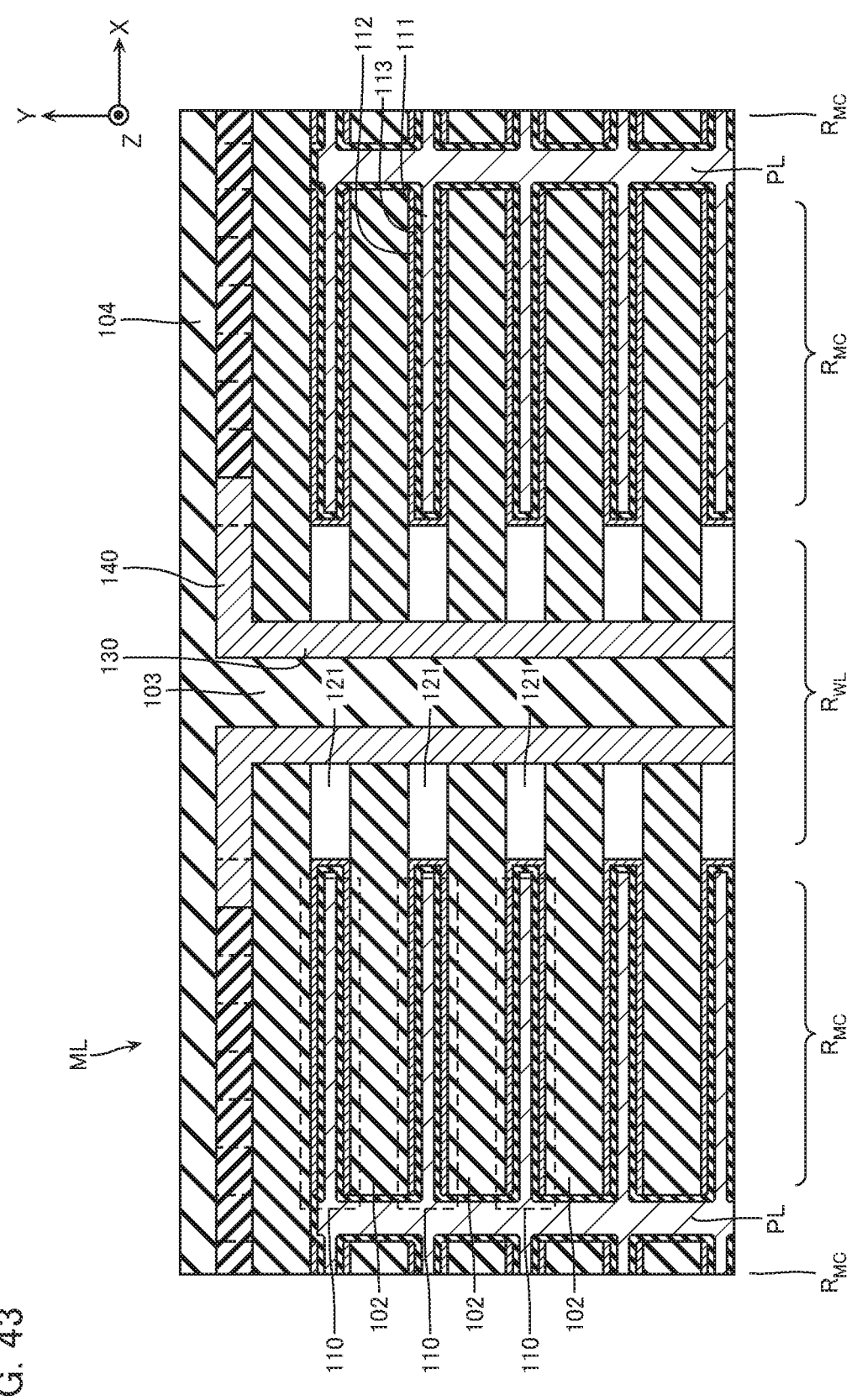
FIG. 43 is a schematic cross-sectional view for describing the manufacturing method.
Figure 44:
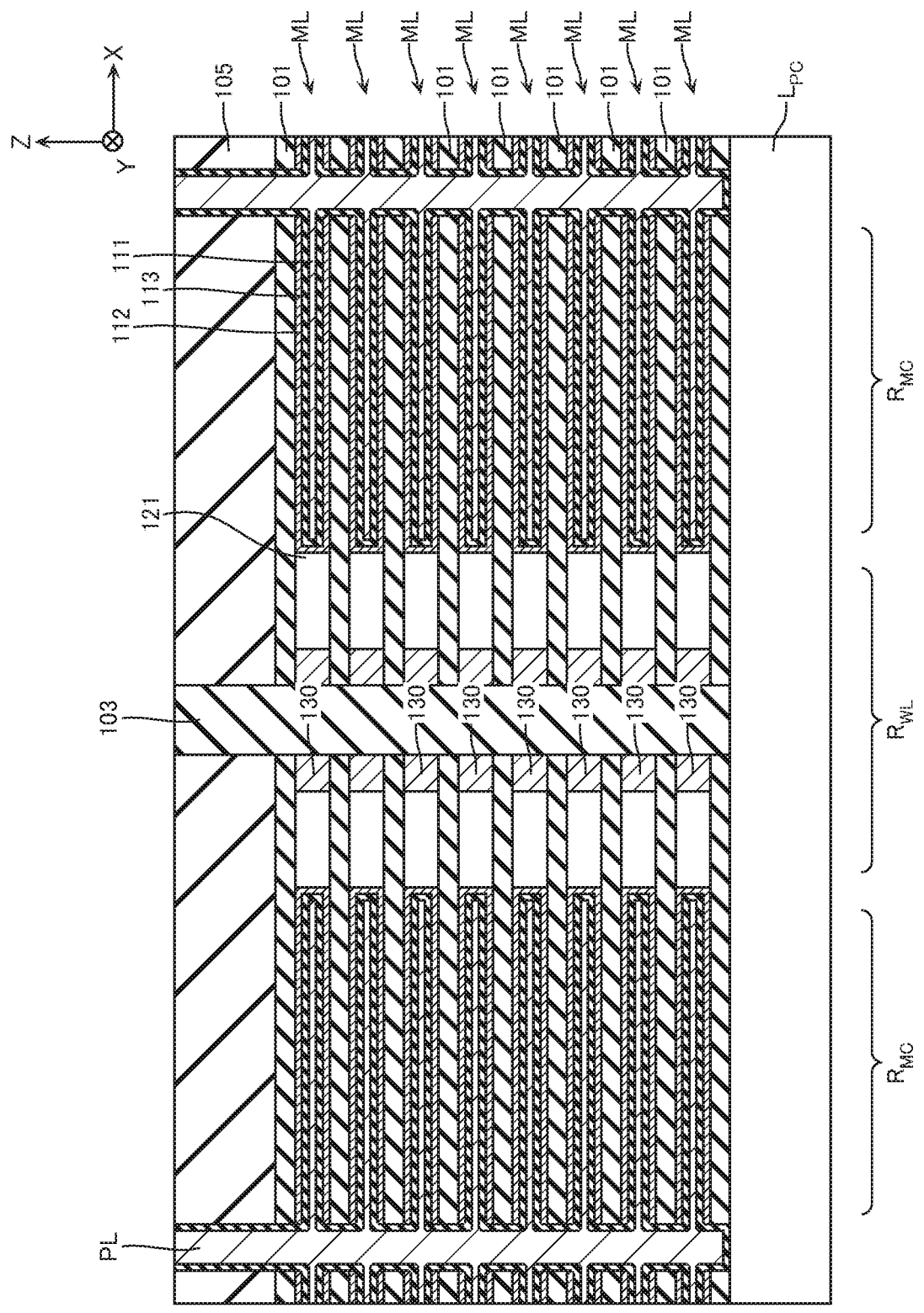
FIG. 44 is a schematic cross-sectional view for describing the manufacturing method.

Next, as illustrated in FIG. 43 and FIG. 44, for example, the insulating layers 113, the electrodes 111, and the plate lines PL are formed inside the openings PLA and the openings 110A. This process is performed by, for example, a method, such as CVD.

Figure 45:
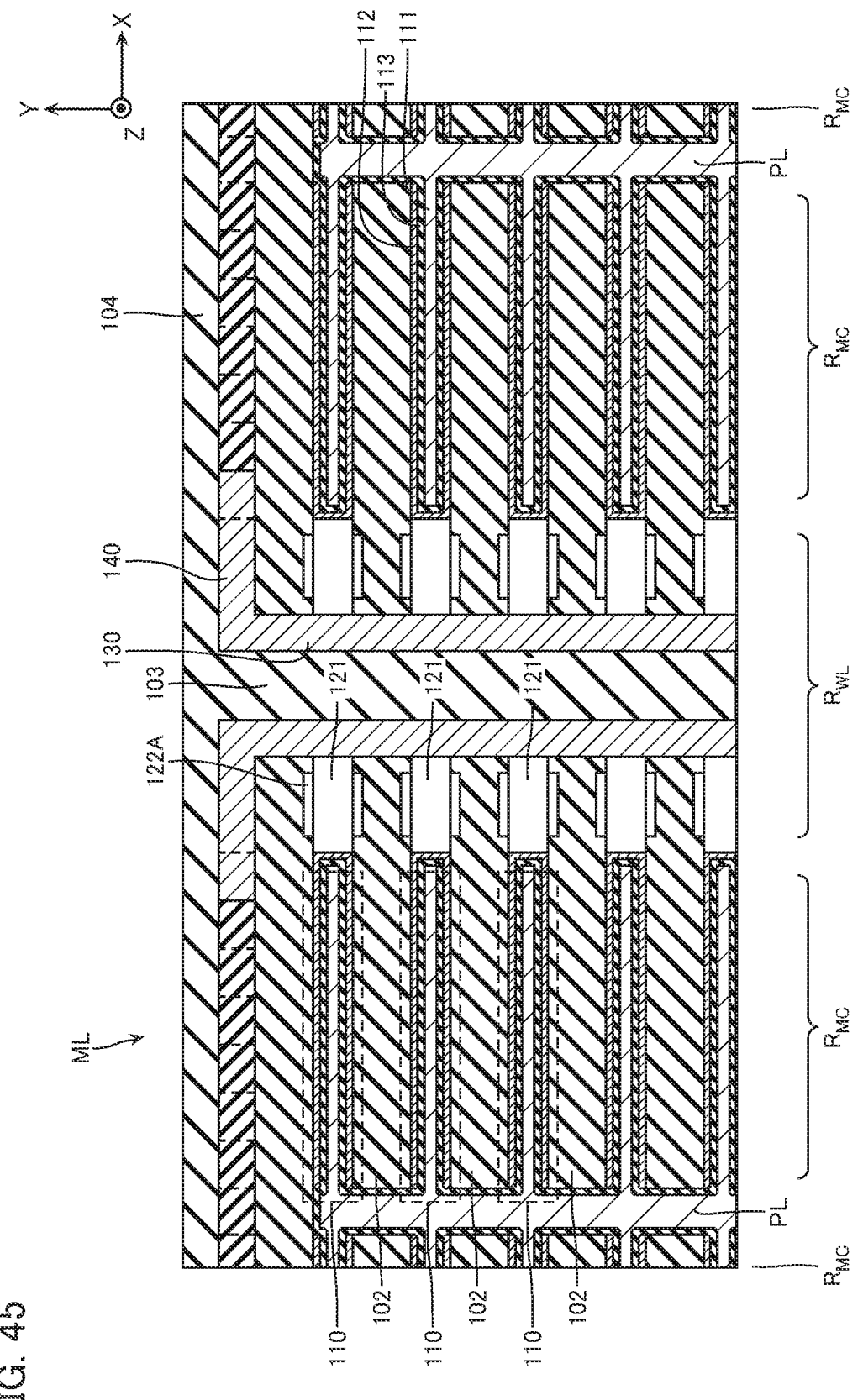
FIG. 45 is a schematic cross-sectional view for describing the manufacturing method.
Figure 46:
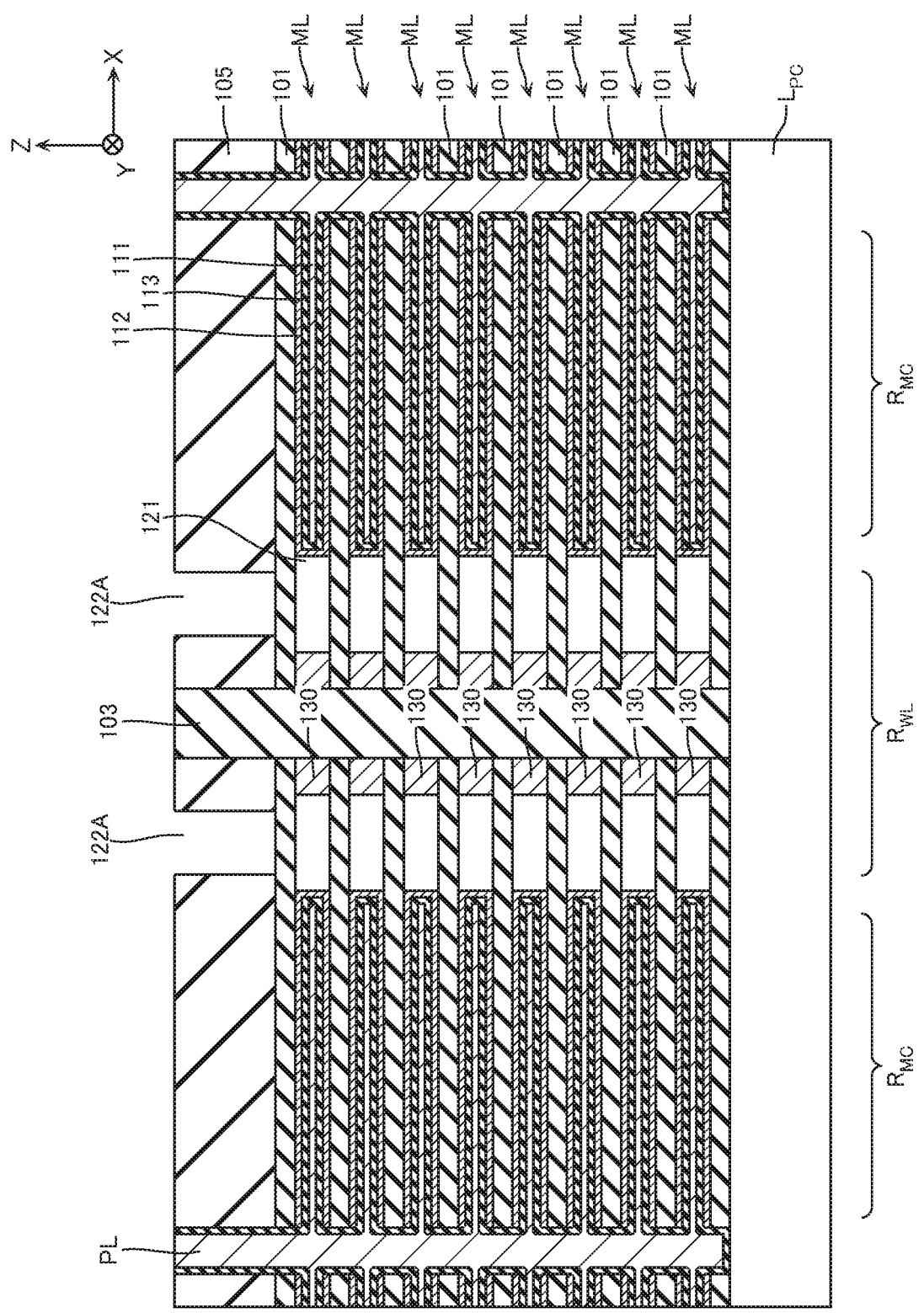
FIG. 46 is a schematic cross-sectional view for describing the manufacturing method.
Figure 47:
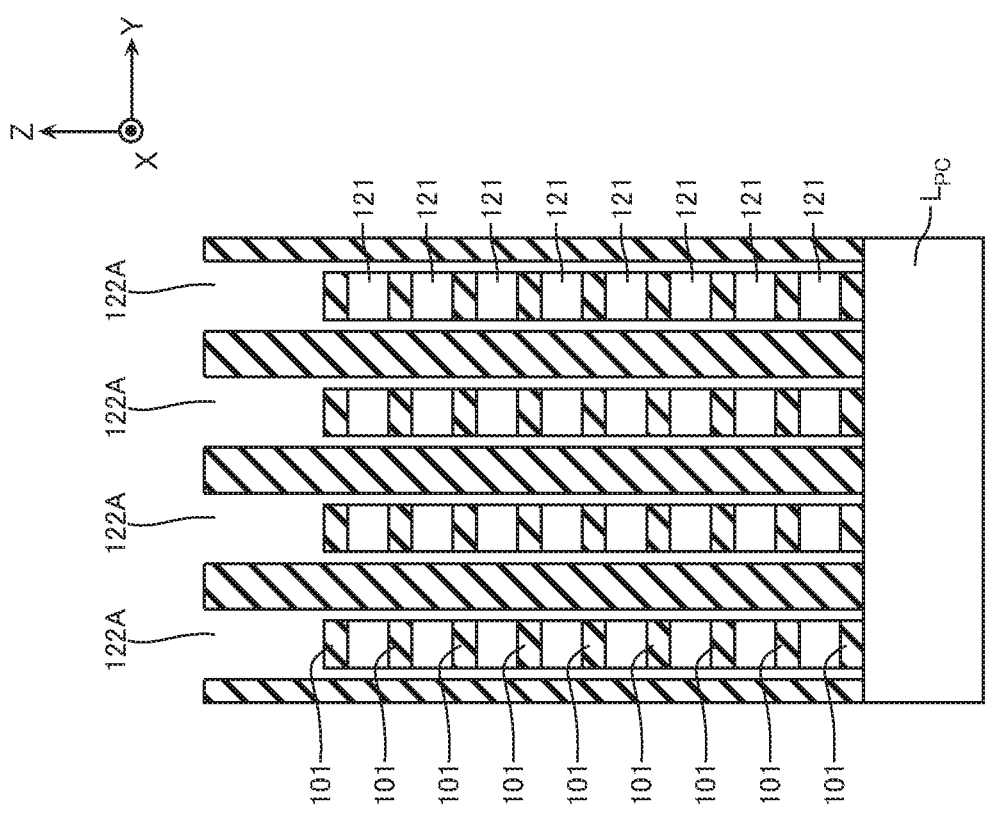
FIG. 47 is a schematic cross-sectional view for describing the manufacturing method.

Next, as illustrated in FIG. 45 to FIG. 47, for example, a plurality of openings 122A are formed in positions corresponding to the plurality of conductive layers 122. As illustrated in FIG. 47, the opening 122A penetrates the insulating layer 105 and the insulating layers 102 to extend in the Z-direction and exposes side surfaces in the Y-direction of the plurality of semiconductor layers 121 arranged in the Z-direction. This process is performed by, for example, a method, such as RIE.

Figure 48:
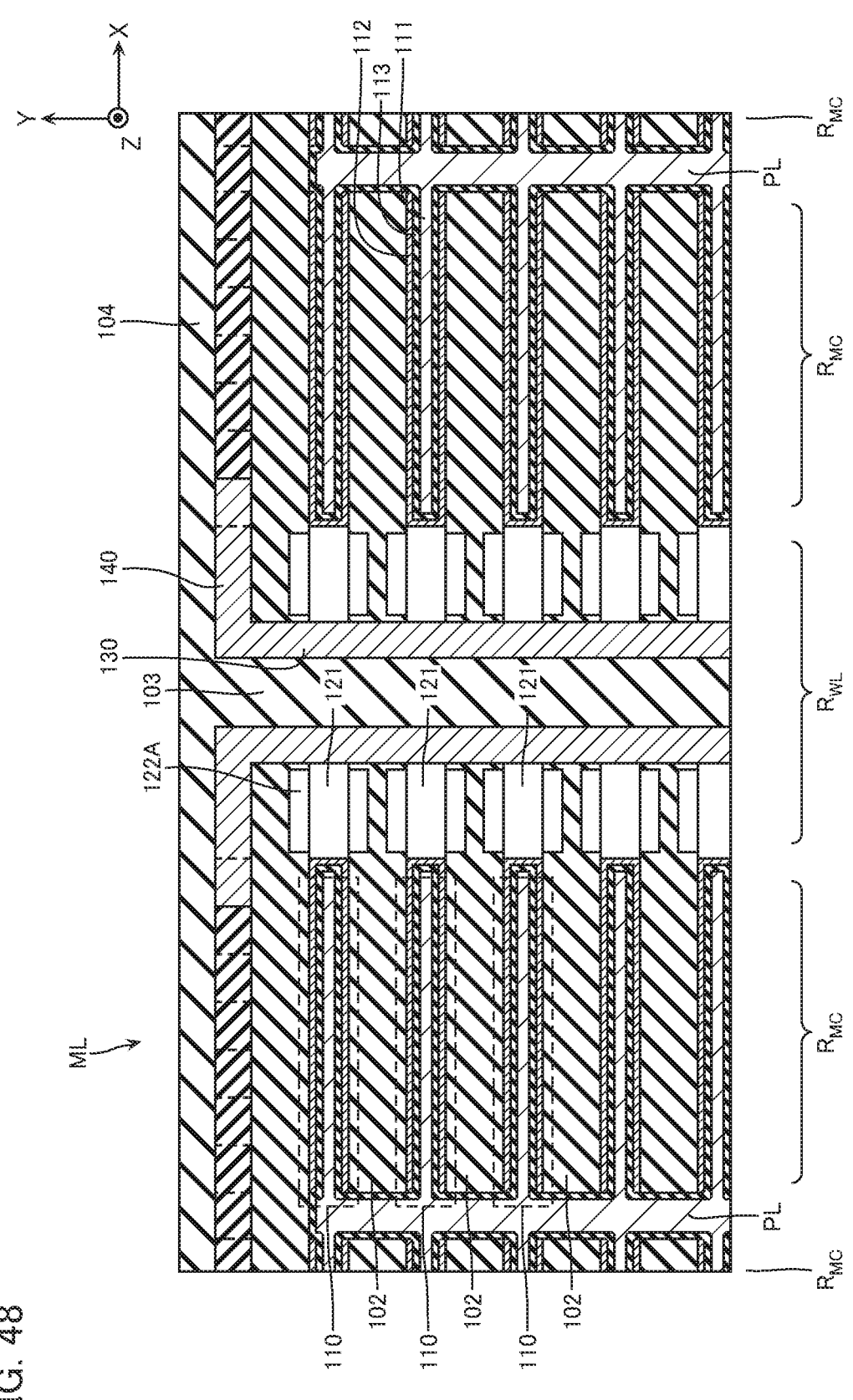
FIG. 48 is a schematic cross-sectional view for describing the manufacturing method.
Figure 49:
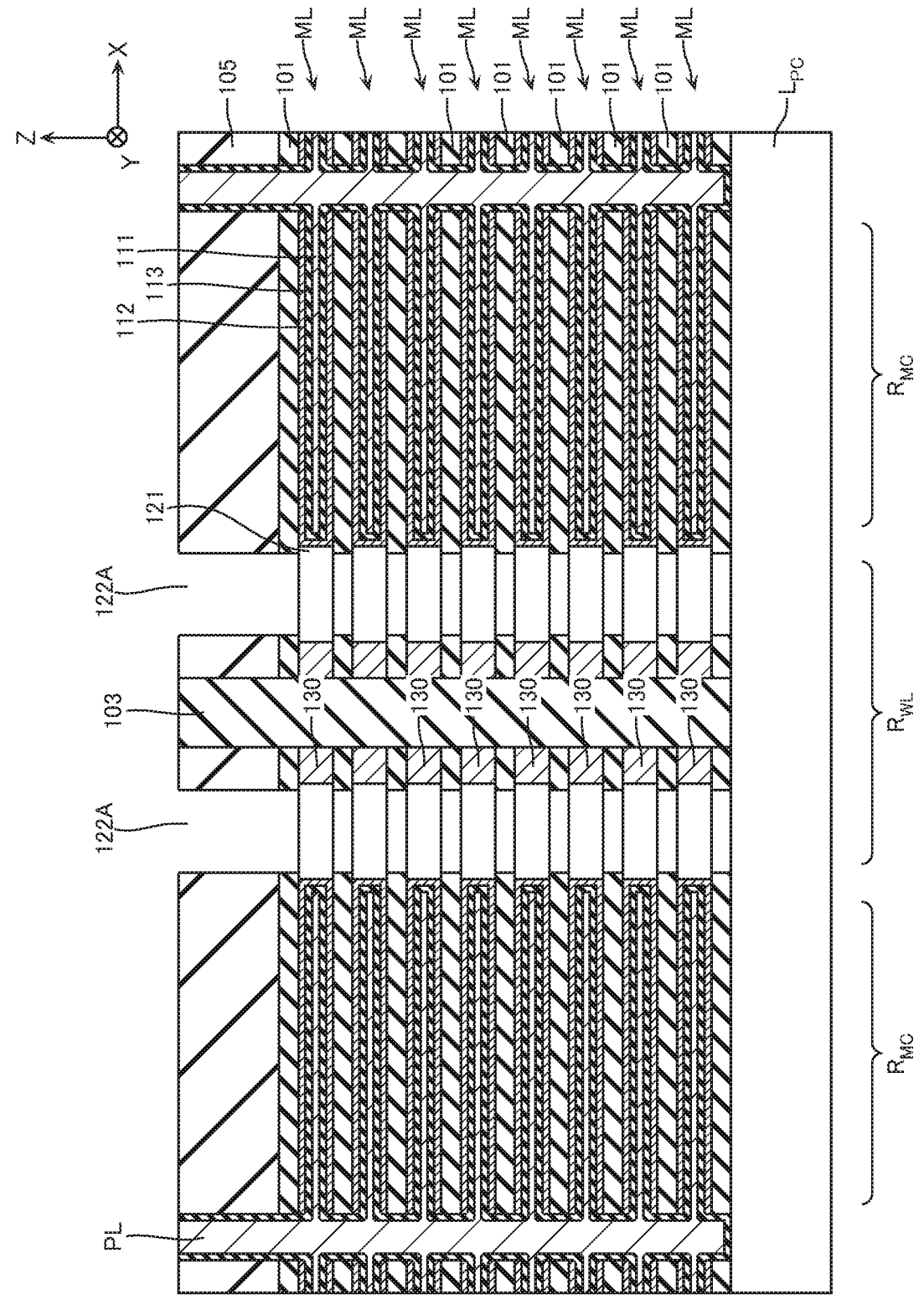
FIG. 49 is a schematic cross-sectional view for describing the manufacturing method.
Figure 50:
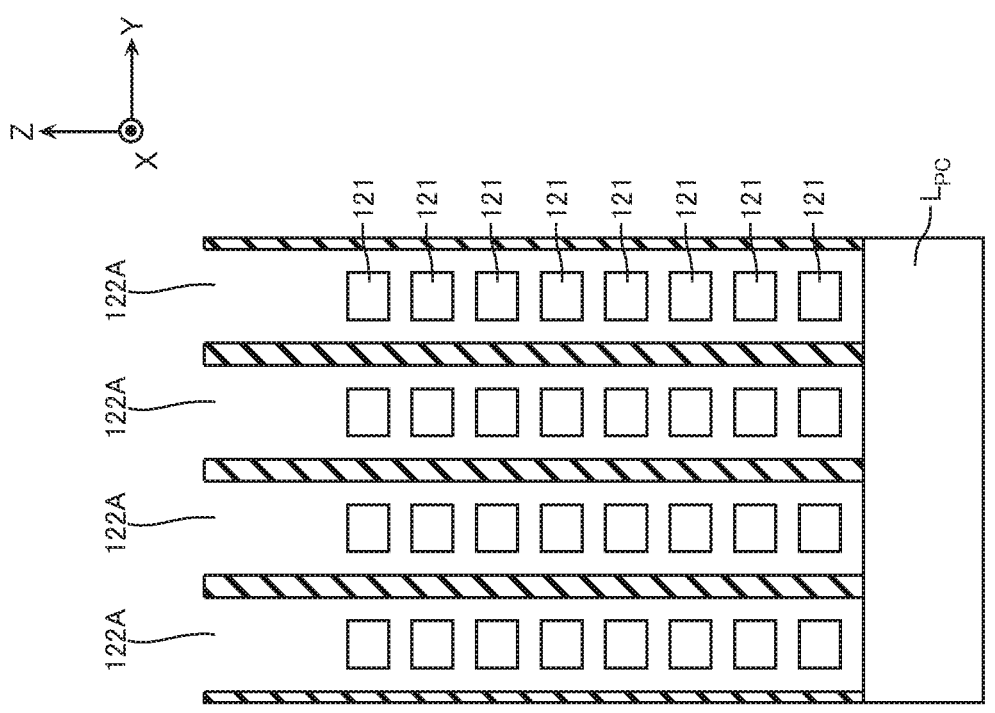
FIG. 50 is a schematic cross-sectional view for describing the manufacturing method.

Next, as illustrated in FIG. 48 to FIG. 50, for example, the insulating layers 101 are partially removed via the openings 122A. As illustrated in FIG. 49 and FIG. 50, in this process, upper surfaces and lower surfaces of the plurality of semiconductor layers 121 arranged in the Z-direction are exposed. As illustrated in FIG. 48, widths in the X-direction and the Y-direction of the openings 122A expand.

Next, as illustrated in FIG. 13 and FIG. 14, for example, insulating layers 123 and the conductive layers 122 are formed inside the openings 122A. This process is performed by, for example, a method, such as CVD.

Next, as illustrated in FIG. 12 and FIG. 15, for example, the contact electrodes $C_{BL}$ are formed. This process is performed by, for example, a method, such as RIE and CVD.

[Modification]

FIG. 51 is a schematic cross-sectional view illustrating another exemplary configuration of the semiconductor memory device according to the first embodiment. FIG. 52 is a schematic cross-sectional view of the structure illustrated in FIG. 51 taken along the line D-D' and viewed along an arrow direction. In the example of FIG. 12 and FIG. 14, regions between the conductive layer 140 and the capacitor structure 110 positioned at a Y end portion, regions between two capacitor structures 110 mutually adjacent in the Y-direction, and regions between two transistor structures 120 mutually adjacent in the Y-direction are embedded with the insulating layers 102. However, as illustrated in FIG. 51 and FIG. 52, cavities AG may be disposed in such regions. As illustrated in FIG. 51, a width $W_{AG0}$ of the cavity AG formed between the conductive layer 140 and the capacitor structure 110 positioned at the Y end portion is large compared with a width $W_{AG1}$ of the cavity AG formed between two capacitor structures 110 mutually adjacent in the Y-direction. Additionally, as illustrated in FIG. 51, the width $W_{AG1}$ of the cavity AG formed between two capacitor structures 110 mutually adjacent in the Y-direction is large compared with a width $W_{AG2}$ of the cavity AG formed between two transistor structures 120 mutually adjacent in the Y-direction.

FIG. 53 is a schematic cross-sectional view illustrating another exemplary configuration of the semiconductor memory device according to the first embodiment.

In the process corresponding to FIG. 18, the opening 103A having a width in the X-direction expanded from a lower side toward an upper side may be formed. In this case, as illustrated in FIG. 53, a width in the X-direction of the insulating layer 103 may be expanded from the lower side toward the upper side. For example, in the example of FIG. 53, a width in the X-direction of the insulating layer 103 at a height position corresponding to a conductive layer 130 positioned at a lowermost layer is indicated as a width $W_{111}$. A width in the X-direction of the insulating layer 103 at a height position corresponding to a conductive layer 130 positioned at an uppermost layer is indicated as a width $W_{113}$. A width in the X-direction of the insulating layer 103 at a height position corresponding to one of two conductive layers 130 disposed in a middle thereof is indicated as a width $W_{112}$. The width $W_{113}$ is greater than the width $W_{112}$. The width $W_{112}$ is greater than the width $W_{111}$.

Here, in the process described with reference to FIG. 19 and FIG. 20, the recessed portions 130A are formed in a range of a constant distance from side surfaces in the X-direction of the opening 103A. In the process described with reference to FIG. 21 to FIG. 24, the conductive layers 130 are formed inside the recessed portions 130A. Therefore, the conductive layers 130 are formed along side surfaces in the X-direction of the insulating layer 103. Similarly, the semiconductor layers 121 are formed in a range of a constant distance from the side surfaces in the X-direction of the conductive layers 130.

In the process corresponding to FIG. 32, the openings PLA may be formed such that a width in the X-direction of the openings PLA is expanded from the lower side to a certain height position, decreases from the certain height position to another height position, and additionally, is expanded from the another height position toward the upper side. In this case, as illustrated in FIG. 53, a width in the X-direction of the plate line PL may be expanded from the lower side to the certain height position, decrease from the certain height position to the another height position, and additionally, be expanded from the another height position toward the upper side. For example, in the example of FIG. 53, a width in the X-direction of the plate line PL at the height position corresponding to the conductive layer 130 positioned at the lowermost layer is indicated as a width $W_{121}$. A width in the X-direction of the plate line PL at the height position corresponding to the conductive layer 130 positioned at the uppermost layer is indicated as a width $W_{123}$. A width in the X-direction of the plate line PL at the height position corresponding to one of the two conductive layers 130 disposed in the middle thereof is indicated as a width $W_{122}$. A width in the X-direction of the plate line PL at its upper end is indicated as a width $W_{124}$. The width $W_{124}$ is greater than the width $W_{123}$. The width $W_{123}$ is smaller than the width $W_{122}$. The width $W_{122}$ is greater than the width $W_{121}$.

With such a configuration, in a region of the height position in which the width in the X-direction of the plate line PL decreases from the lower side to the upper side, variation in widths in the X-direction of the electrodes 111, 112 can be reduced. Accordingly, variation in characteristics of the memory cells MC can be reduced.

In the example of FIG. 53, a magnitude of variation in width in the X-direction of the insulating layer 103 is smaller than a magnitude of variation in width in the X-direction of the plate line PL. For example, in the example of FIG. 53, a difference between the width $W_{113}$ and the width $W_{111}$ is smaller than a difference between the width $W_{122}$ and the width $W_{121}$.

Here, when reduction of the variation in width in the X-direction of both the insulating layer 103 and the plate line PL is attempted, it takes time to form the openings 103A, PLA in some cases. Here, when the variation in width of the X-direction of the insulating layer 103 increases, variation in distance between the conductive layers 130 mutually adjacent in the X-direction increases. Since the conductive layers 130 serve as the bit lines BL, /BL, such variation in distance is considered to have a relatively large influence on variation in characteristics. On the other hand, the variation in width in the X-direction of the plate line PL is considered to have a relatively small influence on variation in characteristics. Therefore, in the example of FIG. 53, formation of openings PLA corresponding to the plate lines PL is performed at high speed while the variation in width in the X-direction of the insulating layer 103 is reduced.

FIG. 54 is a schematic cross-sectional view illustrating another exemplary configuration of the semiconductor memory device according to the first embodiment.

The width in the X-direction of the insulating layer 103 may be expanded from the lower side to a certain height position and decrease from the certain height position toward the upper side. For example, in the example of FIG. 54, a width in the X-direction of the insulating layer 103 at the height position corresponding to the conductive layer 130 positioned at the lowermost layer is indicated as a width $W_{211}$. A width in the X-direction of the insulating layer 103 at the height position corresponding to the conductive layer 130 positioned at the uppermost layer is indicated as a width $W_{213}$. A width in the X-direction of the insulating layer 103 at the height position corresponding to one of the two conductive layers 130 disposed in the middle thereof is indicated as a width $W_{212}$. The width $W_{213}$ is smaller than the width $W_{212}$. The width $W_{212}$ is greater than the width $W_{211}$.

The width in the X-direction of the plate line PL may be expanded from the lower side toward the upper side. For example, in the example of FIG. 54, a width in the X-direction of the plate line PL at the height position corresponding to the conductive layer 130 positioned at the lowermost layer is indicated as a width $W_{221}$. A width in the X-direction of the plate line PL at the height position corresponding to the conductive layer 130 positioned at the uppermost layer is indicated as a width $W_{223}$. A width in the X-direction of the plate line PL at the height position corresponding to one of the two conductive layers 130 disposed in the middle thereof is indicated as a width $W_{222}$. The width $W_{223}$ is greater than the width $W_{222}$. The width $W_{222}$ is greater than the width $W_{221}$.

Additionally, in the example of FIG. 54 as well, the magnitude of the variation in width in the X-direction of the insulating layer 103 is smaller than the magnitude of the variation in width in the X-direction of the plate line PL.

FIG. 55 is a schematic cross-sectional view illustrating another exemplary configuration of the semiconductor memory device according to the first embodiment.

The width in the X-direction of the insulating layer 103 may be expanded from the lower side to a certain height position, decrease from the certain height position to another height position, and additionally, be expanded from the another height position toward the upper side. For example, in the example of FIG. 55, a width in the X-direction of the insulating layer 103 at the height position corresponding to the conductive layer 130 positioned at the lowermost layer is indicated as a width $W_{311}$. A width in the X-direction of the insulating layer 103 at the height position corresponding to the conductive layer 130 positioned at the uppermost layer is indicated as a width $W_{313}$. A width in the X-direction of the insulating layer 103 at the height position corresponding to one of the two conductive layers 130 disposed in the middle thereof is indicated as a width $W_{312}$. A width in the X-direction of the insulating layer 103 at its upper end is indicated as a width $W_{334}$. The width $W_{314}$ is greater than the width $W_{313}$. The width $W_{313}$ is smaller than the width $W_{312}$. The width $W_{312}$ is greater than the width $W_{311}$.

The width in the X-direction of the plate line PL may be expanded from the lower side to a certain height position and decrease from the certain height position toward the upper side. For example, in the example of FIG. 55, a width in the X-direction of the plate line PL at the height position corresponding to the conductive layer 130 positioned at the lowermost layer is indicated as a width $W_{321}$. A width in the X-direction of the plate line PL at the height position corresponding to the conductive layer 130 positioned at the uppermost layer is indicated as a width $W_{323}$. A width in the X-direction of the plate line PL at the height position corresponding to one of the two conductive layers 130 disposed in the middle thereof is indicated as a width $W_{322}$. The width $W_{323}$ is smaller than the width $W_{322}$. The width $W_{322}$ is greater than the width $W_{321}$.

Additionally, in the example of FIG. 55 as well, the magnitude of the variation in width in the X-direction of the insulating layer 103 is smaller than the magnitude of the variation in width in the X-direction of the plate line PL.

FIG. 56 is a schematic cross-sectional view illustrating another exemplary configuration of the semiconductor memory device according to the first embodiment.

The insulating layer 103 may include two or more regions arranged in the Z-direction. Widths in the X-direction of these regions may be each expanded from the lower side toward the upper side. For example, in the example of FIG. 56, a width in the X-direction of the insulating layer 103 at a height position of a conductive layer 130 positioned at a lowermost layer among a plurality of conductive layers 130 disposed at a height position corresponding to a lower region of the insulating layer 103 is indicated as a width $W_{411}$. A width in the X-direction of the insulating layer 103 at a height position of a conductive layer 130 positioned at an uppermost layer among the plurality of conductive layers 130 disposed at the height position corresponding to the lower region of the insulating layer 103 is indicated as a width $W_{412}$. A width in the X-direction of the insulating layer 103 at a height position of a conductive layer 130 positioned at a lowermost layer among a plurality of conductive layers 130 disposed at a height position corresponding to an upper region of the insulating layer 103 is indicated as a width $W_{413}$. A width in the X-direction of the insulating layer 103 at a height position of a conductive layer 130 positioned at an uppermost layer among the plurality of conductive layers 130 disposed at the height position corresponding to the upper region of the insulating layer 103 is indicated as a width $W_{414}$. The width $W_{414}$ is greater than the width $W_{413}$. The width $W_{413}$ is smaller than the width $W_{412}$. The width $W_{412}$ is greater than the width $W_{411}$.

The plate lines PL may include two or more regions arranged in the Z-direction. Widths in the X-direction of these regions may be each expanded from the lower side to a certain height position and decrease from the certain height position toward the upper side.

For example, in the example of FIG. 56, a width in the X-direction of the plate line PL at a height position of a conductive layer 130 positioned at a lowermost layer among a plurality of conductive layers 130 disposed at a height position corresponding to a lower region of the plate line PL is indicated as a width $W_{421}$. A width in the X-direction of the plate line PL at a height position of a conductive layer 130 positioned at an uppermost layer among the plurality of conductive layers 130 disposed at the height position corresponding to the lower region of the plate line PL is indicated as a width $W_{423}$. A width in the X-direction of the plate line PL at a height position corresponding to one of two conductive layers 130 disposed in the middle thereof is indicated as a width $W_{422}$.

A width in the X-direction of the plate line PL at a height position of the conductive layer 130 positioned at a lowermost layer among a plurality of conductive layers 130 disposed at a height position corresponding to an upper region of the plate line PL is indicated as a width $W_{424}$. A width in the X-direction of the plate line PL at a height position of the conductive layer 130 positioned at an uppermost layer among the plurality of conductive layers 130 disposed at the height position corresponding to the upper region of the plate line PL is indicated as a width $W_{425}$. A width in the X-direction of the plate line PL at its upper end is indicated as a width $W_{426}$.

The width $W_{426}$ is smaller than the width $W_{425}$. The width $W_{425}$ is greater than the width $W_{424}$ and the width $W_{423}$. The width $W_{424}$ and the width $W_{423}$ are smaller than the width $W_{422}$. The width $W_{422}$ is greater than the width $W_{421}$.

Additionally, in the example of FIG. 56 as well, the magnitude of the variation in width in the X-direction of the insulating layer 103 is smaller than the magnitude of the variation in width in the X-direction of the plate line PL.

Even with the configurations as exemplified in FIG. 54 to FIG. 56, the variation in characteristics of the memory cells MC can be reduced. Further, formation of the openings PLA corresponding to the plate lines PL can be performed at high speed while the variation in width in the X-direction of the insulating layer 103 is reduced.

FIG. 57 and FIG. 58 are schematic cross-sectional views illustrating exemplary configurations of the semiconductor memory device according to the first embodiment. The global word lines GWL described with reference to FIG. 11 may extend in the X-direction over the entire memory cell array 11 as exemplified in FIG. 57. As exemplified in FIG. 58, the global word lines GWL may be divided into a plurality of parts in the X-direction. In the case of FIG. 58, a distance from each of the memory cells MC to an individual unit of the word line drivers WLD is short, and it is expected that a unit operating speed is fast. Another wiring extending in the Y-direction may be formed in the regions in which the global word lines GWL are separated.

FIG. 59 is a schematic plan view illustrating another exemplary configuration of the semiconductor memory device according to the first embodiment. As illustrated in FIG. 59, a dummy region $R_D$ may be disposed in a part of the memory cell array 11 that overlaps with the sense amplifier circuit SA when viewed from the Z-direction. The dummy region $R_D$ is formed adjacent to the bit line connecting region $R_{BL}$. A configuration in the dummy region $R_D$ is basically equal to the configuration in the memory cell region $R_{MC}$ or the configuration in the word line connecting region $R_{WL}$. However, the configuration in the dummy region $R_D$ is not used as the memory cells MC and the like. That is, the configuration having a shape equal to the memory cell MC in the dummy region $R_D$ cannot store information by specifying an address by a controller. The contact electrodes $C_{WL}$ as described with reference to FIG. 10 and the global word lines GWL as described with reference to FIG. 11 need not be connected to the conductive layers 122 in the dummy region $R_D$.

Second Embodiment

Next, a semiconductor memory device according to a second embodiment is described. In the following description, same reference numerals are attached to parts similar to those of the first embodiment, and their descriptions are omitted.

The semiconductor memory device according to the second embodiment is basically configured similarly to the semiconductor memory device according to the first embodiment. However, the semiconductor memory device according to the second embodiment is different from the semiconductor memory device according to the first embodiment in the following points.

As described with reference to FIG. 7, in the first embodiment, one of the two memory cell arrays 11 mutually adjacent in the Y-direction includes the bit line BL, and the other includes the bit line /BL. On the other hand, in the second embodiment, each of the memory cell arrays 11 includes the bit line BL and the bit line /BL. For example, also in the semiconductor memory device according to the second embodiment, as illustrated in FIG. 12, the memory layer ML includes two conductive layers 130 that are disposed in one of the word line connecting regions $R_{WL}$ and arranged in the X-direction. Here, in the second embodiment, one of these two conductive layers 130 serves as the bit line BL, and the other serves as the bit line /BL.

FIG. 60 is a schematic plan view illustrating a configuration of the peripheral circuit layer $L_{PC}$ of the semiconductor memory device according to the second embodiment. As described with reference to FIG. 9, each of the sense amplifier circuits SA according to the first embodiment corresponds to two memory cell arrays 11 (FIG. 7) arranged in the Y-direction. On the other hand, as illustrated in FIG.

60, each of the sense amplifier circuits SA according to the second embodiment is disposed independently for each memory cell array 11.

FIG. 61 is a schematic plan view illustrating a part of the configuration of the semiconductor memory device according to the second embodiment. As described with reference to FIG. 11, in the semiconductor memory device according to the first embodiment, the plurality of conductive layers 122 arranged in the X-direction are connected to the common global word line GWL. On the other hand, as illustrated in FIG. 61, in the semiconductor memory device according to the second embodiment, two conductive layers 122 arranged in the X-direction in the same word line connecting region $R_{WL}$ are connected to two respective global word lines GWL arranged in the Y-direction.

[Effect]

As described with reference to FIG. 7, in the first embodiment, one of the two memory cell arrays 11 mutually adjacent in the Y-direction includes the bit line BL, and the other includes the bit line /BL. In such a configuration, different noises caused by the memory cell arrays 11 or the peripheral circuits are generated in the bit lines BL, /BL in some cases. In such a case, a read operation and the like cannot be appropriately executed in some cases.

On the other hand, in the second embodiment, one of the two conductive layers 130 mutually adjacent in the X-direction serves as the bit line BL, and the other serves as the bit line /BL in each memory cell array 11. In such a configuration, the bit line /BL is disposed at a proximity of the bit line BL. Therefore, generation of different noises in the bit lines BL, /BL can be reduced, and the read operation can be appropriately executed.

[Modification]

FIG. 62 is a schematic plan view illustrating another exemplary configuration of the semiconductor memory device. In the example of FIG. 61, the two conductive layers 122 arranged in the X-direction in the same word line connecting region $R_{WL}$ are connected to the two respective global word lines GWL arranged in the Y-direction. On the other hand, in the example of FIG. 62, two conductive layers 122 arranged in the X-direction in the same word line connecting region $R_{WL}$ are connected to two respective global word lines GWL arranged in the X-direction. Two global word lines GWL adjacent in the X-direction are connected to respective different units of the word line drivers WLD. Global word lines GWL not adjacent in the X-direction may be connected to one another in another wiring layer and may be connected to the same unit of the word line driver WLD.

Third Embodiment

Next, a semiconductor memory device according to a third embodiment is described. In the following description, same reference numerals are attached to parts similar to those of the second embodiment, and their descriptions are omitted.

The semiconductor memory device according to the third embodiment is basically configured similarly to the semiconductor memory device according to the second embodiment. However, the semiconductor memory device according to the third embodiment is different from the semiconductor memory device according to the second embodiment in the following points.

FIG. 63 is a schematic circuit diagram illustrating a part of a configuration of the semiconductor memory device according to the third embodiment. The semiconductor memory device according to the third embodiment includes memory cell arrays 13 instead of the memory cell arrays 11. The memory cell array 13 is basically configured similarly to the memory cell array 11. However, the memory cell array 13 includes memory cells MC3 instead of the memory cells MC.

Each of the memory cells MC3 includes cell transistors TrC0, TrC1 and cell capacitors CpC0, CpC1. Such a configuration of the memory cell MC3 is referred to as "2T2C" in some cases. As illustrated in FIG. 63, the cell transistors TrC0, TrC1 have source terminals connected to the bit lines BL, /BL. The cell transistors TrC0, TrC1 have drain terminals connected to one terminals of the cell capacitors CpC0, CpC1. The cell transistors TrC0, TrC1 have gate terminals connected in common to the same word line WL. The other terminals of the cell capacitors CpC0, CpC1 are connected to the plate line PL.

FIG. 64 is a schematic plan view illustrating a part of the configuration of the semiconductor memory device according to the third embodiment. In the semiconductor memory device according to the third embodiment, two conductive layers 122 arranged in the X-direction in the same word line connecting region $R_{WL}$ are connected to a common global word line GWL.

Fourth Embodiment

Next, a semiconductor memory device according to a fourth embodiment is described. In the following description, same reference numerals are attached to parts similar to those of the first embodiment, and their descriptions are omitted.

The semiconductor memory device according to the fourth embodiment is basically configured similarly to the semiconductor memory device according to the first embodiment. However, the semiconductor memory device according to the fourth embodiment is different from the semiconductor memory device according to the first embodiment in the following points.

FIG. 65 is a schematic plan view illustrating a part of a configuration of the memory cell array layer $L_{MCA}$ according to the fourth embodiment. As described with reference to FIG. 7, in the first embodiment, the bit line connecting region $R_{BL}$ is disposed in one end portion in the Y-direction of the memory cell array 11. On the other hand, in the fourth embodiment, the bit line connecting region $R_{BL}$ is disposed in one end portion and the other end portion in the Y-direction of the memory cell array 11.

The bit line connecting region $R_{BL}$ disposed on one side in the Y-direction of the memory cell array 11 may be disposed, for example, corresponding to odd-numbered memory layers ML counted from the lower side. That is, such a bit line connecting region $R_{BL}$ may include terrace portions T of odd-numbered conductive layers 140 counted from the lower side and the plurality of contact electrodes $C_{BL}$ connected thereto.

The bit line connecting region $R_{BL}$ disposed on the other side in the Y-direction of the memory cell array 11 may be disposed, for example, corresponding to even-numbered memory layers ML counted from the lower side. That is, such a bit line connecting region $R_{BL}$ may include terrace portions T of even-numbered conductive layers 140 counted from the lower side and the plurality of contact electrodes $C_{BL}$ connected thereto.

For example, a plurality of contact electrodes $C_{BL}$ disposed in the bit line connecting regions $R_{BL}$ disposed at the Y-direction positive side of a plurality of memory cell arrays 11 included in a first row counted from the Y-direction positive side among a plurality of memory cell arrays 11 arranged in the X-direction and the Y-direction need not be connected to the sense amplifier circuits SA. A plurality of configurations connected to these plurality of contact electrodes $C_{BL}$ need not be used as the memory cells MC and the like. This is because, when one of two memory cell arrays 11 mutually adjacent in the Y-direction includes the bit line BL and the other includes the bit line /BL, the other bit line /BL does not exist at a proximity of the bit line BL having the bit line connecting region $R_{BL}$ positioned in the end portion in the Y-direction.

Similarly, a plurality of contact electrodes $C_{BL}$ disposed in the bit line connecting regions $R_{BL}$ disposed at the Y-direction negative side of a plurality of memory cell arrays 11 included in a first row counted from the Y-direction negative side among a plurality of memory cell arrays 11 arranged in the X-direction and the Y-direction need not be connected to the sense amplifier circuits SA. A plurality of configurations connected to these plurality of contact electrodes $C_{BL}$ need not be used as the memory cells MC and the like.

FIG. 66 is a schematic plan view illustrating a part of a configuration of the peripheral circuit layer $L_{PC}$ according to the fourth embodiment. The peripheral circuit layer $L_{PC}$ includes a plurality of regions $R_{11}$ arranged in the X-direction and the Y-direction, corresponding to the memory cell arrays 11. In each of the regions $R_{11}$, the word line driver WLD is disposed. Further, the sense amplifier circuits SA are disposed in regions between the plurality of word line drivers WLD arranged in the Y-direction. Positions in which the sense amplifier circuits SA are disposed mostly overlap with the bit line connecting regions $R_{BL}$ when viewed from the upper side.

In the semiconductor memory device according to the fourth embodiment, one of two memory cell arrays 11 mutually adjacent in the Y-direction includes the bit line BL, and the other includes the bit line /BL. The respective sense amplifier circuits SA are connected to odd-numbered or even-numbered bit lines BL, /BL counted from the lower side among the plurality of bit lines BL, /BL included in these two memory cell arrays 11.

For example, in regions on the Y-direction positive side with respect to the word line drivers WLD of a plurality of regions $R_{11}$ included in a first row counted from the Y-direction positive side among a plurality of regions $R_{11}$ arranged in the X-direction and the Y-direction, dummy circuits SAD may be disposed instead of the sense amplifier circuits SA. The dummy circuits SAD need not be used for the read operation and the like.

Similarly, for example, in regions on the Y-direction negative side with respect to the word line drivers WLD of a plurality of regions $R_{11}$ included in a first row counted from the Y-direction negative side among a plurality of regions $R_{11}$ arranged in the X-direction and the Y-direction, the dummy circuits SAD may be disposed instead of the sense amplifier circuits SA. The dummy circuits SAD need not be used for the read operation and the like.

FIG. 67 is a schematic plan view illustrating another exemplary configuration of the semiconductor memory device according to the fourth embodiment. As illustrated in FIG. 67, the dummy regions $R_D$ may be disposed in parts of the memory cell array 11 that overlap with the sense amplifier circuit SA or the dummy circuit SAD when viewed from the Z-direction.

Fifth Embodiment

Next, a semiconductor memory device according to a fifth embodiment is described. In the following description, same reference numerals are attached to parts similar to those of the second embodiment, and their descriptions are omitted.

The semiconductor memory device according to the fifth embodiment is basically configured similarly to the semiconductor memory device according to the second embodiment. However, the semiconductor memory device according to the fifth embodiment is different from the semiconductor memory device according to the second embodiment in the following points.

In the fifth embodiment, similarly to the fourth embodiment, as exemplified in FIG. 65, for example, the bit line connecting region $R_{BL}$ is disposed in the end portions on one side and on the other side in the Y-direction of the memory cell array 11.

FIG. 68 is a schematic plan view illustrating a part of a configuration of the peripheral circuit layer $L_{PC}$ according to the fifth embodiment. The peripheral circuit layer $L_{PC}$ includes a plurality of regions $R_{11}$ arranged in the X-direction and the Y-direction, corresponding to the memory cell arrays 11. In each of the regions $R_{11}$, the word line driver WLD is disposed. Further, the sense amplifier circuit SA is each disposed in regions on the Y-direction positive side and the Y-direction negative side with respect to the word line driver WLD. Positions in which the sense amplifier circuits SA are disposed overlap with the bit line connecting regions $R_{BL}$ when viewed from the upper side.

Sixth Embodiment

Next, a semiconductor memory device according to a sixth embodiment is described. In the following description, same reference numerals are attached to parts similar to those of the third embodiment, and their descriptions are omitted.

The semiconductor memory device according to the sixth embodiment is basically configured similarly to the semiconductor memory device according to the third embodiment. However, the semiconductor memory device according to the sixth embodiment is different from the semiconductor memory device according to the third embodiment in the following points.

In the sixth embodiment, similarly to the fourth embodiment, as exemplified in FIG. 65, for example, the bit line connecting region $R_{BL}$ is disposed in the end portions on one side and on the other side in the Y-direction of the memory cell array 11.

Additionally, in the sixth embodiment, similarly to the fifth embodiment, as exemplified in FIG. 68, for example, the sense amplifier circuit SA is disposed in the regions on one side and on the other side in the Y-direction of the word line driver 30 (FIG. 1).

Seventh Embodiment

Next, a semiconductor memory device according to a seventh embodiment is described. In the following description, same reference numerals are attached to parts similar to those of the first embodiment, and their descriptions are omitted.

The semiconductor memory device according to the seventh embodiment is basically configured similarly to the semiconductor memory device according to the first embodiment. However, the semiconductor memory device according to the seventh embodiment is different from the semiconductor memory device according to the first embodiment in the following points.

FIG. 69 is a schematic plan view illustrating a part of a configuration of the semiconductor memory device according to the seventh embodiment. The semiconductor memory device according to the seventh embodiment includes bit line connecting regions $R_{BL7}$ instead of the bit line connecting regions $R_{BL}$. The bit line connecting region $R_{BL7}$ is basically configured similarly to the bit line connecting region $R_{BL}$.

However, as described with reference to FIG. 10, in the bit line connecting region $R_{BL}$, a plurality of contact electrodes $C_{BL}$ arranged in a row in the X-direction and a plurality of terrace portions T disposed corresponding to these plurality of contact electrodes $C_{BL}$ are disposed.

On the other hand, the bit line connecting region $R_{BL7}$ includes two rows, each of which is composed of a plurality of contact electrodes $C_{BL}$ arranged in the X-direction. Positions in the Y-direction of these rows are mutually different. For example, of these two rows, a plurality of contact electrodes $C_{BL}$ included in the row disposed closer to the memory cell region $R_{MC}$ are connected to odd-numbered conductive layers 140 counted from the upper side (Z-direction positive side). Further, for example, of these two rows, a plurality of contact electrodes $C_{BL}$ included in the row disposed farther from the memory cell region $R_{MC}$ are connected to the even-numbered conductive layers 140 counted from the upper side (Z-direction positive side). The bit line connecting region $R_{BL7}$ includes the plurality of terrace portions T disposed corresponding to these plurality of contact electrodes $C_{BL}$. The bit line connecting region $R_{BL7}$ may include three or more rows, each of which is composed of a plurality of contact electrodes $C_{BL}$ arranged in the X-direction.

In the above example, an example in which the semiconductor memory device according to the first embodiment includes the bit line connecting regions $R_{BL7}$ instead of the bit line connecting regions $R_{BL}$ has been described. However, for example, the semiconductor memory devices according to the second embodiment to the sixth embodiment may include the bit line connecting regions $R_{BL7}$ instead of the bit line connecting regions $R_{BL}$.

In the example of FIG. 69, a width in the Y-direction of the conductive layers 140 is greater than a width in the X-direction of the conductive layers 130. In manufacturing such a structure, for example, in the process described with reference to FIG. 17, as illustrated in FIG. 70, the opening 103A is formed. Further, for example, as illustrated in FIG. 71, a sacrifice layer 103B is formed in the opening 103A. Further, as illustrated in FIG. 72, for example, the opening 104A is formed. Further, as illustrated in FIG. 73, for example, the sacrifice layers MLA are partially removed. Further, as illustrated in FIG. 74, for example, the sacrifice layer 103B is removed. Further, as illustrated in FIG. 75, for example, the sacrifice layers MLA are partially removed. Thereafter, the processes after the process described with reference to FIG. 21 and FIG. 22 are performed.

Eighth Embodiment

Next, a semiconductor memory device according to an eighth embodiment is described. In the following description, same reference numerals are attached to parts similar to those of the first embodiment, and their descriptions are omitted.

The semiconductor memory device according to the eighth embodiment is basically configured similarly to the semiconductor memory device according to the first embodiment. However, the semiconductor memory device according to the eighth embodiment is different from the semiconductor memory device according to the first embodiment in the following points.

FIG. 76 to FIG. 78 are schematic plan views illustrating a part of a configuration of the semiconductor memory device according to the eighth embodiment.

As illustrated in FIG. 76, the semiconductor memory device according to the eighth embodiment includes bit line connecting regions $R_{BL8}$ instead of the bit line connecting regions $R_{BL}$. The bit line connecting region $R_{BL8}$ is basically configured similarly to the bit line connecting region $R_{BL}$. However, as illustrated in FIG. 77, the bit line connecting region $R_{BL8}$ includes conductive layers 141 instead of the conductive layers 140. The conductive layer 141 is basically configured similarly to the conductive layer 140. However, each of the conductive layers 141 includes a connecting portion 142. The connecting portion 142 extends in the X-direction along two memory cell regions $R_{MC}$ mutually adjacent in the X-direction and is connected to the conductive layers 130 in two word line connecting regions $R_{WL}$ mutually adjacent in the X-direction. Positions in the Y-direction of the terrace portions T are different from a position in the Y-direction of the connecting portion 142.

In the embodiment, a pair of conductive layers 130 arranged in the X-direction and conductive layers 141 connected to these are parts of one continuous conductive layer. That is, one of the pair of conductive layers 130 is continuous to the other of the pair of conductive layers 130 via the conductive layer 141. The conductive layer 130 is a part of this conductive layer, which is disposed in the word line connecting region $R_{WL}$. The conductive layer 141 is a part of this conductive layer, which is disposed in the bit line connecting region $R_{BL8}$.

In the semiconductor memory device according to the eighth embodiment, two conductive layers 130 connected via the conductive layer 141 serve as the common bit line BL or the common bit line /BL. Two conductive layers 122 arranged in the X-direction in a region between these two conductive layers 130 are, as illustrated in FIG. 78, connected to two respective global word lines GWL arranged in the Y-direction.

In FIG. 77 and FIG. 78, one (such as the conductive layer 130 on the X-direction negative side) and the other (such as the conductive layer 130 on the X-direction positive side) of the electrically common pair of conductive layers 130 are exemplified. The global word line GWL connected to one of the plurality of word lines WL arranged in the Y-direction corresponding to one of the conductive layers 130 that is an n-th (n is an integer of 1 or more) closest to the bit line connecting region and the global word line GWL connected to one of the plurality of word lines WL arranged in the Y-direction corresponding to the other of the conductive layers 130 that is the n-th closest to the bit line connecting region $R_{BL8}$ are mutually adjacent in the Y-direction.

FIG. 79 is a schematic plan view illustrating another exemplary configuration of the semiconductor memory device according to the eighth embodiment. As illustrated in FIG. 79, the dummy region $R_D$ may be disposed in a part of the memory cell array 11 that overlaps with the sense amplifier circuit SA when viewed from the Z-direction.

In the above example, an example in which the semiconductor memory device according to the first embodiment includes the bit line connecting regions $R_{BL8}$ instead of the bit line connecting regions $R_{BL}$ has been described. However, for example, the semiconductor memory device according to the second embodiment or the third embodiment may include the bit line connecting regions instead of the bit line connecting regions $R_{BL}$.

Ninth Embodiment

Next, a semiconductor memory device according to a ninth embodiment is described. In the following description, same reference numerals are attached to parts similar to those of the fourth embodiment, and their descriptions are omitted.

The semiconductor memory device according to the ninth embodiment is basically configured similarly to the semiconductor memory device according to the fourth embodiment. However, the semiconductor memory device according to the ninth embodiment is different from the semiconductor memory device according to the fourth embodiment in the following point.

FIG. 80 is a schematic plan view illustrating a part of a configuration of the semiconductor memory device according to the ninth embodiment. As illustrated in FIG. 80, the semiconductor memory device according to the ninth embodiment includes the bit line connecting regions $R_{BLB}$ instead of the bit line connecting regions $R_{BL}$. Therefore, as described with reference to FIG. 77, the conductive layers 130 in the two word line connecting regions $R_{WL}$ mutually adjacent in the X-direction are electrically connected via the connecting portion 142. As illustrated in FIG. 80, the bit line connecting region $R_{BL8}$ is disposed in one end portion and the other end portion in the Y-direction of the memory cell array 11.

In this embodiment, a pair of conductive layers 130 arranged in the X-direction and two conductive layers 141 connected to one end and the other end in the Y-direction thereof are parts of one continuous conductive layer.

FIG. 81 is a schematic plan view illustrating another exemplary configuration of the semiconductor memory device according to the ninth embodiment. As illustrated in FIG. 81, the dummy region $R_D$ may be disposed in a part of the memory cell array 11 that overlaps with the sense amplifier circuit SA when viewed from the Z-direction.

In the above example, an example in which the semiconductor memory device according to the fourth embodiment includes the bit line connecting regions $R_{BL8}$ instead of the bit line connecting regions $R_{BL}$ has been described. However, for example, the semiconductor memory device according to the fifth embodiment or the sixth embodiment may include the bit line connecting regions $R_{BL8}$ instead of the bit line connecting regions $R_{BL}$.

Tenth Embodiment

Next, a semiconductor memory device according to a tenth embodiment is described. In the following description, same reference numerals are attached to parts similar to those of the eighth embodiment, and their descriptions are omitted.

The semiconductor memory device according to the tenth embodiment is basically configured similarly to the semiconductor memory device according to the eighth embodiment. However, the semiconductor memory device according to the tenth embodiment is different from the semiconductor memory device according to the eighth embodiment in the following point.

FIG. 82 is a schematic plan view illustrating a part of a configuration of the semiconductor memory device according to the tenth embodiment. As illustrated in FIG. 82, the semiconductor memory device according to the tenth embodiment includes bit line connecting regions $R_{BL10}$ instead of the bit line connecting regions $R_{BL8}$.

The bit line connecting region $R_{BL10}$ is basically configured similarly to the bit line connecting region $R_{BL8}$. However, the bit line connecting region $R_{BL10}$ includes a plurality of contact electrodes $C_{PC}$ arranged in the X-direction. The contact electrodes $C_{PC}$ connect two wiring layers that sandwich a step (the plurality of terrace portions T) formed in the bit line connecting region $R_{BL10}$ in the Z-direction and are disposed, for example, in a current path between the bit lines BL, /BL and the sense amplifier circuit SA. The bit line connecting region $R_{BL10}$ includes conductive layers 143 instead of the conductive layers 141. The conductive layer 143 is basically configured similarly to the conductive layer 141. However, the conductive layer 143 surrounds outer circumferential surfaces of the plurality of contact electrodes $C_{PC}$ on the XY cross-sectional surface as exemplified in FIG. 82.

In the example of FIG. 82, positions in the X-direction of the contact electrodes $C_{BL}$ and the contact electrodes $C_{PC}$ are different. However, as illustrated in FIG. 83, for example, the contact electrodes $C_{PC}$ may be arranged with the respective contact electrodes $C_{BL}$ in the Y-direction.

In the above example, an example in which the semiconductor memory device according to the eighth embodiment includes the bit line connecting regions $R_{BL10}$ instead of the bit line connecting regions has been $R_{BL8}$ described. However, for example, the semiconductor memory device according to the ninth embodiment may include the bit line connecting regions $R_{BL10}$ instead of the bit line connecting regions $R_{BL8}$.

Eleventh Embodiment

Next, a semiconductor memory device according to an eleventh embodiment is described. In the following description, same reference numerals are attached to parts similar to those of the eighth embodiment, and their descriptions are omitted.

The semiconductor memory device according to the eleventh embodiment is basically configured similarly to the semiconductor memory device according to the eighth embodiment. However, the semiconductor memory device according to the eleventh embodiment is different from the semiconductor memory device according to the eighth embodiment in the following points.

FIG. 84 is a schematic circuit diagram illustrating a part of a configuration of the semiconductor memory device according to the eleventh embodiment. In FIG. 84, a sense amplifier circuit SA0 corresponding to bit lines BL0, /BL0, a sense amplifier circuit SA1 corresponding to bit lines BL1, /BL1, and a sense amplifier circuit SA2 corresponding to bit lines BL2, /BL2 are exemplified. Additionally, in FIG. 84, a word line driver WLD1 corresponding to word lines WL1 and a word line driver WLD2 corresponding to word lines WL2 are exemplified.

In the eleventh embodiment, select transistors $Tr_{SB}$ are disposed in current paths between the bit lines BL, /BL and the contact electrodes $C_{BL}$. The select transistors $Tr_{SB}$ have source terminals connected to the sense amplifier circuits SA0, SA1, SA2 via the contact electrodes $C_{BL}$. The select transistors $Tr_{SB}$ have drain terminals connected to the bit lines BL, /BL. The select transistors $Tr_{SB}$ have gate terminals connected to select gate lines $SG_B$. The select gate line $SG_B$ is connected in common to a plurality of select transistors $Tr_{SB}$ corresponding to a plurality of memory layers ML.

Additionally, in the eleventh embodiment, select transistors $Tr_{SW}$ are disposed in current paths between the word lines WL1 and the word line driver WLD1 and between the word lines WL2 and the word line driver WLD2. The select transistors $Tr_{SW}$ have source terminals connected to the word line drivers WLD1, WLD2. The select transistors $Tr_{SW}$ have drain terminals connected to the word lines WL1, WL2. The select transistors $Tr_{SW}$ have gate terminals connected to select gate lines $SG_W$. The select gate line $SG_W$ is connected in common to a plurality of select transistors $Tr_{SW}$ corresponding to the same bit lines BL, /BL.

In a read operation and a write operation of the semiconductor memory device according to the eleventh embodiment, for example, in a state where a voltage corresponding to an "L" state is output from the word line drivers WLD1, WLD2, all the select gate lines $SG_W$ are set to be in an "H" state. Next, the select gate lines $SG_W$ corresponding to unselected word lines WL are set to be in the "L" state. Next, a voltage corresponding to the "H" state is output from the word line drivers WLD1, WLD2 corresponding to selected word lines WL among the plurality of word line drivers WLD1, WLD2.

FIG. 85 is a schematic plan view illustrating a part of the configuration of the semiconductor memory device according to the eleventh embodiment. FIG. 86 is a schematic XY cross-sectional view illustrating a part of the configuration of the semiconductor memory device. FIG. 87 is a schematic cross-sectional view illustrating a part of the configuration of the semiconductor memory device. As illustrated in FIG. 85, the semiconductor memory device according to the eleventh embodiment includes bit line connecting regions $R_{BL11}$ instead of the bit line connecting regions $R_{BL8}$. The bit line connecting region $R_{BL11}$ is basically configured similarly to the bit line connecting region $R_{BL8}$. However, in the bit line connecting region $R_{BL11}$, parts of the conductive layers 141 that are connected to the conductive layers 130 are physically spaced from parts of the conductive layers 141 that are connected to the contact electrodes $C_{BL}$. The memory layer ML according to the eleventh embodiment includes semiconductor layers 221. In the bit line connecting region $R_{BL11}$, conductive layers 222 disposed corresponding to the semiconductor layers 221 and insulating layers 223 disposed on outer circumferential surfaces of the conductive layers 222 are disposed.

The semiconductor layers 221 serve as channel regions and the like of the select transistors $Tr_{SB}$ (FIG. 84). The semiconductor layer 221 extends in the X-direction and is connected to the two parts of the conductive layer 141 (the parts connected to the conductive layer 130 and the parts connected to the contact electrode $C_{BL}$). The semiconductor layer 221 may contain, for example, a material similar to that of the semiconductor layer 121.

The conductive layers 222 each serve as gate electrodes of the plurality of select transistors $Tr_{SB}$ (FIG. 84) arranged in the Z-direction and the select gate line $SG_B$. The conductive layers 222 penetrate the plurality of memory layers ML to extend in the Z-direction. The conductive layer 222 includes opposed surfaces opposed to outer circumferential surfaces of the semiconductor layers 221. The opposed surfaces cover the outer circumferential surfaces (upper surfaces, lower surfaces and both side surfaces in the Y-direction) of the semiconductor layers 221 over the whole circumference on the YZ cross-sectional surface. The conductive layer 222 may contain, for example, a material similar to that of the conductive layer 122.

The insulating layers 223 serve as gate insulating films of the select transistors $Tr_{SB}$. The insulating layer 223 includes a part that covers the outer circumferential surfaces of the conductive layer 222 and parts disposed between the semiconductor layers 221 and the conductive layer 222. The insulating layer 223 insulates the semiconductor layers 221 from the conductive layer 222. The insulating layer 223 may contain, for example, a material similar to that of the insulating layer 123.

As illustrated in FIG. 87, for example, the semiconductor memory device according to the eleventh embodiment includes semiconductor layers 224 connected to upper ends of the conductive layers 122, conductive layers 225 opposed to the semiconductor layers 224, and insulating layers 226 disposed on outer circumferential surfaces of the conductive layers 225.

The semiconductor layers 224 serve as channel regions and the like of the select transistors $Tr_{SW}$ (FIG. 84). As illustrated in FIG. 86, for example, the semiconductor layers 224 are disposed corresponding to the plurality of conductive layers 122. The semiconductor layer 224 may contain, for example, a material similar to that of the semiconductor layer 121.

The conductive layers 225 each serve as gate electrodes of the plurality of select transistors $Tr_{SW}$ (FIG. 84) arranged in the Y-direction and the select gate line $SG_W$. As illustrated in FIG. 86, for example, the conductive layers 225 extend in the Y-direction. The conductive layer 225 includes opposed surfaces opposed to outer circumferential surfaces of the plurality of semiconductor layers 224 arranged in the Y-direction. The opposed surfaces cover the outer circumferential surfaces of the semiconductor layers 224 over the whole circumference on the XY cross-sectional surface. The conductive layer 225 may contain, for example, a material similar to that of the conductive layer 122.

The insulating layers 226 serve as gate insulating films of the select transistors $Tr_{SW}$. The insulating layer 226 includes a part that covers the outer circumferential surfaces of the conductive layer 225 and parts disposed between the semiconductor layers 224 and the conductive layer 225. The insulating layer 226 insulates the semiconductor layers 224 from the conductive layer 225. The insulating layer 226 may contain, for example, a material similar to that of the insulating layer 123.

FIG. 88 to FIG. 99 are schematic plan views for describing a manufacturing method of the semiconductor memory device according to the eleventh embodiment.

In manufacturing the semiconductor memory device according to the eleventh embodiment, for example, the process described with reference to FIG. 16 is performed.

Next, as illustrated in FIG. 88, insulating layers 104C are formed. In this process, for example, openings extending in the X-direction and the Z-direction are formed. The openings penetrate the plurality of insulating layers 101 and the plurality of sacrifice layers MLA arranged in the Z-direction. This process is performed by, for example, a method, such as RIE. Next, the insulating layers 104C of silicon oxide $(SiO_2)$ or the like are formed by a method, such as CVD.

Next, as illustrated in FIG. 89, openings are formed, and the sacrifice layers 103B are formed inside the openings. In this process, the openings similar to the openings 103A are formed. This process is performed by, for example, a method, such as RIE and CVD.

Next, as illustrated in FIG. 90, the sacrifice layers MLA are partially removed. In this process, openings (not illustrated) are formed by a method, such as RIE. Further, the sacrifice layers MLA are partially removed by a method, such as wet etching.

Next, as illustrated in FIG. 91, the sacrifice layers 103B are removed. Additionally, the sacrifice layers MLA are partially removed via the openings formed in the processes described with reference to FIG. 89 and FIG. 90. Thus, recessed portions 130A, 141A are formed. This process is performed, for example, in a manner similarly to that of the processes described with reference to FIG. 19 and FIG. 20.

Next, as illustrated in FIG. 92, the conductive layers 130, 141 are formed. This process is performed, for example, in a manner similarly to that of the processes described with reference to FIG. 21 to FIG. 24.

Next, as illustrated in FIG. 93, insulating layers of silicon oxide ($SiO_2$) or the like are formed inside the openings formed in the processes described with reference to FIG. 89 and FIG. 90. This process is performed, for example, in a manner similarly to that of the processes described with reference to FIG. 25 and FIG. 26.

Next, as illustrated in FIG. 94, the plurality of openings 102A are formed. This process is performed, for example, in a manner similarly to that of the process described with reference to FIG. 29.

Next, as illustrated in FIG. 95, the insulating layers 102 are formed inside the plurality of openings 102A. This process is performed, for example, in a manner similarly to that of the process described with reference to FIG. 30.

Next, as illustrated in FIG. 96, a plurality of openings 221A are formed. The opening 221A extends in the Z-direction and penetrates the plurality of insulating layers 101 and the plurality of sacrifice layers MLA arranged in the Z-direction. Additionally, the plurality of sacrifice layers MLA are exposed to inner peripheral surfaces of the opening 221A. In this process, the openings PLA described with reference to FIG. 31 are also formed. This process is performed, for example, in a manner similarly to that of the processes described with reference to FIG. 31 and FIG. 32.

Next, as illustrated in FIG. 97, the plurality of sacrifice layers MLA are removed. In this process, the openings 110A are formed in positions corresponding to the capacitor structures 110 and the semiconductor layers 121. Additionally, openings 221B are formed in positions corresponding to the semiconductor layers 221. This process is performed, for example, in a manner similarly to that of the processes described with reference to FIG. 33 and FIG. 34.

Next, as illustrated in FIG. 98, the semiconductor layers 121 and the semiconductor layers 221 are formed. This process may be performed by, for example, epitaxial growth from exposed surfaces of the conductive layers 130 and the conductive layers 141. In this case, crystal interfaces may exist in centers in the X-direction of the semiconductor layers 221. This process is performed, for example, in a manner similarly to that of the processes described with reference to FIG. 35 and FIG. 36.

Next, as illustrated in FIG. 99, the capacitor structures 110 are formed. This process is performed, for example, in a manner similarly to that of the processes described with reference to FIG. 37 to FIG. 44. After this process is performed, parts of the electrodes 111, 112 and the insulating layers 113 that are disposed inside the openings 221A are removed. This process is performed by, for example, a method, such as wet etching.

Next, the processes after the process described with reference to FIG. 45 to FIG. 47 are performed. Next, for example, upper ends of the conductive layers 122 are exposed, and the semiconductor layers 224 (FIG. 87) are formed. The semiconductor layers 224 may be formed by, for example, a method similar to that of the semiconductor layers 121, 221. Afterwards, insulating layers 226 and conductive layers 225 (FIG. 87) are formed.

Twelfth Embodiment

Next, a semiconductor memory device according to a twelfth embodiment is described. In the following description, same reference numerals are attached to parts similar to those of the second embodiment, and their descriptions are omitted.

The semiconductor memory device according to the twelfth embodiment is basically configured similarly to the semiconductor memory device according to the second embodiment. However, the semiconductor memory device according to the twelfth embodiment is different from the semiconductor memory device according to the second embodiment in the following points.

FIG. 100 is a schematic plan view illustrating a part of a configuration of the semiconductor memory device according to the twelfth embodiment. As illustrated in FIG. 100, the semiconductor memory device according to the twelfth embodiment includes bit line connecting regions $R_{BL12}$ instead of the bit line connecting regions $R_{BL}$.

The bit line connecting region $R_{BL12}$ is basically configured similarly to the bit line connecting region $R_{BL}$. However, when focusing on two bit line connecting regions $R_{BL}$ mutually adjacent in the Y-direction, a plurality of conductive layers 140 included in one of the two bit line connecting regions $R_{BL}$ and a plurality of conductive layers 140 included in the other are electrically independent from one another. On the other hand, when focusing on two bit line connecting regions $R_{BL12}$ mutually adjacent in the Y-direction, a plurality of conductive layers 140 included in $R_{BL12}$ one of the two bit line connecting regions and a plurality of conductive layers 140 included in the other are electrically conducted to one another.

For example, as illustrated in FIG. 100, in the twelfth embodiment, a conductive layer constituting the conductive layers 130, 140 is continuous without being separated between two memory cell arrays 11 mutually adjacent in the Y-direction. In other words, one conductive layer continuous across two memory cell arrays 11 mutually adjacent in the Y-direction is shared between these two memory cell arrays 11. This conductive layer includes two conductive layers 130 corresponding to two memory cell arrays 11 mutually adjacent in the Y-direction and two conductive layers 140 corresponding to these two memory cell arrays 11.

In manufacturing the semiconductor memory device according to the twelfth embodiment, for example, in the process corresponding to FIG. 17, as illustrated in FIG. 101, the openings 104A are formed away from the opening 103A.

In the above example, an example in which the semiconductor memory device according to the second embodiment includes the bit line connecting regions $R_{BL12}$ instead of the bit line connecting regions $R_{BL}$ has been described. However, for example, the semiconductor memory device according to the third embodiment, the fifth embodiment, or the sixth embodiment may include the bit line connecting regions $R_{BL12}$ instead of the bit line connecting regions $R_{BL}$.

Thirteenth Embodiment

Next, a semiconductor memory device according to a thirteenth embodiment is described. In the following description, same reference numerals are attached to parts similar to those of the first embodiment, and their descriptions are omitted.

FIG. 102 is a schematic perspective view illustrating a part of a configuration of the semiconductor memory device according to the thirteenth embodiment. As illustrated in FIG. 102, the semiconductor memory device according to the embodiment includes the semiconductor substrate 100 and a device layer $L_D$ disposed above the semiconductor substrate 100.

FIG. 103 is a schematic plan view illustrating a part of the configuration of the semiconductor memory device according to the thirteenth embodiment. The device layer $L_D$ includes a plurality of memory cell arrays 11 arranged in the X-direction and the Y-direction. The word line drivers WLD are disposed in regions on one side and on the other side in the X-direction with respect to the memory cell array 11. The sense amplifier circuit SA is disposed between two memory cell arrays 11 mutually adjacent in the Y-direction. Of end portions in the Y-direction of the memory cell array 11, the bit line connecting region $R_{BL}$ is disposed in one of the end portions closer to the sense amplifier circuit SA.

The memory cell array 11 according to the thirteenth embodiment may include a structure similar to, for example, the memory cell array 11 according to any of the first embodiment to the ninth embodiment.

Fourteenth Embodiment

Next, a semiconductor memory device according to a fourteenth embodiment is described. In the following description, same reference numerals are attached to parts similar to those of the first embodiment, and their descriptions are omitted.

FIG. 104 is a schematic perspective view illustrating a part of a configuration of the semiconductor memory device according to the fourteenth embodiment. FIG. 105 is a schematic cross-sectional view illustrating a part of the configuration of the semiconductor memory device according to the fourteenth embodiment.

As illustrated in FIG. 104, the semiconductor memory device according to the embodiment includes chips $C_{PC}$ and chips $C_{MCA}$ connected to the chips $C_{PC}$.

The chip $C_{PC}$ includes a semiconductor substrate 300 and the peripheral circuit layer $L_{PC}$ disposed above the semiconductor substrate 300.

The semiconductor substrate 300 is basically configured similarly to the semiconductor substrate 100. However, as illustrated in FIG. 105, a plurality of through electrodes 301 are disposed in the semiconductor substrate 300. The through electrodes 301 each penetrate the semiconductor substrate 300 to extend in the Z-direction. The through electrode 301 has one end on which a back surface electrode 302 is disposed. The through electrode 301 has the other end electrically connected to a configuration in the peripheral circuit layer $L_{PC}$.

The peripheral circuit layer $L_{PC}$ is basically configured similarly to the peripheral circuit layer $L_{PC}$ according to any of the first embodiment to the twelfth embodiment. However, the peripheral circuit layer $L_{PC}$ includes a plurality of bonding electrodes 303. These plurality of bonding electrodes 303 include, for example, conductive layers of copper (Cu) or the like.

The chip $C_{MCA}$ includes a semiconductor substrate 300' and the memory cell array layer $L_{MCA}$ disposed below the semiconductor substrate 300'.

The semiconductor substrate 300' is basically configured similarly to the semiconductor substrate 100. However, as illustrated in FIG. 105, a plurality of through electrodes 304 are disposed in the semiconductor substrate 300'. The through electrodes 304 each penetrate the semiconductor substrate 300' to extend in the Z-direction. The through electrode 304 has one end on which a back surface electrode 305 is disposed. The through electrode 304 has the other end electrically connected to a configuration in the memory cell array layer $L_{MCA}$.

The memory cell array layer $L_{MCA}$ is basically configured similarly to the memory cell array layer $L_{MCA}$ according to any of the first embodiment to the twelfth embodiment. However, the memory cell array layer $L_{MCA}$ includes a plurality of bonding electrodes 306. These plurality of bonding electrodes 306 include, for example, conductive layers of copper (Cu) or the like.

In FIG. 105, two sets, each of which includes the chip $C_{PC}$ and the chip $C_{MCA}$, are exemplified. In these sets, the chips $C_{PC}$ are connected to the chips $C_{MCA}$ via the bonding electrodes 303, 306. These two sets are connected to one another via the back surface electrodes 302. Back surface electrodes 305 formed at an upper end of a chip $C_{MCA}$ in a Z-direction uppermost layer need not be connected to other electrodes. Back surface electrodes 305 formed at a lower end of a chip $C_{MCA}$ in a Z-direction lowermost layer are connected to a controller chip $C_C$.

In FIG. 105, the controller chip $C_C$ and a package substrate $S_{PKG}$ are exemplified. The controller chip $C_C$ is connected to wiring formed on the package substrate $S_{PKG}$ via bump electrodes $E_C$. The package substrate $S_{PKG}$ is connected to a host computer or the like (not illustrated) via solder balls $E_{PKG}$.

FIG. 106 is a schematic cross-sectional view for describing another configuration of the semiconductor memory device according to the fourteenth embodiment. In FIG. 106, two sets, each of which includes the chip $C_{PC}$ and the chip $C_{MCA}$ are exemplified. In these sets, the chips $C_{PC}$ are connected to the chips $C_{MCA}$ via the back surface electrodes 302, 305. These two sets are connected to one another via the bonding electrodes 303. Bonding electrodes 306 formed at the upper end of the chip $C_{MCA}$ in the Z-direction uppermost layer need not be connected to other electrodes. Bonding electrodes 306 formed at the lower end of the chip $C_{MCA}$ in the Z-direction lowermost layer may be connected to, for example, the controller chip $C_C$ or the like.

FIG. 107 is a schematic cross-sectional view for describing another configuration of the semiconductor memory device according to the fourteenth embodiment. In FIG. 107, two sets, each of which includes the chip $C_{PC}$ and the chip $C_{MCA}$ are exemplified. In these sets, the chips $C_{PC}$ are connected to the chips $C_{MCA}$ via the back surface electrodes 302 and the bonding electrodes 306. These two sets are connected to one another via the back surface electrodes 305 and the bonding electrodes 303. Bonding electrodes 303 formed at the upper end of the chip $C_{MCA}$ in the Z-direction uppermost layer need not be connected to other electrodes, and the back surface electrodes 305 formed at the lower end of the chip $C_{MCA}$ in the Z-direction lowermost layer may be connected to, for example, the controller chip $C_C$ or the like. Alternatively, the bonding electrodes 303 formed at the upper end of the chip $C_{MCA}$ in the Z-direction uppermost layer may be connected to, for example, the controller chip $C_C$ or the like, and the back surface electrodes 305 formed at the lower end of the chip $C_{MCA}$ in the Z-direction lowermost layer need not be connected to other electrodes.

The chip $C_{PC}$ may have a minimum processing dimension greater than a minimum processing dimension of the chip $C_{MCA}$. Alternatively, the chip $C_{MCA}$ may have the minimum processing dimension greater than the minimum processing dimension of the chip $C_{PC}$.

Fifteenth Embodiment

Next, a semiconductor memory device according to the fifteenth embodiment is described. In the following description, same reference numerals are attached to parts similar to those of the fourteenth embodiment, and their descriptions are omitted.

FIG. 108 is a schematic cross-sectional view illustrating a part of a configuration of the semiconductor memory device according to the fifteenth embodiment. FIG. 109 to FIG. 111 are schematic plan views illustrating a part of the configuration of the semiconductor memory device according to the fifteenth embodiment.

As illustrated in FIG. 108, the semiconductor memory device according to the embodiment includes chips $C_{PC0}$ and chips $C_{MCA0}$, $C_{MCA1}$ connected to the chips $C_{PC0}$.

The chip $C_{MCA0}$ is basically configured similarly to the chip $C_{MCA}$. However, the chip $C_{MCA0}$ includes a memory cell array layer $L_{MCA0}$ instead of the memory cell array layer $L_{MCA}$. In FIG. 109, four memory cell arrays 11 in the memory cell array layer $L_{MCA0}$ are exemplified. In the example of FIG. 109, a bit line connecting region $R_{BL0}$ is disposed at each of inside end portions in the Y-direction of two memory cell arrays 11 adjacent in the Y-direction. The bit line connecting region $R_{BL0}$ is configured similarly to the bit line connecting region $R_{BL}$.

The chip $C_{MCA0}$ is basically configured similarly to the chip $C_{MCA}$. However, the chip $C_{MCA1}$ includes a memory cell array layer $L_{MCA1}$ instead of the memory cell array layer $L_{MCA}$. In FIG. 110, four memory cell arrays 11 in the memory cell array layer $L_{MCA1}$ are exemplified. In the example of FIG. 110, a bit line connecting region $R_{BL1}$ is disposed at each of outside end portions in the Y-direction of two memory cell arrays 11 adjacent in the Y-direction. The bit line connecting region $R_{BL1}$ is configured similarly to the bit line connecting region $R_{BL}$.

The chip $C_{PC0}$ is basically configured similarly to the chip $C_{PC}$. However, the chip $C_{PC0}$ includes a peripheral circuit layer $L_{PC0}$ instead of the peripheral circuit layer $L_{PC}$. In FIG. 111, four regions $R_{11}$ in the peripheral circuit layer $L_{PC0}$ are exemplified.

In the example of FIG. 111, a bit line connecting region $R_{BL00}$ is disposed at each of inside end portions in the Y-direction of two regions $R_{11}$ adjacent in the Y-direction. The bit line connecting regions $R_{BL00}$ have configurations electrically connected to respective configurations in the bit line connecting regions $R_{BL0}$ of the chip $C_{MCA0}$. Further, a bit line connecting region $R_{BL01}$ is disposed at each of outside end portions in the Y-direction of two regions $R_{11}$ adjacent in the Y-direction. The bit line connecting regions $R_{BL01}$ have configurations electrically connected to respective configurations in the bit line connecting regions $R_{BL1}$ of the chip $C_{MCA1}$.

In the region $R_{11}$, two sense amplifier circuits SA arranged in the Y-direction are disposed. Each of these two sense amplifier circuits SA is electrically connected to the configuration in the bit line connecting region $R_{BL00}$ or the configuration in the bit line connecting region $R_{BL01}$.

Additionally, a plurality of word line drivers WLD0, WLD1 alternately arranged in the X-direction are disposed between these two sense amplifier circuits SA. The plurality of word line drivers WLD0 are configured similarly to the word line driver 30 (FIG. 1) and connected to the word lines WL in the chip $C_{MCA0}$. The plurality of word line drivers WLD1 are configured similarly to the word line driver 30 (FIG. 1) and connected to the word lines WL in the chip $C_{MCA1}$.

In FIG. 108, two sets, each of which includes the chip $C_{PC0}$ and the chips $C_{MCA0}$, $C_{MCA1}$, are exemplified. In these sets, the chips $C_{PC0}$ are connected to the chips $C_{MCA0}$ via the back surface electrodes 302 and the bonding electrodes 306. In these sets, the chips $C_{PC0}$ are connected to the chips $C_{MCA1}$ via the bonding electrodes 303 and the back surface electrodes 305. These two sets are connected to one another via the bonding electrodes 306 and the back surface electrodes 305.

FIG. 112 is a schematic cross-sectional view for describing another configuration of the semiconductor memory device according to the fifteenth embodiment. In FIG. 112, two sets, each of which includes the chip $C_{PC0}$ and the chips $C_{MCA0}$, $C_{MCA1}$, are exemplified. In these sets, the chips $C_{PC0}$ are connected to the chips $C_{MCA0}$ via the back surface electrodes 302 and the bonding electrodes 306. In these sets, the chips $C_{PC0}$ are connected to the chips $C_{MCA1}$ via the bonding electrodes 303, 306. These two sets are connected to one another via the back surface electrodes 305.

The chip $C_{PC0}$ may have a minimum processing dimension greater than minimum processing dimensions of the chips $C_{MCA0}$, $C_{MCA1}$. Alternatively, the chips $C_{MCA0}$, $C_{MCA1}$ may have the minimum processing dimensions greater than the minimum processing dimension of the chip $C_{PC0}$.

Sixteenth Embodiment

Next, a semiconductor memory device according to a sixteenth embodiment is described. In the following description, same reference numerals are attached to parts similar to those of the fourteenth embodiment, and their descriptions are omitted.

The semiconductor memory device according to the sixteenth embodiment includes the chips $C_{PC}$, $C_{MCA}$ as described with reference to FIG. 104, similarly to the semiconductor memory device according to the fourteenth embodiment. As described with reference to FIG. 105, these chips $C_{PC}$, $C_{MCA}$ are connected via the bonding electrodes 303, 306. In the following description, a configuration in which the chips $C_{Pc}$ are disposed below the chips $C_{MCA}$ is exemplified. However, in the semiconductor memory device according to the sixteenth embodiment, the chips $C_{PC}$ may be disposed above the chips $C_{MCA}$.

FIG. 113 is a schematic bottom view illustrating a part of the configuration of the semiconductor memory device according to the sixteenth embodiment. In FIG. 113, a part of a configuration of the chip $C_{MCA}$ is illustrated. As illustrated in FIG. 113, the chip $C_{MCA}$ according to the sixteenth embodiment includes the bit line connecting regions $R_{BL7}$, similarly to the semiconductor memory device according to the seventh embodiment. As described above, the bit line connecting region $R_{BL7}$ includes two rows, each of which is composed of a plurality of contact electrodes $C_{BL}$ arranged in the X-direction.

In FIG. 113, a plurality of wirings $WBL_O$, $WBL_E$ connected to the contact electrodes $C_{BL}$ are illustrated. The plurality of wirings $WBL_O$ are arranged in the X-direction and extend in the Y-direction. The wirings $WBL_O$ are connected to the contact electrodes $C_{BL}$ at end portions on the Y-direction positive side. The wirings $WBL_O$ are electrically connected to the odd-numbered conductive layers 140 when viewed from the lower side (Z-direction negative side). The plurality of wirings $WBL_E$ are arranged in the X-direction and extend in the Y-direction. The wirings $WBL_E$ are connected to the contact electrodes $C_{BL}$ at end portions on the Y-direction negative side. The wirings $WBL_E$ are electrically connected to the even-numbered conductive layers 140 when viewed from the lower side (Z-direction negative side).

FIG. 114 is a schematic bottom view illustrating a part of the configuration of the semiconductor memory device according to the sixteenth embodiment. In FIG. 114, a part of a configuration of the chip $C_{PC}$ is illustrated. In FIG. 114, four respective regions $R_{11}$ that overlap with four memory cell arrays 11 when viewed from the Z-direction are illustrated as regions $R_{11a}$, $R_{11b}$, $R_{11c}$, $R_{11d}$.

In FIG. 114, sense amplifier circuits $SAa_E$, $SAa_O$, $SAb_E$, $SAb_O$, $SAc_E$, $SAc_O$, $SAd_E$, $SAd_O$, $SA_E$, $SA_O$ are exemplified.

The sense amplifier circuit $SAa_E$ is connected, via the wirings $WBL_E$ (FIG. 113) connected to the memory cell array 11 that overlaps with the region $R_{11a}$ when viewed from the Z-direction, to a part of the bit lines BL, /BL in this memory cell array 11. The sense amplifier circuit $SAa_E$ is disposed in a region on an outside of the region $R_{11a}$ and on the Y-direction positive side with respect to the region $R_{11a}$.

Similarly, the sense amplifier circuits $SAb_E$ to $SAd_E$ are connected, via the wirings $WBL_E$ (FIG. 113) connected to the memory cell arrays 11 that respectively overlap with the regions $R_{11b}$ to $R_{11d}$ when viewed from the Z-direction, to a part of the bit lines BL, /BL in these memory cell arrays 11. The sense amplifier circuits $SAb_E$ to $SAd_E$ are respectively disposed in regions on outsides of the regions $R_{11b}$ to $R_{11d}$ and on the Y-direction positive side with respect to the regions $R_{11b}$ to $R_{11d}$. On insides of the regions $R_{11a}$, $R_{ub}$, the sense amplifier circuits $SAc_E$, $SAd_E$ are disposed, respectively. Similarly, on insides of the regions $R_{11c}$, $R_{11d}$, the respective sense amplifier circuits $SA_E$ connected to other memory cell arrays 11 are disposed.

The sense amplifier circuit $SAa_O$ is connected, via the wirings $WBL_O$ (FIG. 113) connected to the memory cell array 11 that overlaps with the region $R_{11a}$ when viewed from the Z-direction, to a part of the bit lines BL, /BL in this memory cell array 11. The sense amplifier circuit $SAa_O$ is disposed in an end portion region on the inside of the region $R_{11a}$ and on the Y-direction positive side of the region $R_{11a}$.

Similarly, the sense amplifier circuits $SAb_O$ to $SAd_O$ are connected, via the wirings $WBL_O$ (FIG. 113) connected to the memory cell arrays 11 that respectively overlap with the regions $R_{11b}$ to $R_{11d}$ when viewed from the Z-direction, to a part of the bit lines BL, /BL in these memory cell arrays 11. The sense amplifier circuits $SAb_O$ to $SAd_O$ are respectively disposed at end portions on the insides of the regions $R_{11b}$ to $R_{11d}$ and on the Y-direction positive side of the regions $R_{11b}$ to $R_{11d}$.

Here, as described with reference to FIG. 13 and the like, for example, the plurality of conductive layers 130 are arranged in the Z-direction. As illustrated in FIG. 15, the plurality of conductive layers 140 are arranged in the Z-direction. Since the conductive layers 130, 140 serve as the bit lines BL, /BL, an increase in capacitance between two conductive layers 130 mutually adjacent in the Z-direction and in capacitance between two conductive layers 140 mutually adjacent in the Z-direction may lead to delay in the read operation and the like.

Therefore, in the embodiment, as described with reference to FIG. 113 and the like, the odd-numbered conductive layers 140 counted from the lower side and the even-numbered conductive layers 140 counted from the lower side are drawn to opposite directions by the wirings $WBL_O$, $WBL_E$. Accordingly, a further increase in the above capacitances by the wirings WBL is avoided.

Seventeenth Embodiment

Next, a semiconductor memory device according to a seventeenth embodiment is described. In the following description, same reference numerals are attached to parts similar to those of the sixteenth embodiment, and their descriptions are omitted.

The semiconductor memory device according to the seventeenth embodiment is basically configured similarly to the semiconductor memory device according to the sixteenth embodiment. However, the semiconductor memory device according to the seventeenth embodiment is different from the semiconductor memory device according to the sixteenth embodiment in the following points.

FIG. 115 is a schematic circuit diagram illustrating a part of a configuration of the semiconductor memory device according to the seventeenth embodiment.

In the semiconductor memory device according to the embodiment, select transistors $Tr_{SWO}$ are disposed between the bit lines BL, /BL and the wirings $WBL_O$. A plurality of select transistors $Tr_{SWO}$ are disposed corresponding to the odd-numbered conductive layers 140 counted from the lower side (Z-direction negative side). These plurality of select transistors $Tr_{SWO}$ have gate electrodes connected in common to a select gate line $SG_{WO}$.

In the semiconductor memory device according to the embodiment, select transistors $Tr_{SWE}$ are disposed between the bit lines BL, /BL and the wirings $WBL_E$. A plurality of select transistors $Tr_{SWE}$ are disposed corresponding to the even-numbered conductive layers 140 counted from the lower side (Z-direction negative side). These plurality of select transistors $Tr_{SWE}$ have gate electrodes connected in common to a select gate line $SG_{WE}$.

FIG. 116 is a schematic bottom view illustrating a part of the configuration of the semiconductor memory device according to the seventeenth embodiment. FIG. 117 is a schematic XY cross-sectional view illustrating a part of the configuration of the semiconductor memory device according to the seventeenth embodiment. FIG. 118 is a schematic cross-sectional view illustrating a part of the configuration of the semiconductor memory device according to the seventeenth embodiment.

As illustrated in FIG. 118, for example, the semiconductor memory device according to the seventeenth embodiment includes semiconductor layers 227 connected to lower ends of the contact electrodes $C_{BI}$, conductive layers 228 opposed to the semiconductor layers 227, and insulating layers 229 disposed on outer circumferential surfaces of the conductive layers 228.

The semiconductor layers 227 serve as channel regions and the like of the select transistors $Tr_{SWO}$, $Tr_{SWE}$ (FIG. 115). As illustrated in FIG. 116 and FIG. 117, for example, the semiconductor layers 227 are disposed corresponding to the plurality of contact electrodes $C_{BL}$. The semiconductor layer 227 may contain, for example, a material similar to that of the semiconductor layer 121.

As illustrated in FIG. 117, for example, two conductive layers 228 are disposed in the bit line connecting region $R_{BL7}$ according to the seventeenth embodiment. One conductive layer 228 serves as gate electrodes of the plurality of select transistors $Tr_{SWO}$ (FIG. 115) arranged in the X-direction and the select gate line $SG_{WO}$. The other conductive layer 228 serves as gate electrodes of the plurality of select transistors $Tr_{SWE}$ (FIG. 115) arranged in the X-direction and the select gate line $SG_{WE}$. As illustrated in FIG. 117, for example, the conductive layers 228 extend in the X-direction. The conductive layer 228 includes opposed surfaces opposed to outer circumferential surfaces of the plurality of semiconductor layers 227 arranged in the X-direction. The opposed surfaces cover the outer circumferential surfaces of the semiconductor layers 227 over the whole circumference on the XY cross-sectional surface. The conductive layer 228 may contain, for example, a material similar to that of the conductive layer 122.

The insulating layers 229 serve as gate insulating films of the select transistors $Tr_{SWO}$, $Tr_{SWE}$. The insulating layers 229 are disposed between the semiconductor layers 227 and the conductive layers 228. The insulating layers 229 insulate the semiconductor layers 227 from the conductive layers 228. The insulating layer 229 may contain, for example, a material similar to that of the insulating layer 123.

In a read operation and a write operation of the semiconductor memory device according to the seventeenth embodiment, for example, one of the select gate lines $SG_{WE}$, $SG_{WO}$ described with reference to FIG. 115 enters the "H" state, and the other enters the "L" state. Accordingly, the bit lines BL, /BL in the odd-numbered memory layers ML or in the even-numbered memory layers ML counted from the lower side (Z-direction negative side) are electrically conducted with the sense amplifier circuits SA. With such a configuration, an influence of capacitive coupling between two conductive layers 130 mutually adjacent in the Z-direction and an influence of capacitive coupling between two conductive layers 140 mutually adjacent in the Z-direction can be reduced to ensure speed-up of the read operation and the write operation.

Eighteenth Embodiment

Next, a semiconductor memory device according to an eighteenth embodiment is described. In the following description, same reference numerals are attached to parts similar to those of the first embodiment, and their descriptions are omitted.

In the semiconductor memory device according to the first embodiment, the conductive layers 122 that serve as the word lines WL penetrate the plurality of memory layers ML to extend in the Z-direction. Each of the memory layers ML includes the conductive layers 130, 140 that serve as the bit lines BL, /BL. The conductive layers 140 extend in a direction (X-direction) different from an extending direction (Y-direction) of the conductive layers 130. However, such a structure is only an example, and a specific configuration is adjustable as appropriate.

For example, depending on the configuration of the memory cell array 11, conductive layers that serve as the bit lines BL, /BL may penetrate a plurality of memory layers to extend in the Z-direction. Each of the memory layers may include conductive layers that serve as the word lines WL. The conductive layers that serve as the word lines WL may extend in different directions between in a region near the memory cells MC and in a region connected to contact electrodes.

FIG. 119 is a schematic XY cross-sectional view for describing the configuration of the semiconductor memory device according to the eighteenth embodiment. FIG. 120 is a schematic cross-sectional view of the structure illustrated in FIG. 119 taken along the line G-G' and viewed along an arrow direction. FIG. 121 is a schematic cross-sectional view of the structure illustrated in FIG. 119 taken along the line H-H' and viewed along an arrow direction. Note that, FIG. 119 is a schematic cross-sectional view of the structure illustrated in FIG. 120 and FIG. 121 taken along the line I-I' and viewed along an arrow direction.

In the eighteenth embodiment, the memory cell array 11 includes a plurality of memory cell regions $R_{MC}$ arranged in the X-direction. Further, bit line connecting regions $R_{BL16}$ are disposed in odd-numbered regions counted from the X-direction negative side among regions between the plurality of memory cell regions $R_{MC}$ arranged in the X-direction. A word line connecting region $R_{WL16}$ is disposed in an end portion in the Y-direction of the memory cell array 11.

As illustrated in FIG. 120, for example, the memory cell array 11 includes a plurality of memory layers ML4 and the insulating layers 101 of silicon oxide ($SiO_2$) or the like alternately arranged in the Z-direction. The insulating layers 105 of silicon oxide ($SiO_2$) or the like are disposed above these plurality of memory layers ML4 and the insulating layers 101.

As illustrated in FIG. 119, the memory layer ML4 includes a plurality of capacitor structures 110 and the insulating layers 102 of silicon oxide ($SiO_2$) or the like that are disposed in the memory cell region $R_{MC}$ and alternately arranged in the Y-direction.

As illustrated in FIG. 119, the memory layer ML4 includes a plurality of transistor structures 420 that are disposed in the bit line connecting region $R_{BL16}$ and arranged in the Y-direction. The transistor structure 420 includes a semiconductor layer 421. Further, the memory layer ML4 includes conductive layers 422 that extend in the Y-direction and insulating layers 423 disposed between the conductive layers 422 and the semiconductor layers 421.

The semiconductor layers 421 serve as channel regions and the like of the cell transistors TrC (FIG. 2). The semiconductor layer 421 extends in the X-direction and is connected to the electrode 111 and a conductive layer 430 described later. The semiconductor layer 421 may contain, for example, a material similar to that of the semiconductor layer 121.

The conductive layers 422 each serves as gate electrodes of the plurality of cell transistors TrC (FIG. 2) arranged in the Y-direction and the word line WL. The conductive layer 422 includes opposed surfaces opposed to outer circumferential surfaces (upper surfaces, lower surfaces and both side surfaces in the Y-direction) of the plurality of transistor structures 420. The conductive layers 422 cover the outer circumferential surfaces of the semiconductor layers 421 over the whole circumference via the opposed surfaces. The conductive layer 422 may contain, for example, a material similar to that of the conductive layer 122.

The insulating layers 423 serve as gate insulating films of the cell transistors TrC. The insulating layer 423 includes a part that covers the outer circumferential surfaces of the conductive layer 422 and parts disposed between the semiconductor layers 421 and the conductive layer 422. The insulating layer 423 insulates the semiconductor layers 421 from the conductive layer 422. The insulating layer 423 may contain, for example, a material similar to that of the insulating layer 123.

As illustrated in FIG. 119, a plurality of conductive layers 430 arranged in the Y-direction are disposed corresponding to the plurality of transistor structures 420 in the bit line connecting region $R_{BL16}$. The insulating layer 103 of silicon oxide ($SiO_2$) or the like is disposed between two conductive layers 430 arranged in the Y-direction and between two conductive layers 430 arranged in the X-direction.

The conductive layers 430 serve as the bit lines BL, /BL. The conductive layers 430 penetrate the plurality of memory layers ML4 to extend in the Z-direction. The conductive layer 430 may contain, for example, a material similar to that of the conductive layer 130.

As illustrated in FIG. 119, the memory layer ML4 includes conductive layers 440 that are disposed in the word line connecting region $R_{WL16}$ and extend in the X-direction. The insulating layer 104 of silicon oxide ($SiO_2$) or the like is disposed on side surfaces in the Y-direction of the conductive layers 440.

In the example of FIG. 119, the conductive layers 440 are connected to end portions in the Y-direction of the conductive layers 422. The conductive layer 440 may contain, for example, a material similar to that of the conductive layer 422. In the example of FIG. 119, the plurality of conductive layers 440 arranged in the X-direction are electrically independent for each memory cell region $R_{MC}$.

In the embodiment, the conductive layers 422, 440 are parts of one continuous conductive layer. That is, one conductive layer 422 is continuous to one conductive layer 440. In FIG. 119, approximately L-shaped conductive layers are exemplified. The conductive layer 422 is a part of this conductive layer, which is disposed in the bit line connecting region $R_{BL16}$. The conductive layer 440 is a part of this conductive layer, which is disposed in the word line connecting region $R_{WL16}$.

As illustrated in FIG. 121, for example, a plurality of terrace portions T of the conductive layers 440, and a plurality of contact electrodes $C_{WL}$ connected to these plurality of terrace portions T are disposed in the word line connecting region $R_{WL16}$.

For example, the terrace portion T of one conductive layer 440 means a part that does not overlap with other conductive layers 440 disposed at higher positions than a position at which the one conductive layer 440 is disposed of an upper surface of the one conductive layer 440 when viewed from the upper side (Z-direction positive side). The insulating layers 106 of silicon oxide ($SiO_2$) or the like are disposed above the plurality of terrace portions T.

The contact electrodes $C_{WL}$ are arranged in the X-direction corresponding to the plurality of terrace portions T. The contact electrodes $C_{WL}$ each penetrate the insulating layer 106 and the insulating layer 101 to extend in the Z-direction. The contact electrode $C_{WL}$ has a lower end connected to the terrace portion T of the conductive layer 440. The contact electrode $C_{WL}$ may contain, for example, a material similar to that of the contact electrode $C_{BL}$ described with reference to FIG. 15 and the like.

In the semiconductor memory device according to the eighteenth embodiment, two memory cell arrays arranged in the X-direction or the Y-direction may include the respective bit lines BL, /BL. Further, one memory cell array may include both the bit lines BL, /BL. The semiconductor memory device according to the eighteenth embodiment may include the memory cells MC of 1T1C type or may include the memory cells MC3 of 2T2C type.

In the semiconductor memory device according to the eighteenth embodiment, the word line connecting region $R_{WL16}$ may be disposed on one side in the Y-direction of the memory cell array, or the word line connecting region $R_{WL16}$ may be disposed on one side and on the other side in the Y-direction of the memory cell array.

In the semiconductor memory device according to the eighteenth embodiment, the word line connecting region $R_{WL16}$ may include one row which is composed of a plurality of contact electrodes $C_{WL}$ arranged in the X-direction, or may include two rows or more.

In the semiconductor memory device according to the eighteenth embodiment, the conductive layer 440 may include the connecting portion 142 as exemplified in FIG. 77. Accordingly, the word lines WL may be shared between two memory cell regions $R_{MC}$ mutually adjacent in the X-direction.

In the semiconductor memory device according to the eighteenth embodiment, as exemplified in FIG. 82, for example, a plurality of contact electrodes $C_{PC}$ arranged in the X-direction may be disposed in the word line connecting region $R_{WL16}$. The conductive layer 440 may surround outer circumferential surfaces of the plurality of contact electrodes $C_{PC}$ on the XY cross-sectional surface.

In the semiconductor memory device according to the eighteenth embodiment, similarly to the conductive layers 130 exemplified in FIG. 100, the conductive layers 422 may be connected in common between two word line connecting regions $R_{WL16}$ mutually adjacent in the Y-direction.

The semiconductor memory device according to the eighteenth embodiment may include the semiconductor substrate 100, the peripheral circuit layer $L_{PC}$, and the memory cell array layer $L_{MCA}$ as described with reference to FIG. 5. The semiconductor memory device according to the eighteenth embodiment may include the semiconductor substrate 100 and the device layer $L_D$ as described with reference to FIG. 102. The semiconductor memory device according to the eighteenth embodiment may include the chips $C_{PC}$, $C_{MCA}$ as described with reference to FIG. 104.

[Manufacturing Method]

FIG. 122 to FIG. 140 are schematic cross-sectional views for describing a manufacturing method of the semiconductor memory device according to the eighteenth embodiment. FIG. 123, FIG. 125, FIG. 127, FIG. 129, FIG. 130, FIG. 132, FIG. 134, FIG. 137, and FIG. 139 illustrate the part illustrated in FIG. 119. FIG. 122, FIG. 124, FIG. 126, FIG. 128, FIG. 131, FIG. 133, FIG. 135, FIG. 136, FIG. 138, and FIG. 140 illustrate the part illustrated in FIG. 120.

In the manufacturing method, as illustrated in FIG. 122, for example, the insulating layer 101, a sacrifice layer ML4B, a sacrifice layer ML4A, and the sacrifice layer ML4B are formed repeatedly. The sacrifice layers ML4A, ML4B contain, for example, silicon nitride (SiN) or the like. For example, a nitrogen content rate in the sacrifice layer ML4A may be greater than a nitrogen content rate in the sacrifice layer ML4B. Further, a silicon content rate in the sacrifice layer ML4B may be greater than a silicon content rate in the sacrifice layer ML4A. The sacrifice layer ML4A has a low density and is relatively easy to be etched, and the sacrifice layer ML4B has a high density and is relatively difficult to be etched. The insulating layer 105 is formed above these configurations. This process is performed by, for example, a method, such as CVD.

Next, as illustrated in FIG. 123 and FIG. 124, for example, the conductive layers 430 are formed. This process is performed by, for example, a method, such as RIE and CVD.

Next, as illustrated in FIG. 125 and FIG. 126, for example, the openings 102A, 103A, 104A are formed in positions corresponding to the insulating layers 102, 103, 104, respectively. This process is performed by, for example, a method, such as RIE.

Next, as illustrated in FIG. 127 and FIG. 128, for example, the insulating layers 102, 103, 104 are formed. This process is performed by, for example, a method, such as CVD.

Next, as illustrated in FIG. 129, for example, the sacrifice layers ML4A, ML4B are partially removed to form the plurality of terrace portions T. In this process, for example, slimming of a resist and removal of the insulating layer 101, the sacrifice layer ML4B, the sacrifice layer ML4A, and the sacrifice layer ML4B by a method, such as etching, are repeatedly performed. The insulating layer 106 is formed above the plurality of terrace portions T. This process is performed by, for example, a method, such as CVD.

For example, the terrace portion T of one sacrifice layer ML4A mean a part that does not overlap with other sacrifice layers ML4A disposed at higher positions than a position at which the one sacrifice layer ML4A is disposed of an upper surface of the one sacrifice layer ML4A when viewed from the upper side (Z-direction positive side).

Next, as illustrated in FIG. 130 and FIG. 131, for example, the openings PLA are formed in positions corresponding to the plate lines PL. This process is performed by, for example, a method, such as RIE.

Next, as illustrated in FIG. 132 and FIG. 133, for example, the sacrifice layers ML4A are removed via the openings PLA. The insulating layer 103 is partially removed to expose side surfaces in the X-direction of the conductive layers 430. Accordingly, the openings 110A are formed in positions corresponding to the capacitor structures 110 and the semiconductor layers 421. Additionally, openings 422A are formed in positions corresponding to the conductive layers 422, 440. This process is performed by, for example, a method, such as wet etching.

Next, as illustrated in FIG. 134 and FIG. 135, for example, the semiconductor layers 421 are formed. This process may be performed by, for example, epitaxial growth from the exposed surfaces of the conductive layers 430 or MILC, which is a solid-phase crystallization technology using a metal as a growth end of crystallization, may be performed by another crystal growth method, or may be performed by a method other than crystal growth methods. Crystalline semiconductor layers 421 may be formed in one process, or non-crystalline semiconductor layers 421 may be formed and then crystallized by heat treatment. The semiconductor layers 421 may be polycrystalline or monocrystalline.

Next, as illustrated in FIG. 136, for example, the sacrifice layers ML4B are removed. This process is performed by, for example, a method, such as wet etching.

Next, as illustrated in FIG. 137 and FIG. 138, for example, the insulating layers 423 and the conductive layers 422 are formed inside the openings PLA, 110A, 422A. The insulating layers 423 and the conductive layers 422 are formed to be thick enough to fill at least spaces between upper surfaces of the semiconductor layers 421 and lower surfaces of the insulating layers 101, 105 and spaces between lower surfaces of the semiconductor layers 421 and upper surfaces of the insulating layers 101. Further, the insulating layers 423 and the conductive layers 422 are formed to be thin enough not to fill the openings 110A, PLA. This process is performed by, for example, a method, such as CVD.

Next, as illustrated in FIG. 139 and FIG. 140, for example, the insulating layers 423 and the conductive layers 422 are partially removed. In this process, the insulating layers 423 and the conductive layers 422 are removed to the extent that parts of the insulating layers 423 and the conductive layers 422 formed on upper surfaces and lower surfaces of the semiconductor layers 421 remain, and upper surfaces and lower surfaces of the insulating layers 101, 105 are exposed in the openings 110A, PLA. This process is performed by, for example, a method, such as wet etching.

Next, the processes after the process described with reference to FIG. 37 and FIG. 38 are performed.

Nineteenth Embodiment

Next, a semiconductor memory device according to a nineteenth embodiment is described. In the following description, same reference numerals are attached to parts similar to those of the fifteenth embodiment, and their descriptions are omitted.

FIG. 141 is a schematic cross-sectional view illustrating a part of a configuration of the semiconductor memory device according to the nineteenth embodiment.

The semiconductor memory device according to the nineteenth embodiment is basically configured similarly to the semiconductor memory device according to the fifteenth embodiment. However, the semiconductor memory device according to the nineteenth embodiment includes chips $C_{MCA2}$ instead of the chips $C_{PC0}$ and the chips $C_{MCA1}$ (FIG. 108).

The chip $C_{MCA2}$ includes the semiconductor substrate 300, the peripheral circuit layer $L_{PC0}$ disposed above the semiconductor substrate 300, and the memory cell array layer $L_{MCA1}$ disposed above the peripheral circuit layer $L_{PC0}$.

That is, in the fifteenth embodiment, as described with reference to FIG. 108, the memory cell array layer $L_{MCA1}$ and the peripheral circuit layer $L_{PC0}$ are included in the different chips $C_{MCA1}$, $C_{PC0}$. On the other hand, in the nineteenth embodiment, as illustrated in FIG. 141, the memory cell array layer $L_{MCA1}$ and the peripheral circuit layer $L_{PC0}$ are included in the same chip $C_{MCA2}$.

The configuration of the peripheral circuit layer $L_{PC0}$ has been described with reference to FIG. 111. The configuration of the memory cell array layer $L_{MCA1}$ has been described with reference to FIG. 110.

Twentieth Embodiment

Next, a semiconductor memory device according to a twentieth embodiment is described. In the following description, same reference numerals are attached to parts similar to those of the eighteenth embodiment, and their descriptions are omitted.

As described above, in the semiconductor memory device according to the eighteenth embodiment, one memory cell array may include both the bit lines BL, /BL. Hereinafter, such a configuration is exemplified as the semiconductor memory device according to the twentieth embodiment.

FIG. 142 is a schematic XY cross-sectional view for describing the configuration of the semiconductor memory device according to the twentieth embodiment. FIG. 142 basically illustrates a cross-sectional surface at a height position corresponding to FIG. 119. However, in FIG. 142, configurations (the bit lines BL, /BL, the contact electrodes $C_{BL}$, and wirings WWL) that do not appear on this cross-sectional surface are illustrated.

The semiconductor memory device according to the twentieth embodiment is basically configured similarly to the semiconductor memory device according to the eighteenth embodiment. However, the semiconductor memory device according to the twentieth embodiment includes the plurality of bit lines BL, /BL that extend in the X-direction and are alternately arranged in the Y-direction. The plurality of conductive layers 430 disposed in a region at the X-direction negative side in the bit line connecting region $R_{BL16}$ are electrically connected to the bit lines BL via the contact electrodes $C_{BL}$. The plurality of conductive layers 430 disposed in a region at the X-direction positive side in the bit line connecting region $R_{BL16}$ are electrically connected to the bit lines /BL via the contact electrodes $C_{BL}$. In the twentieth embodiment, the contact electrodes $C_{BL}$ are disposed in positions that overlap with the conductive layers 430 and the bit lines BL, /BL when viewed from the Z-direction.

As illustrated in FIG. 142, each of the plurality of contact electrodes $C_{WL}$ is connected to one of the plurality of wirings WWL and extracted in the Y-direction. These plurality of wirings WWL are arranged in the X-direction and extend in the Y-direction. The semiconductor memory device according to the eighteenth embodiment and the semiconductor memory devices according to the twenty-first embodiment to the thirty-third embodiment may include these plurality of wirings WWL.

FIG. 143 is a schematic XY cross-sectional view for describing the configuration of the semiconductor memory device according to the twentieth embodiment. FIG. 143 basically illustrates the configuration similar to that of FIG. 142. However, in FIG. 143, the bit lines BL, /BL and the contact electrodes $C_{BL}$ are not illustrated.

Regions enclosed by two-dot chain lines in FIG. 143 are disposed in positions that overlap with sense unit regions $R_{60}$ disposed on an upper surface of the semiconductor substrate 100 (not illustrated) when viewed from the Z-direction. The sense unit region $R_{60}$ is a region corresponding to the sense amplifier circuit SA, the column switch YSW, and the equalizing circuit EQ and includes the plurality of transistors (transistors $TR_{51}$ to $TR_{54}$, $TR_{71}$, $TR_{72}$, $TR_{81}$ to $TR_{83}$) illustrated in FIG. 3. Note that the transistors exemplified in FIG. 4 have a channel direction in the X-direction. However, the plurality of transistors included in the sense unit region $R_{60}$ may have a channel direction mainly in the Y-direction.

In the illustrated example, the sense unit regions $R_{60}$ extend in the X-direction and are arranged in the Y-direction. The sense unit regions $R_{60}$ have a pitch in the Y-direction corresponding to a pitch in the Y-direction of the capacitor structures 110 and the conductive layers 430. The sense unit region $R_{60}$ has a length in the X-direction smaller than a distance from a center position in the X-direction of one of two plate lines PL mutually adjacent in the X-direction to a center position in the X-direction of the other. In FIG. 143, from the center position in the X-direction of the one of the two plate lines PL mutually adjacent in the X-direction to the center position in the X-direction of the other is illustrated. Each of the sense unit regions $R_{60}$ is disposed in a position that overlaps with two capacitor structures 110 arranged in the X-direction, two transistor structures 120 arranged in the X-direction, two conductive layers 430 arranged in the X-direction, and two bit lines BL, /BL arranged in the Y-direction (see FIG. 142) when viewed from the Z-direction. The plurality of transistors in the sense unit region $R_{60}$ are electrically connected to at least one of the two bit lines BL, /BL disposed in the position corresponding to this sense unit region $R_{60}$.

Twenty-First Embodiment

Next, a semiconductor memory device according to a twenty-first embodiment is described. In the following description, same reference numerals are attached to parts similar to those of the eighteenth embodiment, and their descriptions are omitted.

In the example of FIG. 119, the plurality of conductive layers 430 arranged in the Y-direction in two rows are disposed in the bit line connecting region $R_{BL16}$ Positions in the Y-direction of the plurality of conductive layers 430 included in one row correspond to those of the plurality of conductive layers 430 included in the other row. However, such a configuration is only an example, and a specific configuration is adjustable as appropriate. For example, the positions in the Y-direction of the plurality of conductive layers 430 included in the one row need not correspond to those of the plurality of conductive layers 430 included in the other row. Hereinafter, such a configuration is exemplified as the semiconductor memory device according to the twenty-first embodiment.

FIG. 144 is a schematic XY cross-sectional view for describing the configuration of the semiconductor memory device according to the twenty-first embodiment.

The semiconductor memory device according to the twenty-first embodiment is basically configured similarly to the semiconductor memory device according to the eighteenth embodiment. However, the semiconductor memory device according to the twenty-first embodiment includes bit line connecting regions $R_{BL21}$ and memory cell regions $R_{MC21}$ instead of the bit line connecting regions $R_{BL16}$ and the memory cell regions $R_{MC}$.

The bit line connecting region $R_{BL21}$ is basically configured similarly to the bit line connecting region $R_{BL16}$. However, positions in the Y-direction of the plurality of conductive layers 430 included in one row of the plurality of conductive layers 430 arranged in the Y-direction in two rows in the bit line connecting region $R_{BL21}$ are displaced by half pitch from those of the plurality of conductive layers 430 included in the other row. For example, when focusing on two conductive layers 430 mutually adjacent in the Y-direction in the one row, one conductive layer 430 included in the other row is disposed in a position in the Y-direction equidistant from these two conductive layers 430.

The memory cell region $R_{MC21}$ is basically configured similarly to the memory cell region $R_{MC}$. However, when focusing on two memory cell regions $R_{MC21}$ mutually adjacent via the bit line connecting region $R_{BL21}$, positions in the Y-direction of the capacitor structures 110 included in one memory cell region $R_{MC21}$ are displaced by half pitch from those of the capacitor structures 110 included in the other memory cell region $R_{MC21}$.

In the semiconductor memory device according to the twenty-first embodiment, similarly to the semiconductor memory device according to the eighteenth embodiment, one memory cell array may include both the bit lines BL, /BL. Hereinafter, such a configuration is exemplified.

FIG. 145 is a schematic XY cross-sectional view for describing the configuration of the semiconductor memory device according to the twenty-first embodiment. FIG. 145 basically illustrates a cross-sectional surface at a height position corresponding to FIG. 144. However, in FIG. 145, configurations (the bit lines BL, /BL and the contact electrodes $C_{BL}$) that do not appear on this cross-sectional surface are illustrated.

In FIG. 145, the plurality of bit lines BL, /BL that extend in the X-direction and are alternately arranged in the Y-direction are exemplified. The plurality of conductive layers 430 (FIG. 144) disposed in the region at the X-direction negative side of the bit line connecting region $R_{BL21}$ are electrically connected to the bit lines BL via the contact electrodes $C_{BL}$. The plurality of conductive layers 430 (FIG. 144) disposed in the region at the X-direction positive side of the bit line connecting region $R_{BL21}$ are electrically connected to the bit lines /BL via the contact electrodes $C_{BL}$. In the twenty-first embodiment, the contact electrodes $C_{BL}$ are disposed in positions that overlap with the conductive layers 430 and the bit lines BL, /BL when viewed from the Z-direction.

The semiconductor memory device according to the twenty-first embodiment may include the plurality of sense unit regions $R_{60}$ as described with reference to FIG. 143, similarly to the semiconductor memory device according to the eighteenth embodiment.

The semiconductor memory device according to the twenty-first embodiment includes, for example, a configuration as described with reference to FIG. 5 or FIG. 104. However, the semiconductor memory device according to the twenty-first embodiment includes a memory cell array layer $L_{MCA21}$ instead of the memory cell array layer $L_{MCA}$. Further, the semiconductor memory device according to the twenty-first embodiment includes a peripheral circuit layer $L_{PC21}$ instead of the peripheral circuit layer $L_{PC}$.

FIG. 146 is a schematic plan view illustrating a part of a configuration of the memory cell array layer $L_{MCA21}$ of the semiconductor memory device according to the twenty-first embodiment. As illustrated in FIG. 146, the memory cell array 11 includes the plurality of memory cell regions $R_{MC21}$ arranged in the X-direction. Further, the bit line connecting regions $R_{BL21}$ are disposed in odd-numbered regions counted from the X-direction negative side among regions between the plurality of memory cell regions $R_{MC21}$ arranged in the X-direction. The word line connecting region $R_{WL16}$ and the dummy region $R_D$ are disposed in an end portion in the Y-direction of the memory cell array 11.

FIG. 147 is a schematic plan view illustrating a part of a configuration of the peripheral circuit layer $L_{PC21}$ of the semiconductor memory device according to the twenty-first embodiment. FIG. 147 illustrates the configuration of a region that overlaps with that of FIG. 146 when viewed from the Z-direction. In FIG. 147, four regions $R_{11}$ that overlap with the memory cell arrays 11 when viewed from the Z-direction are illustrated. The peripheral circuit layer $L_{PC21}$ includes a plurality of regions $R_{11}$ arranged in the X-direction and the Y-direction corresponding to the memory cell arrays 11. In each of the regions $R_{11}$, the sense amplifier circuits SA and the word line driver WLD are each disposed. Each of the word line drivers WLD is disposed in a position that overlaps with the word line connecting region $R_{WL16}$ and the dummy region $R_D$ when viewed from the upper side. Each of the sense amplifier circuits SA is disposed in a position that overlaps with the bit line connecting region $R_{BL21}$ when viewed from the upper side.

Twenty-Second Embodiment

Next, a semiconductor memory device according to a twenty-second embodiment is described. In the following description, same reference numerals are attached to parts similar to those of the twentieth embodiment, and their descriptions are omitted.

FIG. 148 is a schematic cross-sectional view illustrating a part of the configuration of the semiconductor memory device according to the twenty-second embodiment.

As illustrated in FIG. 148, the semiconductor memory device according to the embodiment includes chips $C_{PC22}$ and chips $C_{MCA22}$ connected to the chips $C_{PC22}$. The chip $C_{PC22}$ includes the semiconductor substrate 300 and a peripheral circuit layer $L_{PC22}$ disposed above the semiconductor substrate 300. The chip $C_{MCA22}$ includes the semiconductor substrate 300' and a memory cell array layer $L_{MCA22}$ disposed above the semiconductor substrate 300'.

FIG. 149 is a schematic cross-sectional view illustrating a part of the configuration of the semiconductor memory device according to the twenty-second embodiment.

In FIG. 149, a part of the chip $C_{MCA22}$ and a part of the chip $C_{PC22}$ are exemplified. The memory cell array layer $L_{MCA22}$ in the chip $C_{MCA22}$ includes the memory cell regions $R_{MC}$ and the bit line connecting regions $R_{BL16}$. On the cross-sectional surface exemplified in FIG. 149, the bit line BL is exemplified. The bit line BL is connected to a plurality of transistors Tr that constitute the sense amplifier circuit SA, the column switch YSW, and the equalizing circuit EQ. Further, the bit line BL is connected to the conductive layer 430 via the through electrode 301 and the back surface electrode 302.

While the gate electrodes GCd and the contact electrodes CSd of the transistors Tr are illustrated in FIG. 149, this is a schematic drawing for description. When the transistor Tr has a channel direction in the Y-direction, the contact electrode CSd that serves as a source terminal or a drain terminal of the transistor Tr and the gate electrode GCd do not appear on the same cross-sectional surface.

Further, in FIG. 149, an XZ cross-sectional surface along wiring that serves as the bit line BL in the chip $C_{PC22}$ is exemplified. However, an XZ cross-sectional surface along wiring that serves as the bit line /BL in the chip $C_{PC22}$ is configured approximately similarly to that of FIG. 149. However, the wiring that serves as the bit line /BL in the chip $C_{PC22}$ may be connected to, for example, the conductive layer 430 at the X-direction positive side of the two conductive layers 430 exemplified in FIG. 149, not to the conductive layer 430 at the X-direction negative side.

FIG. 150 is a schematic plan view illustrating a part of a configuration of the peripheral circuit layer $L_{PC22}$ of the semiconductor memory device according to the twenty-second embodiment. In FIG. 150, four regions $R_{11}$ that overlap with the memory cell arrays 11 when viewed from the Z-direction are illustrated. The peripheral circuit layer $L_{PC22}$ includes a plurality of regions $R_{11}$ arranged in the X-direction and the Y-direction corresponding to the memory cell arrays 11. In each of the regions $R_{11}$, the sense amplifier circuits SA, bit line connecting regions $R_{BL22}$, the word line driver WLD, and a word line connecting region $R_{WL22}$ are each disposed.

Each of the sense amplifier circuits SA is disposed in a position that overlaps with the memory cell region $R_{Mc}$ when viewed from the upper side.

Each of the bit line connecting regions $R_{BL22}$ is disposed in a position that overlaps with the bit line connecting region $R_{BL16}$ when viewed from the upper side. The back surface electrodes 302 and the through electrodes 301 disposed in current paths between the sense amplifier circuit SA and the conductive layers 430, as described with reference to FIG. 149, are disposed in the bit line connecting region $R_{BL22}$.

The word line driver WLD is disposed in a position that overlaps with the dummy region $R_D$ when viewed from the upper side.

The word line connecting region $R_{WL22}$ is disposed in a position that overlaps with the word line connecting region $R_{WL16}$ when viewed from the upper side. The back surface electrodes 302 and the through electrodes 301 disposed in current paths between the word line drivers WLD and the conductive layers 440 are disposed in the word line connecting region $R_{WL22}$.

Twenty-Third Embodiment

Next, a semiconductor memory device according to a twenty-third embodiment is described. In the following description, same reference numerals are attached to parts similar to those of the twenty-first embodiment, and their descriptions are omitted.

The semiconductor memory device according to the twenty-third embodiment is basically configured similarly to the semiconductor memory device according to the twenty-first embodiment. However, the semiconductor memory device according to the twenty-third embodiment is different from the semiconductor memory device according to the twenty-first embodiment in the following points.

FIG. 151 is a schematic plan view illustrating a part of a configuration of the semiconductor memory device according to the twenty-third embodiment. The semiconductor memory device according to the twenty-third embodiment includes a memory cell array layer $L_{MCA23}$ (FIG. 151) instead of the memory cell array layer $L_{MCA21}$ (FIG. 146). The memory cell array layer $L_{MCA23}$ is basically configured similarly to the memory cell array layer $L_{MCA21}$. However, as illustrated in FIG. 146, in the twenty-first embodiment, the word line connecting region R and the dummy region $R_D$ are disposed in one end portion in the Y-direction of the memory cell array 11. On the other hand, as illustrated in FIG. 151, in the twenty-third embodiment, the word line connecting region $R_{WL16}$ and the dummy region $R_D$ are disposed in one end portion and the other end portion in the Y-direction of the memory cell array 11.

FIG. 152 is a schematic plan view illustrating a part of the configuration of the semiconductor memory device according to the twenty-third embodiment. The semiconductor memory device according to the twenty-third embodiment includes a peripheral circuit layer $L_{PC23}$ (FIG. 152) instead of the peripheral circuit layer $L_{PC21}$ (FIG. 147). The peripheral circuit layer $L_{PC23}$ is basically configured similarly to the peripheral circuit layer $L_{PC21}$ However, as illustrated in FIG. 147, in the twenty-first embodiment, the word line driver WLD is disposed in one end portion in the Y-direction of the region $R_{11}$. On the other hand, as illustrated in FIG. 152, in the twenty-third embodiment, the word line driver WLD is disposed in one end portion and the other end portion in the Y-direction of the region $R_{11}$.

Twenty-Fourth Embodiment

Next, a semiconductor memory device according to a twenty-fourth embodiment is described. In the following description, same reference numerals are attached to parts similar to those of the twenty-second embodiment, and their descriptions are omitted.

The semiconductor memory device according to the twenty-fourth embodiment is basically configured similarly to the semiconductor memory device according to the twenty-second embodiment. However, the semiconductor memory device according to the twenty-fourth embodiment is different from the semiconductor memory device according to the twenty-second embodiment in the following points.

The semiconductor memory device according to the twenty-fourth embodiment includes the memory cell array layer $L_{MCA23}$ (FIG. 151) instead of the memory cell array layer $L_{MCA22}$.

FIG. 153 is a schematic plan view illustrating a part of a configuration of the semiconductor memory device according to the twenty-fourth embodiment. The semiconductor memory device according to the twenty-fourth embodiment includes a peripheral circuit layer $L_{PC24}$ (FIG. 153) instead of the peripheral circuit layer $L_{PC22}$ (FIG. 150). The peripheral circuit layer $L_{PC24}$ is basically configured similarly to the peripheral circuit layer $L_{PC22}$ However, as illustrated in FIG. 150, in the twenty-second embodiment, the word line driver WLD and the word line connecting region $R_{WL22}$ are disposed in one end portion in the Y-direction of the region $R_{11}$. On the other hand, as illustrated in FIG. 153, in the twenty-fourth embodiment, the word line driver WLD and the word line connecting region $R_{WL22}$ are disposed in one end portion and the other end portion in the Y-direction of the region $R_{11}$.

Twenty-Fifth Embodiment

Next, a semiconductor memory device according to a twenty-fifth embodiment is described. In the following description, same reference numerals are attached to parts similar to those of the eighteenth embodiment, and their descriptions are omitted.

FIG. 154 is a schematic cross-sectional view illustrating a part of a configuration of the semiconductor memory device according to the twenty-fifth embodiment.

The semiconductor memory device according to the twenty-fifth embodiment includes chips $C_{25A}$ and chips $C_{25B}$. The chip $C_{25A}$ includes the semiconductor substrate 300, a peripheral circuit layer $L_{PC25}$ disposed above the semiconductor substrate 300, and a memory cell array layer $L_{MCA25A}$ disposed above the peripheral circuit layer $L_{PC25}$ The chip $C_{25B}$ includes the semiconductor substrate 300' and a memory cell array layer $L_{MCA25B}$ disposed above the semiconductor substrate 300'.

FIG. 155 and FIG. 156 are schematic plan views illustrating a part of the configuration of the semiconductor memory device according to the twenty-fifth embodiment. FIG. 155 schematically illustrates a part of a configuration of the memory cell array layer $L_{MCA25A}$ FIG. 156 schematically illustrates a part of a configuration of the memory cell array layer $L_{MCA25B}$.

As illustrated in FIG. 155 and FIG. 156, the memory cell array layers $L_{MCA25A}$, $L_{MCA25B}$ are basically configured similarly to the memory cell array layer $L_{MCA21}$ described with reference to FIG. 146. However, as illustrated in FIG. 155 and FIG. 156, the word line connecting region $R_{WL16}$ and the dummy region $R_D$ of the memory cell array layer $L_{MCA25A}$ are disposed in a position that does not overlap with the word line connecting region $R_{WL16}$ and the dummy region $R_D$ of the memory cell array layer $L_{MCA25B}$ one another when viewed from the Z-direction. In the illustrated example, the word line connecting region $R_{WL16}$ and the dummy region $R_D$ of the memory cell array layer $L_{MCA25A}$ are disposed in the end portion at the Y-direction negative side of the memory cell array 11. On the other hand, the word line connecting region $R_{WL16}$ and the dummy region $R_D$ of the memory cell array layer $L_{MCA25B}$ are disposed in the end portion at the Y-direction positive side of the memory cell array 11.

FIG. 157 is a schematic plan view illustrating a part of the configuration of the semiconductor memory device according to the twenty-fifth embodiment. FIG. 157 schematically illustrates a part of a configuration of the peripheral circuit layer $L_{PC25}$.

As illustrated in FIG. 157, the peripheral circuit layer $L_{PC25}$ is basically configured similarly to the peripheral circuit layer $L_{PC24}$ described with reference to FIG. 153.

However, in the configuration in FIG. 157, sense amplifier circuits SA(A) are connected to the configuration in the memory cell array layer $L_{MCA25A}$, and sense amplifier circuits SA(B) are connected to the configuration in the memory cell array layer $L_{MCA25B}$. Further, word line drivers WLD(A) are connected to the configuration in the memory cell array layer $L_{MCA25A}$, and word line drivers WLD(B) are connected to the configuration in the memory cell array layer $L_{MCA25B}$.

In positions of the peripheral circuit layer $L_{PC25}$ that overlap with the word line connecting regions $R_{WL16}$ in the memory cell array layer $L_{MCA25A}$ when viewed from the Z-direction, the word line connecting regions $R_{WL22}$ are not disposed. That is, in the embodiment, in positions of the substrate 300 (FIG. 154) that overlap with the word line connecting regions $R_{WL16}$ in the memory cell array layer $L_{MCA25A}$ when viewed from the Z-direction, the back surface electrodes 302 and the through electrodes 301 as described with reference to FIG. 149 are not disposed. This is because the memory cell array layer $L_{MCA25A}$ is included in the chip $C_{25A}$ in common with the peripheral circuit layer $L_{PC25}$ and is connected to the configuration in the peripheral circuit layer $L_{PC25}$ without via the substrate 300.

On the other hand, in positions of the peripheral circuit layer $L_{PC25}$ that overlap with the word line connecting regions $R_{WL16}$ in the memory cell array layer $L_{MCA25B}$ when viewed from the Z-direction, the word line connecting regions $R_{WL22}$ are disposed. That is, in positions of the substrate 300 (FIG. 154) that overlap with the word line connecting regions $R_{WL16}$ in the memory cell array layer $L_{MCA25B}$ when viewed from the Z-direction, the back surface electrodes 302 and the through electrodes 301 are disposed. This is because the memory cell array layer $L_{MCA25B}$ is included in the chip $C_{25B}$, which is different from the peripheral circuit layer $L_{PC25}$, and is connected to the configuration in the peripheral circuit layer $L_{PC25}$ via the substrate 300.

FIG. 158 is a schematic XY cross-sectional view illustrating a part of the configuration of the semiconductor memory device according to the twenty-fifth embodiment. FIG. 158 basically illustrates a cross-sectional surface at the height position corresponding to FIG. 119. However, in FIG. 158, configurations (the bit lines BL(A), /BL(A), BL(B), /BL(B) and the contact electrodes $C_{BL}$) that do not appear on this cross-sectional surface are illustrated.

Regions enclosed by two-dot chain lines in FIG. 158 are disposed in positions that overlap with the sense unit regions $R_{60}$ disposed on an upper surface of the semiconductor substrate 300 (FIG. 159 and FIG. 160) when viewed from the Z-direction. In the illustrated example, the sense unit regions $R_{60}$ extend in the X-direction and are arranged in the X-direction and the Y-direction. The sense unit regions $R_{60}$ have a pitch in the Y-direction corresponding to a pitch in the Y-direction of the capacitor structures 110 and the conductive layers 430. The sense unit region $R_{60}$ has a length in the X-direction smaller than a distance from a center position in the X-direction of one of two plate lines PL mutually adjacent in the X-direction to a center position in the X-direction of the bit line connecting region $R_{BL16}$ disposed between these two plate lines PL. In FIG. 158, from the center position in the X-direction of the one of the two plate lines PL mutually adjacent in the X-direction to the center position in the X-direction of the other is illustrated.

Each of the sense unit regions $R_{60}$ corresponding to the memory cell region $R_{MC}$ disposed at the X-direction positive side of the two memory cell regions $R_{MC}$ exemplified in FIG. 158 is disposed in a position that overlaps with one capacitor structure 110, one conductive layer 430, and two bit lines BL(A), /BL(A) arranged in the Y-direction, when viewed from the Z-direction. The plurality of transistors in this sense unit region $R_{60}$ are electrically connected to at least one of these two bit lines BL(A), /BL(A).

Each of the sense unit regions $R_{60}$ corresponding to the memory cell region $R_{MC}$ disposed at the X-direction negative side of the two memory cell regions $R_{MC}$ exemplified in FIG. 158 is disposed in a position that overlaps with one capacitor structure 110, one conductive layer 430, and two bit lines BL(B), /BL(B) arranged in the Y-direction, when viewed from the Z-direction. The plurality of transistors in this sense unit region $R_{60}$ are electrically connected to at least one of these two bit lines BL(B), /BL(B).

When lengths in the X-direction of the transistor structure 120 and the capacitor structure 110 are nearly equal to a length in the X-direction of the sense unit region $R_{60}$ or greater than the length in the X-direction of the sense unit region $R_{60}$, a structure, such as that of FIG. 158, is employed. On the other hand, when the lengths in the X-direction of the transistor structure 120 and the capacitor structure 110 are smaller than the length in the X-direction of the sense unit region $R_{60}$ and lengths that are twice the lengths in the X-direction of the transistor structure 120 and the capacitor structure 110 are greater than the length in the X-direction of the sense unit region $R_{60}$, a structure, such as that of FIG. 142, is employed.

When a half pitch in the X-direction of the plate lines PL is nearly equal to the length in the X-direction of the sense unit region $R_{60}$ or greater than the length in the X-direction of the sense unit region $R_{60}$, a structure, such as that of FIG. 158, is employed. On the other hand, when the half pitch in the X-direction of the plate lines PL is smaller than the length in the X-direction of the sense unit region $R_{60}$ and a pitch in the X-direction of the plate lines PL is greater than the length in the X-direction of the sense unit region $R_{60}$, a structure, such as that of FIG. 142, is employed.

FIG. 159 is a schematic cross-sectional view illustrating a part of the configuration of the semiconductor memory device according to the twenty-fifth embodiment.

In FIG. 159, a part of the chip $C_{25A}$ and a part of the chip $C_{25B}$ are exemplified. On the cross-sectional surface exemplified in FIG. 159, the bit line BL(A) corresponding to the memory cell array layer $L_{MCA25A}$, and the sense amplifier circuit SA(A), a column switch YSW(A), and an equalizing circuit EQ(A) that are connected to the bit line BL(A) are illustrated. Further, on the cross-sectional surface exemplified in FIG. 159, the bit line BL(B) corresponding to the memory cell array layer $L_{MCA25B}$, and the sense amplifier circuit SA(B), a column switch YSW(B), and an equalizing circuit EQ(B) that are connected to the bit line BL(B) are illustrated.

The bit line BL(A) is connected to the plurality of transistors Tr that constitute the sense amplifier circuit SA(A), the column switch YSW(A), and the equalizing circuit EQ(A). These plurality of transistors Tr have a small width in the X-direction compared with the plurality of transistors Tr exemplified in FIG. 149. The bit line BL(A) is connected to the conductive layer 430 in the memory cell array layer $L_{MCA25A}$ via a wiring 315 that extends in the X-direction in the peripheral circuit layer $L_{PC25}$ and contact electrodes 316.

The bit line BL(B) is connected to the plurality of transistors Tr that constitute the sense amplifier circuit SA(B), the column switch YSW(B), and the equalizing circuit EQ(B). These plurality of transistors Tr have a small width in the X-direction compared with the plurality of transistors Tr exemplified in FIG. 149. The bit line BL(B) is connected to the conductive layer 430 in the memory cell array layer $L_{MCA25B}$ via the through electrode 301 and the back surface electrode 302. In the drawing, a wiring 317 and contact electrodes 318 in the memory cell array layer $L_{MCA25B}$ that are disposed in a current path between the back surface electrode 302 and the conductive layer 430 are exemplified.

In the illustrated example, a part of the contact electrodes 316 and the contact electrodes 318 are disposed in a position that overlap with one another when viewed from the Z-direction.

FIG. 160 is a schematic cross-sectional view illustrating a part of the configuration of the semiconductor memory device according to the twenty-fifth embodiment.

In FIG. 160, a part of the chip $C_{25A}$ and a part of the chip $C_{25B}$ are exemplified. On the cross-sectional surface exemplified in FIG. 160, the bit line /BL(A) corresponding to the memory cell array layer $L_{MCA25A}$ and the bit line /BL(B) corresponding to the memory cell array layer $L_{MCA25B}$ are illustrated.

The bit line /BL(A) is connected to the plurality of transistors Tr that constitute the sense amplifier circuit SA(A), the column switch YSW(A), and the equalizing circuit EQ(A). These plurality of transistors Tr have a small width in the X-direction compared with the plurality of transistors Tr exemplified in FIG. 149. The bit line /BL(A) is connected to the conductive layer 430 in the memory cell array layer $L_{MCA25A}$ via the wiring 315 and the contact electrodes 316 in the peripheral circuit layer $L_{PC25}$.

The bit line /BL(B) is connected to the plurality of transistors Tr that constitute the sense amplifier circuit SA(B), the column switch YSW(B), and the equalizing circuit EQ(B). These plurality of transistors Tr have a small width in the X-direction compared with the plurality of transistors Tr exemplified in FIG. 149. The bit line /BL(B) is connected to the conductive layer 430 in the memory cell array layer $L_{MCA25B}$ via the through electrode 301, the back surface electrode 302, the wiring 317 that extends in the X-direction in the memory cell array layer $L_{MCA25B}$, and the contact electrodes 318.

In the illustrated example, the contact electrodes 316 and a part of the contact electrodes 318 are disposed in a position that overlap with one another when viewed from the Z-direction.

While the gate electrodes GCd and the contact electrodes CSd of the transistors Tr are illustrated in FIG. 159 and FIG. 160, these are schematic drawings for description. When the transistor Tr has a channel direction in the Y-direction, the contact electrode CSd that serves as a source terminal or a drain terminal of the transistor Tr and the gate electrode GCd do not appear on the same cross-sectional surface.

Twenty-Sixth Embodiment

Next, a semiconductor memory device according to a twenty-sixth embodiment is described. In the following description, same reference numerals are attached to parts similar to those of the eighteenth embodiment, and their descriptions are omitted.

FIG. 161 and FIG. 162 are schematic XY cross-sectional views illustrating a part of a configuration of the semiconductor memory device according to the twenty-sixth embodiment. Note that, similarly to FIG. 119, FIG. 161 is a schematic cross-sectional view of the structure as exemplified in FIG. 120 and FIG. 121 taken along the line corresponding to the line I-I' and viewed along an arrow direction.

FIG. 161 basically illustrates the configuration similar to that of FIG. 119. However, in FIG. 119, two plate lines PL arranged in the X-direction and one bit line connecting region $R_{BL16}$ disposed therebetween are illustrated. On the other hand, in FIG. 161, two bit line connecting regions $R_{BL16}$ arranged in the X-direction and one plate line PL disposed therebetween are illustrated. In the example of FIG. 161, the plurality of conductive layers 440 arranged in the X-direction are electrically independent for each memory cell region $R_{MC}$.

FIG. 162 basically illustrates the configuration similar to that of FIG. 142. However, in the example of FIG. 142, the configurations in two memory cell regions $R_{MC}$ mutually adjacent in the X-direction via the bit line connecting region $R_{BL16}$ are connected to the common sense amplifier circuit SA. On the other hand, in the example of FIG. 162, the configurations in two memory cell regions $R_{MC}$ mutually adjacent in the X-direction via the plate line PL are connected to the common sense amplifier circuit SA.

Regions enclosed by two-dot chain lines in FIG. 162 are disposed in positions that overlap with the sense unit regions $R_{60}$ disposed on an upper surface of a semiconductor substrate (not illustrated) when viewed from the Z-direction. In the illustrated example, the sense unit regions $R_{60}$ extend in the X-direction and are arranged in the Y-direction. The sense unit regions $R_{60}$ have a pitch in the Y-direction corresponding to a pitch in the Y-direction of the capacitor structures 110 and the conductive layers 430. The sense unit region $R_{60}$ has a length in the X-direction smaller than a distance from a center position in the X-direction of one of two bit line connecting regions $R_{BL16}$ mutually adjacent in the X-direction to a center position in the X-direction of the other. In FIG. 162, from the center position in the X-direction of the one of the two bit line connecting regions $R_{BL16}$ mutually adjacent in the X-direction to the center position in the X-direction of the other is illustrated. Each of the sense unit regions $R_{60}$ is disposed in a position that overlaps with two capacitor structures 110 arranged in the X-direction, two transistor structures 120 arranged in the X-direction, two conductive layers 430 arranged in the X-direction, and two bit lines BL, /BL arranged in the Y-direction when viewed from the Z-direction. The plurality of transistors in the sense unit region $R_{60}$ are electrically connected to at least one of the two bit lines BL, /BL disposed in the position corresponding to this sense unit region $R_{60}$.

The semiconductor memory device according to the twenty-sixth embodiment includes a configuration, for example, as described with reference to FIG. 5 or FIG. 104. However, the semiconductor memory device according to the twenty-sixth embodiment includes a memory cell array layer $L_{MCA26}$ instead of the memory cell array layer $L_{MCA}$. Further, the semiconductor memory device according to the twenty-sixth embodiment includes a peripheral circuit layer $L_{PC26}$ instead of the peripheral circuit layer $L_{PC}$.

FIG. 163 is a schematic plan view illustrating a part of a configuration of the memory cell array layer $L_{MCA26}$ of the semiconductor memory device according to the twenty-sixth embodiment. The memory cell array layer $L_{MCA26}$ includes, for example, as illustrated in FIG. 6, the plurality of memory cell arrays 11 arranged in the X-direction and the Y-direction. FIG. 163 illustrates an end portion in the X-direction of the memory cell array layer $L_{MCA26}$ (that is, an end portion in the X-direction of a chip where the memory cell array layer $L_{MCA26}$ is disposed, which is an end portion at the X-direction negative side in the illustrated example).

The memory cell array layer $L_{MCA26}$ is basically configured similarly to the memory cell array layer according to the eighteenth embodiment. However, as illustrated in FIG. 163, in the end portion in the X-direction of the memory cell array layer $L_{MCA26}$ (the end portion at the X-direction negative side in the illustrated example), memory cell arrays 11' are disposed instead of the memory cell arrays 11. The memory cell array 11' is basically configured similarly to the memory cell array 11. However, the dummy region $R_D$ is disposed in a range from an end portion in the X-direction of the memory cell array 11' (an end portion at the X-direction negative side in the illustrated example) to the bit line connecting region $R_{BL16}$.

FIG. 164 is a schematic plan view illustrating a part of a configuration of the peripheral circuit layer $L_{PC26}$ of the semiconductor memory device according to the twenty-sixth embodiment. FIG. 164 illustrates the configuration of a region that overlaps with that of FIG. 163 when viewed from the Z-direction. In FIG. 164, two regions $R_{11}$ that overlap with the memory cell arrays 11 when viewed from the Z-direction and two regions $R_{11}'$ that overlap with the memory cell arrays 11' when viewed from the Z-direction are illustrated. The peripheral circuit layer $L_{PC26}$ is basically configured similarly to the peripheral circuit layer $L_{PC21}$ described with reference to FIG. 147. However, as illustrated in FIG. 163 and FIG. 164, in the peripheral circuit layer $L_{PC26}$, each of the sense amplifier circuits SA is disposed in a region that overlaps with a region between two bit line connecting regions $R_{BL16}$ (FIG. 163) mutually adjacent in the X-direction when viewed from the Z-direction. In the illustrated example, the sense amplifier circuits SA are disposed in positions that do not overlap with the bit line connecting regions $R_{BL16}$ when viewed from the upper side. Some of the sense amplifier circuits SA are disposed across regions that overlap with two memory cell arrays 11 mutually adjacent in the X-direction. Further, some of the sense amplifier circuits SA are disposed across regions that overlap with one memory cell array 11' and one memory cell array 11 adjacent in the X-direction to this memory cell array 11'.

Twenty-Seventh Embodiment

Next, a semiconductor memory device according to a twenty-seventh embodiment is described. In the following description, same reference numerals are attached to parts similar to those of the twenty-sixth embodiment, and their descriptions are omitted.

FIG. 165 is a schematic plan view illustrating a part of a configuration of the semiconductor memory device according to the twenty-seventh embodiment.

The semiconductor memory device according to the twenty-seventh embodiment is basically configured similarly to the semiconductor memory device according to the twenty-sixth embodiment.

However, the semiconductor memory device according to the twenty-seventh embodiment includes a configuration as described with reference to FIG. 148 instead of a configuration as described with reference to FIG. 5 or FIG. 104. That is, in the semiconductor memory device according to the twenty-sixth embodiment, a configuration, such as a semiconductor substrate, is not disposed between the memory cell arrays 11 and peripheral circuits connected to the memory cell arrays 11. However, in the semiconductor memory device according to the twenty-seventh embodiment, the semiconductor substrate 300 is disposed between the memory cell arrays 11 and the peripheral circuits connected to the memory cell arrays 11.

Further, the semiconductor memory device according to the twenty-seventh embodiment includes a peripheral circuit layer $L_{PC27}$ instead of the peripheral circuit layer $L_{PC26}$. The peripheral circuit layer $L_{PC27}$ is basically configured similarly to the peripheral circuit layer $L_{PC26}$ However, in the peripheral circuit layer $L_{PC27}$, the bit line connecting regions $R_{BL22}$ that include the back surface electrodes 302 and the through electrodes 301 and the word line connecting region $R_{WL22}$ that includes the back surface electrodes 302 and the through electrodes 301 are each disposed in each of the regions $R_{11}$, $R_{11}'$. This is because in the twenty-seventh embodiment, the memory cell arrays 11 and the peripheral circuits connected to the memory cell arrays 11 are included in different chips from one another and are connected via the semiconductor substrate 300. Each of the bit line connecting regions $R_{BL22}$ is disposed in a position that overlaps with the bit line connecting region $R_{BL16}$ when viewed from the upper side. Each of the word line connecting regions $R_{WL22}$ is disposed in a position that overlaps with the word line connecting region $R_{WL16}$ when viewed from the upper side.

Twenty-Eighth Embodiment

Next, a semiconductor memory device according to a twenty-eighth embodiment is described. In the following description, same reference numerals are attached to parts similar to those of the twenty-sixth embodiment, and their descriptions are omitted.

The semiconductor memory device according to the twenty-eighth embodiment is basically configured similarly to the semiconductor memory device according to the twenty-sixth embodiment. However, the semiconductor memory device according to the twenty-eighth embodiment is different from the semiconductor memory device according to the twenty-sixth embodiment in the following points.

FIG. 166 is a schematic plan view illustrating a part of a configuration of the semiconductor memory device according to the twenty-eighth embodiment. The semiconductor memory device according to the twenty-eighth embodiment includes a memory cell array layer $L_{MCA28}$ (FIG. 166) instead of the memory cell array layer $L_{MCA26}$ (FIG. 163). The memory cell array layer $L_{MCA28}$ is basically configured similarly to the memory cell array layer $L_{MCA26}$. However, as illustrated in FIG. 163, in the twenty-sixth embodiment, the word line connecting regions $R_{WL16}$ and the dummy regions $R_D$ are disposed in one end portions in the Y-direction of the memory cell arrays 11, 11'. On the other hand, as illustrated in FIG. 166, in the twenty-eighth embodiment, the word line connecting regions $R_{WL16}$ and the dummy regions $R_D$ are disposed in one end portions and the other end portions in the Y-direction of the memory cell arrays 11, 11'.

FIG. 167 is a schematic plan view illustrating a part of the configuration of the semiconductor memory device according to the twenty-eighth embodiment. The semiconductor memory device according to the twenty-eighth embodiment includes a peripheral circuit layer $L_{PC28}$ (FIG. 167) instead of the peripheral circuit layer $L_{PC26}$ (FIG. 164). The peripheral circuit layer $L_{PC28}$ is basically configured similarly to the peripheral circuit layer $L_{PC26}$. However, as illustrated in FIG. 164, in the twenty-sixth embodiment, the word line driver WLD is disposed in one end portions in the Y-direction of the regions $R_{11}$, $R_{11}'$. On the other hand, as illustrated in FIG. 167, in the twenty-eighth embodiment, the word line driver WLD is disposed in one end portions and the other end portions in the Y-direction of the regions $R_{11}$, $R_{11}'$.

Twenty-Ninth Embodiment

Next, a semiconductor memory device according to a twenty-ninth embodiment is described. In the following description, same reference numerals are attached to parts similar to those of the twenty-seventh embodiment, and their descriptions are omitted.

The semiconductor memory device according to the twenty-ninth embodiment is basically configured similarly to the semiconductor memory device according to the twenty-seventh embodiment. However, the semiconductor memory device according to the twenty-ninth embodiment is different from the semiconductor memory device according to the twenty-seventh embodiment in the following points.

The semiconductor memory device according to the twenty-ninth embodiment includes the memory cell array layer $L_{MCA28}$ (FIG. 166) instead of the memory cell array layer $L_{MCA26}$.

FIG. 168 is a schematic plan view illustrating a part of a configuration of the semiconductor memory device according to the twenty-ninth embodiment. The semiconductor memory device according to the twenty-ninth embodiment includes a peripheral circuit layer $L_{PC29}$ (FIG. 168) instead of the peripheral circuit layer $L_{PC27}$ (FIG. 165). The peripheral circuit layer $L_{PC29}$ is basically configured similarly to the peripheral circuit layer $L_{PC27}$. However, as illustrated in FIG. 165, in the twenty-seventh embodiment, the word line driver WLD and the word line connecting region $R_{WL22}$ are disposed in one end portions in the Y-direction of the regions $R_{11}$, $R_{11}'$. On the other hand, as illustrated in FIG. 168, in the twenty-ninth embodiment, the word line driver WLD and the word line connecting region $R_{WL22}$ are disposed in one end portions and the other end portions in the Y-direction of the regions $R_{11}$, $R_{11}'$.

Thirtieth Embodiment

Next, a semiconductor memory device according to a thirtieth embodiment is described. In the following description, same reference numerals are attached to parts similar to those of the twenty-sixth embodiment, and their descriptions are omitted.

The semiconductor memory device according to the thirtieth embodiment is basically configured similarly to the semiconductor memory device according to the twenty-sixth embodiment. However, the semiconductor memory device according to the thirtieth embodiment includes the memory cells MC3 of 2T2C type described with reference to FIG. 63. Further, the semiconductor memory device according to the thirtieth embodiment is different from the semiconductor memory device according to the twenty-sixth embodiment in the following points.

FIG. 169 is a schematic plan view illustrating a part of a configuration of the semiconductor memory device according to the thirtieth embodiment. FIG. 169 basically illustrates a cross-sectional surface at the height position corresponding to FIG. 161. However, in FIG. 169, configurations (the bit lines BL, /BL and the contact electrodes $C_{BL}$) that do not appear on this cross-sectional surface are illustrated.

As illustrated in FIG. 169, the semiconductor memory device according to the thirtieth embodiment includes word line connecting regions $R_{WL30}$ instead of the word line connecting regions $R_{WL16}$ The word line connecting region $R_{WL30}$ is basically configured similarly to the word line connecting region $R_{WL16}$ However, the word line connecting region $R_{WL30}$ includes conductive layers 441 instead of the conductive layers 440. The conductive layer 441 is basically configured similarly to the conductive layer 440. However, each of the conductive layers 441 includes a connecting portion 442. The connecting portion 442 extends in the X-direction along two memory cell regions $R_{MC}$ mutually adjacent in the X-direction and is connected to the conductive layers 422 in two bit line connecting regions $R_{BL16}$ mutually adjacent in the X-direction. Positions in the Y-direction of the terrace portions T are different from a position in the Y-direction of the connecting portion 442.

In the embodiment, a pair of conductive layers 422 arranged in the X-direction and conductive layers 441 connected to these are parts of one continuous conductive layer. That is, one of the pair of conductive layers 422 is continuous to the other of the pair of conductive layers 422 via the conductive layer 441. The conductive layer 422 is a part of this conductive layer, which is disposed in the memory cell region $R_{MC}$. The conductive layer 441 is a part of this conductive layer, which is disposed in the word line connecting regions $R_{WL30}$.

In the semiconductor memory device according to the thirtieth embodiment, the two conductive layers 422 connected via the conductive layer 441 serve as the common word line WL. The two conductive layers 430 arranged in the X-direction corresponding to these two conductive layers 422 are connected to the respective bit lines BL, /BL arranged in the Y-direction.

In FIG. 169, one (such as the conductive layer 422 on the X-direction negative side) and the other (such as the conductive layer 422 on the X-direction positive side) of the electrically common pair of conductive layers 422 are exemplified. The bit line BL connected to one of the plurality of conductive layers 430 arranged in the Y-direction corresponding to one of the conductive layers 422 that is the n-th (n is an integer of 1 or more) closest to the word line connecting region $R_{WL30}$ and the bit line /BL connected to one of the plurality of conductive layers 430 arranged in the Y-direction corresponding to the other of the conductive layers 422 that is the n-th closest to the word line connecting region $R_{WL30}$ are mutually adjacent in the Y-direction.

In the above example, an example in which the semiconductor memory device according to the twenty-sixth embodiment includes the word line connecting regions $R_{WL30}$ instead of the word line connecting regions $R_{WL16}$ has been described. However, for example, the semiconductor memory devices according to the twenty-seventh embodiment (FIG. 165) to the twenty-ninth embodiment (FIG. 168) may include the word line connecting regions $R_{WL30}$ instead of the word line connecting regions $R_{WL16}$ When the semiconductor memory device according to the twenty-eighth embodiment or the twenty-ninth embodiment includes the word line connecting regions $R_{WL30}$ instead of the word line connecting regions $R_{WL16}$, a pair of conductive layers 422 arranged in the X-direction and two conductive layers 441 connected to one end and the other end in the Y-direction thereof are parts of one continuous conductive layer.

Thirty-First Embodiment

Next, a semiconductor memory device according to the thirty-first embodiment is described. In the following description, same reference numerals are attached to parts similar to those of the thirtieth embodiment, and their descriptions are omitted.

The semiconductor memory device according to the thirtieth embodiment includes the memory cells MC3 of 2T2C type. However, the semiconductor memory device according to the thirtieth embodiment may include the memory cells MC of 1T1C type. An example thus configured as the semiconductor memory device according to the thirty-first embodiment is described.

FIG. 170 is a schematic plan view illustrating a part of a configuration of the semiconductor memory device according to the thirty-first embodiment. FIG. 170 basically illustrates a cross-sectional surface at a height position corresponding to FIG. 161. However, in FIG. 170, configurations (the bit lines BL, /BL and the contact electrodes $C_{BL}$) that do not appear on this cross-sectional surface are illustrated.

The semiconductor memory device according to the thirty-first embodiment is basically configured similarly to the semiconductor memory device according to the thirtieth embodiment. However, as illustrated in FIG. 169, in the semiconductor memory device according to the thirtieth embodiment, configurations in two memory cell regions $R_{MC}$ mutually adjacent in the X-direction via the plate line PL are connected to a common sense amplifier circuit SA via the bit lines BL, /BL. On the other hand, as illustrated in FIG. 170, in the semiconductor memory device according to the thirty-first embodiment, configurations in two memory cell regions $R_{MC}$ mutually adjacent in the X-direction via the insulating layer 103 are connected to a common sense amplifier circuit SA via the bit lines BL, /BL.

In the example of FIG. 170, the configuration in one (the memory cell region $R_{MC}$ at the X-direction negative side in the illustrated example) of two memory cell regions $R_{MC}$ mutually adjacent in the X-direction via the insulating layer 103 is electrically connected to the bit line BL via the conductive layer 430. Additionally, the configuration in the other (the memory cell region $R_{MC}$ at the X-direction positive side in the illustrated example) of these two memory cell regions $R_{MC}$ is electrically connected to the bit line /BL via the conductive layer 430.

Further, in the example of FIG. 170, a plurality of conductive layers 422 corresponding to one of two memory cell regions $R_{MC}$ mutually adjacent in the X-direction via the insulating layer 103 are electrically independent from a plurality of conductive layers 422 corresponding to the other of the two memory cell regions $R_{MC}$.

Thirty-Second Embodiment

Next, a semiconductor memory device according to a thirty-second embodiment is described. In the following description, same reference numerals are attached to parts similar to those of the eighteenth embodiment, and their descriptions are omitted.

FIG. 171 is a schematic XY cross-sectional view for describing a configuration of the semiconductor memory device according to the thirty-second embodiment.

The semiconductor memory device according to the thirty-second embodiment is basically configured similarly to the semiconductor memory device according to the eighteenth embodiment. However, the semiconductor memory device according to the thirty-second embodiment includes plate lines PL' instead of the plate lines PL. The plate line PL' is basically configured similarly to the plate line PL. However, the plate line PL' has an end portion $E_{PLY}$ in the Y-direction at which a curved surface projecting in the Y-direction is formed. Such a curved surface is gradually formed in the processes described with reference to FIG. 130 to FIG. 140. For example, such curved surface is gradually formed according to conditions such as the selectivity in the various etching processes. Even when a curved surface projecting in the Y-direction is formed on the end portion $E_{PLY}$ in the Y-direction of the plate line PL', such curved surface is considered to have a small influence on characteristics. Therefore, in the example of FIG. 171, requirements regarding the conditions such as the selectivity in the etching processes is lowered. The plate line PL' has side surfaces $S_{PLX}$ in the X-direction that are formed linearly. That is, a plurality of opposed surfaces of the plate line PL' with respect to the plurality of insulating layers 102 are formed along the straight line that extends in the Y-direction.

In the above example, an example in which the semiconductor memory device according to the eighteenth embodiment includes the plate lines PL' instead of the plate lines PL has been described. However, for example, the semiconductor memory devices according to the twentieth embodiment to the thirtieth embodiment may include the plate lines PL' instead of the plate lines PL.

Thirty-Third Embodiment

Next, a semiconductor memory device according to a thirty-third embodiment is described. In the following description, same reference numerals are attached to parts similar to those of the thirty-second embodiment, and their descriptions are omitted.

FIG. 172 is a schematic XY cross-sectional view for describing a configuration of the semiconductor memory device according to the thirty-third embodiment.

The semiconductor memory device according to the thirty-third embodiment is basically configured similarly to the semiconductor memory device according to the thirty-second embodiment. However, the semiconductor memory device according to the thirty-third embodiment includes plate lines PL" instead of the plate lines PL'. The plate line PL" is basically configured similarly to the plate line PL'. However, the side surfaces $S_{PLX}$ in the X-direction of the plate line PL" have a plurality of opposed surfaces with respect to the plurality of insulating layers 102, on each of which a curved surface projecting in the X-direction is formed. Such curved surfaces are gradually formed in the processes described with reference to FIG. 130 to FIG. 140.

In the illustrated example, a projection amount $W_{PLY}$ of the curved surface formed at the end portion $E_{PLY}$ in the Y-direction of the plate line PL" is greater than a projection amount $W_{PLX}$ of the curved surfaces formed on the side surfaces $S_{PLX}$ in the X-direction of the plate line PL". For example, on the XY cross-sectional surface as exemplified in FIG. 172, the projection amount $W_{PLY}$ of the curved surface may be a distance in the Y-direction from a side surface at the Y-direction positive side of the electrode 112 disposed at the most Y-direction positive side among the plurality of electrodes 112 arranged in the Y-direction to the end portion at the Y-direction positive side of the plate line PL". For example, on the XY cross-sectional surface as exemplified in FIG. 172, the projection amount $W_{PLX}$ of the curved surfaces may be a distance in the X-direction between a point positioned at the most X-direction positive side and a point positioned at the most X-direction negative side among points that constitute any of the plurality of curved surfaces formed on the side surfaces $S_{PLX}$ in the X-direction of the plate line PL".

In the above example, an example in which the semiconductor memory device according to the eighteenth embodiment includes the plate lines PL" instead of the plate lines PL has been described. However, for example, the semiconductor memory devices according to the twentieth embodiment to the thirtieth embodiment may include the plate lines PL" instead of the plate lines PL.

Other Embodiments

The semiconductor memory devices according to the first embodiment to the thirty-third embodiment have been described above. However, the semiconductor memory devices according to these embodiments are only examples, and a specific configuration, operations, and the like are adjustable as appropriate.

For example, in the above description, examples in which a capacitor is employed as a memory portion connected to the transistor structures 120 have been described. However, the memory portion need not be the capacitor. For example, the memory portion may be one that contains ferromagnet, a chalcogen material such as GeSbTe, or another material and stores data using the characteristics of these materials. For example, in any of the structures described above, any of these materials may be included in the insulating layer between the electrodes forming the capacitor.

Furthermore, for example, the semiconductor memory devices according to the first embodiment to the thirty-third embodiment may be a memory system MS as illustrated in FIG. 173 or may be a part of the memory system MS. The memory system MS exemplified in FIG. 173 includes a plurality of memory chips $C_M$ and the controller chip $C_C$ connected to these plurality of memory chips $C_M$. The memory chip $C_M$ includes the memory cell arrays 11 and peripheral circuits as exemplified in FIG. 11.

For example, in the twenty-second embodiment to the thirty-third embodiment, the memory cell regions $R_{MC}$ and the memory cell regions $R_{MC21}$ may be switched. Further, the bit line connecting regions $R_{BL16}$ and the bit line connecting regions $R_{BL21}$ may be switched.

[Remarks]

This specification discloses at least the following matters.

[Matter 1]

For example, as described with reference to FIG. 53 to FIG. 56, this specification discloses a semiconductor memory device that includes:

a first plate electrode and a second plate electrode spaced from one another in a first direction;

a first capacitor disposed between the first plate electrode and the second plate electrode and connected to the first plate electrode;

a first bit line disposed between the first capacitor and the second plate electrode and connected to the first capacitor;

a second capacitor disposed between the first bit line and the second plate electrode and connected to the second plate electrode;

a second bit line disposed between the first bit line and the second capacitor and connected to the second capacitor; and an insulating layer disposed between the first bit line and the second bit line.

The insulating layer has a variation in width in the first direction smaller than a variation in width in the first direction of the first plate electrode.

The insulating layer has the variation in width in the first direction smaller than a variation in width in the first direction of the second plate electrode.

[Matter 2]

For example, as described with reference to FIG. 108 to FIG. 112, this specification discloses a semiconductor memory device that includes:

a first chip including a first memory cell;

a second chip including a second memory cell; and a third chip disposed between the first chip and the second chip and including a peripheral circuit.

The first memory cell includes a first capacitor.

The second memory cell includes a second capacitor.

The peripheral circuit is electrically connected to the first memory cell and the second memory cell.

[Matter 3]

For example, as described with reference to FIG. 141 and FIG. 154 to FIG. 157, this specification discloses a semiconductor memory device that includes:

a first chip including a first memory cell and a peripheral circuit; and a second chip including a second memory cell.

The first memory cell includes a first capacitor.

The second memory cell includes a second capacitor.

The peripheral circuit is electrically connected to the first memory cell and the second memory cell.

[Matter 4]

For example, as described with reference to FIG. 84 to FIG. 87, this specification discloses a semiconductor memory device that includes:

a plurality of memory portions arranged in a first direction intersecting with a substrate;

a plurality of first semiconductor layers arranged in the first direction and electrically connected to the plurality of memory portions;

a first electrode extending in the first direction and opposed to the plurality of first semiconductor layers;

a second semiconductor layer connected to one end in the first direction of the first electrode; and a second electrode opposed to the second semiconductor layer.

[Matter 5]

For example, as described with reference to FIG. 84 to FIG. 87, this specification discloses a semiconductor memory device that includes:

a plurality of memory portions arranged in a first direction intersecting with a substrate;

a plurality of first semiconductor layers arranged in the first direction and electrically connected to the plurality of memory portions;

a first electrode extending in the first direction and opposed to the plurality of first semiconductor layers;

a plurality of wirings electrically connected to the plurality of memory portions via the plurality of first semiconductor layers;

a plurality of second semiconductor layers arranged in the first direction and electrically connected to the plurality of wirings; and a second electrode extending in the first direction and opposed to the plurality of second semiconductor layers.

[Matter 6]

For example, as described with reference to FIG. 172, this specification discloses a semiconductor memory device that includes:

a plurality of memory portions arranged in a first direction intersecting with a substrate and extending in a second direction intersecting with the first direction;

a plurality of first semiconductor layers disposed on one side in the second direction with respect to the plurality of memory portions, arranged in the first direction, and electrically connected to the plurality of memory portions; and a plate electrode disposed on the other side in the second direction with respect to the plurality of memory portions, extending in the first direction and a third direction intersecting with the first direction and the second direction, and electrically connected to the plurality of memory portions.

On a first cross-sectional surface extending in the second direction and the third direction, a first curved surface is disposed at an end portion in the third direction of the plate electrode, and a second curved surface is disposed on a side surface in the second direction of the plate electrode.

The first curved surface has a projection amount greater than a projection amount of the second curved surface.

[Matter 7]

For example, as described with reference to FIG. 142, this specification discloses a semiconductor memory device that includes:

a first memory cell region and a second memory cell region mutually adjacent in a first direction; and a wiring connecting region disposed between the first memory cell region and the second memory cell region.

The first memory cell region includes a first memory cell.

The second memory cell region includes a second memory cell.

The wiring connecting region includes:

a first bit line electrically connected to the first memory cell; and a second bit line electrically connected to the second memory cell.

The first bit line and the second bit line are connected to a common sense amplifier circuit.

[Matter 8]

For example, as described with reference to FIG. 161 and FIG. 162, this specification discloses a semiconductor memory device that includes:

a first wiring connecting region and a second wiring connecting region mutually adjacent in a first direction; and a first memory cell region and a second memory cell region disposed between the first wiring connecting region and the second wiring connecting region and mutually adjacent in the first direction.

The first wiring connecting region includes a first bit line.

The second wiring connecting region includes a second bit line.

The first memory cell region includes a first memory cell connected to the first bit line.

The second memory cell region includes a second memory cell connected to the second bit line.

The first bit line and the second bit line are connected to a common sense amplifier circuit.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:

a substrate including a first region and a second region arranged in a first direction;

a plurality of first electrodes arranged in a second direction intersecting with a surface of the substrate, and each including:

a pair of first parts disposed in the first region, extending in the first direction, and arranged in a third direction intersecting with the first direction and the second direction; and a second part disposed in the second region, extending in the third direction, having an L-shape, and electrically connected to the pair of first parts;

a plurality of first wirings arranged in the first direction along a plurality of ones of the pairs of first parts of the plurality of first electrodes, and extending in the second direction;

a plurality of first semiconductor layers arranged in the first direction and the second direction corresponding to the plurality of the ones of the pairs of first parts of the plurality of first electrodes and the plurality of first wirings, opposed to the plurality of the ones of the pairs of first parts of the plurality of first electrodes, and connected to the plurality of first wirings;

a plurality of first memory portions electrically connected to the plurality of first wirings via the plurality of first semiconductor layers;

a plurality of second wirings arranged in the first direction along a plurality of others of the pairs of first parts of the plurality of first electrodes, and extending in the second direction;

a plurality of second semiconductor layers arranged in the first direction and the second direction corresponding to the plurality of the other of the pairs of first parts of the plurality of first electrodes and the plurality of second wirings, opposed to the plurality of the other of the pairs of first parts of the plurality of first electrodes, and connected to the plurality of second wirings; and a plurality of second memory portions electrically connected to the plurality of second wirings via the plurality of second semiconductor layers.

2. The semiconductor memory device according to claim 1, further comprising:

a plurality of first contact electrodes disposed in the second region, extending in the second direction, arranged in the third direction, and connected to the respective plurality of first electrodes;

a plurality of third wirings disposed in the second region, extending in the first direction, arranged in the third direction, and connected to the respective plurality of first contact electrodes; and a fourth wiring disposed in the first region, extending in the third direction, and connected to one of the plurality of first wirings.

3. The semiconductor memory device according to claim 1, further comprising:

a plurality of second electrodes arranged in the second direction, aligned with the plurality of first electrodes in the third direction, and each including:

a third part disposed in the first region, and extending in the first direction; and a fourth part disposed in the second region, extending in the third direction, electrically connected to the third part, and the first part and the third part being disposed between the second part and the fourth part in the third direction;

a plurality of fifth wirings arranged in the first direction along a plurality of the third parts of the plurality of second electrodes, and extending in the second direction;

a plurality of third semiconductor layers arranged in the first direction and the second direction corresponding to the plurality of the third parts of the plurality of second electrodes and the plurality of fifth wirings, opposed to the plurality of the third parts of the plurality of second electrodes, and electrically connected to the plurality of fifth wirings;

a plurality of third memory portions electrically connected to the plurality of fifth wirings via the plurality of third semiconductor layers; and a plurality of fourth wirings and a plurality of sixth wirings alternately arranged in the first direction in the first region, extending in the third direction, the plurality of fourth wirings being electrically connected to the plurality of first wirings, and the plurality of sixth wirings being electrically connected to the plurality of fifth wirings.

4. The semiconductor memory device according to claim 1, wherein the plurality of memory portions each include a capacitor.

5. The semiconductor memory device according to claim 1, wherein the one of the pair of first parts is continuous to the other of the pair of first parts via the second part.

6. The semiconductor memory device according to claim 1, further comprising:

a plurality of second electrodes arranged in the second direction, aligned with the plurality of first electrodes in the third direction, and each including:

a third part disposed in the first region, and extending in the first direction; and a fourth part disposed in the second region, extending in the third direction, electrically connected to the third part, and the first part and the third part being disposed between the second part and the fourth part in the third direction;

a plurality of fifth wirings arranged in the first direction along a plurality of the third parts of the plurality of second electrodes, and extending in the second direction;

a plurality of third semiconductor layers arranged in the first direction and the second direction corresponding to the plurality of the third parts of the plurality of second electrodes and the plurality of fifth wirings, opposed to the plurality of the third parts of the plurality of second electrodes, and electrically connected to the plurality of fifth wirings;

a plurality of third memory portions electrically connected to the plurality of fifth wirings via the plurality of third semiconductor layers; and a sense amplifier circuit electrically connected to one of the first wirings and one of the fifth wirings, wherein the sense amplifier circuit includes a first inverter and a second inverter, the one of the plurality of first wirings is connected to an input terminal of the first inverter and an output terminal of the second inverter, and the one of the plurality of fifth wirings is connected to an output terminal of the first inverter and an input terminal of the second inverter.

7. The semiconductor memory device according to claim 6, wherein the plurality of first electrodes are electrically independent from the plurality of second electrodes.

8. The semiconductor memory device according to claim 1, wherein the first region includes a plurality of sense unit regions arranged in the first direction corresponding to the plurality of first wirings, each of the plurality of sense unit regions includes a sense amplifier circuit, and the plurality of sense unit regions are disposed in positions that overlap the plurality of first wirings when viewed from the second direction.

9. The semiconductor memory device according to claim 1, wherein the second parts have protruding part which protrudes in the third direction from a position of an edge of the pair of first parts, the edge extending in the first direction.

* * * * *